US012520715B2

(12) United States Patent
Li et al.

(10) Patent No.: US 12,520,715 B2
(45) Date of Patent: Jan. 6, 2026

(54) ORGANIC ELECTROLUMINESCENT MATERIALS AND DEVICES

(71) Applicant: University of Southern California, Los Angeles, CA (US)

(72) Inventors: Tian-Yi Li, Los Angeles, CA (US); Peter I. Djurovich, Long Beach, CA (US); Mark E. Thompson, Anaheim, CA (US)

(73) Assignee: University of Southern California

( * ) Notice: Subject to any disclaimer, the term of this patent is extended or adjusted under 35 U.S.C. 154(b) by 754 days.

(21) Appl. No.: 17/811,422

(22) Filed: Jul. 8, 2022

(65) Prior Publication Data

US 2023/0101042 A1 Mar. 30, 2023

Related U.S. Application Data

(60) Provisional application No. 63/298,943, filed on Jan. 12, 2022, provisional application No. 63/222,523, filed on Jul. 16, 2021.

(51) Int. Cl.
*H10K 85/30* (2023.01)
*C07F 1/00* (2006.01)
(Continued)

(52) U.S. Cl.
CPC ........... *H10K 85/371* (2023.02); *C07F 1/005* (2013.01); *C07F 1/08* (2013.01); *C09K 11/06* (2013.01);
(Continued)

(58) Field of Classification Search
CPC ............. H10K 85/371; H10K 2101/20; H10K 2101/30; H10K 50/11
See application file for complete search history.

(56) References Cited

U.S. PATENT DOCUMENTS

| | | | |
|---|---|---|---|
| 4,769,292 | A | 9/1988 | Tang |
| 5,061,569 | A | 10/1991 | VanSlyke |
| 5,247,190 | A | 9/1993 | Friend |
| 5,703,436 | A | 12/1997 | Forrest |

(Continued)

FOREIGN PATENT DOCUMENTS

| | | |
|---|---|---|
| EP | 0650955 | 5/1995 |
| EP | 1238981 | 9/2002 |

(Continued)

OTHER PUBLICATIONS

Huynh et al., "Donor Strength Determination of Benzoxazolin-2-ylidene, Benzobisoxazolin-2-ylidene, and Their Isocyanide precursors by 13C NMR Spectroscopy of Their Pdll and Aul Complexes", Organometallics 2017, 36, 275-284.*

(Continued)

*Primary Examiner* — Golam Mowla
(74) *Attorney, Agent, or Firm* — Riverside Law LLP

(57) ABSTRACT

The present disclosure provides coinage metal carbene emitters of Formula I; organic light emitting device (OLED) comprising an anode, a cathode, and an organic layer, disposed between the anode and the cathode, comprising a compound of Formula I; and consumer products comprising an OLED comprising a compound of Formula I:

Formula I

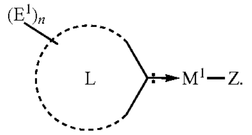

20 Claims, 74 Drawing Sheets

(51) Int. Cl.

| | |
|---|---|
| ***C07F 1/08*** | (2006.01) |
| ***C09K 11/06*** | (2006.01) |
| ***H10K 50/11*** | (2023.01) |

(52) U.S. Cl.
CPC ........ *C09K 2211/188* (2013.01); *H10K 50/11* (2023.02)

(56) References Cited

U.S. PATENT DOCUMENTS

| | | | |
|---|---|---|---|
| 5,707,745 | A | 1/1998 | Forrest |
| 5,834,893 | A | 11/1998 | Bulovic |
| 5,844,363 | A | 12/1998 | Gu |
| 6,013,982 | A | 1/2000 | Thompson |
| 6,087,196 | A | 7/2000 | Sturm |
| 6,091,195 | A | 7/2000 | Forrest |
| 6,097,147 | A | 8/2000 | Baldo |
| 6,294,398 | B1 | 9/2001 | Kim |
| 6,303,238 | B1 | 10/2001 | Thompson |
| 6,337,102 | B1 | 1/2002 | Forrest |
| 6,468,819 | B1 | 10/2002 | Kim |
| 6,528,187 | B1 | 3/2003 | Okada |
| 6,687,266 | B1 | 2/2004 | Ma |
| 6,835,469 | B2 | 12/2004 | Kwong |
| 6,921,915 | B2 | 7/2005 | Takiguchi |
| 7,087,321 | B2 | 8/2006 | Kwong |
| 7,090,928 | B2 | 8/2006 | Thompson |
| 7,154,114 | B2 | 12/2006 | Brooks |
| 7,250,226 | B2 | 7/2007 | Tokito |
| 7,279,704 | B2 | 10/2007 | Walters |
| 7,332,232 | B2 | 2/2008 | Ma |
| 7,338,722 | B2 | 3/2008 | Thompson |
| 7,393,599 | B2 | 7/2008 | Thompson |
| 7,396,598 | B2 | 7/2008 | Takeuchi |
| 7,431,968 | B1 | 10/2008 | Shtein |
| 7,445,855 | B2 | 11/2008 | Mackenzie |
| 7,534,505 | B2 | 5/2009 | Lin |
| 7,968,146 | B2 | 6/2011 | Wagner |
| 8,409,729 | B2 | 4/2013 | Zeng |
| 2002/0034656 | A1 | 3/2002 | Thompson |
| 2002/0134984 | A1 | 9/2002 | Igarashi |
| 2002/0158242 | A1 | 10/2002 | Son |
| 2003/0138657 | A1 | 7/2003 | Li |
| 2003/0152802 | A1 | 8/2003 | Tsuboyama |
| 2003/0162053 | A1 | 8/2003 | Marks |
| 2003/0175553 | A1 | 9/2003 | Thompson |
| 2003/0230980 | A1 | 12/2003 | Forrest |
| 2004/0036077 | A1 | 2/2004 | Ise |
| 2004/0137267 | A1 | 7/2004 | Igarashi |
| 2004/0137268 | A1 | 7/2004 | Igarashi |
| 2004/0174116 | A1 | 9/2004 | Lu |
| 2005/0025993 | A1 | 2/2005 | Thompson |
| 2005/0112407 | A1 | 5/2005 | Ogasawara |
| 2005/0238919 | A1 | 10/2005 | Ogasawara |
| 2005/0244673 | A1 | 11/2005 | Satoh |
| 2005/0260441 | A1 | 11/2005 | Thompson |
| 2005/0260449 | A1 | 11/2005 | Walters |
| 2006/0008670 | A1 | 1/2006 | Lin |
| 2006/0202194 | A1 | 9/2006 | Jeong |
| 2006/0240279 | A1 | 10/2006 | Adamovich |
| 2006/0251923 | A1 | 11/2006 | Lin |
| 2006/0263635 | A1 | 11/2006 | Ise |
| 2006/0280965 | A1 | 12/2006 | Kwong |
| 2007/0190359 | A1 | 8/2007 | Knowles |
| 2007/0278938 | A1 | 12/2007 | Yabunouchi |
| 2008/0015355 | A1 | 1/2008 | Schafer |
| 2008/0018221 | A1 | 1/2008 | Egen |
| 2008/0106190 | A1 | 5/2008 | Yabunouchi |
| 2008/0124572 | A1 | 5/2008 | Mizuki |
| 2008/0220265 | A1 | 9/2008 | Xia |
| 2008/0297033 | A1 | 12/2008 | Knowles |
| 2009/0008605 | A1 | 1/2009 | Kawamura |
| 2009/0009065 | A1 | 1/2009 | Nishimura |
| 2009/0017330 | A1 | 1/2009 | Iwakuma |
| 2009/0030202 | A1 | 1/2009 | Toshihiro |
| 2009/0039776 | A1 | 2/2009 | Yamada |
| 2009/0045730 | A1 | 2/2009 | Nishimura |
| 2009/0045731 | A1 | 2/2009 | Nishimura |
| 2009/0101870 | A1 | 4/2009 | Prakash |
| 2009/0108737 | A1 | 4/2009 | Kwong |
| 2009/0115316 | A1 | 5/2009 | Zheng |
| 2009/0165846 | A1 | 7/2009 | Johannes |
| 2009/0167162 | A1 | 7/2009 | Lin |
| 2009/0179554 | A1 | 7/2009 | Kuma |
| 2013/0026452 | A1 | 1/2013 | Kottas |
| 2013/0119354 | A1 | 5/2013 | Ma |
| 2014/0054564 | A1 | 2/2014 | Kim |
| 2015/0318487 | A1 | 11/2015 | Ito |
| 2019/0161504 | A1 | 5/2019 | Thompson |
| 2022/0041626 | A1 | 2/2022 | Djurovich |

FOREIGN PATENT DOCUMENTS

| | | | |
|---|---|---|---|
| EP | 1725079 | | 11/2006 |
| EP | 2034538 | | 3/2009 |
| EP | 2551932 | | 1/2013 |
| EP | 2977378 | | 1/2016 |
| JP | 200511610 | | 1/2005 |
| JP | 2007123392 | | 5/2007 |
| JP | 2007254297 | | 10/2007 |
| JP | 2008074939 | | 4/2008 |
| JP | 2010135467 | | 6/2010 |
| WO | 0139234 | | 5/2001 |
| WO | 0202714 | | 1/2002 |
| WO | 0215645 | | 2/2002 |
| WO | 03040257 | | 5/2003 |
| WO | 03060956 | | 7/2003 |
| WO | 2004093207 | | 10/2004 |
| WO | 2004107822 | | 12/2004 |
| WO | 2004111066 | A1 | 12/2004 |
| WO | 2005014551 | | 2/2005 |
| WO | 2005019373 | | 3/2005 |
| WO | 2005030900 | | 4/2005 |
| WO | 2005089025 | | 9/2005 |
| WO | 2005123873 | | 12/2005 |
| WO | 2006009024 | | 1/2006 |
| WO | 2006056418 | | 6/2006 |
| WO | 2006072002 | | 7/2006 |
| WO | 2006082742 | | 8/2006 |
| WO | 2006098120 | | 9/2006 |
| WO | 2006100298 | | 9/2006 |
| WO | 2006103874 | | 10/2006 |
| WO | 2006114966 | | 11/2006 |
| WO | 2006132173 | | 12/2006 |
| WO | 2007002683 | | 1/2007 |
| WO | 2007004380 | | 1/2007 |
| WO | 2007063754 | | 6/2007 |
| WO | 2007063796 | | 6/2007 |
| WO | 2008044723 | | 4/2008 |
| WO | 2008056746 | | 5/2008 |
| WO | 2008057394 | A1 | 5/2008 |
| WO | 2008101842 | | 8/2008 |
| WO | 2008132085 | | 11/2008 |
| WO | 2009000673 | | 12/2008 |
| WO | 2009003898 | | 1/2009 |
| WO | 2009008311 | | 1/2009 |
| WO | 2009018009 | | 2/2009 |
| WO | 2009021126 | | 2/2009 |
| WO | 2009050290 | | 4/2009 |
| WO | 2009062578 | | 5/2009 |
| WO | 2009063833 | | 5/2009 |
| WO | 2009066778 | | 5/2009 |
| WO | 2009066779 | | 5/2009 |
| WO | 2009086028 | | 7/2009 |
| WO | 2009100991 | | 8/2009 |
| WO | 2010011390 | A2 | 1/2010 |
| WO | 2010111175 | | 9/2010 |
| WO | 2010126234 | | 11/2010 |

OTHER PUBLICATIONS

Huynh et al., "Gold and Palladium Hetero-Bis-NHC Complexes: Characterizations, Correlations, and Ligand Redistributions", Organometallics 2013, 32, 3685-3696.*

(56) References Cited

OTHER PUBLICATIONS

Sun, Yiru and Forrest, Stephen R., "High-Efficiency White Organic Light Emitting Devices with Three Separate Phosphorescent Emission Layers," Appl. Phys. Lett., 91:263503-1-263503-3 (2007).
T. Ostergard et al., "Langmuir-Blodgett Light-Emitting Diodes of Poly(3-Hexylthiophene): Electro-Optical Characteristics Related to Structure," Synthetic Metals, 87:171-177 (1997).
Tadle, A. C. et al. Tuning the Photophysical and Electrochemical Properties of Aza-Boron-Dipyridylmethenes for Fluorescent Blue OLEDs Adv. Funct. Mater. 2021, 31, 2101175.
Taffet, E. J. et al. Carbene-Metal-Amide Bond Deformation, Rather Than Ligand Rotation, Drives Delayed Fluorescence. J. Phys. Chem. Lett. 2018, 9, 1620.
Takizawa, Shin-ya et al., "Phosphorescent Iridium Complexes Based on 2-Phenylimidazo[1,2-a]pyridine Ligands: Tuning of Emission Color toward the Blue Region and Application to Polymer Light-Emitting Devices," Inorg. Chem., 46(10):4308-4319 (2007).
Tang, C.W. and VanSlyke, S.A., "Organic Electroluminescent Diodes," Appl. Phys. Lett., 51(12):913-915 (1987).
Thompson, S. et al. The intersystem crossing of a cyclic (alkyl)(amino) carbene gold (I) complex. J. Chem. Phys. 2018, 149, 014304.
Tung, Yung-Liang et al., "Organic Light-Emitting Diodes Based on Charge-Neutral Ru II PHosphorescent Emitters," Adv. Mater., 17(8):1059-1064 (2005).
Van Slyke, S. A. et al., "Organic Electroluminescent Devices with Improved Stability," Appl. Phys. Lett, 69(15 ):2160-2162 (1996).
Wang, J. et al. Synthesis and structures of gold and copper carbene intermediates in catalytic amination of alkynes. Nature Comm. 2017, 8, 14625.
Wang, Y. et al., "Highly Efficient Electroluminescent Materials Based on Fluorinated Organometallic Iridium Compounds," Appl. Phys. Lett., 79(4):449-451 (2001).
Wong, Keith Man-Chung et al., "A Novel Class of Phosphorescent Gold(III) Alkynyl-Based Organic Light-Emitting Devices with Tunable Colour," Chem. Commun., 2906-2908 (2005).
Wong, Wai-Yeung, "Multifunctional Iridium Complexes Based on Carbazole Modules as Highly Efficient Electrophosphors," Angew. Chem. Int. Ed., 45:7800-7803 (2006).
Zhang, C. et al. Facile syntheses of N-heterocyclic carbene precursors through Cu(ii)- or Ag(i)-catalyzed amination of N-alkynyl formamidines. New J. Chem. 2017, 5, 1889.
Hall, C. R. et al. Ultrafast Structure and Dynamics in the Thermally Activated Delayed Fluorescence of a Carbene-Metal-Amide. J. Phys. Chem. Lett. 2018, 9, 5873.
Adachi et al., "Nearly 100% Internal Phosphorescent Efficiency in an Organic Light Emitting Device," J. Appl. Phys., vol. 90, No. 10, pp. 5048-5051 (2001).
Adachi, Chihaya et al., "High-Efficiency Red Electrophosphorescence Devices," Appl. Phys. Lett., 78(11):1622-1624 (2001).
Adachi, Chihaya et al., "Organic Electroluminescent Device Having a Hole Conductor as an Emitting Layer," Appl. Phys. Lett., 55(15):1489-1491 (1989).
Aonuma, Masaki et al., "Material Design of Hole Transport Materials Capable of Thick-Film Formation in Organic Light Emitting Diodes," Appl. Phys. Lett., 90, Apr. 30, 2007, 183503-1-183503-3.
Baldo et al., "Highly Efficient Phosphorescent Emission from Organic Electroluminescent Devices," Nature, vol. 395, pp. 151-154 (1998).
Baldo et al., "Very High-Efficiency Green Organic Light-Emitting Devices Based on Electrophosphorescence," Appl. Phys. Lett., vol. 75, No. 1, pp. 4-6 (1999).
Chotard, F. et al. Mono- versus Bicyclic Carbene Metal Amide Photoemitters: Which Design Leads to the Best Performance? Chem. Mater. 2020, 32, 6114.
Conaghan, P. J. et al. Highly efficient blue organic light-emitting diodes based on carbene-metal-amides. Nature Comm. 2020, 11, 1758.
Feng, J. et al. Environmental Control of Triplet Emission in Donor-Bridge-Acceptor Organometallics. Adv. Funct. Mater. 2020, 30, 1908715.
Gao, Zhiqiang et al., "Bright-Blue Electroluminescence From a Silyl-Substituted ter-(phenylenevinylene) derivative," Appl. Phys. Lett., 74(6):865-867 (1999).
Gernert, M. et al. Cyclic (Amino)(aryl)carbenes Enter the Field of Chromophore Ligands: Expanded TT System Leads to Unusually Deep Red Emitting Cul Compounds. J. Am. Chem. Soc. 2020, 142, 8897.
Guo, Tzung-Fang et al., "Highly Efficient Electrophosphorescent Polymer Light-Emitting Devices," Organic Electronics, 1:15-20 (2000).
Hamada, Yuji et al., "High Luminance in Organic Electroluminescent Devices with Bis(10-hydroxybenzo[h]quinolinato)beryllium as an Emitter," Chem. Lett., 905-906 (1993).
Hamze, R. et al. "Quick-Silver" from a Systematic Study of Highly Luminescent, Two-Coordinate, d10 Coinage Metal Complexes. J. Am. Chem. Soc. 2019, 141, 8616.
Hamze, R. et al. Eliminating nonradiative decay in Cu(I) emitters: >99% quantum efficiency and microsecond lifetime. Science 2019, 363, 601.
Holmes, R.J. et al., "Blue Organic Electrophosphorescence Using Exothermic Host-Guest Energy Transfer," Appl. Phys. Lett., 82(15):2422-2424 (2003).
Hu, Nan-Xing et al., "Novel High Tg Hole-Transport Molecules Based on Indolo[3,2-b]carbazoles for Organic Light-Emitting Devices," Synthetic Metals, 111-112:421-424 (2000).
Huang, Jinsong et al., "Highly Efficient Red-Emission Polymer Phosphorescent Light-Emitting Diodes Based on Two Novel Tris(1-phenylisoquinolinato-C2,N)iridium(III) Derivatives," Adv. Mater., 19:739-743 (2007).
Huang, Wei-Sheng et al., "Highly Phosphorescent Bis-Cyclometalated Iridium Complexes Containing Benzoimidazole-Based Ligands," Chem. Mater., 16(12):2480-2488 (2004).
Hung, L.S. et al., "Anode Modification in Organic Light-Emitting Diodes by Low-Frequency Plasma Polymerization of CHF3," Appl. Phys. Lett., 78(5):673-675 (2001).
Ikai, Masamichi and Tokito, Shizuo, "Highly Efficient Phosphorescence From Organic Light-Emitting Devices with an Exciton-Block Layer," Appl. Phys. Lett., 79(2):156-158 (2001).
Ikeda, Hisao et al., "P-185: Low-Drive-Voltage OLEDs with a Buffer Layer Having Molybdenum Oxide," SID Symposium Digest, 37:923-926 (2006).
Inada, Hiroshi and Shirota, Yasuhiko, "1,3,5-Tris[4-(diphenylamino)phenyl]benzene and its Methylsubstituted Derivatives as a Novel Class of Amorphous Molecular Materials," J. Mater. Chem., 3(3):319-320 (1993).
J. Mater. Chem. C, 2022, 10, 4674.
Kanno, Hiroshi et al., "Highly Efficient and Stable Red Phosphorescent Organic Light-Emitting Device Using bis[2-(2-benzothiazoyl)phenolato]zinc(II) as host material," Appl. Phys. Lett., 90:123509-1-123509-3 (2007).
Kido, Junji et al.,"1,2,4-Triazole Derivative as an Electron Transport Layer in Organic Electroluminescent Devices," Jpn. J. Appl. Phys., 32:L917-L920 (1993).
Kuwabara, Yoshiyuki et al., "Thermally Stable Multilayered Organic Electroluminescent Devices Using Novel Starburst Molecules, 4,4',4"-Tri(N-carbazolyl)triphenylamine (TCTA) and 4,4',4'-Tris(3-methylphenylphenyl-amino)triphenylamine (m-MTDATA), as Hole-Transport Materials," Adv. Mater., 6(9):677-679 (1994).
Kwong et al., "High Operational Stability of Electrophosphorescent Devices," Appl. Phys. Lett., vol. 81, No. 1, pp. 162-164 (2002).
Lamansky, Sergey et al., "Synthesis and Characterization of Phosphorescent Cyclometalated Iridium Complexes," Inorg. Chem., 40(7):1704-1711 (2001).
Lee, Chang-Lyoul et al., "Polymer Phosphorescent Light-Emitting Devices Doped with Tris(2-phenylpyridine) Iridium as a Triplet Emitter," Appl. Phys. Lett., 77(15):2280-2282 (2000).
Li, T.-Y. et al. A Luminescent Two-Coordinate AuI Bimetallic Complex with a Tandem-Carbene Structure: A Molecular Design for the Enhancement of TADF Radiative Decay Rate. Chem. Eur. J. 2021, 27, 6191.
Li, T.-Y. et al. Enhancement of the Luminescent Efficiency in Carbene-Au(I)-Aryl Complexes by the Restriction of Renner-Teller Distortion and Bond Rotation. J. Am. Chem. Soc. 2020, 142, 6158.

(56) References Cited

OTHER PUBLICATIONS

Lo, Shih-Chun et al., "Blue Phosphorescence from Iridium(III) Complexes at Room Temperature," Chem. Mater., 18(21):5119-5129 (2006).
Ma, Yuguang et al., "Triplet Luminescent Dinuclear-Gold(I) Complex-Based Light-Emitting Diodes with Low Turn-On voltage," Appl. Phys. Lett., 74(10):1361-1363 (1999).
Mi, Bao-Xiu et al., "Thermally Stable Hole-Transporting Material for Organic Light-Emitting Diode: an Isoindole Derivative," Chem. Mater., 15(16):3148-3151 (2003).
Nishida, Jun-ichi et al., "Preparation, Characterization, and Electroluminescence Characteristics of a-Diimine-type Platinum(II) Complexes with Perfluorinated Phenyl Groups as Ligands," Chem. Lett., 34(4):592-593 (2005).
Niu, Yu-Hua et al., "Highly Efficient Electrophosphorescent Devices with Saturated Red Emission from a Neutral Osmium Complex," Chem. Mater., 17(13):3532-3536 (2005).
Noda, Tetsuya and Shirota, Yasuhiko, "5,6-Bis(dinnesitylboryl)-2,2'-bithiophene and 5,5"-Bis(dimesitylbory1)-2,2':5',2"-terthiophene as a Novel Family of Electron-Transporting Amorphous Molecular Materials," J. Am. Chem. Soc., 120 (37):9714-9715 (1998).
Okumoto, Kenji et al., "Green Fluorescent Organic Light-Emitting Device with External Quantum Efficiency of Nearly 10%," Appl. Phys. Lett., 89:063504-1-063504-3 (2006).
Palilis, Leonidas C., "High Efficiency Molecular Organic Light-Emitting Diodes Based on Silole Derivatives and Their Exciplexes," Organic Electronics, 4:113-121 (2003).
Paulose, Betty Marie Jennifer S, et al., "First Examples of Alkenyl Pyridines as Organic Ligands for Phosphorescent Iridium Complexes," Adv. Mater., 16(22):2003-2007 (2004).
Ranjan, Sudhir et al., "Realizing Green Phosphorescent Light-Emitting Materials from Rhenium(I) Pyrazolato Diimine Complexes," Inorg. Chem., 42(4):1248-1255 (2003).
Romanov, A. S. et al. Carbene metal amide photoemitters: tailoring conformationally flexible amides for full color range emissions including white-emitting OLED. Chem. Sci. 2020, 11, 435.
Sakamoto, Youichi et al., "Synthesis, Characterization, and Electron-Transport Property of Perfluorinated Phenylene Dendrimers," J. Am. Chem. Soc., 122(8):1832-1833 (2000).
Salbeck, J. et al., "Low Molecular Organic Glasses for Blue Electroluminescence," Synthetic Metals, 91:209-215 (1997).
Shi, S. et al. Highly Efficient Photo- and Electroluminescence from Two-Coordinate Cu(I) Complexes Featuring Nonconventional N-Heterocyclic Carbenes. J. Am. Chem. Soc. 2019, 141, 3576.
Shichang Lv, Jiwei Wang, Caiyun Zhang, Sheng Xu, Min Shi, and Jun Zhang; Angew. Chem. Int. Ed. 2015, 54, 14941-14946.
Shirota, Yasuhiko et al., "Starburst Molecules Based on p-Electron Systems as Materials for Organic Electroluminescent Devices," Journal of Luminescence, 72-74:985-991 (1997).
Sotoyama, Wataru et al., "Efficient Organic Light-Emitting Diodes with Phosphorescent Platinum Complexes Containing NCN-Coordinating Tridentate Ligand," Appl. Phys. Lett., 86:153505-1-153505-3 (2005).

* cited by examiner

Me-Au

Me-Ag

Me-Cu

Ph-Cu$^{CN}$

Ph-Cu

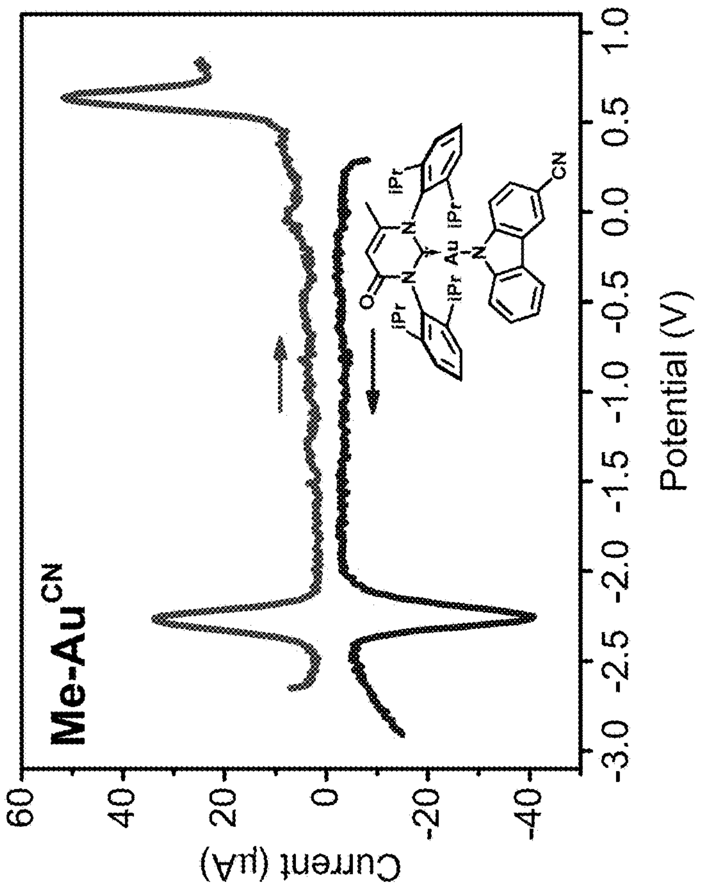
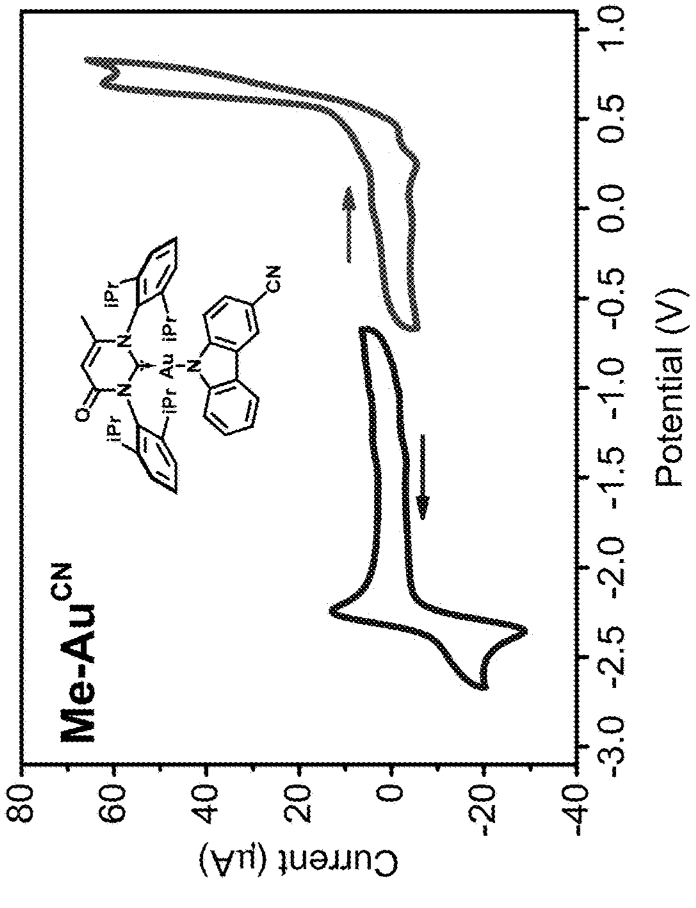
Figure 21

| Complex | $S_1$ | $T_1$ |
|---|---|---|
| **Me-Cu** | 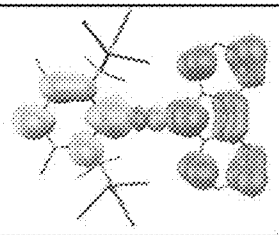 ICT (2.40eV, 98.9%) | 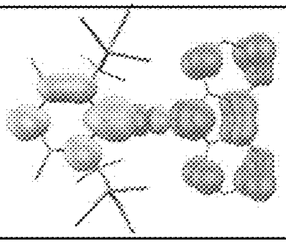 ICT (2.17eV, 99.0%) |
| **Me-Cu$^{CN}$** | 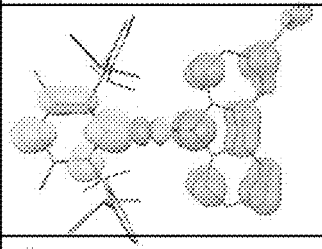 ICT (2.67eV, 99.1%) | 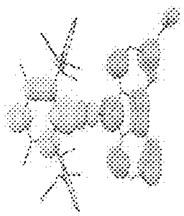 ICT (2.47eV, 98.5%) |
| **Ph-Cu** | 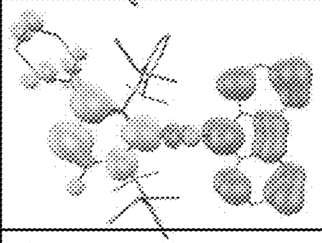 ICT (2.28eV, 99.3%) | 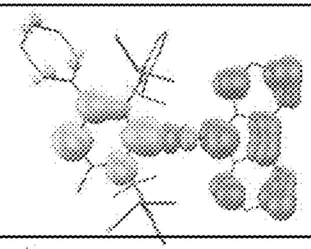 ICT (2.10eV, 99.0%) |
| **Ph-Cu$^{CN}$** | 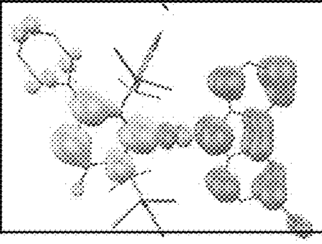 ICT (2.58eV, 99.4%) | 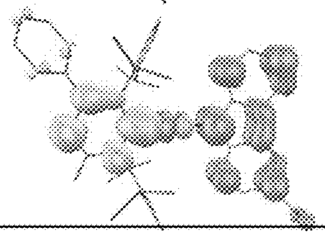 ICT (2.42eV, 98.4%) |
Figure 27

| Complex | $S_1$ | $T_1$ |
| --- | --- | --- |
| **Me-Ag** | 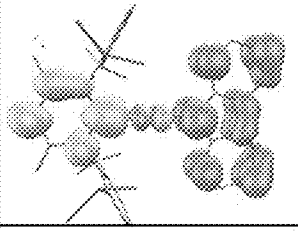 ICT (2.34eV, 99.4%) | 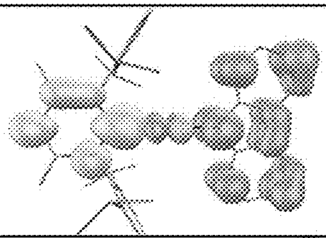 ICT (2.23eV, 99.4%) |
| **Me-Ag$^{CN}$** | 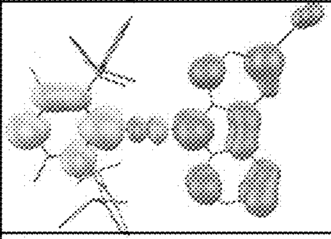 ICT (2.66eV, 99.6%) | 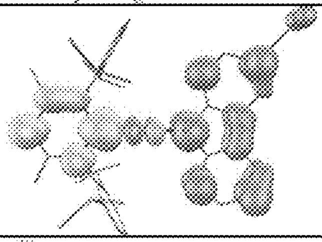 ICT (2.57eV, 98.9%) |
| **Ph-Ag** | 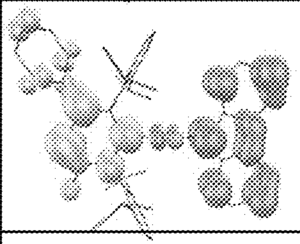 ICT (2.20eV, 99.8%) | 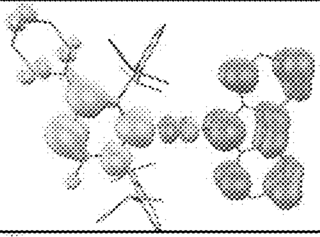 ICT (2.12eV, 99.6%) |
| **Ph-Ag$^{CN}$** | 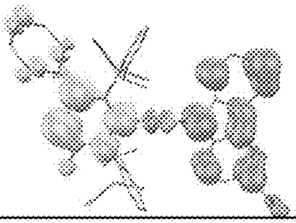 ICT (2.53eV, 99.7%) | 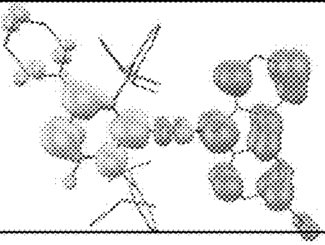 ICT (2.48eV, 99.2%) |
Figure 28

| Complex | $S_1$ | $T_1$ |
|---|---|---|
| Me-Au | 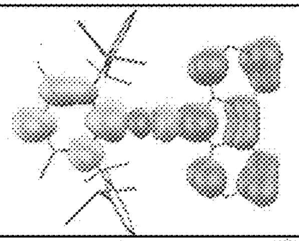 ICT (2.598eV, 98.7%) | 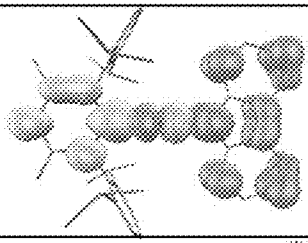 ICT (2.32eV, 98.6%) |
| Me-Au$^{CN}$ | 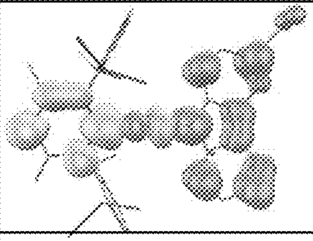 ICT (2.82eV, 98.9%) | 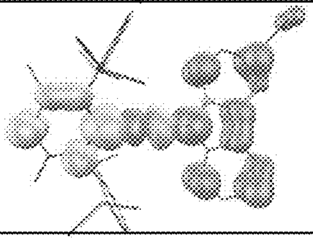 ICT (2.61eV, 97.6%) |
| Ph-Au | 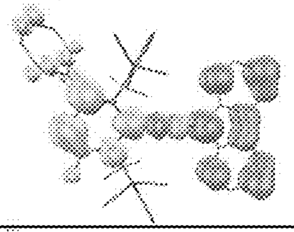 ICT (2.46eV, 99.1%) | 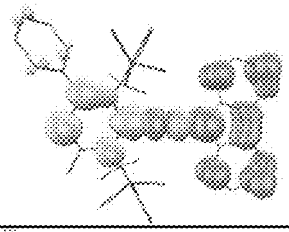 ICT (2.25eV, 98.6%) |
| Ph-Au$^{CN}$ | 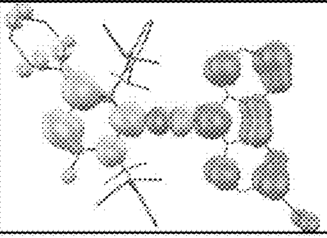 ICT (2.73eV, 99.2%) | 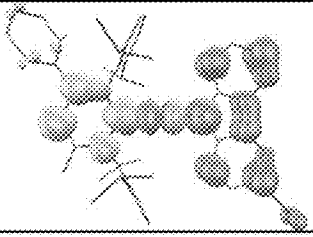 ICT (2.55eV, 97.4%) |
Figure 29

CAM-B3LYP/LACVP* Ω = 0.20
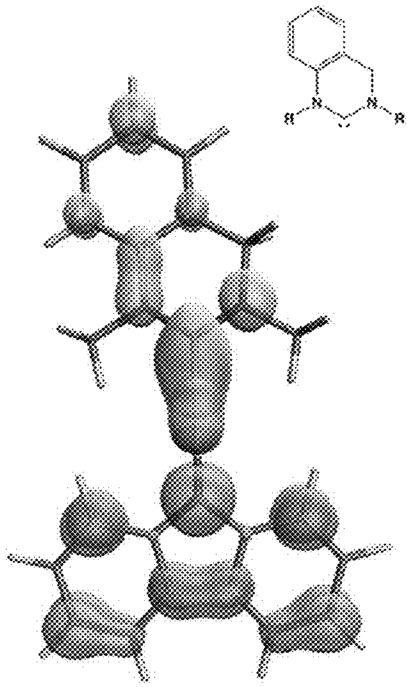
$S_1$: 3.43 eV, $f$ = 0.125
H→L: 0.936, H→L+2: 0.292
$T_1$: 3.07 eV
$\Delta E_{ST}$ = 0.36 eV
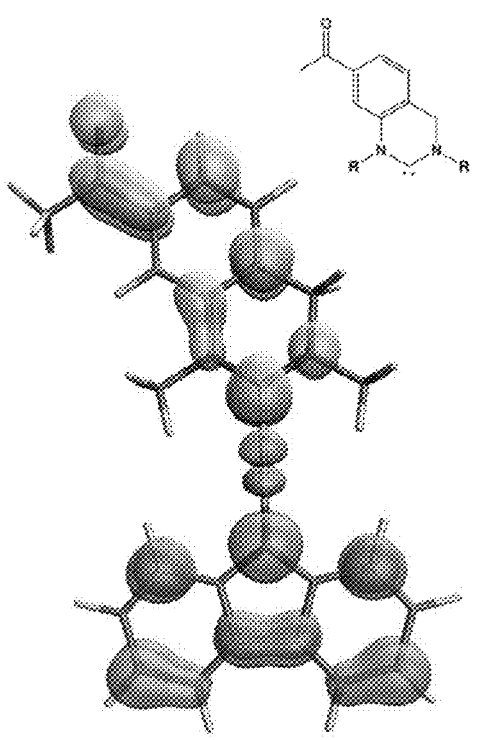
$S_1$: 2.85 eV, $f$ = 0.075
H→L: 0.785, H→L+1: 0.578
$T_1$: 2.72 eV
$\Delta E_{ST}$ = 0.13 eV
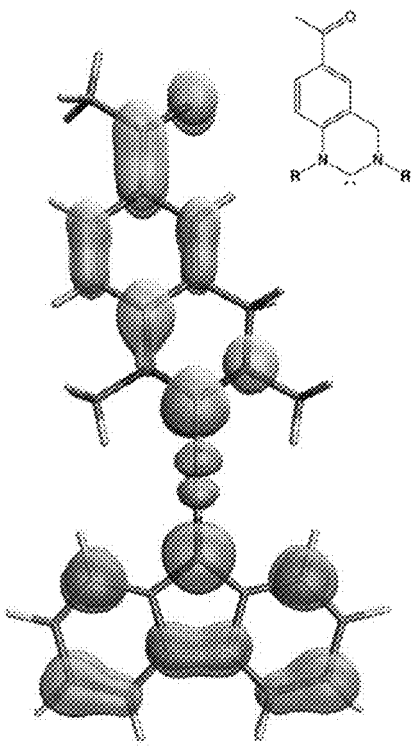
$S_1$: 2.62 eV, $f$ = 0.103
H→L: 0.937, H→L+2: 0.321
$T_1$: 2.50 eV
$\Delta E_{ST}$ = 0.12 eV
Figure 61 side view top view B3LYP/LACVP*

HOMO→LUMO+4: symmetry allowed (along z-axis) moderate orbital overlap — LUMO+4 -0.33 eV $b_1$ HOMO→LUMO+3: symmetry forbidden — LUMO+3 -0.46 eV $b_2$ HOMO→LUMO+2: symmetry allowed (along y-axis) weak orbital overlap — LUMO+2 -0.52 eV $a_2$ HOMO→LUMO+1: symmetry allowed (along z-axis) zero net orbital overlap — LUMO+1 -0.71 eV $a_1$ HOMO→LUMO+1: symmetry allowed (along z-axis) strong orbital overlap — LUMO -0.79 eV $b_1$

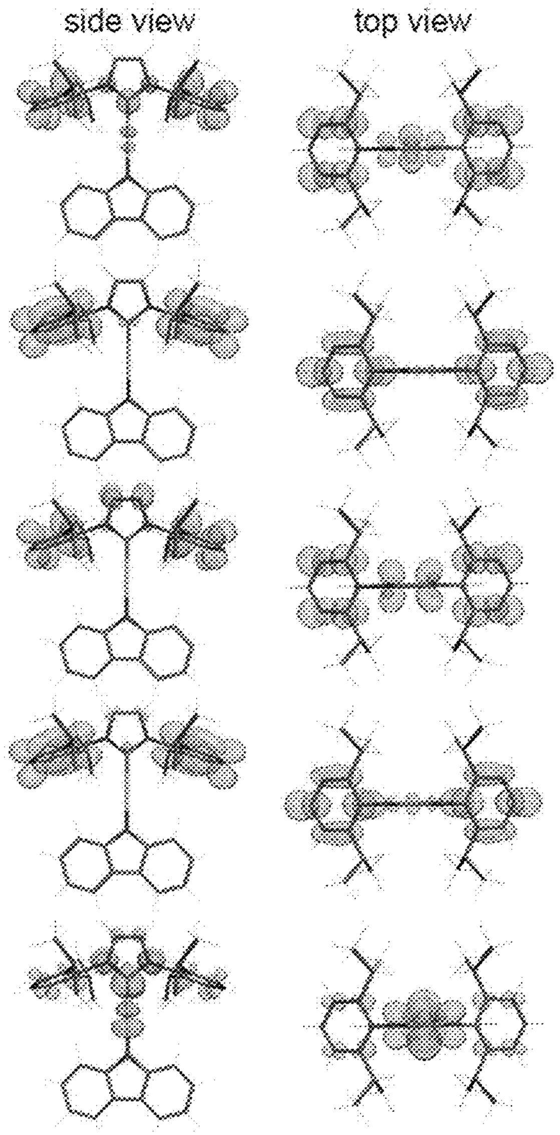

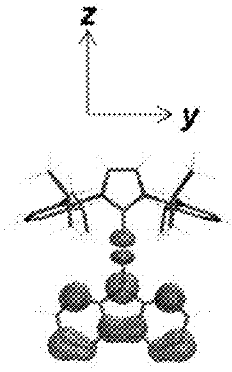

HOMO
-4.16 eV
$b_1$

| | E | $C_2$ (z) | $\sigma_v(xz)$ | $\sigma_v(yz)$ | linear, rotations | quadratic |
|---|---|---|---|---|---|---|
| $A_1$ | 1 | 1 | 1 | 1 | z | $x^2, y^2, z^2$ |
| $A_2$ | 1 | 1 | -1 | -1 | $R_z$ | xy |
| $B_1$ | 1 | -1 | 1 | -1 | x, $R_y$ | xz |
| $B_2$ | 1 | -1 | -1 | 1 | y, $R_x$ | yz |

Product table

| | $A_1$ | $A_2$ | $B_1$ | $B_2$ |
|---|---|---|---|---|
| $A_1$ | $A_1$ | $A_2$ | $B_1$ | $B_2$ |
| $A_2$ | $A_2$ | $A_1$ | $B_2$ | $B_1$ |
| $B_1$ | $B_1$ | $B_2$ | $A_1$ | $A_2$ |
| $B_2$ | $B_2$ | $B_1$ | $A_2$ | $A_1$ |

Figure 65

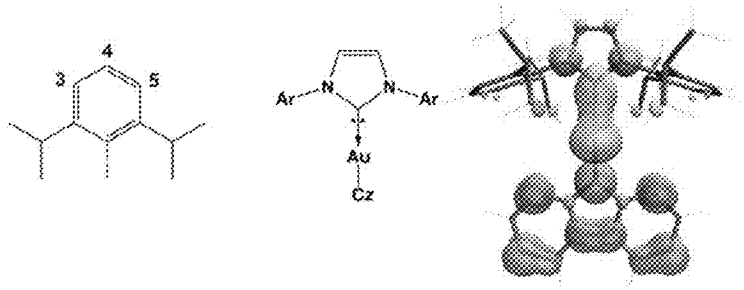
(IPr)Au(Cz)
$S_1$: 3.47 eV, $f$ = 0.145
$T_1$: 3.16 eV
$\Delta E_{ST}$ = 0.31 eV
$f$ = oscillator strength
$\Delta E_{ST}$ = $S_1$-$T_1$ energy gap
Ar =
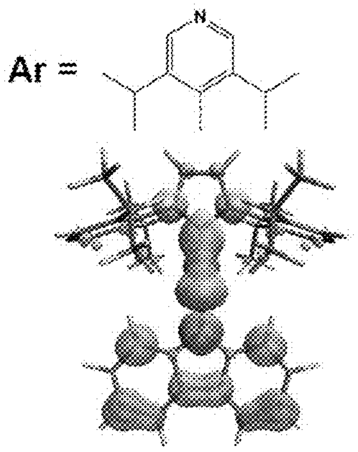
$S_1$: 3.28 eV, $f$ = 0.148
$T_1$: 3.03 eV
$\Delta E_{ST}$ = 0.25 eV
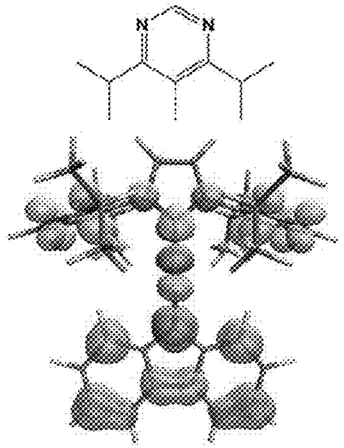
$S_1$: 3.03 eV, $f$ = 0.081
$T_1$: 2.87 eV
$\Delta E_{ST}$ = 0.16 eV
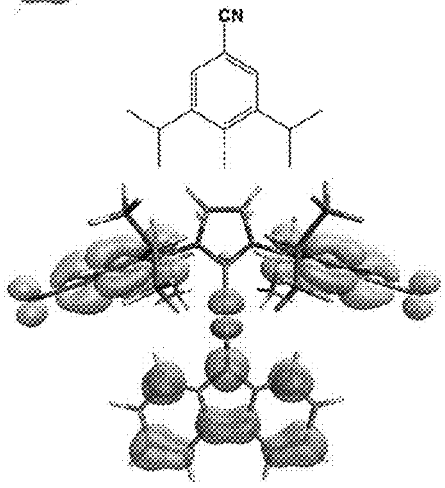
$S_1$: 2.9632 eV, $f$ = 2 x $10^{-6}$
$T_1$: 2.9626 eV
$\Delta E_{ST}$ = 0.0006 eV
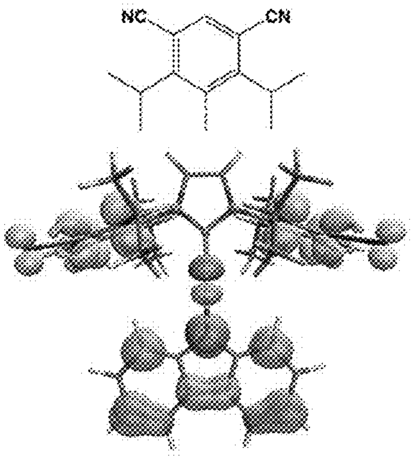
$S_1$: 2.48 eV, $f$ = 0.018
$T_1$: 2.43 eV
$\Delta E_{ST}$ = 0.05 eV
Figure 67

1 2 3 3

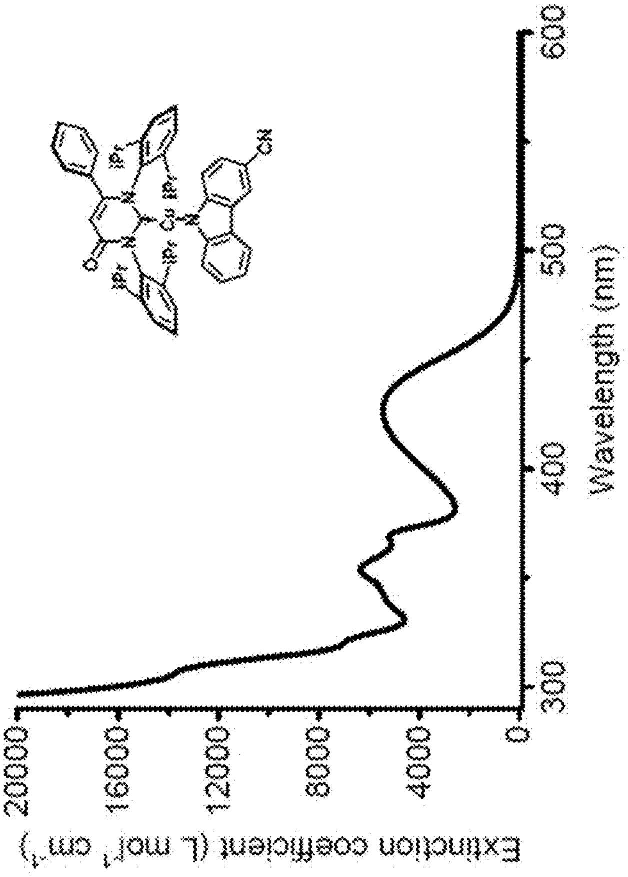
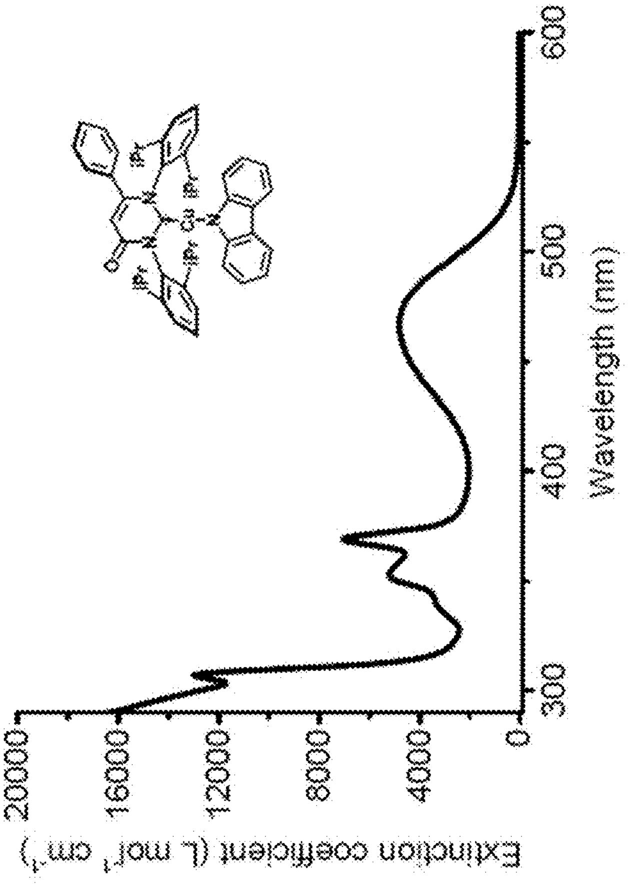
Figure 69

ORGANIC ELECTROLUMINESCENT MATERIALS AND DEVICES

CROSS-REFERENCE TO RELATED APPLICATIONS

The present application claims priority to U.S. Provisional Application No. 63/298,943, filed Jan. 12, 2022, and U.S. Provisional Application No. 63/222,523, filed Jul. 16, 2021, all of which are incorporated by reference herein in their entireties.

STATEMENT REGARDING FEDERALLY SPONSORED RESEARCH OR DEVELOPMENT

This invention was made with government support under Grant No. DE-SC0016450, awarded by the U.S. Department of Energy (DOE). The Government has certain rights in the invention.

FIELD

The present disclosure relates to compounds for use as emitters, and devices, such as organic light emitting diodes, including the same.

PARTIES TO A JOINT RESEARCH AGREEMENT

The claimed invention was made by, on behalf of, and/or in connection with one or more of the following parties to a joint university corporation research agreement: Regents of the University of Michigan, Princeton University, University of Southern California, and the Universal Display Corporation. The agreement was in effect on and before the date the claimed invention was made, and the claimed invention was made as a result of activities undertaken within the scope of the agreement.

BACKGROUND

Opto-electronic devices that make use of organic materials are becoming increasingly desirable for a number of reasons. Many of the materials used to make such devices are relatively inexpensive, so organic opto-electronic devices have the potential for cost advantages over inorganic devices. In addition, the inherent properties of organic materials, such as their flexibility, may make them well suited for particular applications such as fabrication on a flexible substrate. Examples of organic opto-electronic devices include organic light emitting diodes/devices (OLEDs), organic phototransistors, organic photovoltaic cells, and organic photodetectors. For OLEDs, the organic materials may have performance advantages over conventional materials. For example, the wavelength at which an organic emissive layer emits light may generally be readily tuned with appropriate dopants.

OLEDs make use of thin organic films that emit light when voltage is applied across the device. OLEDs are becoming an increasingly interesting technology for use in applications such as flat panel displays, illumination, and backlighting. Several OLED materials and configurations are described in U.S. Pat. Nos. 5,844,363, 6,303,238, and 5,707,745, which are incorporated herein by reference in their entirety.

Efficient emitters with high radiative rates are critical for high performance display technologies and solid-state lighting applications. Blue-emitting materials for OLEDs are particularly problematic due to the required high energy that leads to detrimental photophysical processes (TTA & TPA) and chemical decomposition of the materials. While decreasing the emission lifetime is key solutions to this issue, today's widely used heavy-metal phosphors (e.g $Ir^{3+}$, $Pt^{+2}$ complexes) inherently fail to have lifetimes below 1 μs due to the nature of spin-orbit coupling (SOC) contribution in the triplet harvesting events. That is, SOC that helps fast intersystem crossing events between singlets and triplets does eventually induce large zero-field splitting (ZFS) between triplet sublevels hampering fast equilibration of triplet states for harvest. Early developed organic and inorganic thermally activated delayed fluorescence (TADF) alternatives also suffer similar long-lived excitons (microsecond regime), but now due to the counteractive relationship between the required small singlet-triplet separation ($\Delta E_{ST}$<0.12 eV) and large oscillator strength for short $\tau_{TADF}$.

One application for phosphorescent emissive molecules is a full color display. Industry standards for such a display call for pixels adapted to emit particular colors, referred to as "saturated" colors. In particular, these standards call for saturated red, green, and blue pixels. Alternatively the OLED can be designed to emit white light. In conventional liquid crystal displays emission from a white backlight is filtered using absorption filters to produce red, green and blue emission. The same technique can also be used with OLEDs. The white OLED can be either a single EML device or a stack structure. Color may be measured using CIE coordinates, which are well known to the art.

One example of a green emissive molecule is tris(2-phenylpyridine) iridium, denoted $Ir(ppy)_3$, which has the following structure:

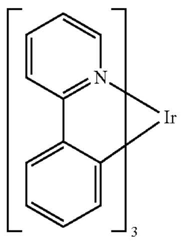

In this, and later figures herein, we depict the dative bond from nitrogen to metal (here, Ir) as a straight line.

SUMMARY

The present disclosure provides a compound of Formula (I):

Formula I

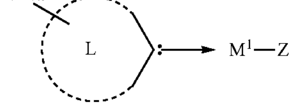

wherein $M^1$ is selected from the group consisting of Au(I), Ag(I), and Cu(I);

L is a carbene coordinated to the metal $M^1$;

Z is a monoanionic ligand;

$E^1$ is an electron accepting group;

n is an integer from 1 to the maximum allowable substitution on L, wherein when n is greater than 1, each $E^1$ may be the same or different;

$E^1$, L, and Z may each be substituted with one or more substituents independently selected from the group consisting of hydrogen, deuterium, halogen, pseudohalogen, alkyl, cycloalkyl, heteroalkyl, heterocycloalkyl, arylalkyl, alkoxy, aryloxy, amino, amide, hydroxyl, silyl, alkenyl, cycloalkenyl, heteroalkenyl, alkynyl, heteroalkynyl, aryl, heteroaryl, nitro, nitrile, isonitrile, sulfanyl, boryl, acyl, carboxylic acid, benzoyl, ether, ester, vinyl, ketone, sulfinyl, sulfonyl, cyano, phosphino, and combinations thereof; wherein any two adjacent substituents may together join to form a ring.

An OLED comprising the compound of the present disclosure in an organic layer therein is also disclosed.

A consumer product comprising the OLED is also disclosed.

BRIEF DESCRIPTION OF THE DRAWINGS

FIG. 21 depicts the CV (left) and DPV (right) curves for Me-$Au^{CN}$ in DMF.

FIG. 27 is a table of the natural transition orbitals (NTO) analyses of the $S_1$ and $T_1$ state for (carbene)Cu(carbazolyl) complexes.

FIG. 28 is a table of the natural transition orbitals (NTO) analyses of the $S_1$ and $T_1$ state for (carbene)Ag(carbazolyl) complexes.

FIG. 29 is a table of the natural transition orbitals (NTO) analyses of the $S_1$ and $T_1$ state for (carbene)Au(carbazolyl) complexes.

FIG. 61 shows calculated NTOs for the $S_1$ state in (acetyl-Bzac)Cu(Cz) isomers.

FIG. 65 shows calculated MOs for (IPr)Au(Cz).

FIG. 67 shows calculated $S_1$ NTOs for ($Ar_2$imid)Au(Cz) complexes.

FIG. 69 depicts the absorption spectra in toluene for $^{Ph}$Cu and $^{Ph}$Cu* complexes.

DETAILED DESCRIPTION

Generally, an OLED comprises at least one organic layer disposed between and electrically connected to an anode and a cathode. When a current is applied, the anode injects holes and the cathode injects electrons into the organic layer(s). The injected holes and electrons each migrate toward the oppositely charged electrode. When an electron and hole localize on the same molecule, an "exciton," which is a localized electron-hole pair having an excited energy state, is formed. Light is emitted when the exciton relaxes via a photoemissive mechanism. In some cases, the exciton may be localized on an excimer or an exciplex. Non-radiative mechanisms, such as thermal relaxation, may also occur, but are generally considered undesirable.

The initial OLEDs used emissive molecules that emitted light from their singlet states ("fluorescence") as disclosed, for example, in U.S. Pat. No. 4,769,292, which is incorporated by reference in its entirety. Fluorescent emission generally occurs in a time frame of less than 10 nanoseconds.

More recently, OLEDs having emissive materials that emit light from triplet states ("phosphorescence") have been demonstrated. Baldo et al., "Highly Efficient Phosphorescent Emission from Organic Electroluminescent Devices," Nature, vol. 395, 151-154, 1998; ("Baldo-I") and Baldo et al., "Very high-efficiency green organic light-emitting devices based on electrophosphorescence," Appl. Phys. Lett., vol. 75, No. 3, 4-6 (1999) ("Baldo-II"), are incorporated by reference in their entireties. Phosphorescence is described in more detail in U.S. Pat. No. 7,279,704 at cols. 5-6, which are incorporated by reference.

Figure 1:
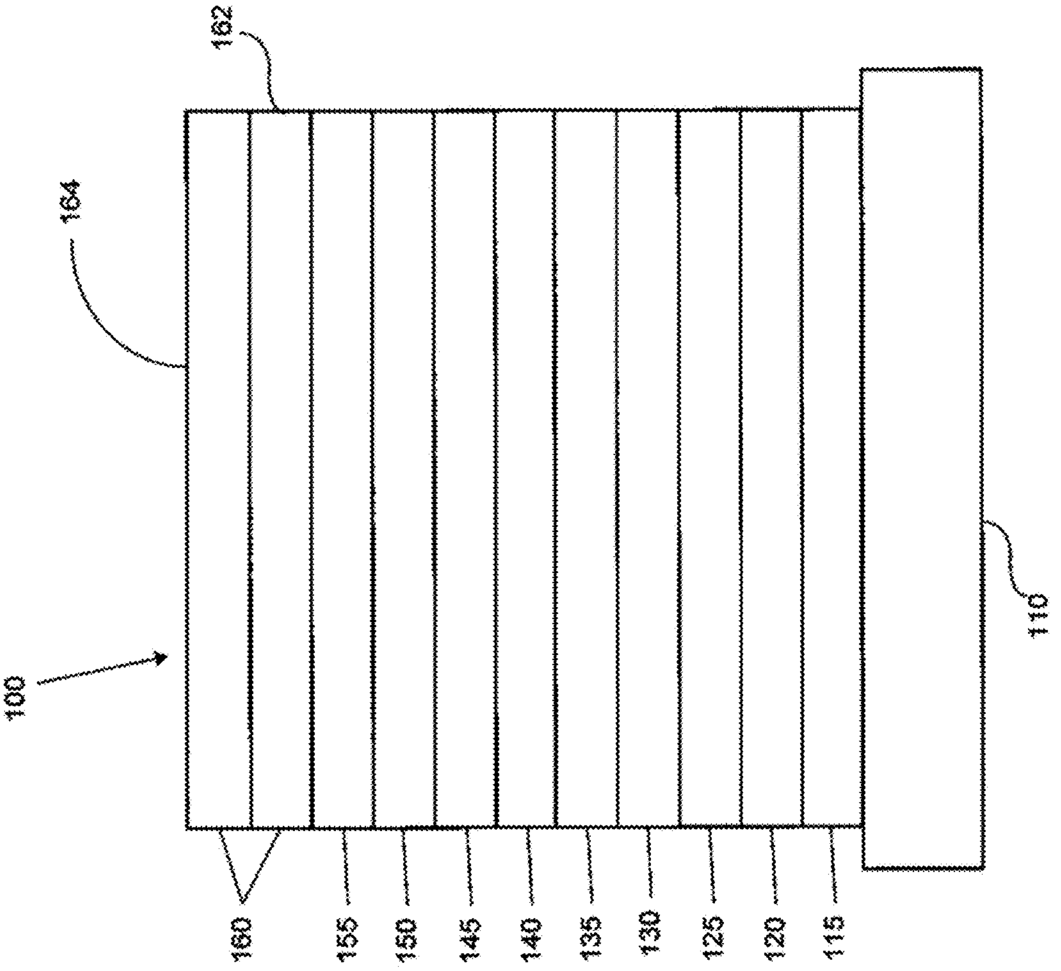
FIG. 1 shows an organic light emitting device.

FIG. 1 shows an organic light emitting device 100. The figures are not necessarily drawn to scale. Device 100 may include a substrate 110, an anode 115, a hole injection layer 120, a hole transport layer 125, an electron blocking layer 130, an emissive layer 135, a hole blocking layer 140, an electron transport layer 145, an electron injection layer 150, a protective layer 155, a cathode 160, and a barrier layer 170. Cathode 160 is a compound cathode having a first conductive layer 162 and a second conductive layer 164. Device 100 may be fabricated by depositing the layers described, in order. The properties and functions of these various layers, as well as example materials, are described in more detail in U.S. Pat. No. 7,279,704 at cols. 6-10, which are incorporated by reference.

More examples for each of these layers are available. For example, a flexible and transparent substrate-anode combination is disclosed in U.S. Pat. No. 5,844,363, which is incorporated by reference in its entirety. An example of a p-doped hole transport layer is m-MTDATA doped with $F_4$-TCNQ at a molar ratio of 50:1, as disclosed in U.S. Patent Application Publication No. 2003/0230980, which is incorporated by reference in its entirety. Examples of emissive and host materials are disclosed in U.S. Pat. No. 6,303,238 to Thompson et al., which is incorporated by reference in its entirety. An example of an n-doped electron transport layer is BPhen doped with Li at a molar ratio of 1:1, as disclosed in U.S. Patent Application Publication No. 2003/0230980, which is incorporated by reference in its entirety. U.S. Pat. Nos. 5,703,436 and 5,707,745, which are incorporated by reference in their entireties, disclose examples of cathodes including compound cathodes having a thin layer of metal such as Mg:Ag with an overlying transparent, electrically-conductive, sputter-deposited ITO layer. The theory and use of blocking layers is described in more detail in U.S. Pat. No. 6,097,147 and U.S. Patent Application Publication No. 2003/0230980, which are incorporated by reference in their entireties. Examples of injection layers are provided in U.S. Patent Application Publication No. 2004/0174116, which is incorporated by reference in its entirety. A description of protective layers may be found in U.S. Patent Application Publication No. 2004/0174116, which is incorporated by reference in its entirety.

Figure 2:
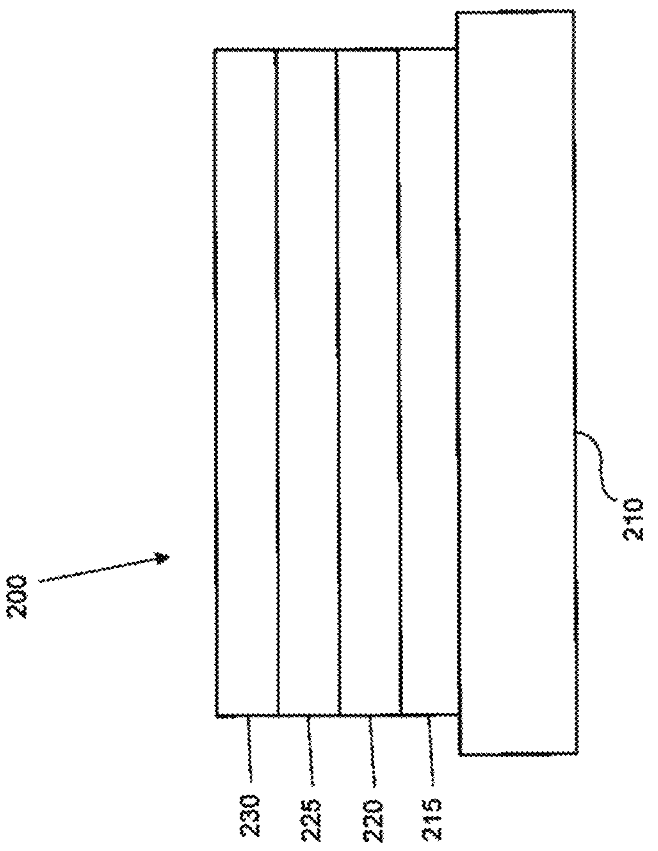
FIG. 2 shows an inverted organic light emitting device that does not have a separate electron transport layer.

FIG. 2 shows an inverted OLED 200. The device includes a substrate 210, a cathode 215, an emissive layer 220, a hole transport layer 225, and an anode 230. Device 200 may be fabricated by depositing the layers described, in order. Because the most common OLED configuration has a cathode disposed over the anode, and device 200 has cathode 215 disposed under anode 230, device 200 may be referred to as an "inverted" OLED. Materials similar to those described with respect to device 100 may be used in the corresponding layers of device 200. FIG. 2 provides one example of how some layers may be omitted from the structure of device 100.

The simple layered structure illustrated in FIGS. 1 and 2 is provided by way of non-limiting example, and it is understood that embodiments of the invention may be used in connection with a wide variety of other structures. The specific materials and structures described are exemplary in nature, and other materials and structures may be used. Functional OLEDs may be achieved by combining the various layers described in different ways, or layers may be omitted entirely, based on design, performance, and cost factors. Other layers not specifically described may also be included. Materials other than those specifically described may be used. Although many of the examples provided herein describe various layers as comprising a single material, it is understood that combinations of materials, such as a mixture of host and dopant, or more generally a mixture, may be used. Also, the layers may have various sublayers. The names given to the various layers herein are not intended to be strictly limiting. For example, in device 200, hole transport layer 225 transports holes and injects holes into emissive layer 220, and may be described as a hole transport layer or a hole injection layer. In one embodiment, an OLED may be described as having an "organic layer" disposed between a cathode and an anode. This organic layer may comprise a single layer, or may further comprise multiple layers of different organic materials as described, for example, with respect to FIGS. 1 and 2.

Structures and materials not specifically described may also be used, such as OLEDs comprised of polymeric materials (PLEDs) such as disclosed in U.S. Pat. No. 5,247,190 to Friend et al., which is incorporated by reference in its entirety. By way of further example, OLEDs having a single organic layer may be used. OLEDs may be stacked, for example as described in U.S. Pat. No. 5,707,745 to Forrest et al, which is incorporated by reference in its entirety. The OLED structure may deviate from the simple layered structure illustrated in FIGS. 1 and 2. For example, the substrate may include an angled reflective surface to improve out-coupling, such as a mesa structure as described in U.S. Pat. No. 6,091,195 to Forrest et al., and/or a pit structure as described in U.S. Pat. No. 5,834,893 to Bulovic et al., which are incorporated by reference in their entireties.

Unless otherwise specified, any of the layers of the various embodiments may be deposited by any suitable method. For the organic layers, preferred methods include thermal evaporation, ink-jet, such as described in U.S. Pat. Nos. 6,013,982 and 6,087,196, which are incorporated by reference in their entireties, organic vapor phase deposition (OVPD), such as described in U.S. Pat. No. 6,337,102 to Forrest et al., which is incorporated by reference in its entirety, and deposition by organic vapor jet printing (OVJP), such as described in U.S. Pat. No. 7,431,968, which is incorporated by reference in its entirety. Other suitable deposition methods include spin coating and other solution based processes. Solution based processes are preferably carried out in nitrogen or an inert atmosphere. For the other layers, preferred methods include thermal evaporation. Preferred patterning methods include deposition through a mask, cold welding such as described in U.S. Pat. Nos. 6,294,398 and 6,468,819, which are incorporated by reference in their entireties, and patterning associated with some of the deposition methods such as ink jet and organic vapor jet printing (OVJP). Other methods may also be used. The materials to be deposited may be modified to make them compatible with a particular deposition method. For example, substituents such as alkyl and aryl groups, branched or unbranched, and preferably containing at least 3 carbons, may be used in small molecules to enhance their ability to undergo solution processing. Substituents having 20 carbons or more may be used, and 3-20 carbons is a preferred range. Materials with asymmetric structures may have better solution processability than those having symmetric structures, because asymmetric materials may have a lower tendency to recrystallize. Dendrimer substituents may be used to enhance the ability of small molecules to undergo solution processing.

Devices fabricated in accordance with embodiments of the present invention may further optionally comprise a barrier layer. One purpose of the barrier layer is to protect the electrodes and organic layers from damaging exposure to harmful species in the environment including moisture, vapor and/or gases, etc. The barrier layer may be deposited over, under or next to a substrate, an electrode, or over any other parts of a device including an edge. The barrier layer may comprise a single layer, or multiple layers. The barrier layer may be formed by various known chemical vapor deposition techniques and may include compositions having a single phase as well as compositions having multiple phases. Any suitable material or combination of materials may be used for the barrier layer. The barrier layer may incorporate an inorganic or an organic compound or both. The preferred barrier layer comprises a mixture of a polymeric material and a non-polymeric material as described in U.S. Pat. No. 7,968,146, PCT Pat. Application Nos. PCT/US2007/023098 and PCT/US2009/042829, which are herein incorporated by reference in their entireties. To be considered a "mixture", the aforesaid polymeric and non-polymeric materials comprising the barrier layer should be deposited under the same reaction conditions and/or at the same time. The weight ratio of polymeric to non-polymeric material may be in the range of 95:5 to 5:95. The polymeric material and the non-polymeric material may be created from the same precursor material. In one example, the mixture of a polymeric material and a non-polymeric material consists essentially of polymeric silicon and inorganic silicon.

Devices fabricated in accordance with embodiments of the invention can be incorporated into a wide variety of electronic component modules (or units) that can be incorporated into a variety of electronic products or intermediate components. Examples of such electronic products or intermediate components include display screens, lighting devices such as discrete light source devices or lighting panels, etc. that can be utilized by the end-user product manufacturers. Such electronic component modules can optionally include the driving electronics and/or power source(s). Devices fabricated in accordance with embodiments of the invention can be incorporated into a wide variety of consumer products that have one or more of the electronic component modules (or units) incorporated therein. A consumer product comprising an OLED that includes the compound of the present disclosure in the organic layer in the OLED is disclosed. Such consumer products would include any kind of products that include one or more light source(s) and/or one or more of some type of visual displays. Some examples of such consumer products include flat panel displays, curved displays, computer monitors, medical monitors, televisions, billboards, lights for interior or exterior illumination and/or signaling, heads-up displays, fully or partially transparent displays, flexible displays, rollable displays, foldable displays, stretchable displays, laser printers, telephones, mobile phones, tablets, phablets, personal digital assistants (PDAs), wearable devices, laptop computers, digital cameras, camcorders, viewfinders, micro-displays (displays that are less than 2 inches diagonal), 3-D displays, virtual reality or augmented reality displays, vehicles, video walls comprising multiple displays tiled together, theater or stadium screen, a light therapy device, and a sign. Various control mechanisms may be used to control devices fabricated in accordance with the present invention, including passive matrix and active matrix. Many of the devices are intended for use in a temperature range comfortable to humans, such as 18° C. to 30° C., and more preferably at room temperature (20-25° C.), but could be used outside this temperature range, for example, from −40° C. to +80° C.

The materials and structures described herein may have applications in devices other than OLEDs. For example, other optoelectronic devices such as organic solar cells and organic photodetectors may employ the materials and structures. More generally, organic devices, such as organic transistors, may employ the materials and structures.

As used herein, the term "organic" includes polymeric materials as well as small molecule organic materials that may be used to fabricate organic opto-electronic devices. "Small molecule" refers to any organic material that is not a polymer, and "small molecules" may actually be quite large. Small molecules may include repeat units in some circumstances. For example, using a long chain alkyl group as a substituent does not remove a molecule from the "small molecule" class. Small molecules may also be incorporated into polymers, for example as a pendent group on a polymer backbone or as a part of the backbone Small molecules may also serve as the core moiety of a dendrimer, which consists of a series of chemical shells built on the core moiety. The core moiety of a dendrimer may be a fluorescent or phosphorescent small molecule emitter. A dendrimer may be a "small molecule," and it is believed that all dendrimers currently used in the field of OLEDs are small molecules.

As used herein, "top" means furthest away from the substrate, while "bottom" means closest to the substrate. Where a first layer is described as "disposed over" a second layer, the first layer is disposed further away from substrate. There may be other layers between the first and second layer, unless it is specified that the first layer is "in contact with" the second layer. For example, a cathode may be described as "disposed over" an anode, even though there are various organic layers in between.

As used herein, "solution processable" means capable of being dissolved, dispersed, or transported in and/or deposited from a liquid medium, either in solution or suspension form.

A ligand may be referred to as "photoactive" when it is believed that the ligand directly contributes to the photoactive properties of an emissive material. A ligand may be referred to as "ancillary" when it is believed that the ligand does not contribute to the photoactive properties of an emissive material, although an ancillary ligand may alter the properties of a photoactive ligand.

As used herein, and as would be generally understood by one skilled in the art, a first "Highest Occupied Molecular Orbital" (HOMO) or "Lowest Unoccupied Molecular Orbital" (LUMO) energy level is "greater than" or "higher than" a second HOMO or LUMO energy level if the first energy level is closer to the vacuum energy level. Since ionization potentials (IP) are measured as a negative energy relative to a vacuum level, a higher HOMO energy level corresponds to an IP having a smaller absolute value (an IP that is less negative) Similarly, a higher LUMO energy level corresponds to an electron affinity (EA) having a smaller absolute value (an EA that is less negative). On a conventional energy level diagram, with the vacuum level at the top, the LUMO energy level of a material is higher than the HOMO energy level of the same material. A "higher" HOMO or LUMO energy level appears closer to the top of such a diagram than a "lower" HOMO or LUMO energy level.

As used herein, and as would be generally understood by one skilled in the art, a first work function is "greater than" or "higher than" a second work function if the first work function has a higher absolute value. Because work functions are generally measured as negative numbers relative to vacuum level, this means that a "higher" work function is more negative. On a conventional energy level diagram, with the vacuum level at the top, a "higher" work function is illustrated as further away from the vacuum level in the downward direction. Thus, the definitions of HOMO and LUMO energy levels follow a different convention than work functions.

More details on OLEDs, and the definitions described above, can be found in U.S. Pat. No. 7,279,704, which is incorporated herein by reference in its entirety.

The terms "halo," "halogen," and "halide" are used interchangeably and refer to fluorine, chlorine, bromine, and iodine.

The term "acyl" refers to a substituted carbonyl radical ($C(O)—R_s$).

The term "ester" refers to a substituted oxycarbonyl ($—O—C(O)—R_s$ or $—C(O)—O—R_s$) radical.

The term "ether" refers to an $—OR_s$ radical.

The terms "sulfanyl" or "thio-ether" are used interchangeably and refer to a $—SR_s$ radical.

The term "sulfinyl" refers to a $—S(O)—R_s$ radical.

The term "sulfonyl" refers to a —$SO_2$—$R_s$ radical.

The term "phosphino" refers to a —$P(R_s)_3$ radical, wherein each R can be same or different.

The term "silyl" refers to a —$S_1(R_s)_3$ radical, wherein each $R_s$ can be same or different.

The term "boryl" refers to a —$B(R_s)_2$ radical or its Lewis adduct —$B(Rs)_3$ radical, wherein Rs can be same or different.

In each of the above, $R_s$ can be hydrogen or a substituent selected from the group consisting of deuterium, halogen, alkyl, cycloalkyl, heteroalkyl, heterocycloalkyl, arylalkyl, alkoxy, aryloxy, amino, silyl, alkenyl, cycloalkenyl, heteroalkenyl, alkynyl, aryl, heteroaryl, and combination thereof. Preferred $R_s$ is selected from the group consisting of alkyl, cycloalkyl, aryl, heteroaryl, and combination thereof.

The term "alkyl" refers to and includes both straight and branched chain alkyl radicals. Preferred alkyl groups are those containing from one to fifteen carbon atoms and includes methyl, ethyl, propyl, 1-methylethyl, butyl, 1-methylpropyl, 2-methylpropyl, pentyl, 1-methylbutyl, 2-methylbutyl, 3-methylbutyl, 1,1-dimethylpropyl, 1,2-dimethylpropyl, 2,2-dimethylpropyl, and the like. Additionally, the alkyl group is optionally substituted.

The term "cycloalkyl" refers to and includes monocyclic, polycyclic, and spiro alkyl radicals. Preferred cycloalkyl groups are those containing 3 to 12 ring carbon atoms and includes cyclopropyl, cyclopentyl, cyclohexyl, bicyclo[3.1.1]heptyl, spiro[4.5]decyl, spiro[5.5]undecyl, adamantyl, and the like. Additionally, the cycloalkyl group is optionally substituted.

The terms "heteroalkyl" or "heterocycloalkyl" refer to an alkyl or a cycloalkyl radical, respectively, having at least one carbon atom replaced by a heteroatom. Optionally the at least one heteroatom is selected from O, S, N, P, B, Si and Se, preferably, 0, S or N. Additionally, the heteroalkyl or heterocycloalkyl group is optionally substituted.

The term "alkenyl" refers to and includes both straight and branched chain alkene radicals. Alkenyl groups are essentially alkyl groups that include at least one carbon-carbon double bond in the alkyl chain Cycloalkenyl groups are essentially cycloalkyl groups that include at least one carbon-carbon double bond in the cycloalkyl ring. The term "heteroalkenyl" as used herein refers to an alkenyl radical having at least one carbon atom replaced by a heteroatom. Optionally the at least one heteroatom is selected from O, S, N, P, B, Si, and Se, preferably, O, S, or N. Preferred alkenyl, cycloalkenyl, or heteroalkenyl groups are those containing two to fifteen carbon atoms. Additionally, the alkenyl, cycloalkenyl, or heteroalkenyl group is optionally substituted.

The term "alkynyl" refers to and includes both straight and branched chain alkyne radicals. Preferred alkynyl groups are those containing two to fifteen carbon atoms. Additionally, the alkynyl group is optionally substituted.

The terms "aralkyl" or "arylalkyl" are used interchangeably and refer to an alkyl group that is substituted with an aryl group. Additionally, the aralkyl group is optionally substituted.

The term "heterocyclic group" refers to and includes aromatic and non-aromatic cyclic radicals containing at least one heteroatom. Optionally the at least one heteroatom is selected from O, S, N, P, B, Si, and Se, preferably, O, S, or N. Hetero-aromatic cyclic radicals may be used interchangeably with heteroaryl. Preferred hetero-non-aromatic cyclic groups are those containing 3 to 7 ring atoms which includes at least one hetero atom, and includes cyclic amines such as morpholino, piperidino, pyrrolidino, and the like, and cyclic ethers/thio-ethers, such as tetrahydrofuran, tetrahydropyran, tetrahydrothiophene, and the like. Additionally, the heterocyclic group may be optionally substituted.

The term "aryl" refers to and includes both single-ring aromatic hydrocarbyl groups and polycyclic aromatic ring systems. The polycyclic rings may have two or more rings in which two carbons are common to two adjoining rings (the rings are "fused") wherein at least one of the rings is an aromatic hydrocarbyl group, e.g., the other rings can be cycloalkyls, cycloalkenyls, aryl, heterocycles, and/or heteroaryls. Preferred aryl groups are those containing six to thirty carbon atoms, preferably six to twenty carbon atoms, more preferably six to twelve carbon atoms. Especially preferred is an aryl group having six carbons, ten carbons or twelve carbons. Suitable aryl groups include phenyl, biphenyl, triphenyl, triphenylene, tetraphenylene, naphthalene, anthracene, phenalene, phenanthrene, fluorene, pyrene, chrysene, perylene, and azulene, preferably phenyl, biphenyl, triphenyl, triphenylene, fluorene, and naphthalene. Additionally, the aryl group is optionally substituted.

The term "heteroaryl" refers to and includes both single-ring aromatic groups and polycyclic aromatic ring systems that include at least one heteroatom. The heteroatoms include, but are not limited to O, S, N, P, B, Si, and Se. In many instances, O, S, or N are the preferred heteroatoms. Hetero-single ring aromatic systems are preferably single rings with 5 or 6 ring atoms, and the ring can have from one to six heteroatoms. The hetero-polycyclic ring systems can have two or more rings in which two atoms are common to two adjoining rings (the rings are "fused") wherein at least one of the rings is a heteroaryl, e.g., the other rings can be cycloalkyls, cycloalkenyls, aryl, heterocycles, and/or heteroaryls. The hetero-polycyclic aromatic ring systems can have from one to six heteroatoms per ring of the polycyclic aromatic ring system. Preferred heteroaryl groups are those containing three to thirty carbon atoms, preferably three to twenty carbon atoms, more preferably three to twelve carbon atoms. Suitable heteroaryl groups include dibenzothiophene, dibenzofuran, dibenzoselenophene, furan, thiophene, benzofuran, benzothiophene, benzoselenophene, carbazole, indolocarbazole, pyridylindole, pyrrolodipyridine, pyrazole, imidazole, triazole, oxazole, thiazole, oxadiazole, oxatriazole, dioxazole, thiadiazole, pyridine, pyridazine, pyrimidine, pyrazine, triazine, oxazine, oxathiazine, oxadiazine, indole, benzimidazole, indazole, indoxazine, benzoxazole, benzisoxazole, benzothiazole, quinoline, isoquinoline, cinnoline, quinazoline, quinoxaline, naphthyridine, phthalazine, pteridine, xanthene, acridine, phenazine, phenothiazine, phenoxazine, benzofuropyridine, furodipyridine, benzothienopyridine, thienodipyridine, benzoselenophenopyridine, and selenophenodipyridine, preferably dibenzothiophene, dibenzofuran, dibenzoselenophene, carbazole, indolocarbazole, imidazole, pyridine, triazine, benzimidazole, 1,2-azaborine, 1,3-azaborine, 1,4-azaborine, borazine, and aza-analogs thereof. Additionally, the heteroaryl group is optionally substituted.

Of the aryl and heteroaryl groups listed above, the groups of triphenylene, naphthalene, anthracene, dibenzothiophene, dibenzofuran, dibenzoselenophene, carbazole, indolocarbazole, imidazole, pyridine, pyrazine, pyrimidine, triazine, and benzimidazole, and the respective aza-analogs of each thereof are of particular interest.

The terms alkyl, cycloalkyl, heteroalkyl, heterocycloalkyl, alkenyl, cycloalkenyl, heteroalkenyl, alkynyl, aralkyl, heterocyclic group, aryl, and heteroaryl, as used herein, are independently unsubstituted, or independently substituted, with one or more general substituents.

In many instances, the general substituents are selected from the group consisting of deuterium, halogen, alkyl, cycloalkyl, heteroalkyl, heterocycloalkyl, arylalkyl, alkoxy, aryloxy, amino, silyl, alkenyl, cycloalkenyl, heteroalkenyl, alkynyl, aryl, heteroaryl, acyl, carboxylic acid, ether, ester, nitrile, isonitrile, sulfanyl, sulfinyl, sulfonyl, phosphino, and combinations thereof.

In some instances, the preferred general substituents are selected from the group consisting of deuterium, fluorine, alkyl, cycloalkyl, heteroalkyl, alkoxy, aryloxy, amino, silyl, alkenyl, cycloalkenyl, heteroalkenyl, aryl, heteroaryl, nitrile, isonitrile, sulfanyl, and combinations thereof.

In some instances, the preferred general substituents are selected from the group consisting of deuterium, fluorine, alkyl, cycloalkyl, alkoxy, aryloxy, amino, silyl, aryl, heteroaryl, sulfanyl, and combinations thereof.

In yet other instances, the more preferred general substituents are selected from the group consisting of deuterium, fluorine, alkyl, cycloalkyl, aryl, heteroaryl, and combinations thereof.

The terms "substituted" and "substitution" refer to a substituent other than H that is bonded to the relevant position, e.g., a carbon or nitrogen. For example, when $R^1$ represents mono-substitution, then one $R^1$ must be other than H (i.e., a substitution). Similarly, when $R^1$ represents di-substitution, then two of $R^1$ must be other than H. Similarly, when $R^1$ represents no substitution, $R^1$, for example, can be a hydrogen for available valencies of ring atoms, as in carbon atoms for benzene and the nitrogen atom in pyrrole, or simply represents nothing for ring atoms with fully filled valencies, e.g., the nitrogen atom in pyridine. The maximum number of substitutions possible in a ring structure will depend on the total number of available valencies in the ring atoms.

As used herein, "combinations thereof" indicates that one or more members of the applicable list are combined to form a known or chemically stable arrangement that one of ordinary skill in the art can envision from the applicable list. For example, an alkyl and deuterium can be combined to form a partial or fully deuterated alkyl group; a halogen and alkyl can be combined to form a halogenated alkyl substituent; and a halogen, alkyl, and aryl can be combined to form a halogenated arylalkyl. In one instance, the term substitution includes a combination of two to four of the listed groups. In another instance, the term substitution includes a combination of two to three groups. In yet another instance, the term substitution includes a combination of two groups. Preferred combinations of substituent groups are those that contain up to fifty atoms that are not hydrogen or deuterium, or those which include up to forty atoms that are not hydrogen or deuterium, or those that include up to thirty atoms that are not hydrogen or deuterium. In many instances, a preferred combination of substituent groups will include up to twenty atoms that are not hydrogen or deuterium.

The "aza" designation in the fragments described herein, i.e. aza-dibenzofuran, aza-dibenzothiophene, etc. means that one or more of the C—H groups in the respective aromatic ring can be replaced by a nitrogen atom, for example, and without any limitation, azatriphenylene encompasses both dibenzoniquinoxaline and dibenzoniquinoline. One of ordinary skill in the art can readily envision other nitrogen analogs of the aza-derivatives described above, and all such analogs are intended to be encompassed by the terms as set forth herein.

As used herein, "deuterium" refers to an isotope of hydrogen. Deuterated compounds can be readily prepared using methods known in the art. For example, U.S. Pat. No. 8,557,400, Patent Pub. No. WO 2006/095951, and U.S. Pat. Application Pub. No. US 2011/0037057, which are hereby incorporated by reference in their entireties, describe the making of deuterium-substituted organometallic complexes. Further reference is made to Ming Yan, et al., *Tetrahedron* 2015, 71, 1425-30 and Atzrodt et al., *Angew. Chem. Int. Ed.* (*Reviews*) 2007, 46, 7744-65, which are incorporated by reference in their entireties, describe the deuteration of the methylene hydrogens in benzyl amines and efficient pathways to replace aromatic ring hydrogens with deuterium, respectively.

It is to be understood that when a molecular fragment is described as being a substituent or otherwise attached to another moiety, its name may be written as if it were a fragment (e.g. phenyl, phenylene, naphthyl, dibenzofuryl) or as if it were the whole molecule (e.g. benzene, naphthalene, dibenzofuran). As used herein, these different ways of designating a substituent or attached fragment are considered to be equivalent.

In some instance, a pair of adjacent substituents can be optionally joined or fused into a ring. The preferred ring is a five, six, or seven-membered carbocyclic or heterocyclic ring, includes both instances where the portion of the ring formed by the pair of substituents is saturated and where the portion of the ring formed by the pair of substituents is unsaturated. As used herein, "adjacent" means that the two substituents involved can be on the same ring next to each other, or on two neighboring rings having the two closest available substitutable positions, such as 2, 2' positions in a biphenyl, or 1, 8 position in a naphthalene, as long as they can form a stable fused ring system.

Compounds of the Disclosure

In one aspect, the present disclosure relates to compounds of Formula I:

Formula I

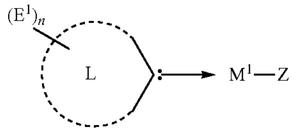

wherein $M^1$ is selected from the group consisting of Au(I), Ag(I), and Cu(I);

L is a carbene coordinated to the metal $M^1$;

Z is a monoanionic ligand;

$E^1$ is an electron accepting group;

n is an integer from 1 to the maximum allowable substitution on L, wherein when n is greater than 1, each $E^1$ may be the same or different;

$E^1$, L, and Z may each be substituted with one or more substituents independently selected from the group consisting of hydrogen, deuterium, halogen, pseudohalogen, alkyl, cycloalkyl, heteroalkyl, heterocycloalkyl, arylalkyl, alkoxy, aryloxy, amino, amide, hydroxyl, silyl, alkenyl, cycloalkenyl, heteroalkenyl, alkynyl, heteroalkynyl, aryl, heteroaryl, nitro, nitrile, isonitrile, sulfanyl, boryl, acyl, carboxylic acid, benzoyl, ether, ester, vinyl, ketone, sulfinyl, sulfonyl, cyano, phosphino, and combinations thereof; wherein any two adjacent substituents may together join to form a ring.

In one embodiment, $E^1$ is selected from the group consisting of a nitrogen-containing heterocyclic ring and a carbocyclic aromatic ring optionally having at least one electron-withdrawing substituent. In one embodiment, $E^1$ is a nitrogen-containing heterocyclic ring selected from the group consisting of aza-dibenzothiophene, aza-dibenzofuran, aza-dibenzoselenophene, aza-benzofuran, aza-benzothiophene, aza-benzoselenophene, aza-carbazole, aza-indolocarbazole, pyridylindole, pyrrolodipyridine, pyrazole, imidazole, triazole, oxazole, thiazole, oxadiazole, oxatriazole, dioxazole, thiadiazole, pyridine, pyridazine, pyrimidine, pyrazine, triazine, oxazine, oxathiazine, oxadiazine, indole, benzimidazole, indazole, indoxazine, benzoxazole, benzisoxazole, benzothiazole, quinoline, isoquinoline, cinnoline, quinazoline, quinoxaline, naphthyridine, phthalazine, pteridine, aza-xanthene, acridine, phenazine, phenothiazine, phenoxazine, benzofuropyridine, furodipyridine, benzothienopyridine, thienodipyridine, benzoselenophenopyridine, selenophenodipyridine, 1,2-azaborine, 1,3-azaborine, 1,4-azaborine, borazine, and aza-analogs thereof; wherein $E^1$ is optionally further substituted. In one embodiment, $E^1$ is a nitrogen-containing heterocyclic ring fused to the carbene L. In one embodiment, $E^1$ is an aromatic ring having at least one electron-withdrawing substituent selected from the group consisting of halogen, pseudohalogen, haloalkyl, halocycloalkyl, heteroalkyl, amide, alkenyl, cycloalkenyl, heteroalkenyl, alkynyl, heteroalkynyl, aryl, heteroaryl, nitro, nitrile, isonitrile, sulfanyl, boryl, acyl, carboxylic acid, benzoyl, ester, vinyl, ketone, sulfinyl, sulfonyl, cyano, phosphino, and combinations thereof; wherein $E^1$ is optionally further substituted.

In one embodiment, L is selected from the group consisting of Formula A, Formula B, Formula C, Formula D, Formula E, and Formula F:

Formula A

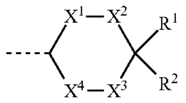

wherein each $X^1$ to $X^4$ independently represents $NR^1$, $CR^1R^2$, C═O, C═S, O, or S; and each occurrence of $R^1$ and $R^2$ is independently selected from the group consisting of hydrogen, deuterium, halogen, alkyl, cycloalkyl, heteroalkyl, heterocycloalkyl, arylalkyl, alkoxy, aryloxy, amino, silyl, alkenyl, cycloalkenyl, heteroalkenyl, alkynyl, aryl, heteroaryl, nitrile, isonitrile, sulfanyl, boryl, acyl, carboxylic acid, ether, ester, sulfinyl, sulfonyl, cyano, phosphino, and combinations thereof;

wherein at least one substituent $R^1$ and $R^2$ comprises an electron accepting group;

wherein any two adjacent $R^1$ and $R^2$ are optionally joined or fused together to form a ring which is optionally substituted.

Formula B

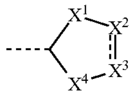

wherein each $X^1$ and $X^4$ independently represents N, $NR^1$, $CR^1$, $CR^1R^2$, $SiR^1R^2$, $PR^1$, B, $BR^1$, $BR^1R^2$, O, or S; and each $X^2$ and $X^3$ independently represents $CR^1$, $CR^1R^2$, $SiR^1$, $SiR^1R^2$, N, $NR^1$, P, B, O, or S;

each occurrence of $R^1$ and $R^2$ is independently hydrogen or a substituent selected from the group consisting of deuterium, halogen, alkyl, cycloalkyl, heteroalkyl, heterocycloalkyl, arylalkyl, alkoxy, aryloxy, amino, silyl, alkenyl, cycloalkenyl, heteroalkenyl, alkynyl, aryl, heteroaryl, nitrile, isonitrile, sulfanyl, boryl, acyl, carboxylic acid, ether, ester, sulfinyl, sulfonyl, cyano, phosphino, and combinations thereof;

wherein at least one substituent $R^1$ and $R^2$ comprises an electron accepting group;

wherein any two adjacent $R^1$ and $R^2$ are optionally joined or fused together to form a ring which is optionally substituted; and the dashed line inside the five-member ring represents zero or one double-bond.

Formula C

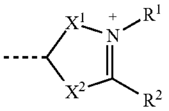

wherein each $X^1$ and $X^2$ independently represents $NR^1$, $CR^1R^2$, O, or S;

each occurrence of $R^1$ and $R^2$ is independently hydrogen or a substituent selected from the group consisting of deuterium, halogen, alkyl, cycloalkyl, heteroalkyl, heterocycloalkyl, arylalkyl, alkoxy, aryloxy, amino, silyl, alkenyl, cycloalkenyl, heteroalkenyl, alkynyl, aryl, heteroaryl, nitrile, isonitrile, sulfanyl, boryl, acyl, carboxylic acid, ether, ester, sulfinyl, sulfonyl, cyano, phosphino, and combinations thereof; and wherein at least one substituent $R^1$ and $R^2$ comprises an electron accepting group;

wherein any two adjacent $R^1$ and $R^2$ are optionally joined or fused together to form a ring which is optionally substituted.

Formula D

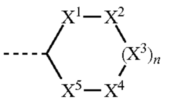

wherein each $X^1$ to $X^5$ independently represents N, P, $NR^1$, $PR^1$, B, $BR^1$, $CR^1$, $SiR^1$, $CR^1R^2$, $SiR^1R^2$, C═O, C═S, O, or S;

n is 0 or 1;

each occurrence of $R^1$ and $R^2$ is independently hydrogen or a substituent selected from the group consisting of deuterium, halogen, alkyl, cycloalkyl, heteroalkyl, heterocycloalkyl, arylalkyl, alkoxy, aryloxy, amino, silyl, alkenyl, cycloalkenyl, heteroalkenyl, alkynyl, aryl, heteroaryl, nitrile, isonitrile, sulfanyl, boryl, acyl, carboxylic acid, ether, ester, sulfinyl, sulfonyl, cyano, phosphino, and combinations thereof;

wherein at least one substituent $R^1$ and $R^2$ comprises an electron accepting group; and wherein any two adjacent $R^1$ and $R^2$ are optionally joined or fused together to form a ring which is optionally substituted;

Formula E

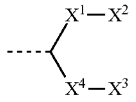

wherein each $X^1$ and $X^4$ independently represents $NR^1$, $CR^1$, $SiR^1$, $CR^1R^2$, $SiR^1R^2$, $PR^1$, $BR^1$, C=O, C=S, O, or S;

each $X^2$ and $X^3$ is independently present or absent, and if present, independently represents H, $NR^1R^2$, $CR^1$, $CR^1R^2$, C=O, C=S, O, or S;

each occurrence of $R^1$ and $R^2$ is independently hydrogen or a substituent selected from the group consisting of deuterium, halogen, alkyl, cycloalkyl, heteroalkyl, heterocycloalkyl, arylalkyl, alkoxy, aryloxy, amino, silyl, alkenyl, cycloalkenyl, heteroalkenyl, alkynyl, aryl, heteroaryl, nitrile, isonitrile, sulfanyl, boryl, acyl, carboxylic acid, ether, ester, sulfinyl, sulfonyl, cyano, phosphino, and combinations thereof;

wherein at least one substituent $R^1$ and $R^2$ comprises an electron accepting group; and wherein any two adjacent $R^1$ and $R^2$ are optionally joined or fused together to form a ring which is optionally substituted Formula F

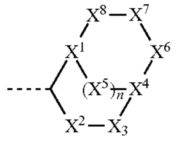

wherein each occurrence of $X^1$ to $X^8$ independently represents N, P, $NR^1$, $PR^1$, B, $BR^1$, $CR^1$, $SiR^1$, $CR^1R^2$, $SiR^1R^2$, C=O, C=S, O, or S;

n is 1 or 2;

each occurrence of $R^1$ and $R^2$ is independently hydrogen or a substituent selected from the group consisting of deuterium, halogen, alkyl, cycloalkyl, heteroalkyl, heterocycloalkyl, arylalkyl, alkoxy, aryloxy, amino, silyl, alkenyl, cycloalkenyl, heteroalkenyl, alkynyl, aryl, heteroaryl, nitrile, isonitrile, sulfanyl, boryl, acyl, carboxylic acid, ether, ester, sulfinyl, sulfonyl, cyano, phosphino, and combinations thereof;

wherein at least one substituent $R^1$ and $R^2$ comprises an electron accepting group; and wherein any two adjacent $R^1$ and $R^2$ are optionally joined or fused together to form a ring which is optionally substituted.

In one embodiment, L is represented by one of the following structures:

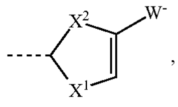

,

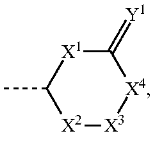

,

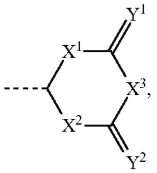

, and

-continued

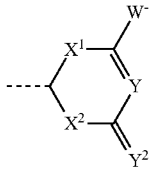

wherein each $X^1$ and $X^2$ independently represents $NR^1$, $CR^1$, $SiR^1$, $CR^1R^2$, C=O, C=S, O, or S;

each $X^3$ and $X^4$ independently represents N, P, B, $CR^1$, $SiR^1$, $CR^1R^2$, C=O, C=S, O, or S;

Y represents N, P, $CR^1$, or $SiR^1$;

each $Y^1$ and $Y^2$ independently represents O, S, $NR^1$, or $CR^1R^2$

W represents O, $NR^1$, or S;

each occurrence of $R^1$ and $R^2$ is independently hydrogen or a substituent selected from the group consisting of deuterium, halogen, alkyl, cycloalkyl, heteroalkyl, heterocycloalkyl, arylalkyl, alkoxy, aryloxy, amino, silyl, alkenyl, cycloalkenyl, heteroalkenyl, alkynyl, aryl, heteroaryl, nitrile, isonitrile, sulfanyl, boryl, acyl, carboxylic acid, ether, ester, sulfinyl, sulfonyl, cyano, phosphino, and combinations thereof;

wherein at least one substituent $R^1$ and $R^2$ comprises an electron accepting group; and wherein any two adjacent $R^1$ and $R^2$ are optionally joined or fused together to form a ring which is optionally substituted.

In one embodiment, L is represented by one of the following structures:

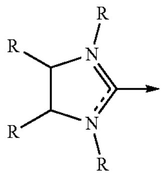
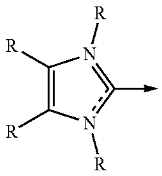
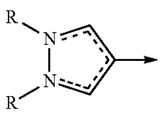
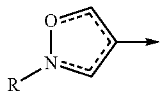
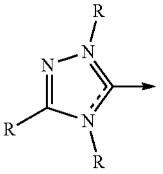
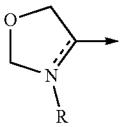
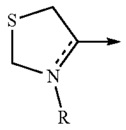
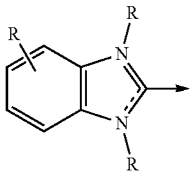
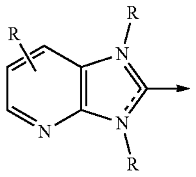
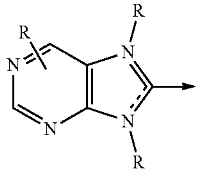
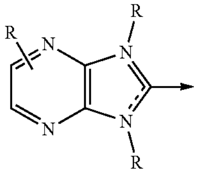
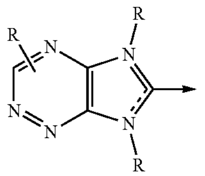
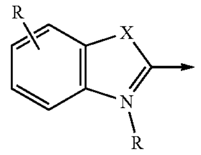

-continued
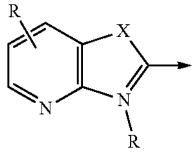
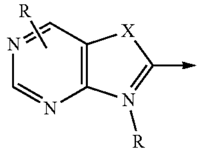
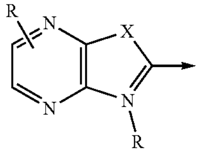
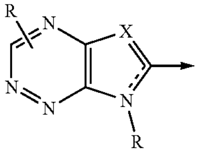
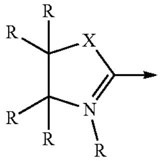
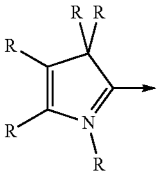
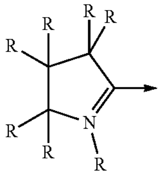
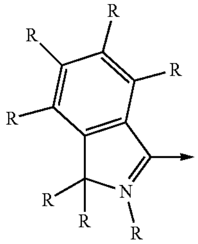
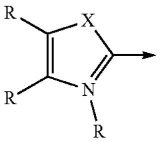
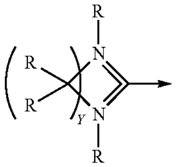
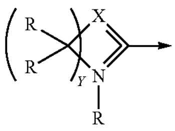
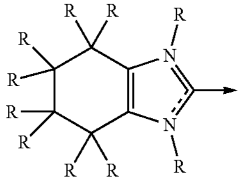
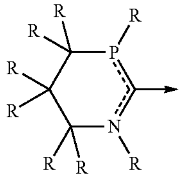
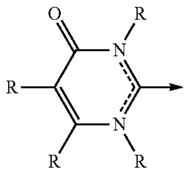
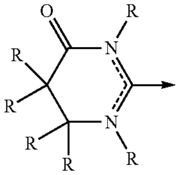
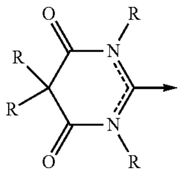
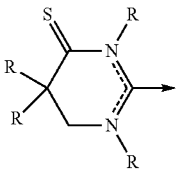
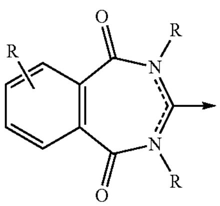
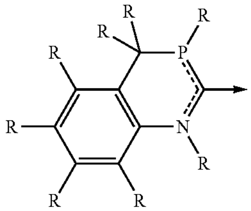
-continued
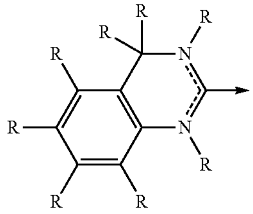
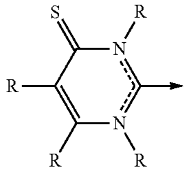
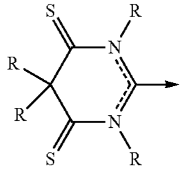
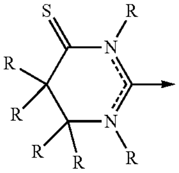
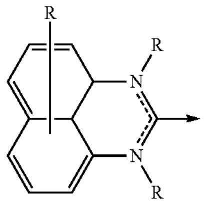
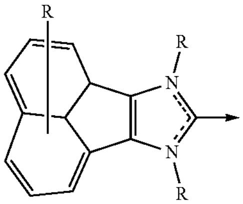
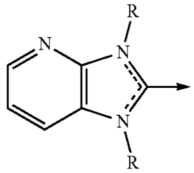
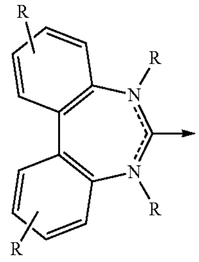
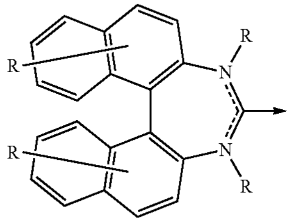
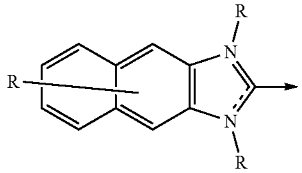
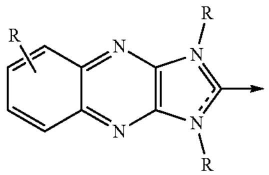
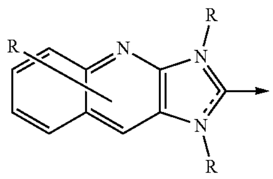
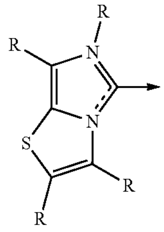

-continued

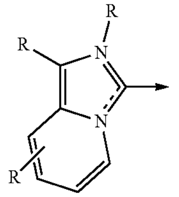
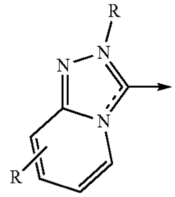
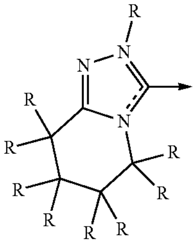
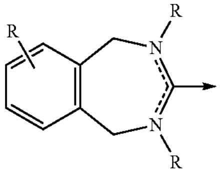
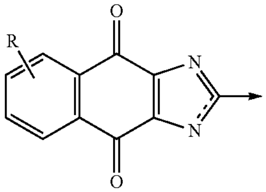
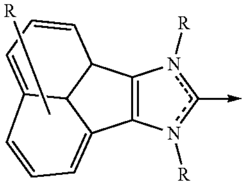
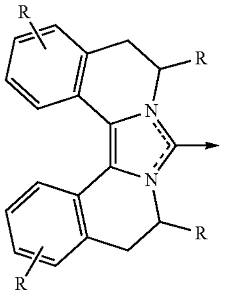
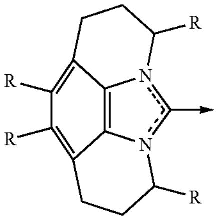
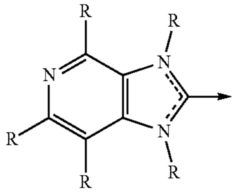
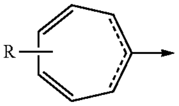
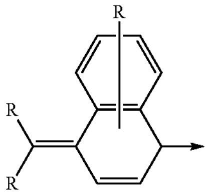
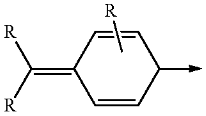
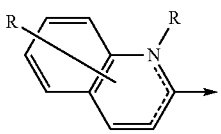
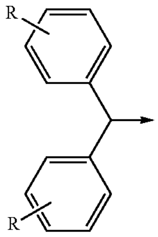
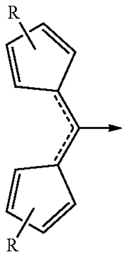
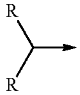 ;

wherein each X represents S, O, $C(R)_2$, NR, or PR;

wherein each R is independently selected from the group consisting of hydrogen, deuterium, halogen, pseudohalogen, alkyl, cycloalkyl, heteroalkyl, heterocycloalkyl, arylalkyl, alkoxy, aryloxy, amino, amide, hydroxyl, silyl, alkenyl, cycloalkenyl, heteroalkenyl, alkynyl, heteroalkynyl, aryl, heteroaryl, nitro, nitrile, isonitrile, sulfanyl, boryl, acyl, carboxylic acid, benzoyl, ether, ester, vinyl, ketone, sulfinyl, sulfonyl, cyano, phosphino, and combinations thereof; wherein any two adjacent substituents may together join to form a ring.

In one embodiment, L is represented by one of the following structures:

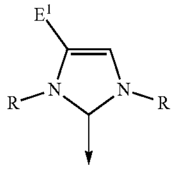
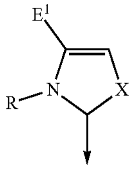
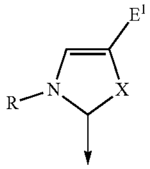
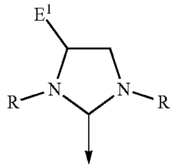
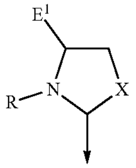
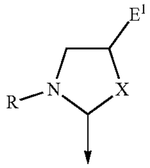
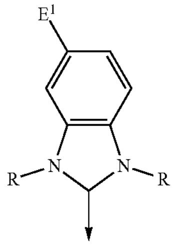
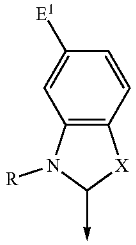
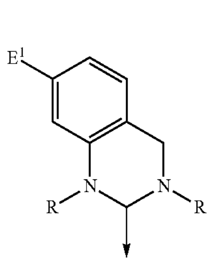
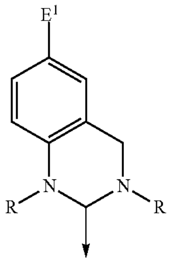
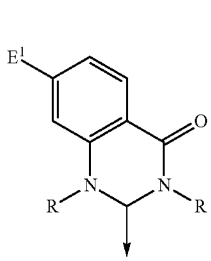
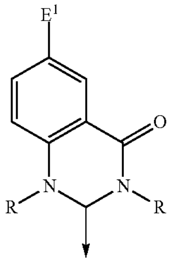
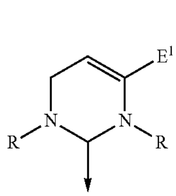
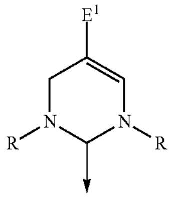

-continued

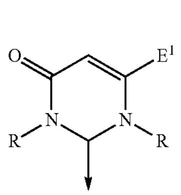
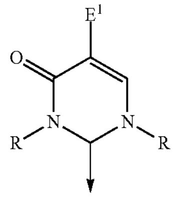
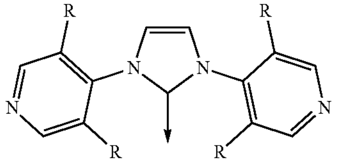
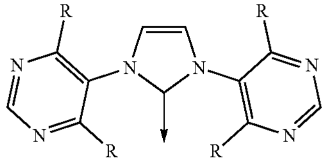
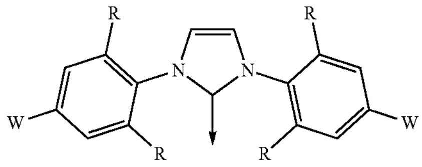
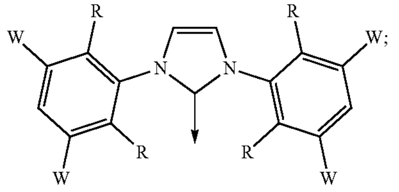

wherein each X represents S, O, $C(R)_2$, NR, or PR;

wherein each W represents an electron withdrawing group selected from the group consisting of halogen, $CF_3$, CN, C(O)R, $CO_2R$, $NO_2$, and $SO_2R$; and wherein each R is independently selected from the group consisting of hydrogen, deuterium, halogen, pseudohalogen, alkyl, cycloalkyl, heteroalkyl, heterocycloalkyl, arylalkyl, alkoxy, aryloxy, amino, amide, hydroxyl, silyl, alkenyl, cycloalkenyl, heteroalkenyl, alkynyl, heteroalkynyl, aryl, heteroaryl, nitro, nitrile, isonitrile, sulfanyl, boryl, acyl, carboxylic acid, benzoyl, ether, ester, vinyl, ketone, sulfinyl, sulfonyl, cyano, phosphino, and combinations thereof; wherein any two adjacent substituents may together join to form a ring.

In one embodiment, L is represented by one of the following structures:

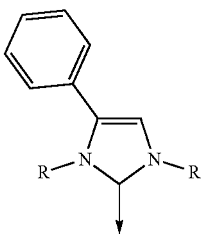
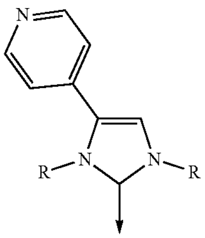

-continued

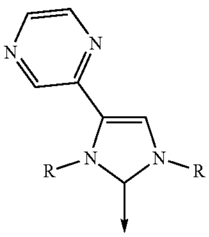
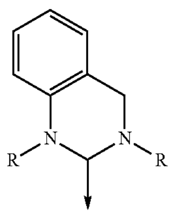
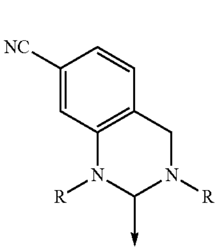
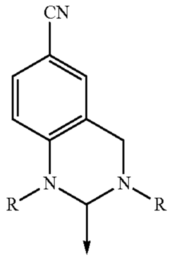
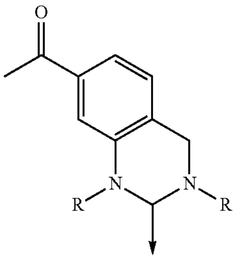
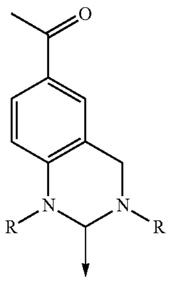
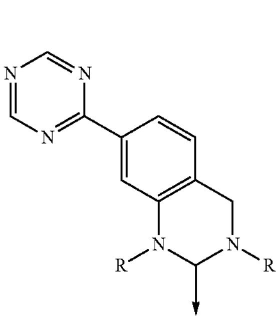
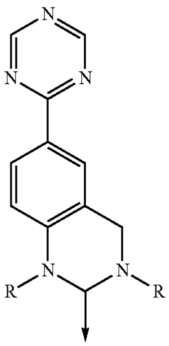
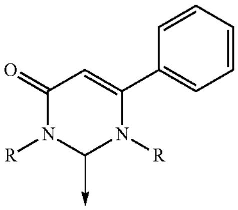
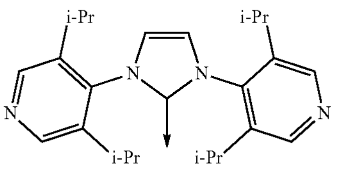
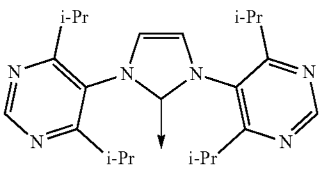

-continued

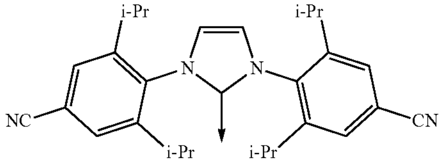

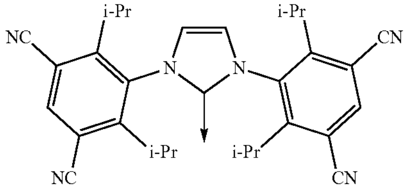

wherein each R is independently selected from the group consisting of hydrogen, deuterium, halogen, pseudohalogen, alkyl, cycloalkyl, heteroalkyl, heterocycloalkyl, arylalkyl, alkoxy, aryloxy, amino, amide, hydroxyl, silyl, alkenyl, cycloalkenyl, heteroalkenyl, alkynyl, heteroalkynyl, aryl, heteroaryl, nitro, nitrile, isonitrile, sulfanyl, boryl, acyl, carboxylic acid, benzoyl, ether, ester, vinyl, ketone, sulfinyl, sulfonyl, cyano, phosphino, and combinations thereof; wherein any two adjacent substituents may together join to form a ring.

In one embodiment, each R represents an aryl substituent which is optionally substituted. In one embodiment, each R represents an aryl substituent which is substituted at the 2- or 6-position or which is substituted at the 2- and the 6-positions relative to the bond to the carbene nitrogen. In one embodiment, each R represents a 2-6-disubstituted aryl, wherein each substituent is an alkyl group. In one embodiment, the alkyl group substituent on R is methyl or isopropyl. In one embodiment, each R represents a 2,6-diisopropylphenyl group.

In one embodiment, Z is selected from the group consisting of an alkyl anion, aryl anion, heteroaryl anion, halide, trifluoromethylsulfonate, amide, alkoxide, sulfide, and phosphide, wherein Z may be further substituted.

In one embodiment, Z is represented by one of the following structures:

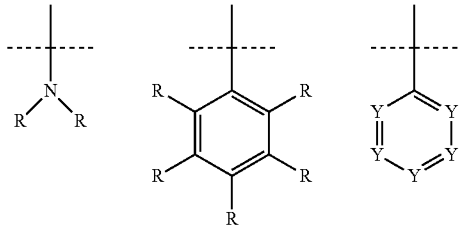

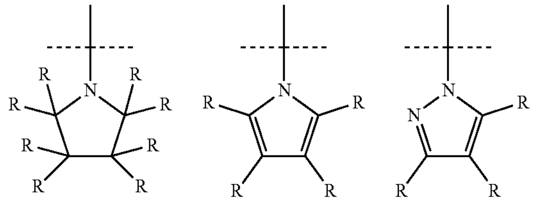

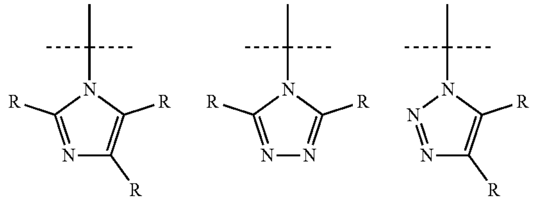

-continued

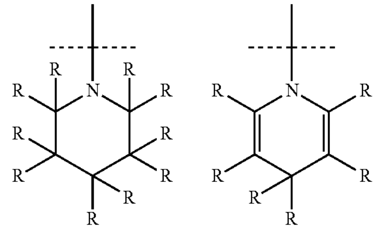

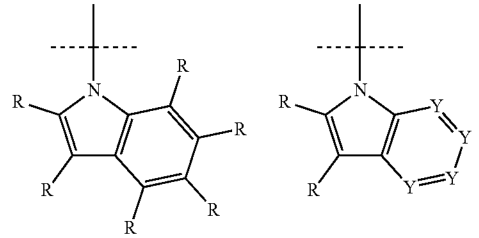

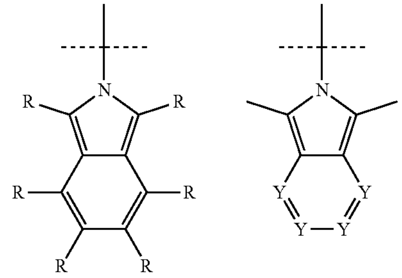

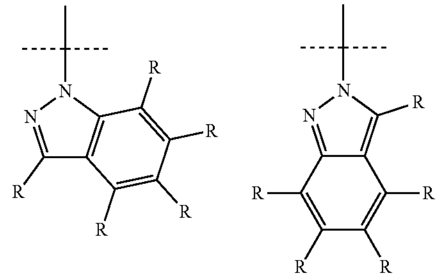

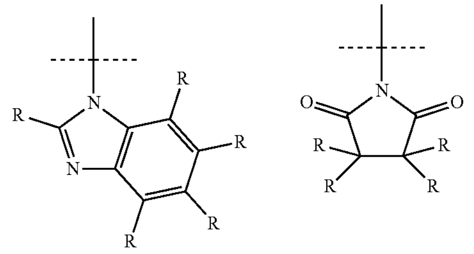

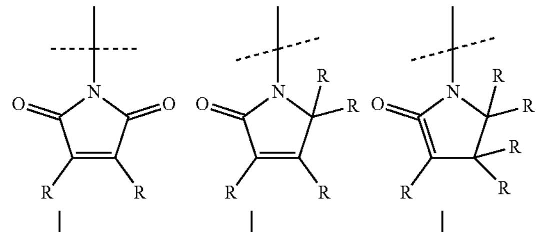

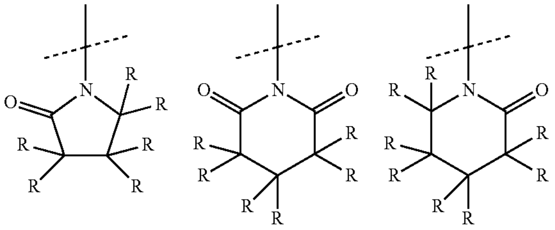

-continued

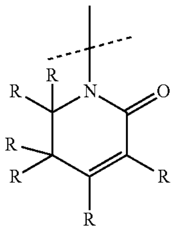
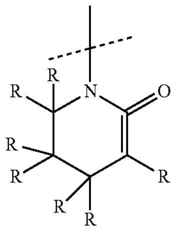
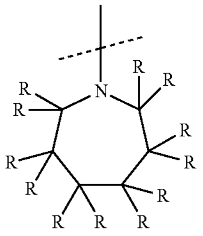
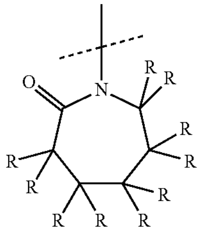
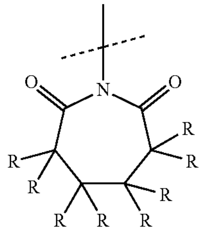
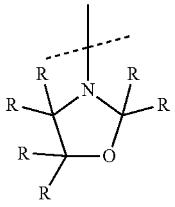
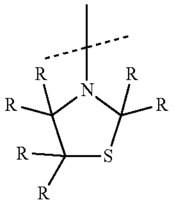
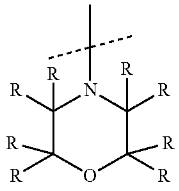
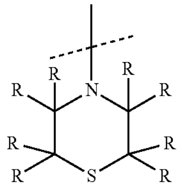
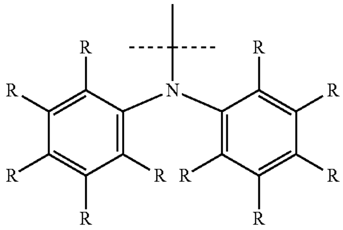
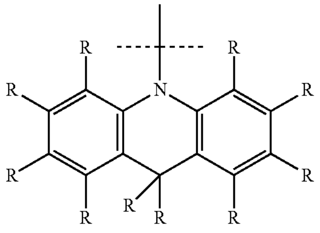
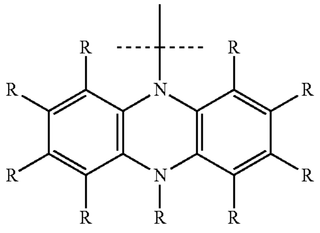

-continued

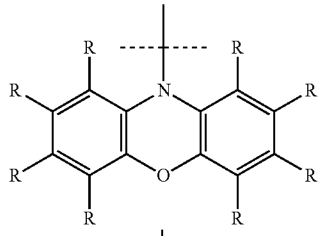
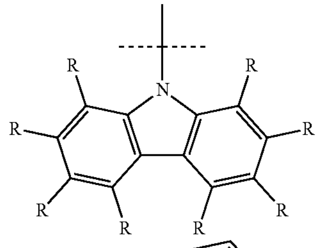
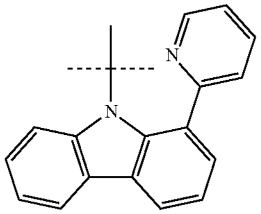
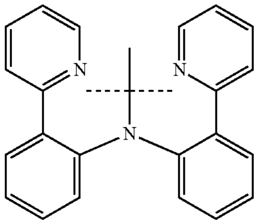
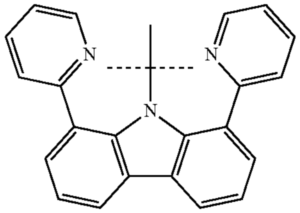
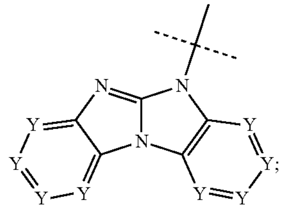

wherein the dashed line indicates the bond to $M^1$; and each occurrence Y is selected from the group consisting of N and CR; and each R independently represents a substituent selected from the group consisting of hydrogen, deuterium, halogen, pseudohalogen, alkyl, cycloalkyl, heteroalkyl, heterocycloalkyl, arylalkyl, alkoxy, aryloxy, amino, amide, hydroxyl, silyl, alkenyl, cycloalkenyl, heteroalkenyl, alkynyl, heteroalkynyl, aryl, heteroaryl, nitro, nitrile, isonitrile, sulfanyl, boryl, acyl, carboxylic acid, benzoyl, ether, ester, vinyl, ketone, sulfinyl, sulfonyl, cyano, phosphino, and combinations thereof; wherein any two adjacent substituents may together join to form a ring.

In one embodiment, Z is represented by one of the following structures:
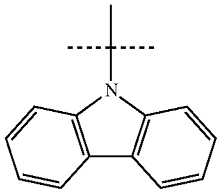
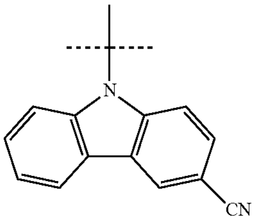
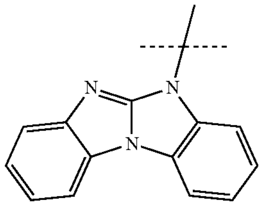
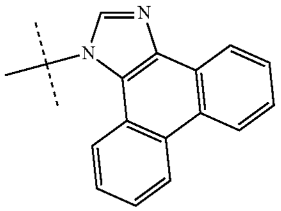
wherein the dashed line indicates the bond to $M^1$.
In one embodiment, the compound is represented by one of the following structures:
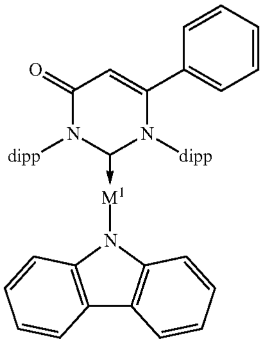
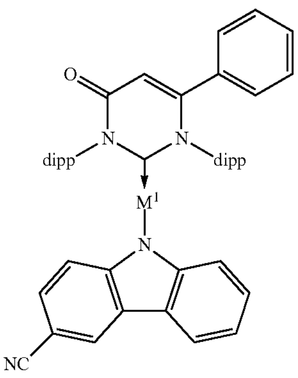
-continued
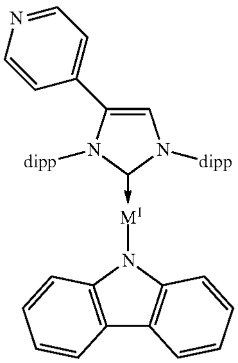
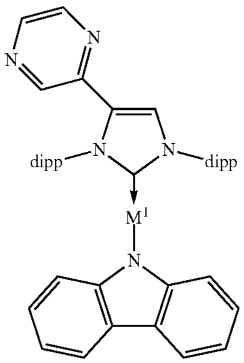
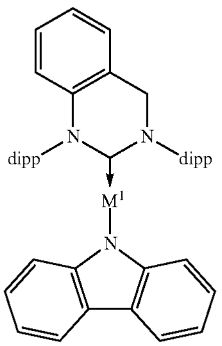
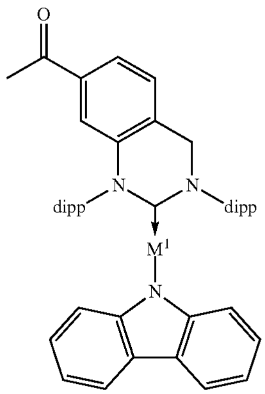
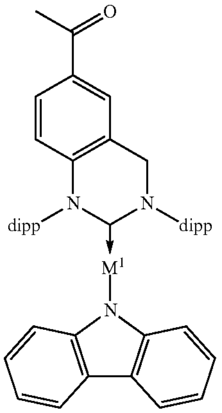
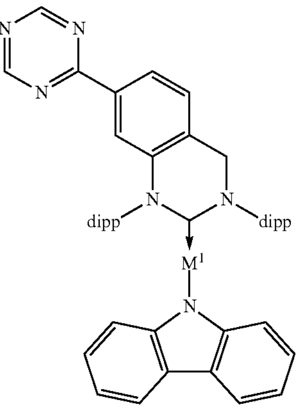

-continued

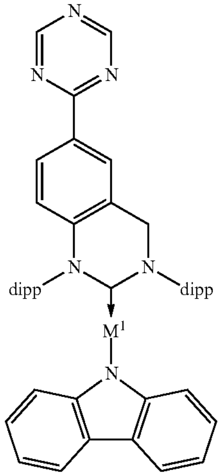

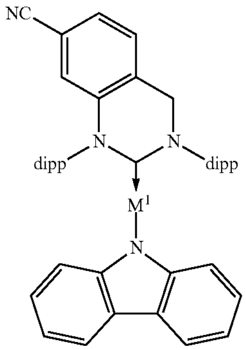

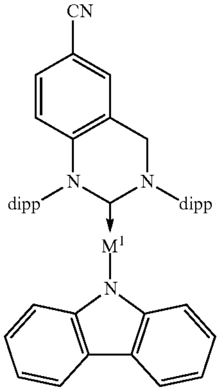

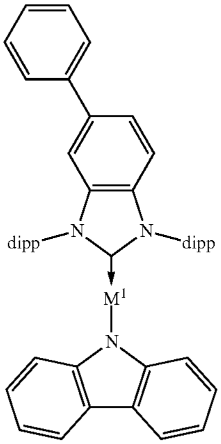

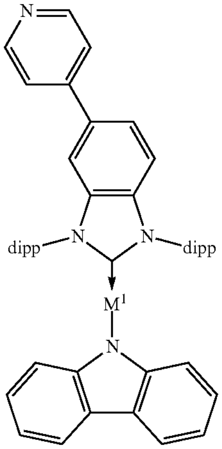

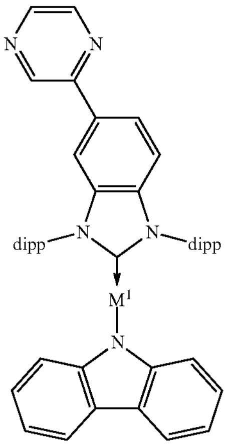

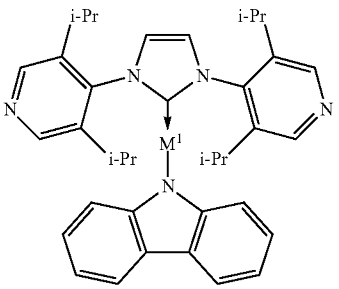

-continued

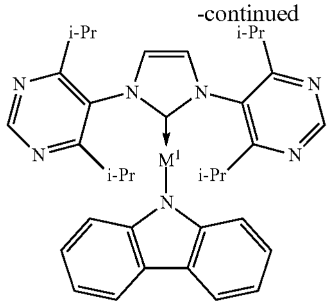

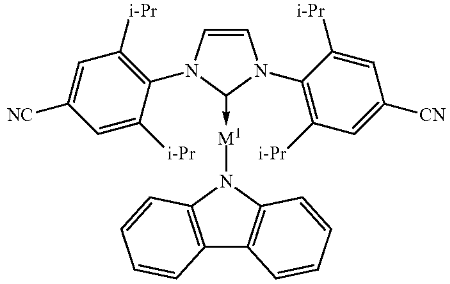

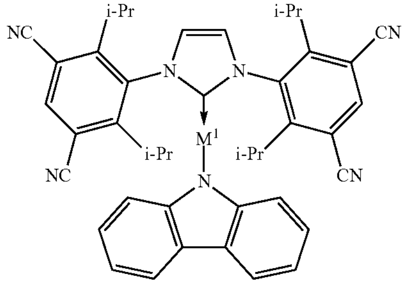

wherein dipp represents 2,6-diisopropylphenyl.

In another aspect, the present disclosure provides a formulation comprising a compound of the present disclosure.

In another aspect, the present disclosure relates to an organic light emitting device (OLED) comprising an anode; a cathode; and an organic layer, disposed between the anode and the cathode, comprising a compound of the present disclosure.

A consumer product comprising an organic light-emitting device (OLED) is also described. The OLED includes an anode, a cathode, and an organic layer disposed between the anode and the cathode, wherein the organic layer includes a compound of the present disclosure.

In some embodiments, the OLED has one or more characteristics selected from the group consisting of being flexible, being rollable, being foldable, being stretchable, and being curved. In some embodiments, the OLED is transparent or semi-transparent. In some embodiments, the OLED further comprises a layer comprising carbon nanotubes.

In some embodiments, the OLED further comprises a layer comprising a delayed fluorescent emitter. In some embodiments, the OLED comprises a RGB pixel arrangement or white plus color filter pixel arrangement. In some embodiments, the OLED is a mobile device, a hand held device, or a wearable device. In some embodiments, the OLED is a display panel having less than 10 inch diagonal or 50 square inch area. In some embodiments, the OLED is a display panel having at least 10 inch diagonal or 50 square inch area. In some embodiments, the OLED is a lighting panel.

In some embodiments, the compound can be an emissive dopant. In some embodiments, the compound can produce emissions via phosphorescence, fluorescence, thermally activated delayed fluorescence, i.e., TADF (also referred to as E-type delayed fluorescence; see, e.g., U.S. application Ser. No. 15/700,352, which is hereby incorporated by reference in its entirety), triplet-triplet annihilation, or combinations of these processes. In some embodiments, the emissive dopant can be a racemic mixture, or can be enriched in one enantiomer. In some embodiments, the compound is neutrally charged. In some embodiments, the compound can be homoleptic (each ligand is the same). In some embodiments, the compound can be heteroleptic (at least one ligand is different from others). When there are more than one ligand coordinated to a metal, the ligands can all be the same in some embodiments. In some other embodiments, at least one ligand is different from the other ligands. In some embodiments, every ligand can be different from each other. This is also true in embodiments where a ligand being coordinated to a metal can be linked with other ligands being coordinated to that metal to form a tridentate, tetradentate, pentadentate, or hexadentate ligands. Thus, where the coordinating ligands are being linked together, all of the ligands can be the same in some embodiments, and at least one of the ligands being linked can be different from the other ligand(s) in some other embodiments.

In some embodiments, the compound can be used as a phosphorescent sensitizer in an OLED where one or multiple layers in the OLED contains an acceptor in the form of one or more fluorescent and/or delayed fluorescence emitters. In some embodiments, the compound can be used as one component of an exciplex to be used as a sensitizer. As a phosphorescent sensitizer, the compound must be capable of energy transfer to the acceptor and the acceptor will emit the energy or further transfer energy to a final emitter. The acceptor concentrations can range from 0.001% to 100%. The acceptor could be in either the same layer as the phosphorescent sensitizer or in one or more different layers. In some embodiments, the acceptor is a TADF emitter. In some embodiments, the acceptor is a fluorescent emitter. In some embodiments, the emission can arise from any or all of the sensitizer, acceptor, and final emitter.

According to another aspect, a formulation comprising the compound described herein is also disclosed.

The OLED disclosed herein can be incorporated into one or more of a consumer product, an electronic component module, and a lighting panel. The organic layer can be an emissive layer and the compound can be an emissive dopant in some embodiments, while the compound can be a non-emissive dopant in other embodiments.

The organic layer can also include a host. In some embodiments, two or more hosts are preferred. In some embodiments, the hosts used maybe a) bipolar, b) electron transporting, c) hole transporting or d) wide band gap materials that play little role in charge transport. In some embodiments, the host can include a metal complex. The host can be a triphenylene containing benzo-fused thiophene or benzo-fused furan. Any substituent in the host can be an unfused substituent independently selected from the group consisting of $C_nH_{2n+1}$, $OC_nH_{2n+1}$, $OAr_1$, $N(C_nH_{2n+1})_2$, $N(Ar_1)(Ar_2)$, $CH{=}CH{-}C_nH_{2n+1}$, $Ar_1$, $Ar_1{-}Ar_2$, and $C_nH_{2n}{-}Ar_1$, or the host has no substitutions. In the preceding substituents n can range from 1 to 10; and $Ar_1$ and $Ar_2$ can be independently selected from the group consisting of benzene, biphenyl, naphthalene, triphenylene, carbazole, and heteroaromatic analogs thereof. The host can be an inorganic compound. For example a Zn containing inorganic material e.g. ZnS.

The host can be a compound comprising at least one chemical group selected from the group consisting of triphenylene, carbazole, dibenzothiophene, dibenzofuran, dibenzoselenophene, azatriphenylene, azacarbazole, aza-dibenzothiophene, aza-dibenzofuran, and aza-dibenzoselenophene. The host can include a metal complex. The host can be, but is not limited to, a specific compound selected from the group consisting of:

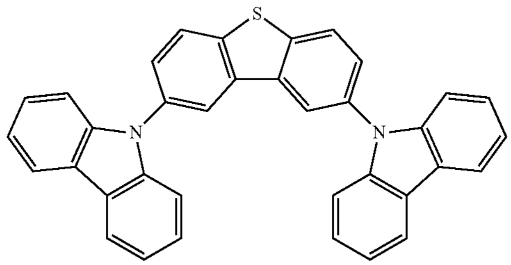

,

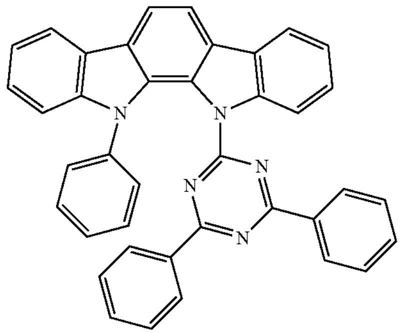

,

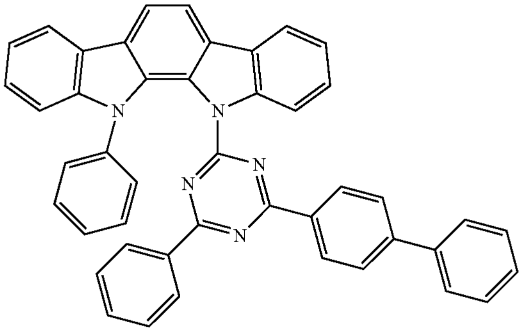

,

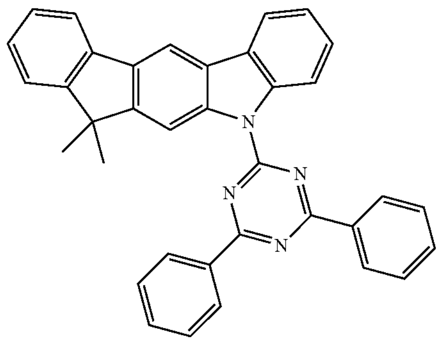

,

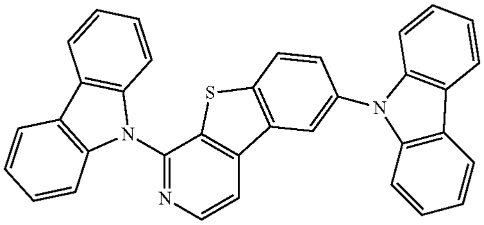
,
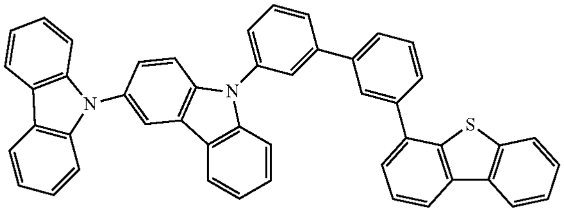
,
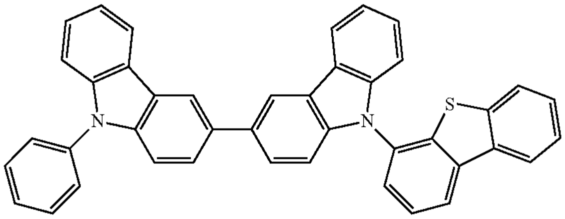
,
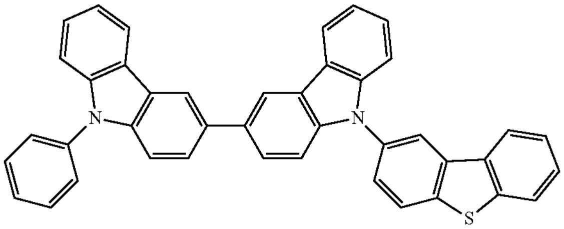
,
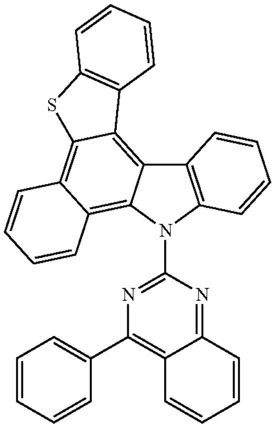
,
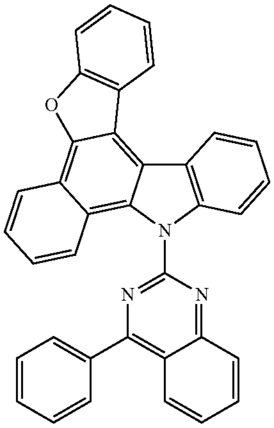
,
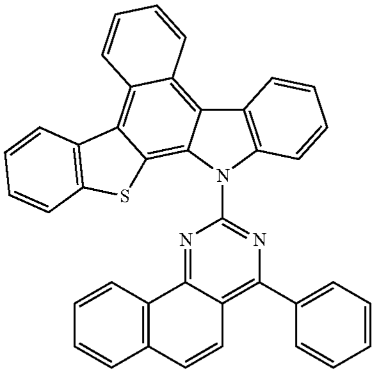
,
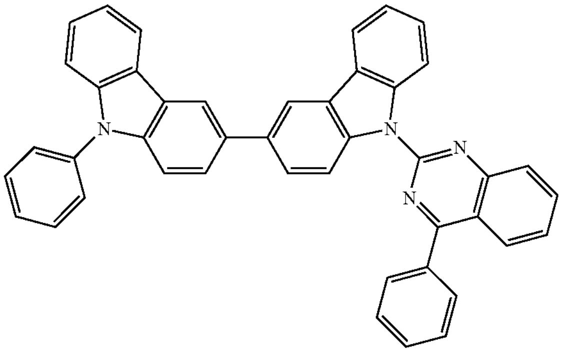
,
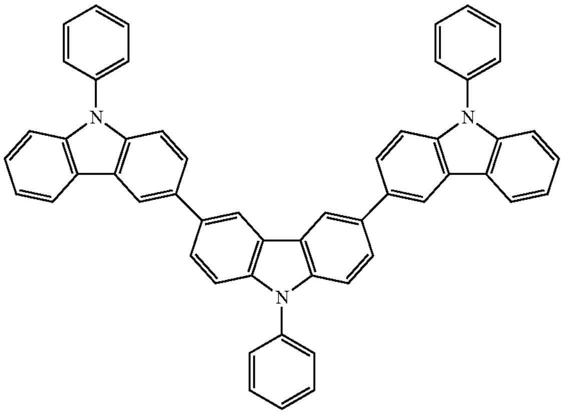
, -continued
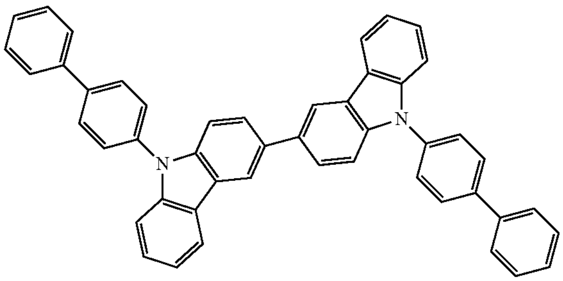
,
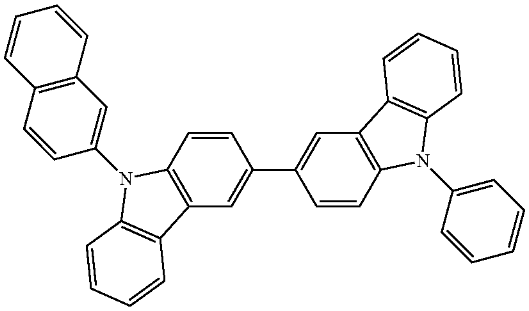
,
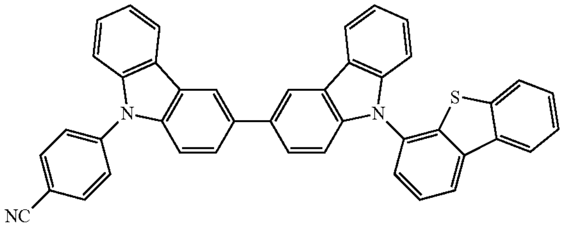
,
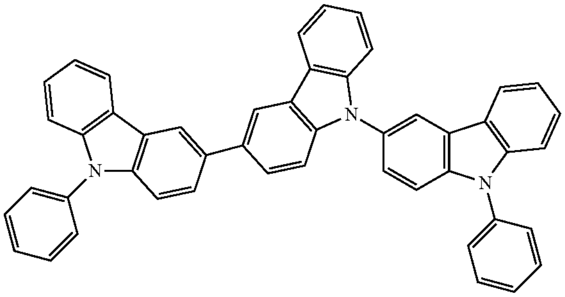
,
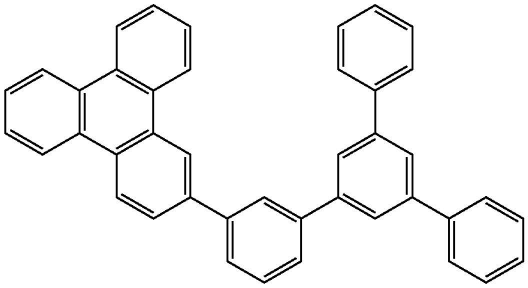
,
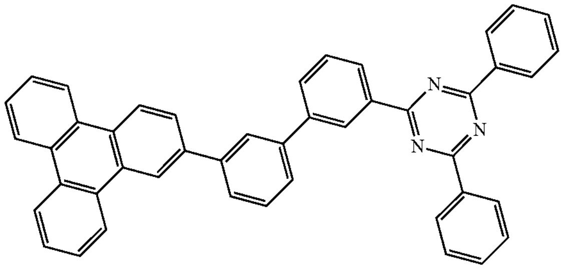
,
-continued
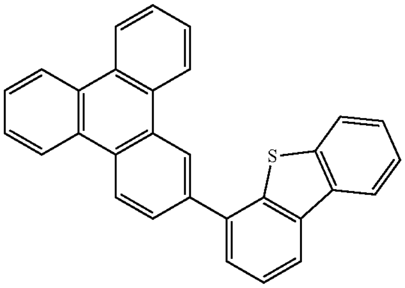
,
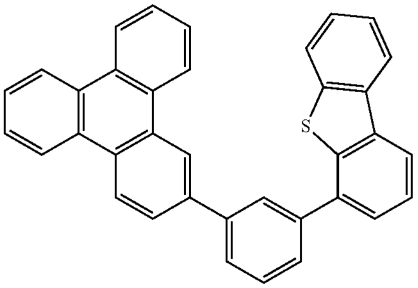
,
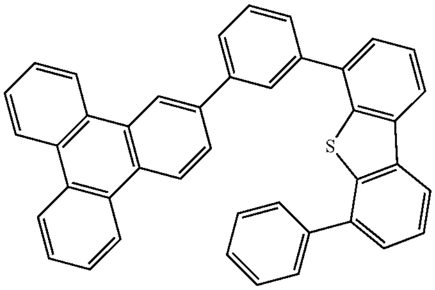
,
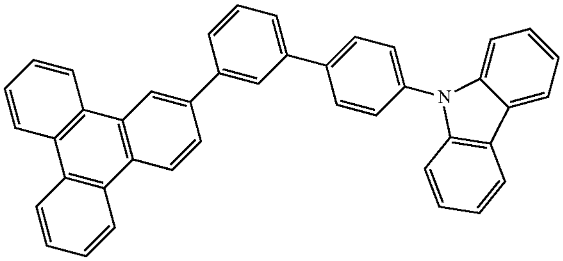
,
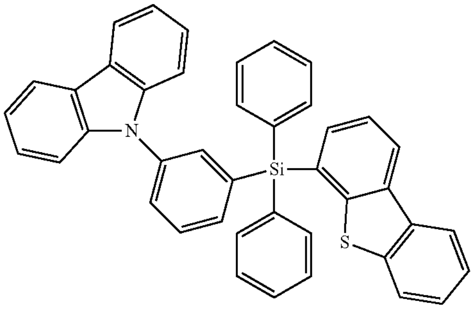
,
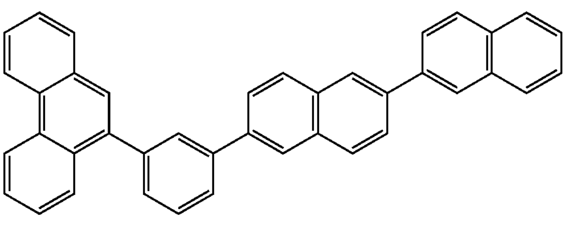
,
and combinations thereof.

Additional information on possible hosts is provided below.

In yet another aspect of the present disclosure, a formulation that comprises the novel compound disclosed herein is described. The formulation can include one or more components selected from the group consisting of a solvent, a host, a hole injection material, hole transport material, electron blocking material, hole blocking material, and an electron transport material, disclosed herein.

The present disclosure encompasses any chemical structure comprising the novel compound of the present disclosure, or a monovalent or polyvalent variant thereof. In other words, the inventive compound, or a monovalent or polyvalent variant thereof, can be a part of a larger chemical structure. Such chemical structure can be selected from the group consisting of a monomer, a polymer, a macromolecule, and a supramolecule (also known as supermolecule). As used herein, a “monovalent variant of a compound” refers to a moiety that is identical to the compound except that one hydrogen has been removed and replaced with a bond to the rest of the chemical structure. As used herein, a “polyvalent variant of a compound” refers to a moiety that is identical to the compound except that more than one hydrogen has been removed and replaced with a bond or bonds to the rest of the chemical structure. In the instance of a supramolecule, the inventive compound can also be incorporated into the supramolecule complex without covalent bonds.

Combination with Other Materials

The materials described herein as useful for a particular layer in an organic light emitting device may be used in combination with a wide variety of other materials present in the device. For example, emissive dopants disclosed herein may be used in conjunction with a wide variety of hosts, transport layers, blocking layers, injection layers, electrodes and other layers that may be present. The materials described or referred to below are non-limiting examples of materials that may be useful in combination with the compounds disclosed herein, and one of skill in the art can readily consult the literature to identify other materials that may be useful in combination. Conductivity Dopants:

A charge transport layer can be doped with conductivity dopants to substantially alter its density of charge carriers, which will in turn alter its conductivity. The conductivity is increased by generating charge carriers in the matrix material, and depending on the type of dopant, a change in the Fermi level of the semiconductor may also be achieved. Hole-transporting layer can be doped by p-type conductivity dopants and n-type conductivity dopants are used in the electron-transporting layer.

Non-limiting examples of the conductivity dopants that may be used in an OLED in combination with materials disclosed herein are exemplified below together with references that disclose those materials: EP01617493, EP01968131, EP2020694, EP2684932, US20050139810, US20070160905, US20090167167, US2010288362, WO06081780, WO2009003455, WO2009008277, WO2009011327, WO2014009310, US2007252140, US2015060804, US20150123047, and US2012146012.

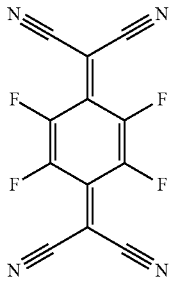

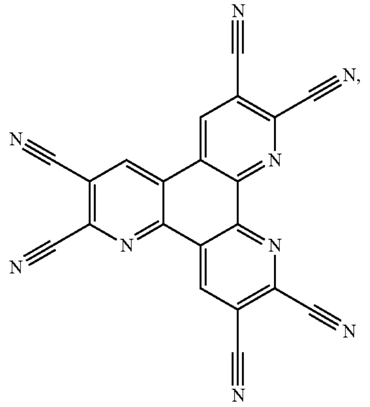

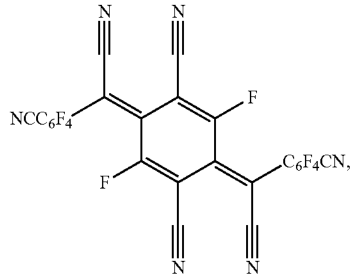

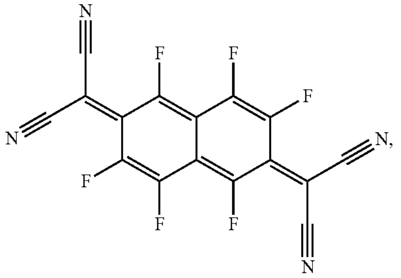

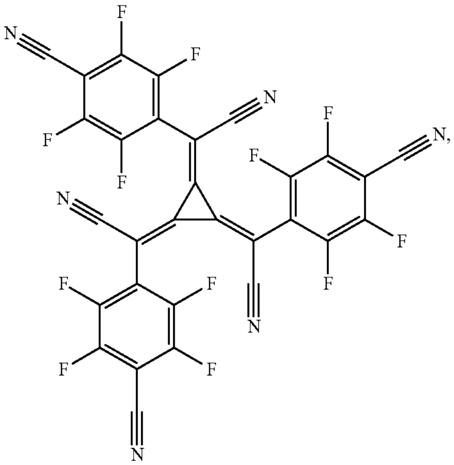

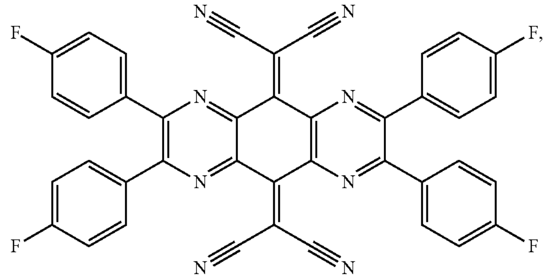

-continued

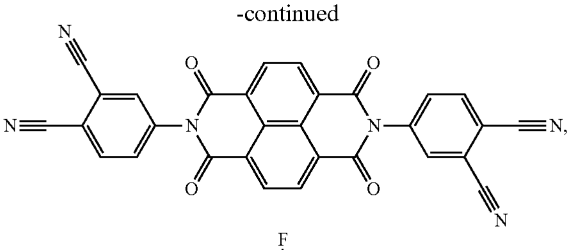

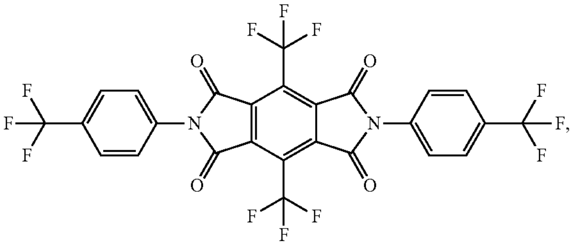

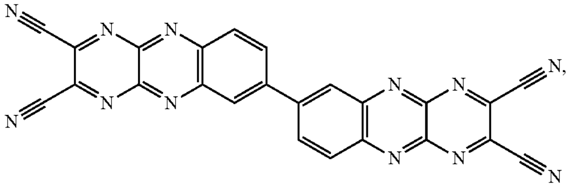

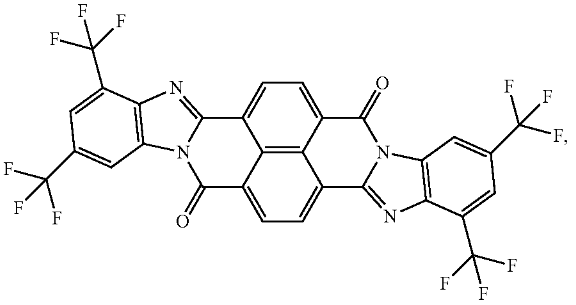

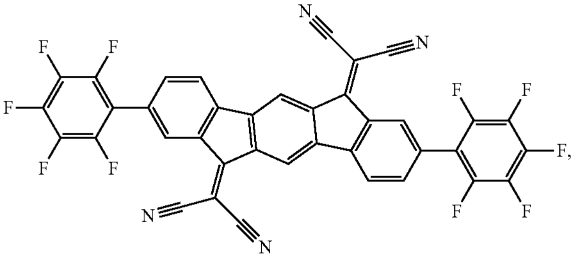

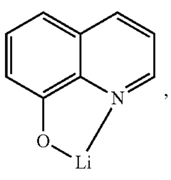

, and

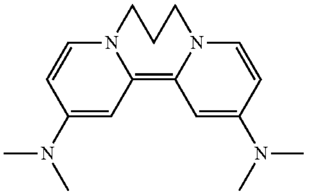

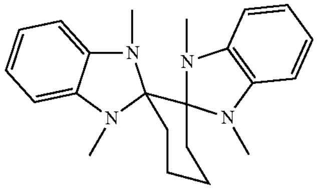

.

HIL/HTL:

A hole injecting/transporting material to be used in the present invention is not particularly limited, and any compound may be used as long as the compound is typically used as a hole injecting/transporting material. Examples of the material include, but are not limited to: a phthalocyanine or porphyrin derivative; an aromatic amine derivative; an indolocarbazole derivative; a polymer containing fluorohydrocarbon; a polymer with conductivity dopants; a conducting polymer, such as PEDOT/PSS; a self-assembly monomer derived from compounds such as phosphonic acid and silane derivatives; a metal oxide derivative, such as $MoO_x$; a p-type semiconducting organic compound, such as 1,4,5,8,9,12-Hexaazatriphenylenehexacarbonitrile; a metal complex, and a cross-linkable compounds.

Examples of aromatic amine derivatives used in HIL or HTL include, but not limit to the following general structures:

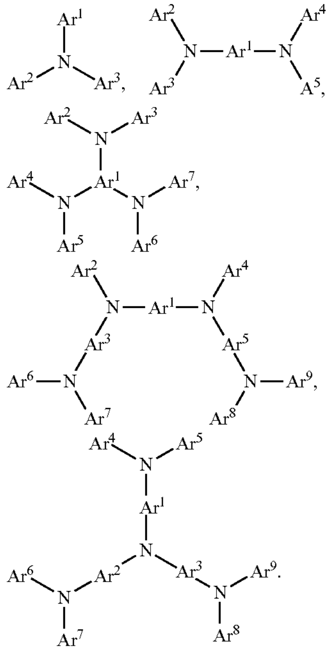

and

Each of $Ar^1$ to $Ar^9$ is selected from the group consisting of aromatic hydrocarbon cyclic compounds such as benzene, biphenyl, triphenyl, triphenylene, naphthalene, anthracene, phenalene, phenanthrene, fluorene, pyrene, chrysene, perylene, and azulene; the group consisting of aromatic heterocyclic compounds such as dibenzothiophene, dibenzofuran, dibenzoselenophene, furan, thiophene, benzofuran, benzothiophene, benzoselenophene, carbazole, indolocarbazole, pyridylindole, pyrrolodipyridine, pyrazole, imidazole, triazole, oxazole, thiazole, oxadiazole, oxatriazole, dioxazole, thiadiazole, pyridine, pyridazine, pyrimidine, pyrazine, triazine, oxazine, oxathiazine, oxadiazine, indole, benzimidazole, indazole, indoxazine, benzoxazole, benzisoxazole, benzothiazole, quinoline, isoquinoline, cinnoline, quinazoline, quinoxaline, naphthyridine, phthalazine, pteridine, xanthene, acridine, phenazine, phenothiazine, phenoxazine, benzofuropyridine, furodipyridine, benzothienopyridine, thienodipyridine, benzoselenophenopyridine, and selenophenodipyridine; and the group consisting of 2 to 10 cyclic structural units which are groups of the same type or different types selected from the aromatic hydrocarbon cyclic group and the aromatic heterocyclic group and are bonded to each other directly or via at least one of oxygen atom, nitrogen atom, sulfur atom, silicon atom, phosphorus atom, boron atom, chain structural unit and the aliphatic cyclic group. Each Ar may be unsubstituted or may be substituted by a substituent selected from the group consisting of deuterium, halogen, alkyl, cycloalkyl, heteroalkyl, heterocycloalkyl, arylalkyl, alkoxy, aryloxy, amino, silyl, alkenyl, cycloalkenyl, heteroalkenyl, alkynyl, aryl, heteroaryl, acyl, carboxylic acids, ether, ester, nitrile, isonitrile, sulfanyl, sulfinyl, sulfonyl, phosphino, and combinations thereof.

In one aspect, $Ar^1$ to $Ar^9$ is independently selected from the group consisting of:

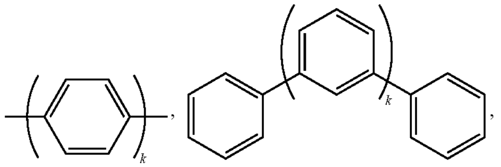

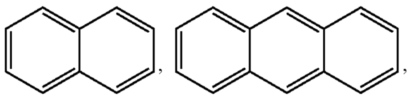

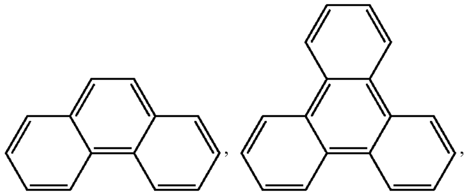

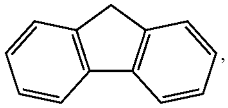
, and
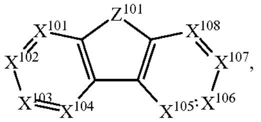

wherein k is an integer from 1 to 20; $X^{101}$ to $X^{108}$ is C (including CH) or N; $Z^{101}$ is $NAr^1$, O, or S; has the same group defined above.

Examples of metal complexes used in HIL or HTL include, but are not limited to the following general formula:

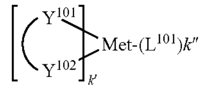

wherein Met is a metal, which can have an atomic weight greater than 40; ($Y^{101}$-$Y^{102}$) is a bidentate ligand, $Y^{101}$ and $Y^{102}$ are independently selected from C, N, O, P, and S; $L^{101}$ is an ancillary ligand; k' is an integer value from 1 to the maximum number of ligands that may be attached to the metal; and k'+k" is the maximum number of ligands that may be attached to the metal.

In one aspect, ($Y^{101}$-$Y^{102}$) is a 2-phenylpyridine derivative. In another aspect, ($Y^{101}$-$Y^{102}$) is a carbene ligand. In another aspect, Met is selected from Ir, Pt, Os, and Zn. In a further aspect, the metal complex has a smallest oxidation potential in solution vs. $Fc^+$/Fc couple less than about 0.6 V.

Non-limiting examples of the HIL and HTL materials that may be used in an OLED in combination with materials disclosed herein are exemplified below together with references that disclose those materials: CN102702075, DE102012005215, EP01624500, EP01698613, EP01806334, EP01930964, EP01972613, EP01997799, EP02011790, EP02055700, EP02055701, EP1725079, EP2085382, EP2660300, EP650955, JP07-073529, JP2005112765, JP2007091719, JP2008021687, JP2014-009196, KR20110088898, KR20130077473, TW201139402, U.S. Ser. No. 06/517,957, US20020158242, US20030162053, US20050123751, US20060182993, US20060240279, US20070145888, US20070181874, US20070278938, US20080014464, US20080091025, US20080106190, US20080124572, US20080145707, US20080220265, US20080233434, US20080303417, US2008107919, US20090115320, US20090167161, US2009066235, US2011007385, US20110163302, US2011240968, US2011278551, US2012205642, US2013241401, US20140117329, US2014183517, U.S. Pat. Nos. 5,061,569, 5,639,914, WO05075451, WO07125714, WO08023550, WO08023759, WO2009145016, WO2010061824, WO2011075644, WO2012177006, WO2013018530, WO2013039073, WO2013087142, WO2013118812, WO2013120577, WO2013157367, WO2013175747, WO2014002873, WO2014015935, WO2014015937, WO2014030872, WO2014030921, WO2014034791, WO2014104514, WO2014157018.

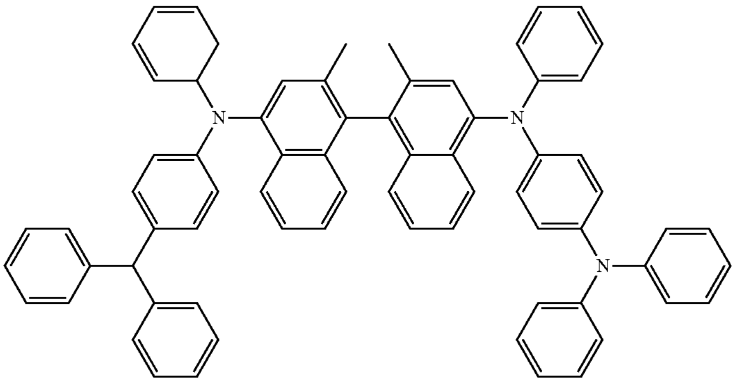
,

-continued
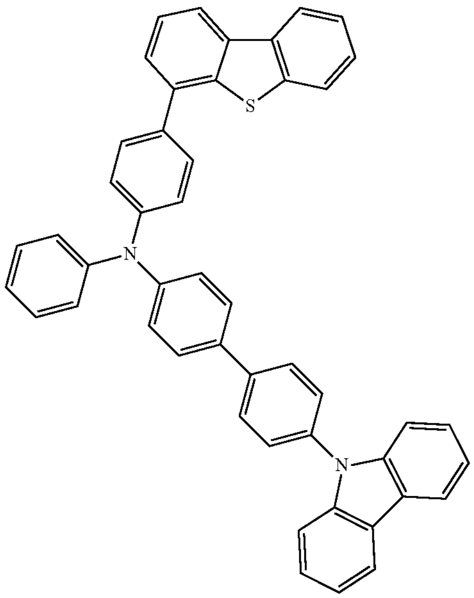
,
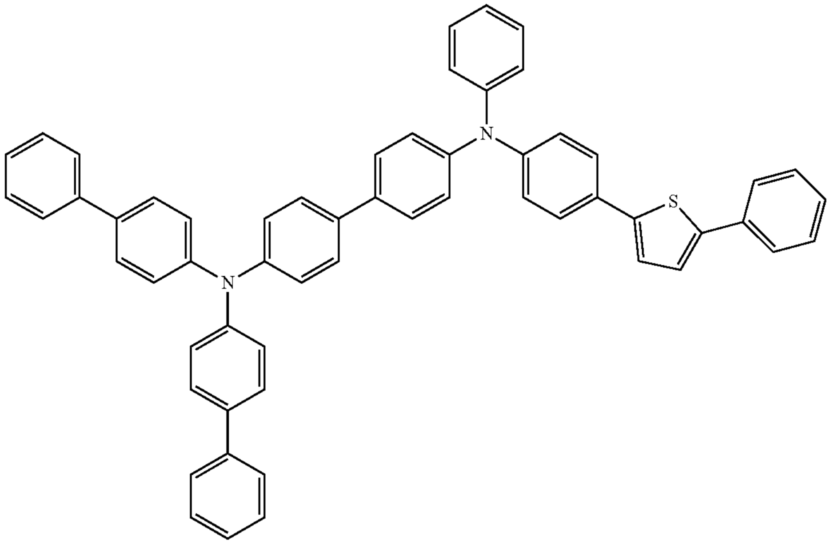
,
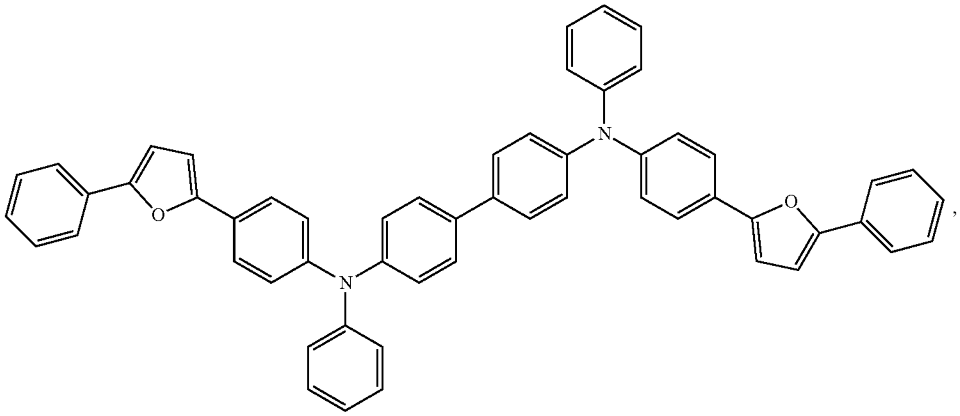
,

-continued
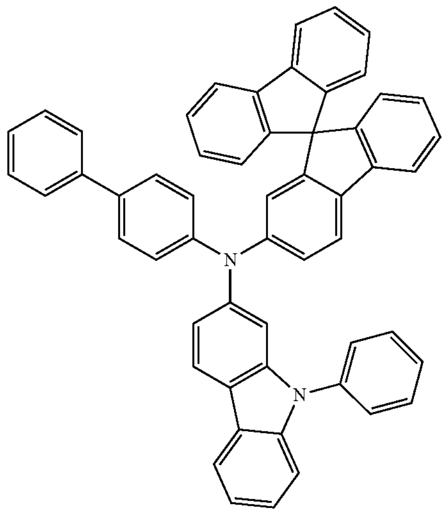
,
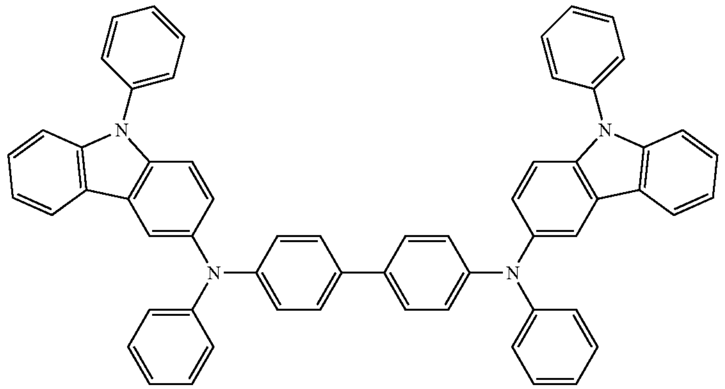
,
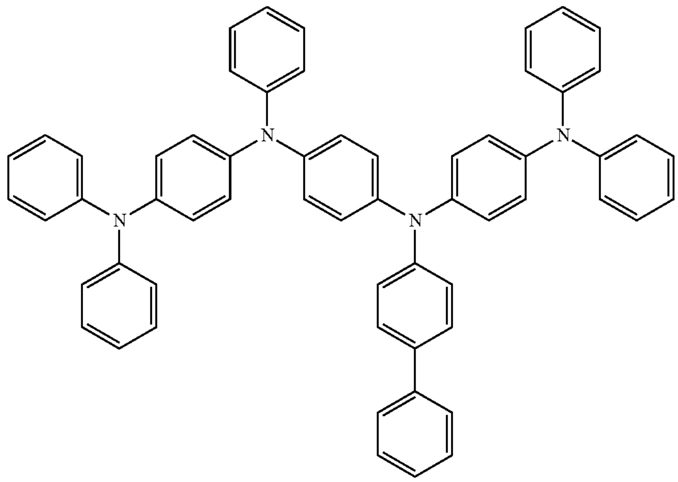
,

-continued
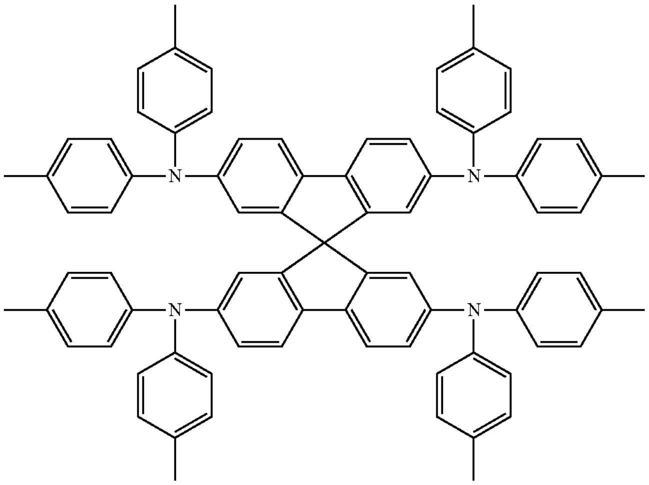
,
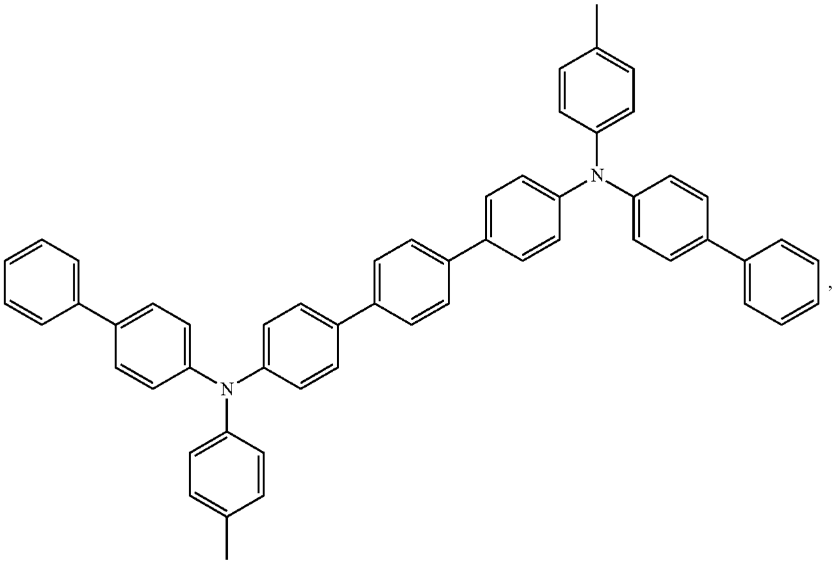
,
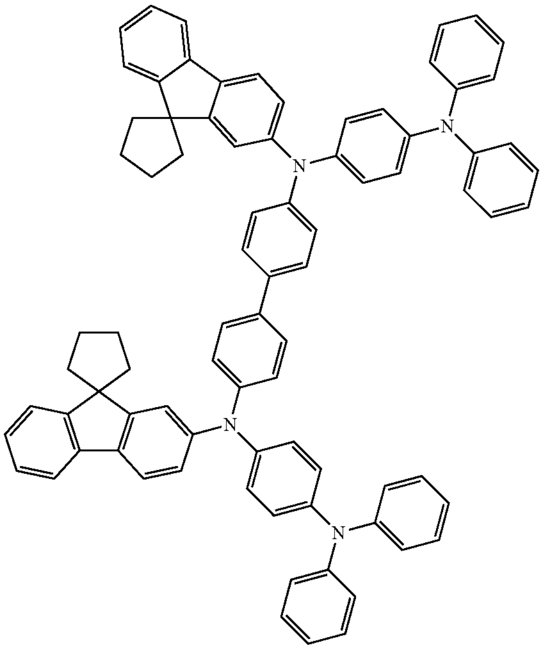
,

-continued
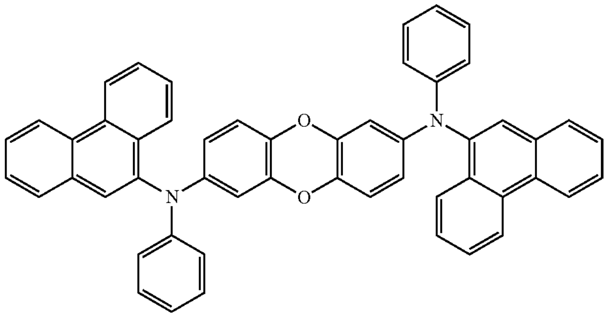
,
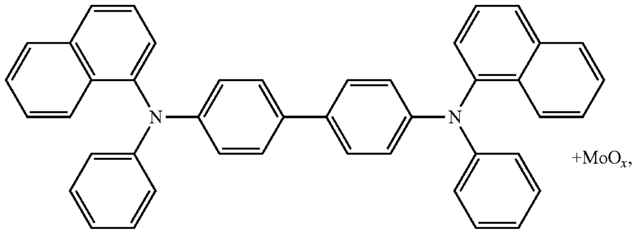
$+MoO_x$,
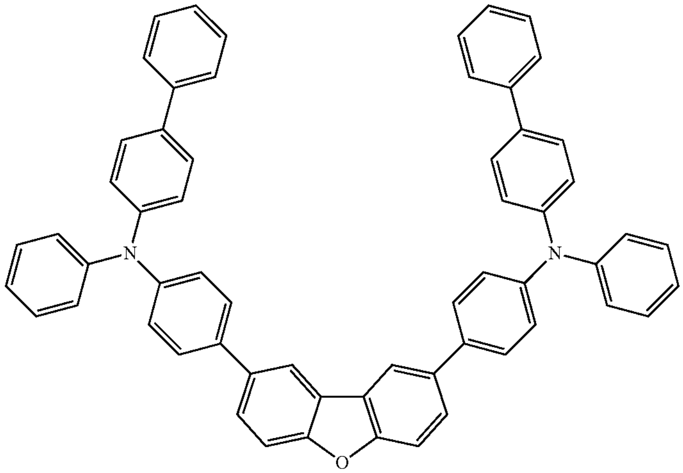
,
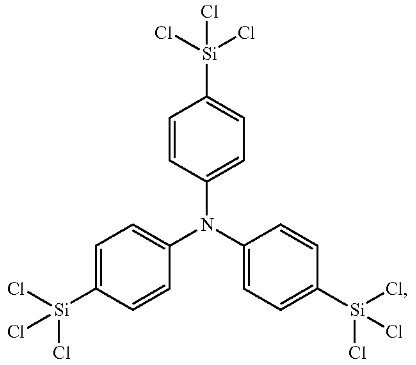
,
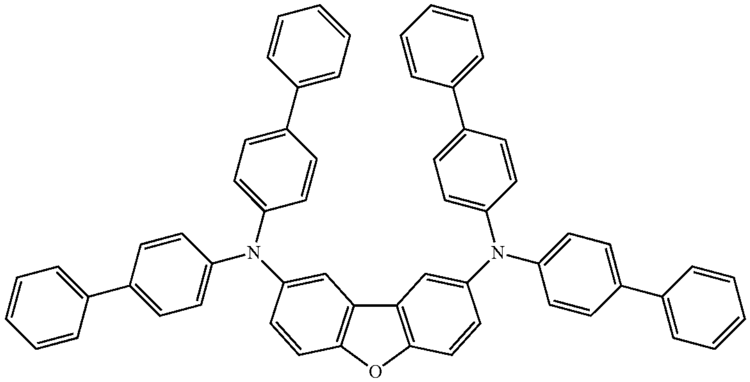
,
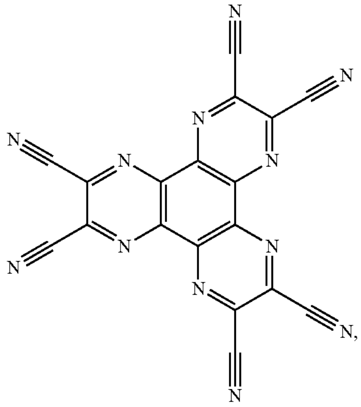
, -continued
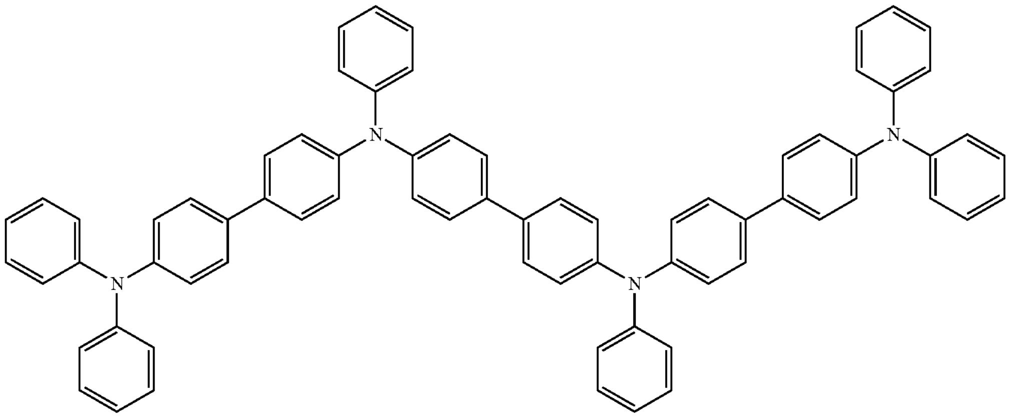
,
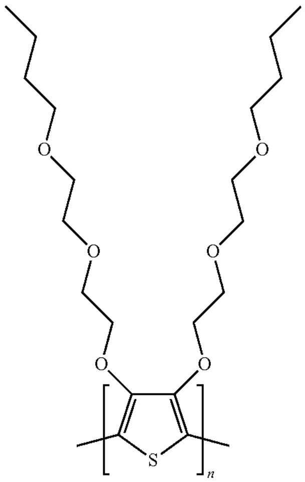
,
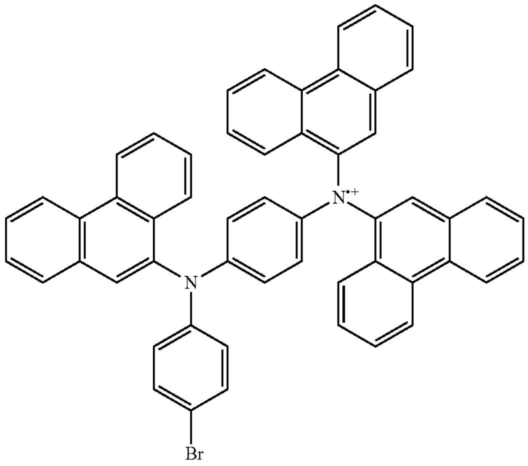
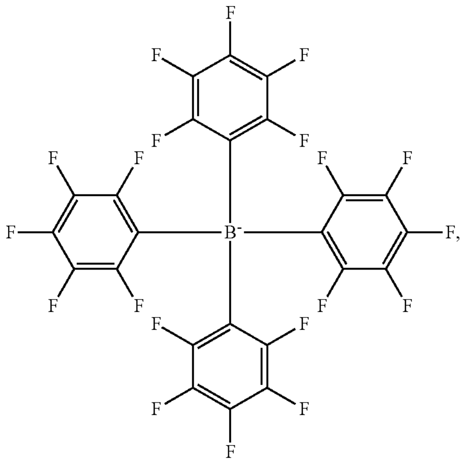
,
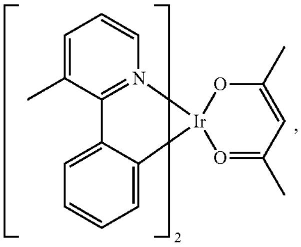
, -continued
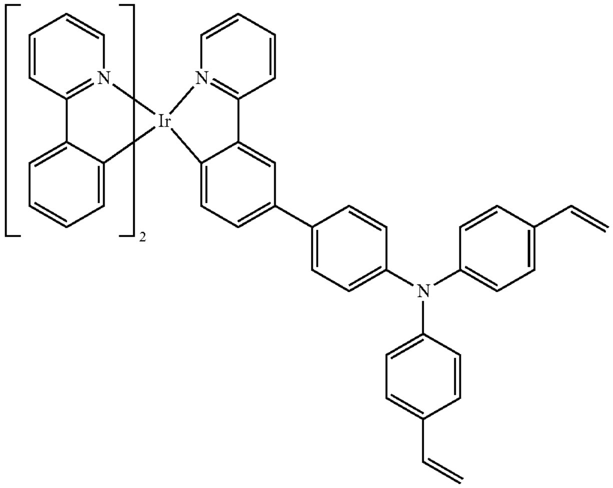
,
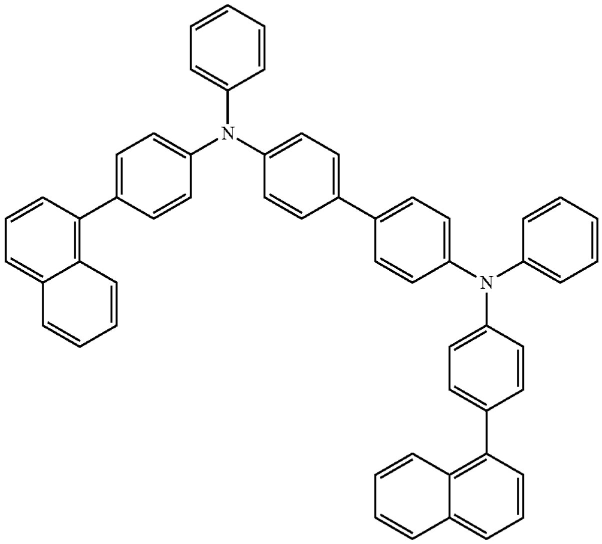
,
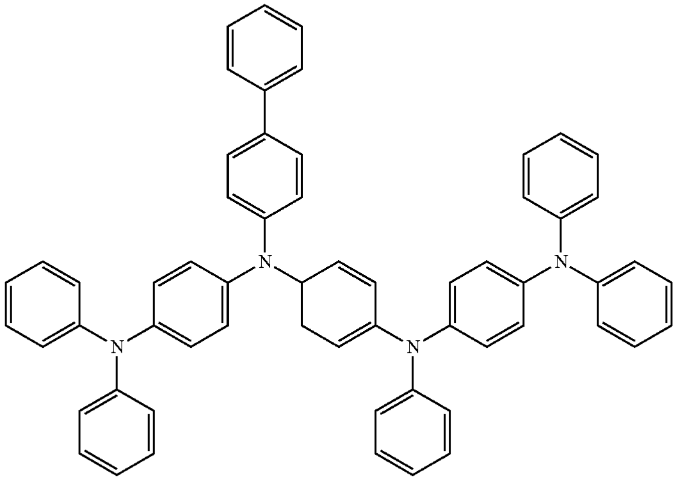
, -continued
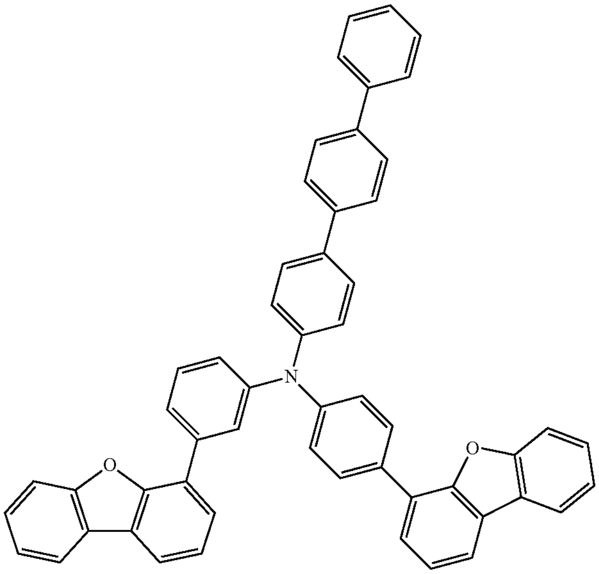
,
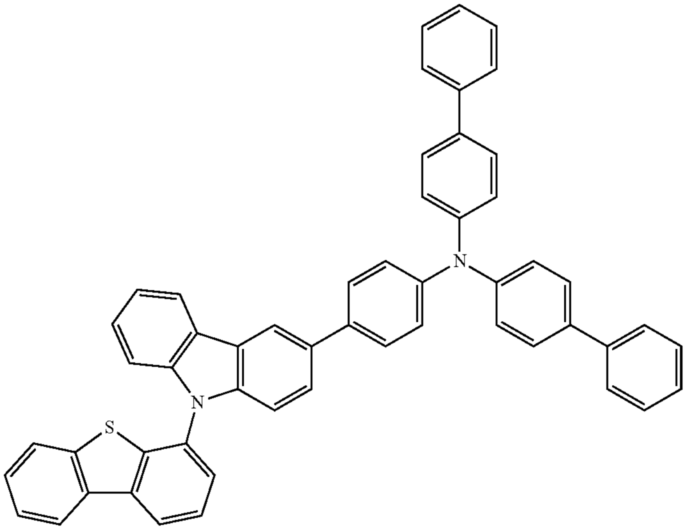
,
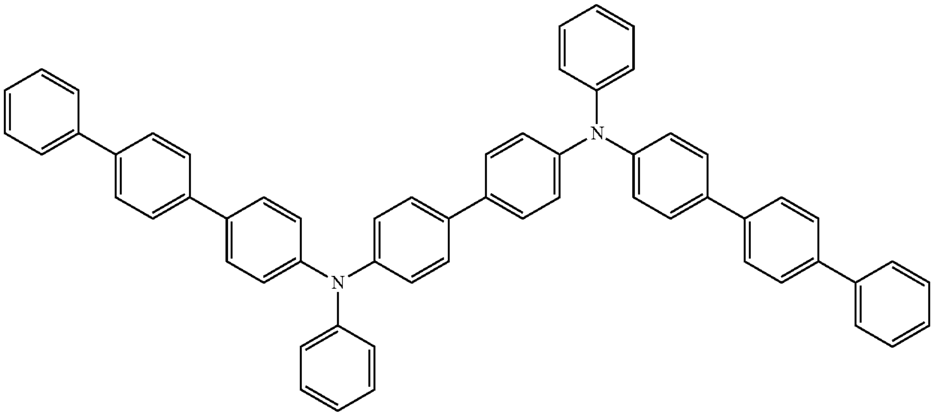
, -continued
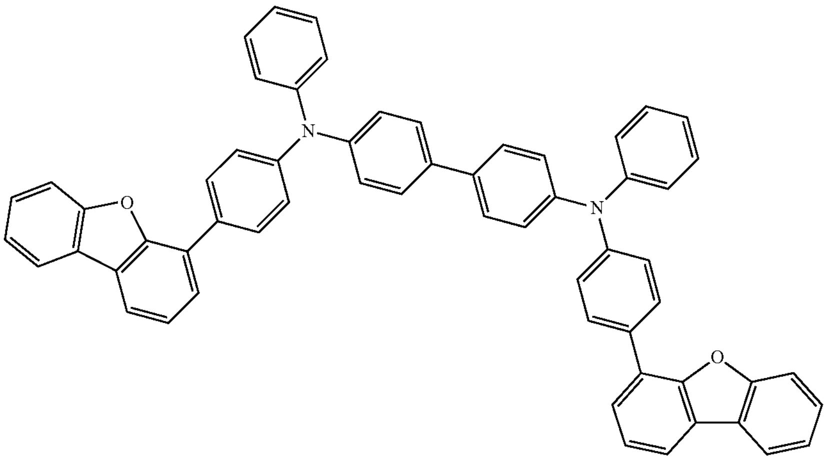
,
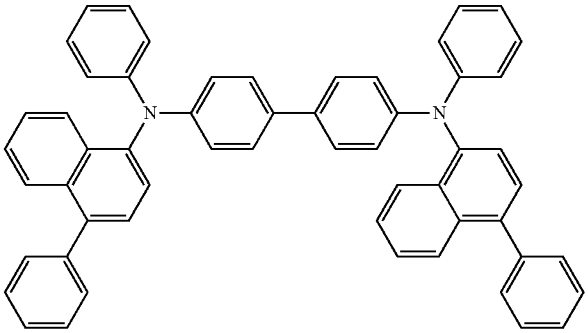
,
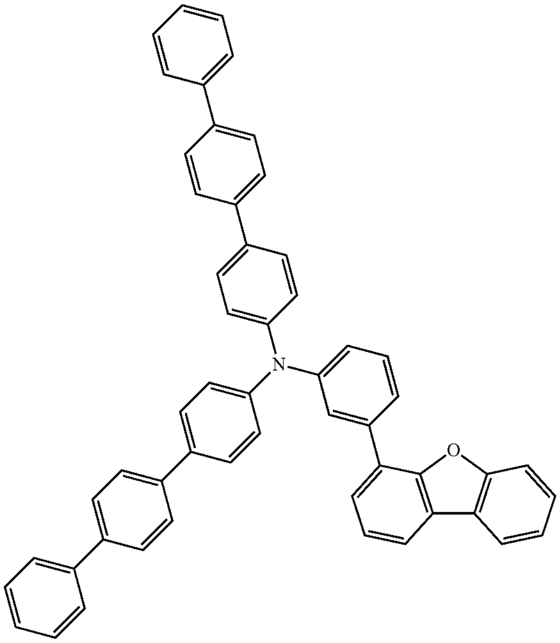
,
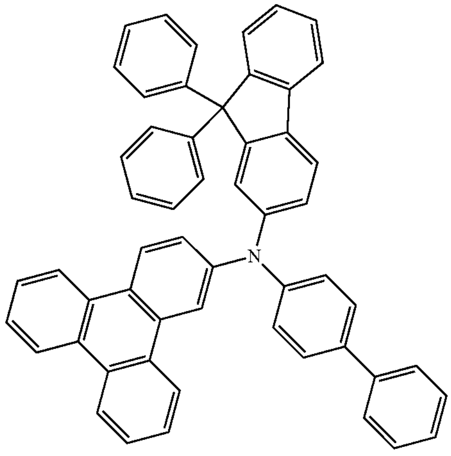
, -continued
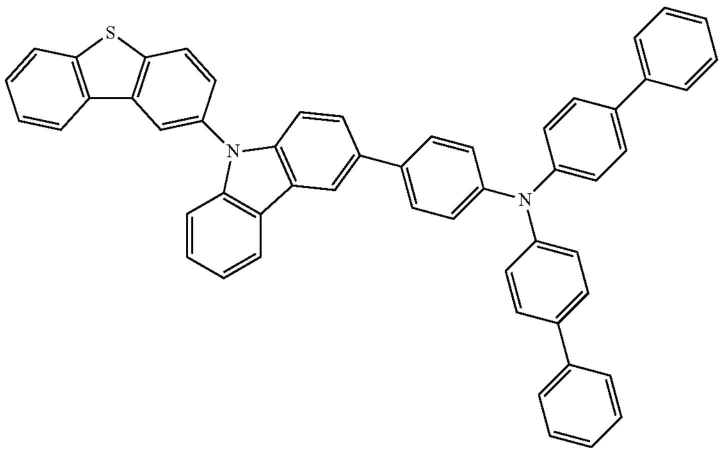
,
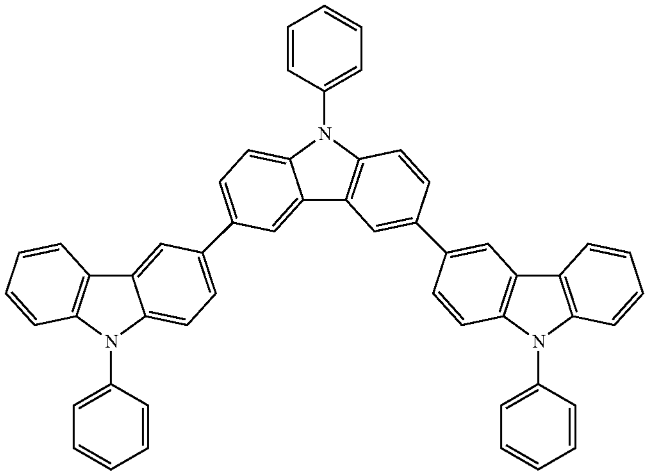
,
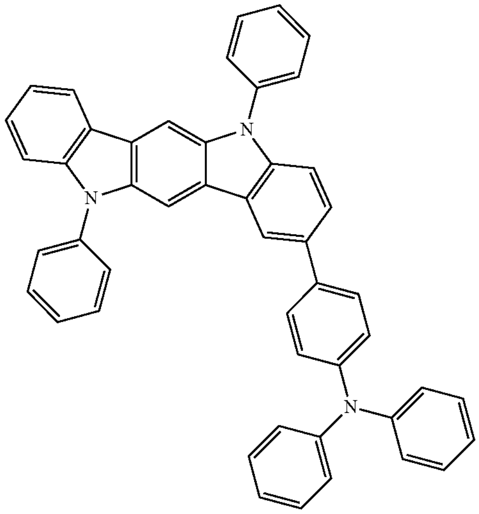
, -continued
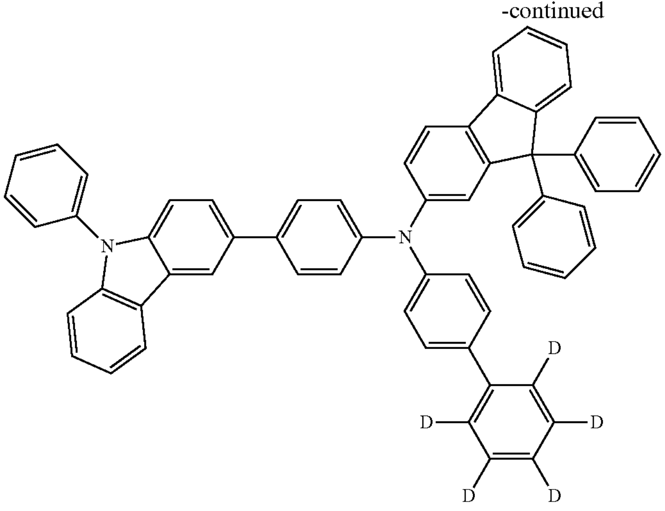
,
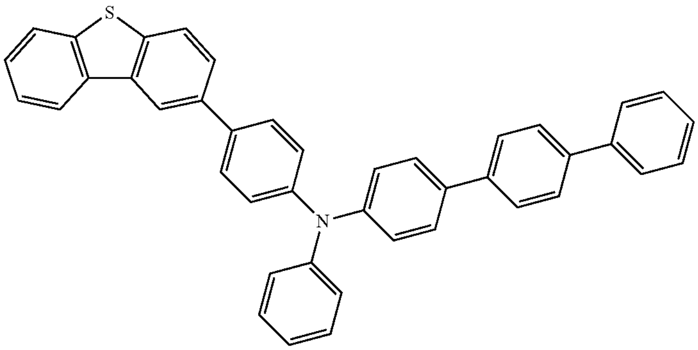
,
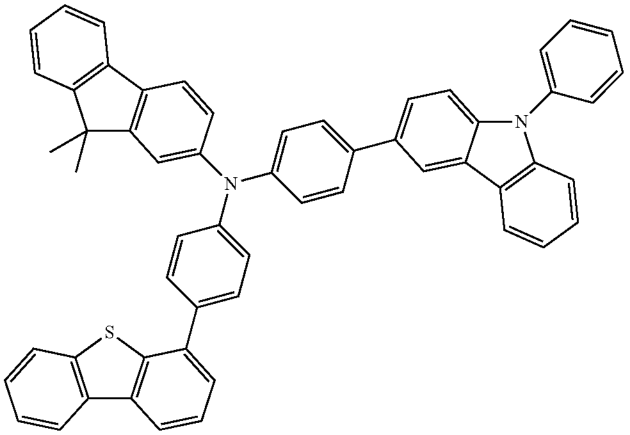
,
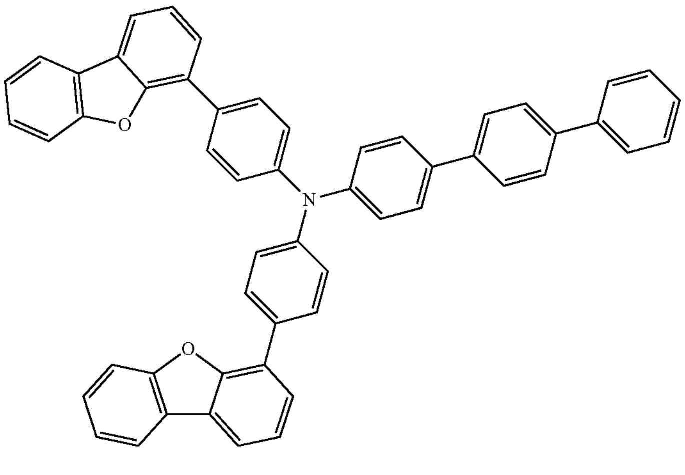
, -continued
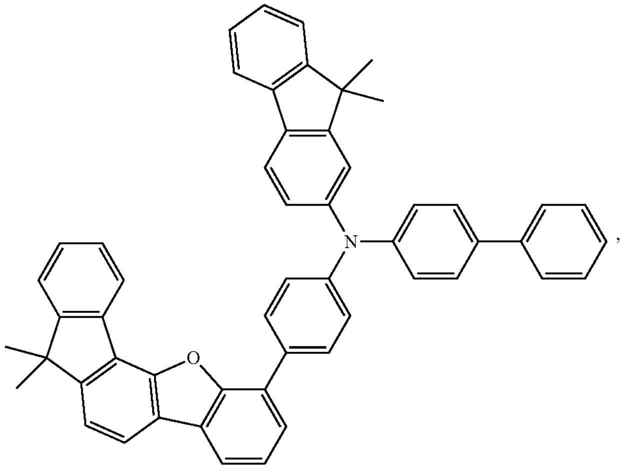
,
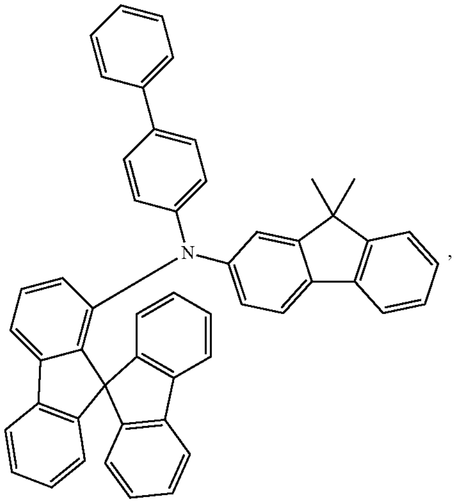
,
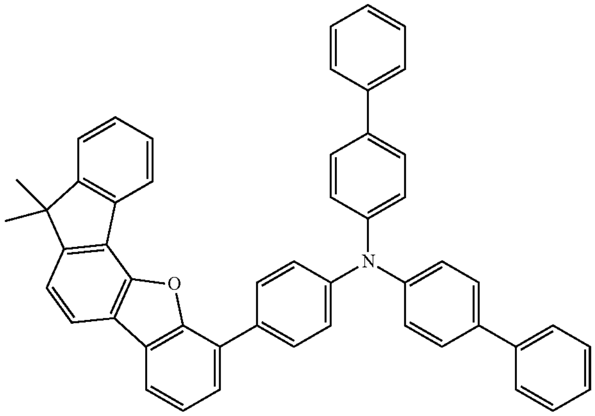
,
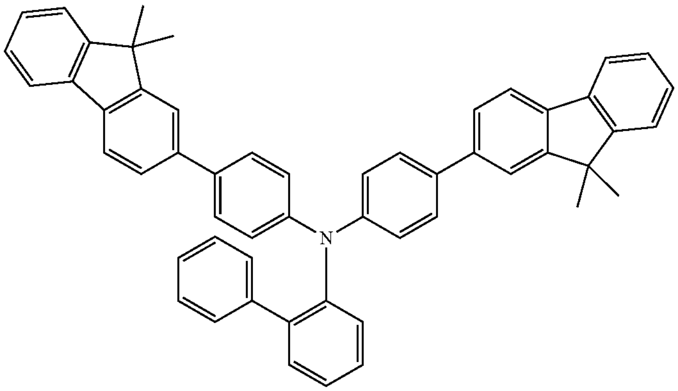
, -continued
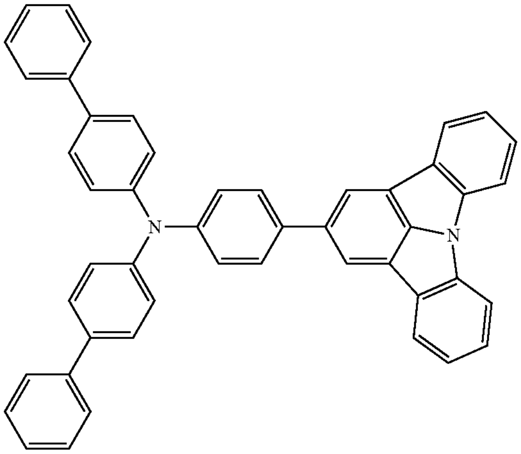
,
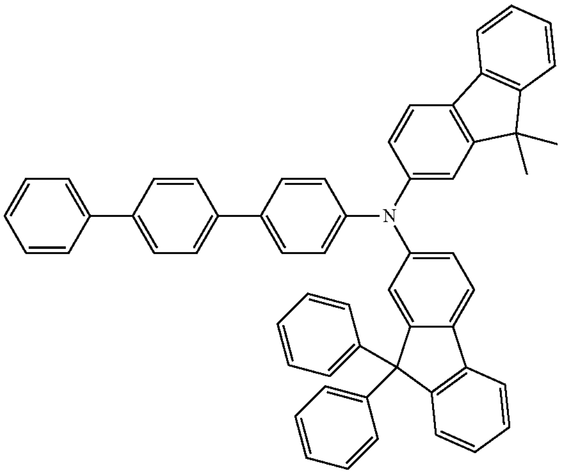
,
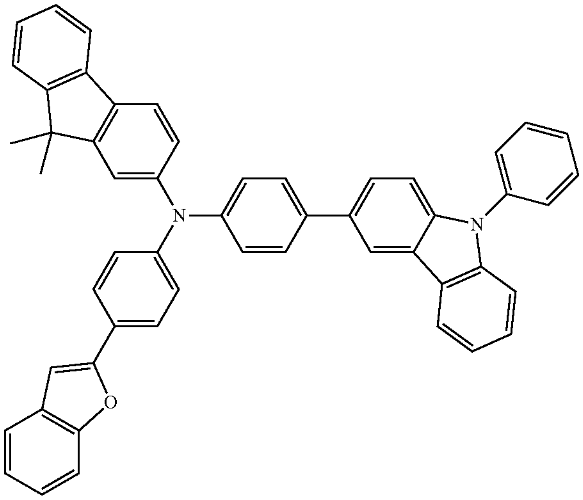
,
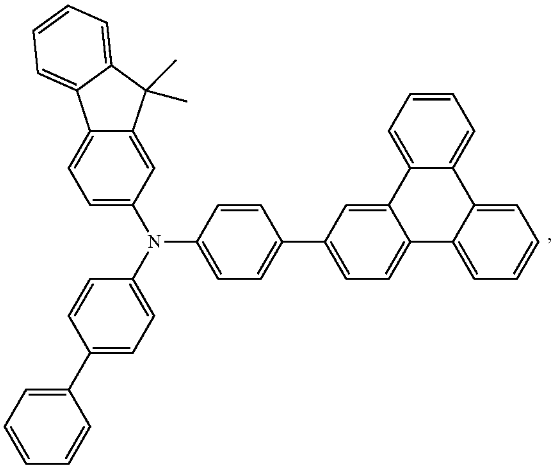
, -continued
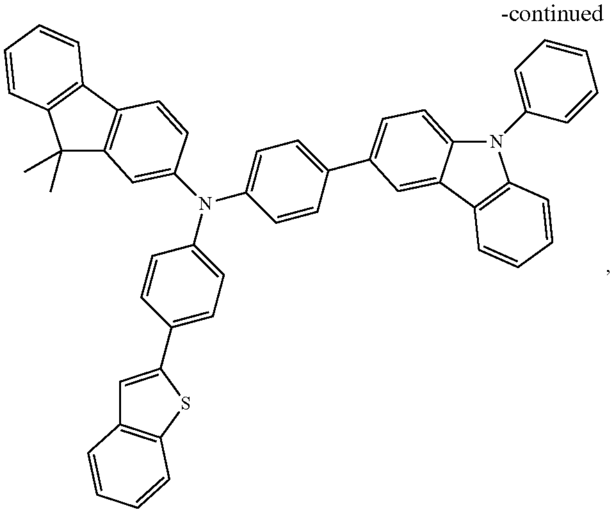
,
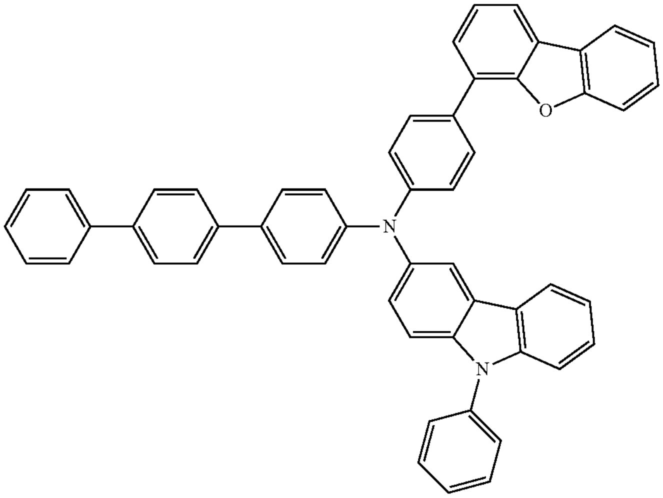
,
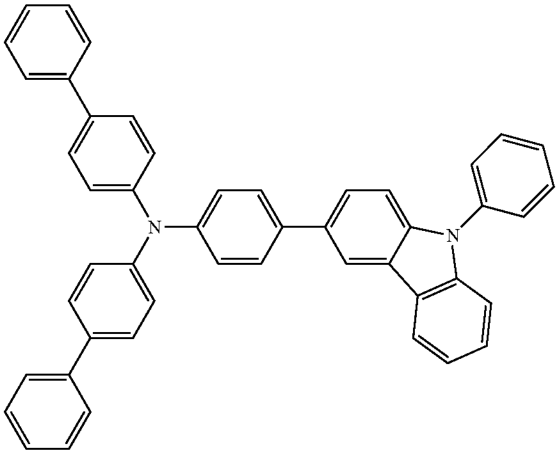
, -continued
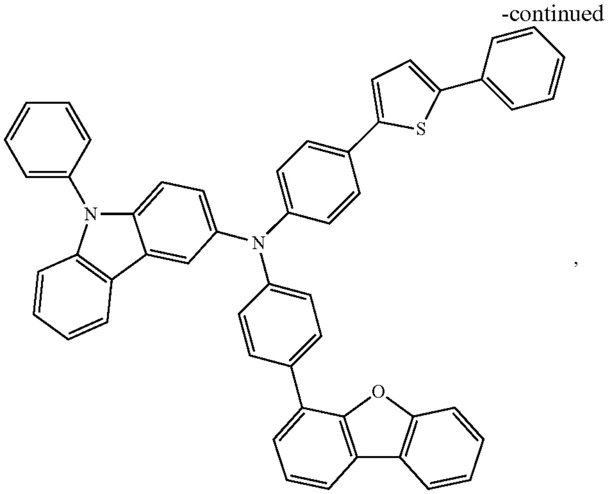
,
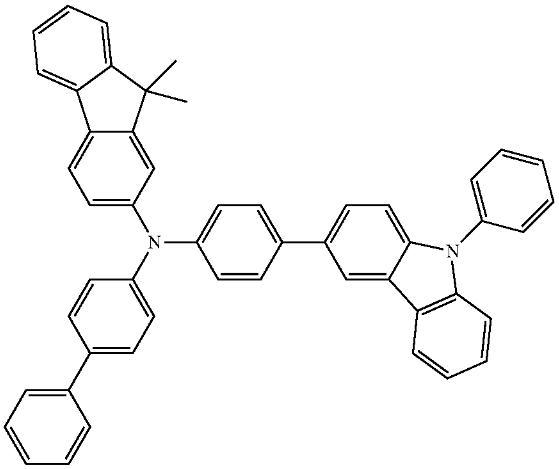
,
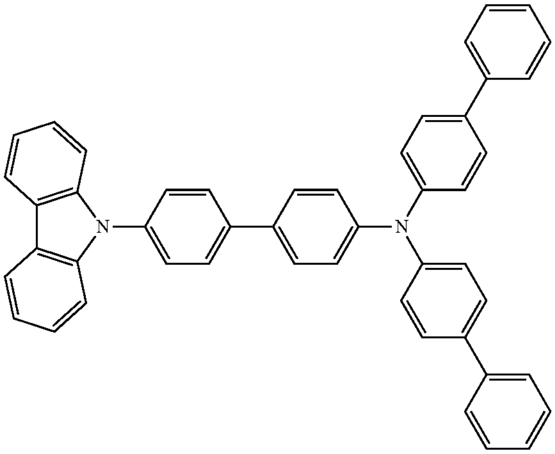
, -continued
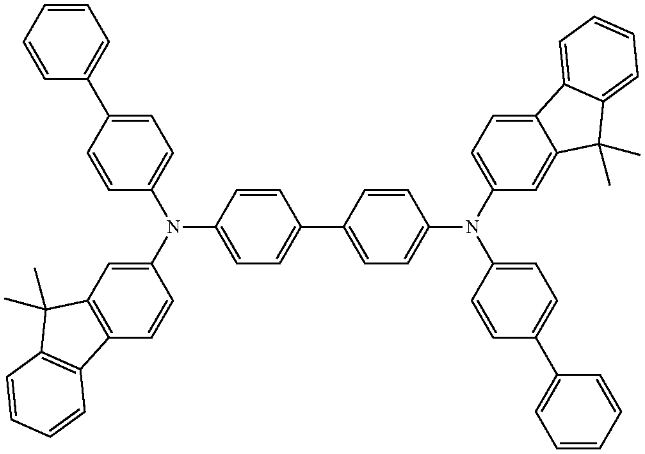
,
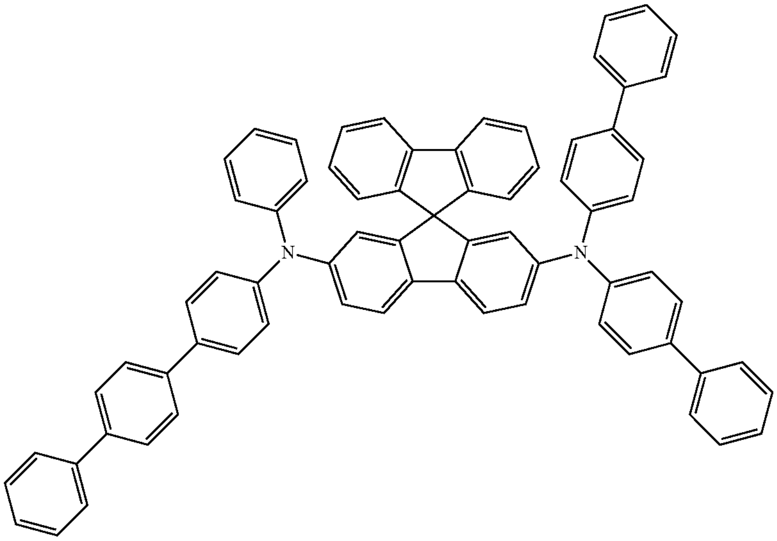
,
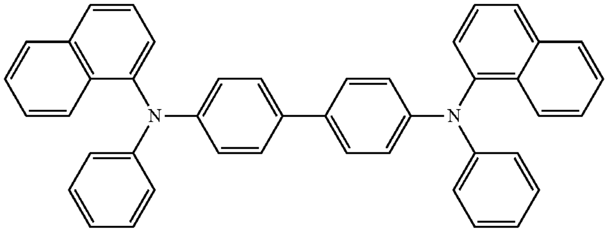
,
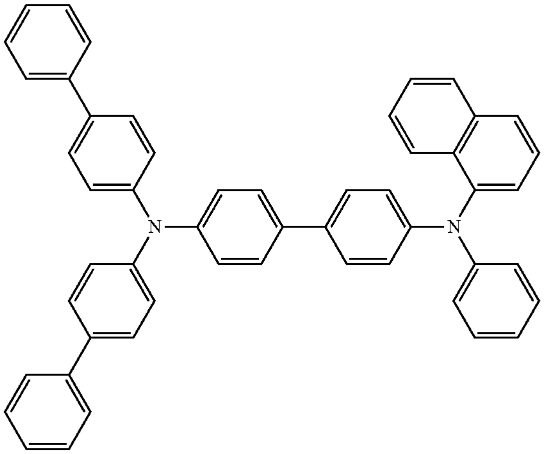
, -continued
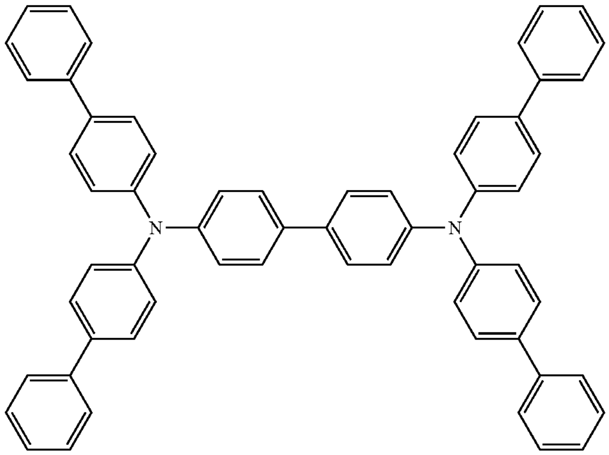
,
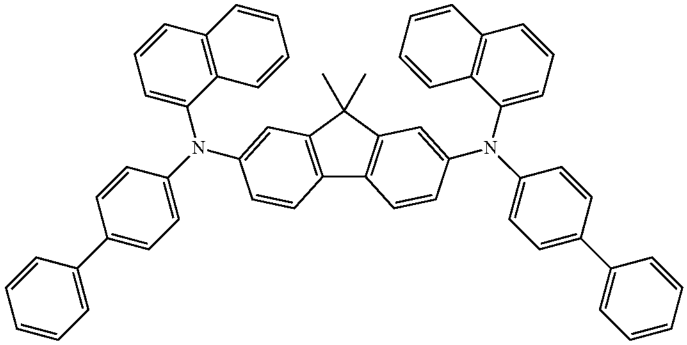
,
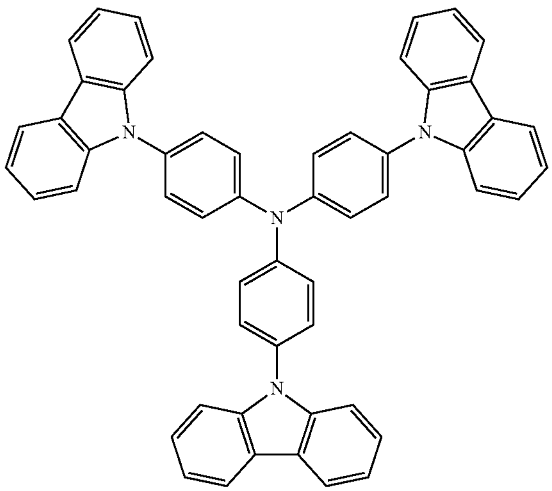
,
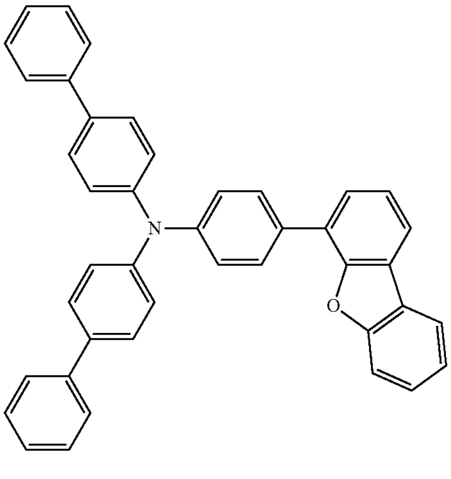
, -continued

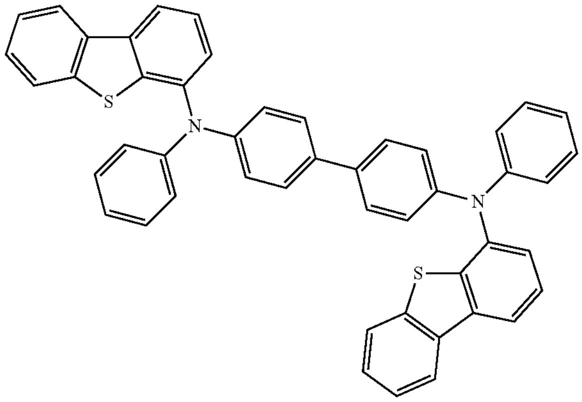

,

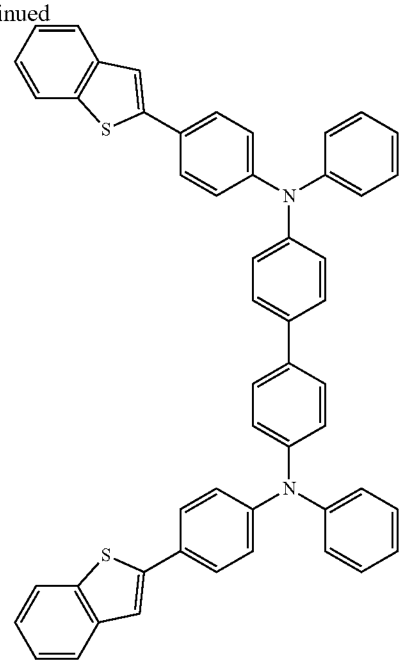

, and

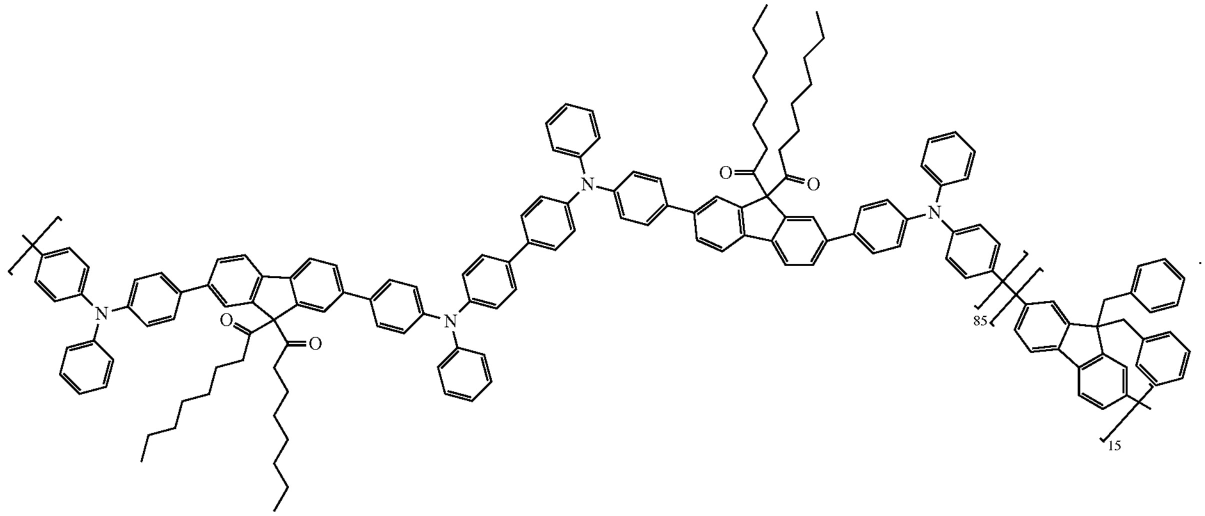

.

EBL:

An electron blocking layer (EBL) may be used to reduce the number of electrons and/or excitons that leave the emissive layer. The presence of such a blocking layer in a device may result in substantially higher efficiencies, and/or longer lifetime, as compared to a similar device lacking a blocking layer. Also, a blocking layer may be used to confine emission to a desired region of an OLED. In some embodiments, the EBL material has a higher LUMO (closer to the vacuum level) and/or higher triplet energy than the emitter closest to the EBL interface. In some embodiments, the EBL material has a higher LUMO (closer to the vacuum level) and/or higher triplet energy than one or more of the hosts closest to the EBL interface. In one aspect, the compound used in EBL contains the same molecule or the same functional groups used as one of the hosts described below.

Host:

The light emitting layer of the organic EL device of the present invention preferably contains at least a metal complex as light emitting material, and may contain a host material using the metal complex as a dopant material. Examples of the host material are not particularly limited, and any metal complexes or organic compounds may be used as long as the triplet energy of the host is larger than that of the dopant. Any host material may be used with any dopant so long as the triplet criteria is satisfied.

Examples of metal complexes used as host are preferred to have the following general formula:

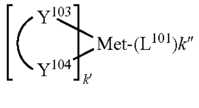

wherein Met is a metal; ($Y^{103}$-$Y^{104}$) is a bidentate ligand, $Y^{103}$ and $Y^{104}$ are independently selected from C, N, O, P, and S; $L^{101}$ is an another ligand; k' is an integer value from 1 to the maximum number of ligands that may be attached to the metal; and k'+k" is the maximum number of ligands that may be attached to the metal.

In one aspect, the metal complexes are:

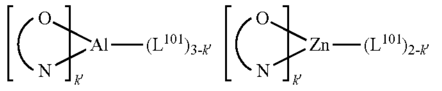

wherein (O—N) is a bidentate ligand, having metal coordinated to atoms O and N.

In another aspect, Met is selected from Ir and Pt. In a further aspect, ($Y^{103}$-$Y^{104}$) is a carbene ligand.

In one aspect, the host compound contains at least one of the following groups selected from the group consisting of aromatic hydrocarbon cyclic compounds such as benzene, biphenyl, triphenyl, triphenylene, tetraphenylene, naphthalene, anthracene, phenalene, phenanthrene, fluorene, pyrene, chrysene, perylene, and azulene; the group consisting of aromatic heterocyclic compounds such as dibenzothiophene, dibenzofuran, dibenzoselenophene, furan, thiophene, benzofuran, benzothiophene, benzoselenophene, carbazole, indolocarbazole, pyridylindole, pyrrolodipyridine, pyrazole, imidazole, triazole, oxazole, thiazole, oxadiazole, oxatriazole, dioxazole, thiadiazole, pyridine, pyridazine, pyrimidine, pyrazine, triazine, oxazine, oxathiazine, oxadiazine, indole, benzimidazole, indazole, indoxazine, benzoxazole, benzisoxazole, benzothiazole, quinoline, isoquinoline, cinnoline, quinazoline, quinoxaline, naphthyridine, phthalazine, pteridine, xanthene, acridine, phenazine, phenothiazine, phenoxazine, benzofuropyridine, furodipyridine, benzothienopyridine, thienodipyridine, benzoselenophenopyridine, and selenophenodipyridine; and the group consisting of 2 to 10 cyclic structural units which are groups of the same type or different types selected from the aromatic hydrocarbon cyclic group and the aromatic heterocyclic group and are bonded to each other directly or via at least one of oxygen atom, nitrogen atom, sulfur atom, silicon atom, phosphorus atom, boron atom, chain structural unit and the aliphatic cyclic group. Each option within each group may be unsubstituted or may be substituted by a substituent selected from the group consisting of deuterium, halogen, alkyl, cycloalkyl, heteroalkyl, heterocycloalkyl, arylalkyl, alkoxy, aryloxy, amino, silyl, alkenyl, cycloalkenyl, heteroalkenyl, alkynyl, aryl, heteroaryl, acyl, carboxylic acids, ether, ester, nitrile, isonitrile, sulfanyl, sulfinyl, sulfonyl, phosphino, and combinations thereof.

In one aspect, the host compound contains at least one of the following groups in the molecule:

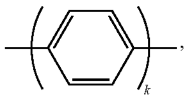,
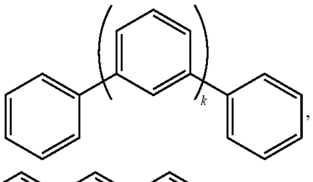,
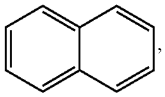,
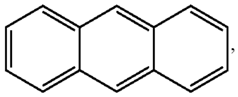,
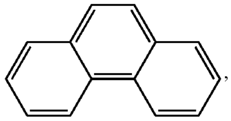,

-continued

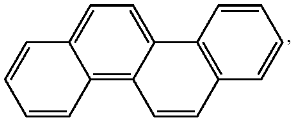,
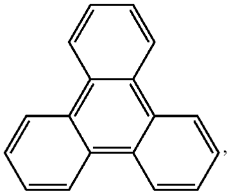,
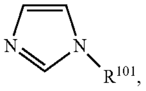,
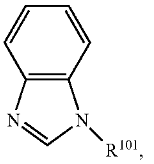,
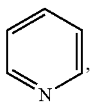,
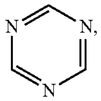,
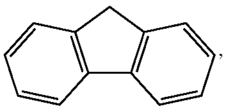,
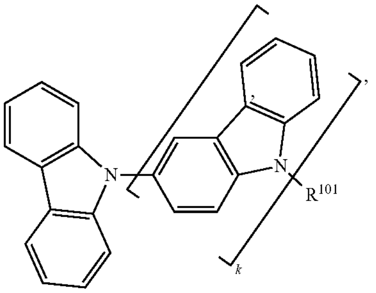,
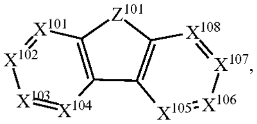,
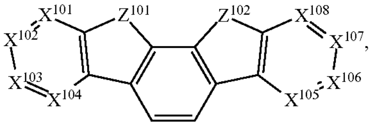,
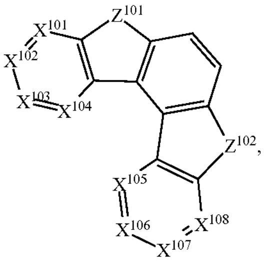,
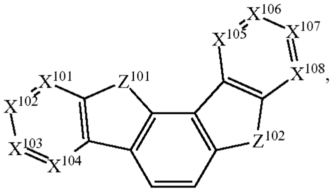, -continued

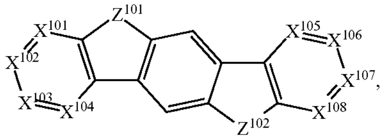

and

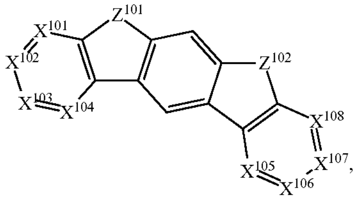

wherein $R^{101}$ is selected from the group consisting of hydrogen, deuterium, halogen, alkyl, cycloalkyl, heteroalkyl, heterocycloalkyl, arylalkyl, alkoxy, aryloxy, amino, silyl, alkenyl, cycloalkenyl, heteroalkenyl, alkynyl, aryl, heteroaryl, acyl, carboxylic acids, ether, ester, nitrile, isonitrile, sulfanyl, sulfinyl, sulfonyl, phosphino, and combinations thereof, and when it is aryl or heteroaryl, it has the similar definition as Ar's mentioned above. k is an integer from 0 to 20 or 1 to 20. $X^{101}$ to $X^{108}$ are independently selected from C (including CH) or N. $Z^{101}$ and $Z^{102}$ are independently selected from $NR^{101}$, O, or S.

Non-limiting examples of the host materials that may be used in an OLED in combination with materials disclosed herein are exemplified below together with references that disclose those materials: EP2034538, EP2034538A, EP2757608, JP2007254297, KR20100079458, KR20120088644, KR20120129733, KR20130115564, TW201329200, US20030175553, US20050238919, US20060280965, US20090017330, US20090030202, US20090167162, US20090302743, US20090309488, US20100012931, US20100084966, US20100187984, US2010187984, US2012075273, US2012126221, US2013009543, US2013105787, US2013175519, US2014001446, US20140183503, US20140225088, US2014034914, U.S. Pat. No. 7,154,114, WO2001039234, WO2004093207, WO2005014551, WO2005089025, WO2006072002, WO2006114966, WO2007063754, WO2008056746, WO2009003898, WO2009021126, WO2009063833, WO2009066778, WO2009066779, WO2009086028, WO2010056066, WO2010107244, WO2011081423, WO2011081431, WO2011086863, WO2012128298, WO2012133644, WO2012133649, WO2013024872, WO2013035275, WO2013081315, WO2013191404, WO2014142472, US20170263869, US20160163995, U.S. Pat. No. 9,466,803,

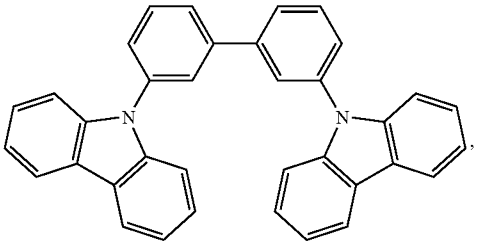

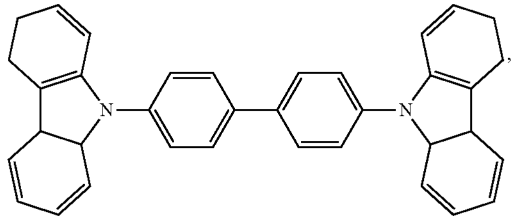

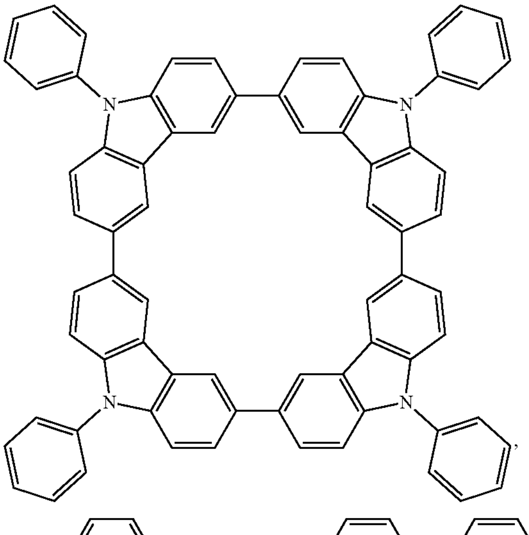

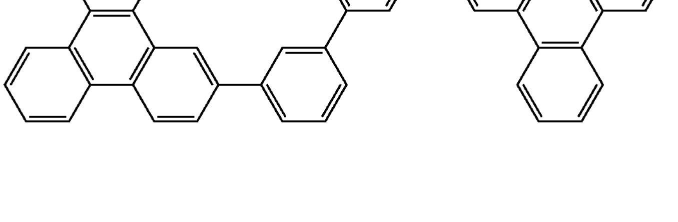

-continued
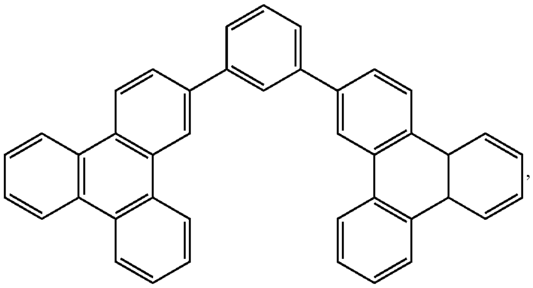
,
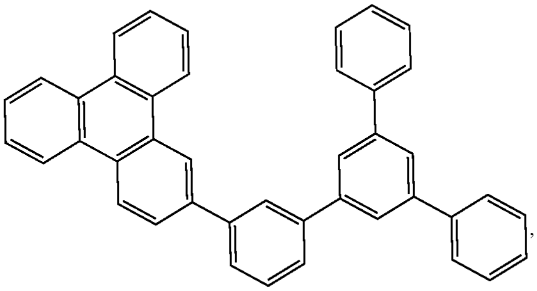
,
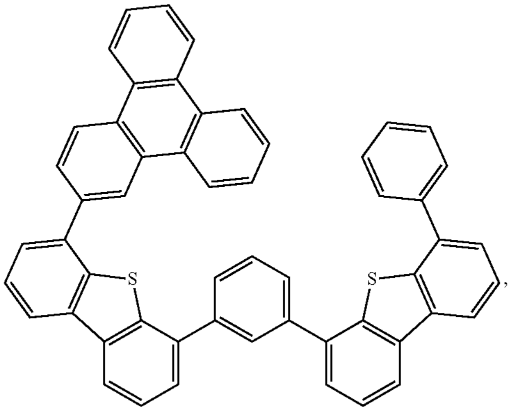
,
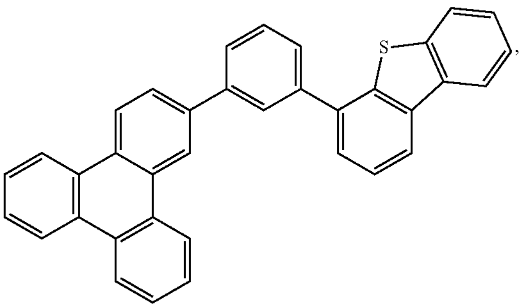
,
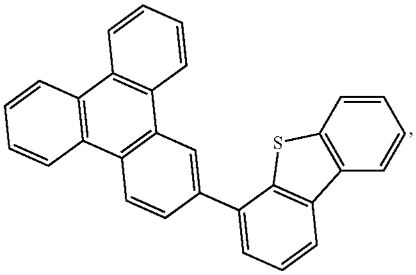
,
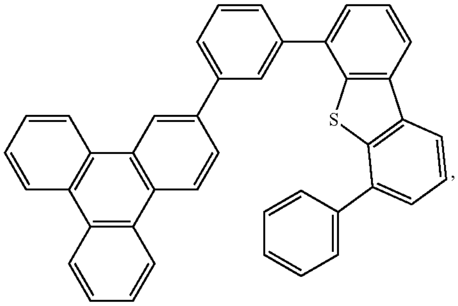
,
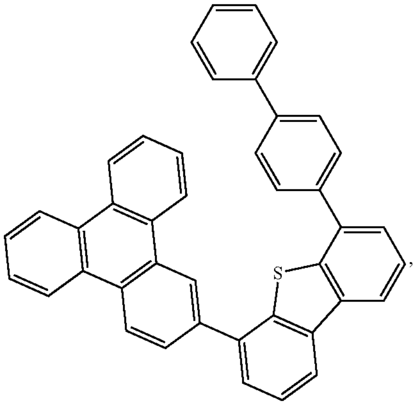
,
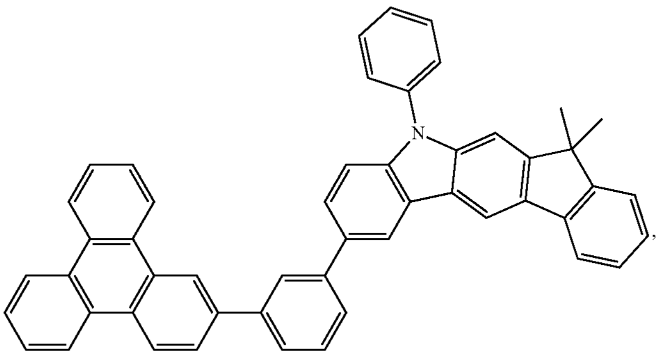
, -continued
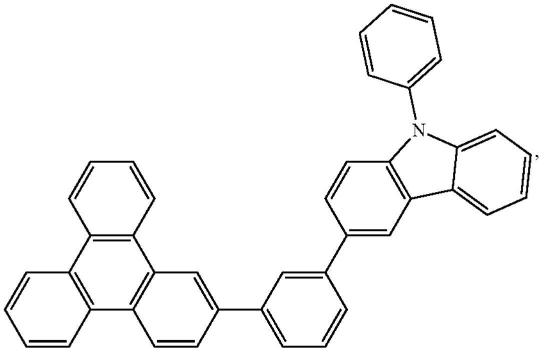
,
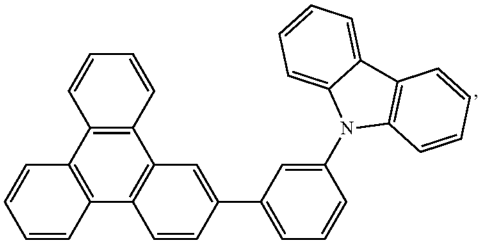
,
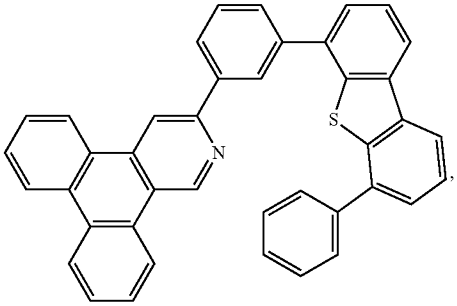
,
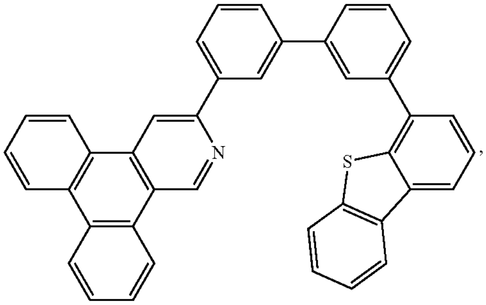
,
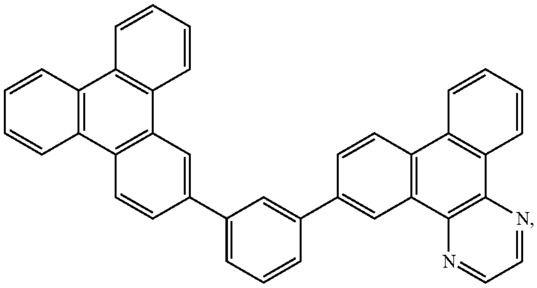
,
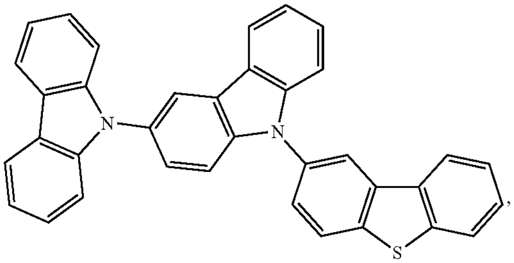
,
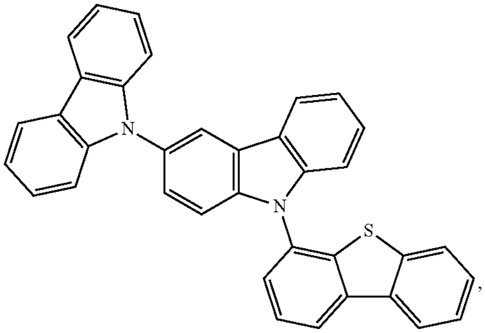
,
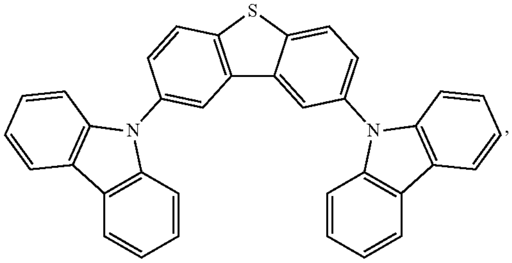
,
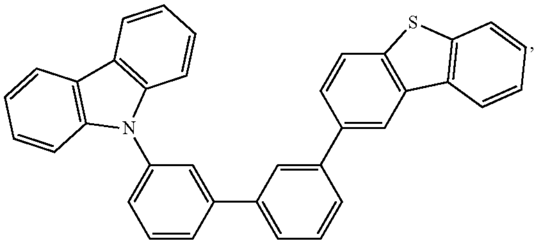
,
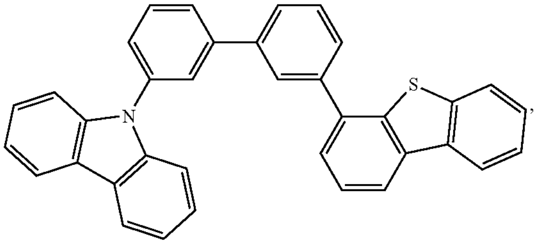
, -continued
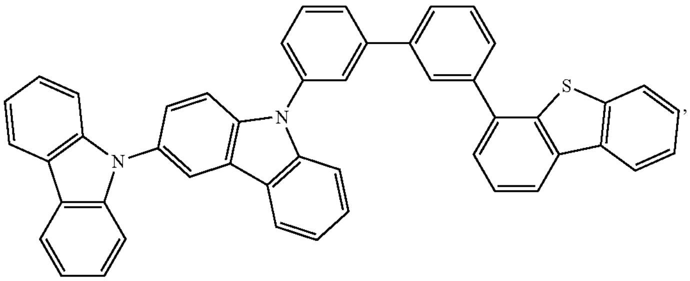
,
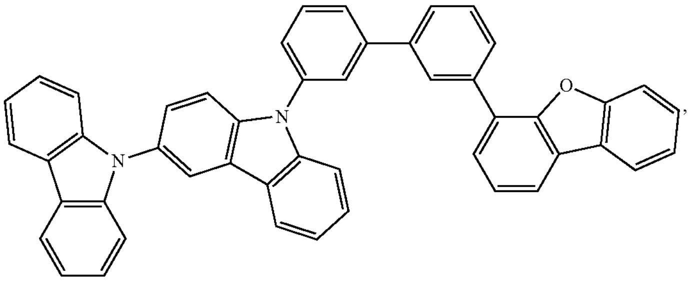
,
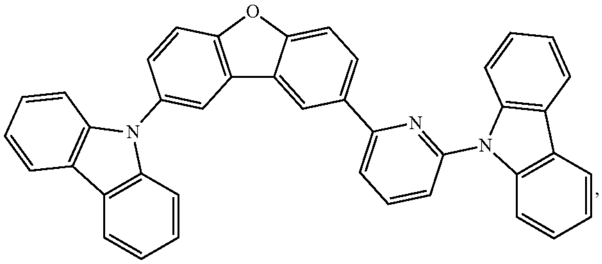
,
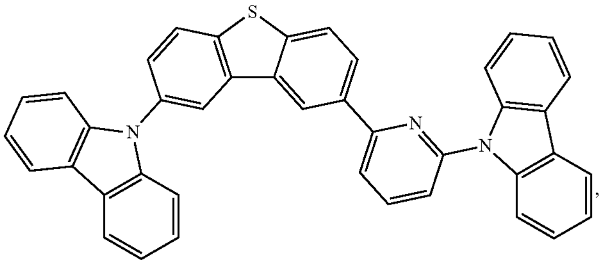
,
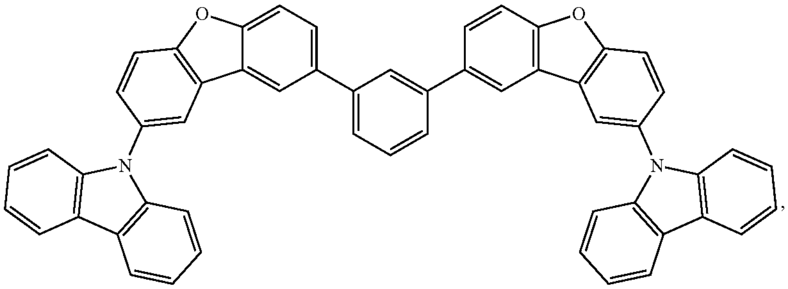
,
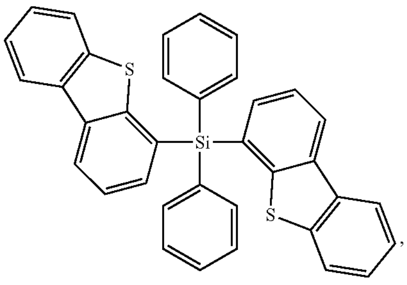
,
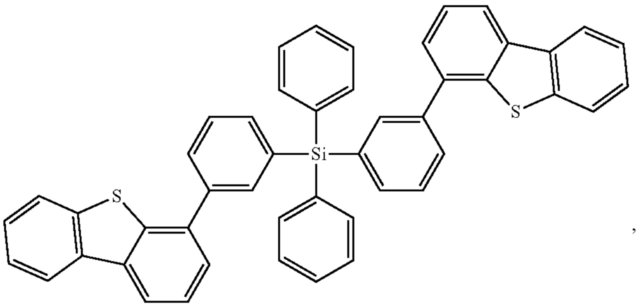
, -continued
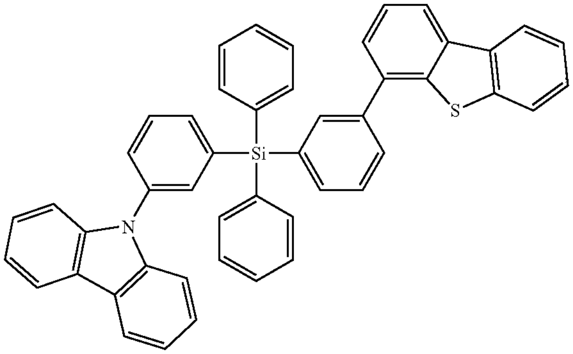
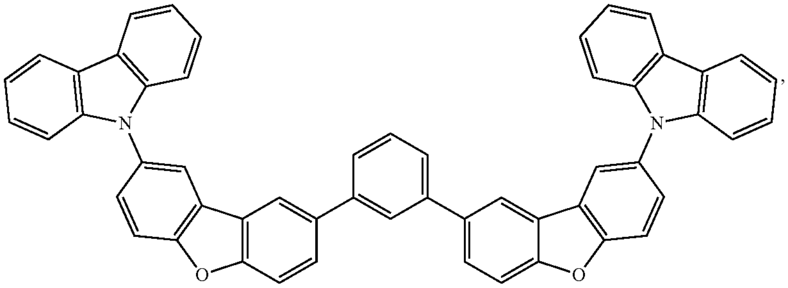
,
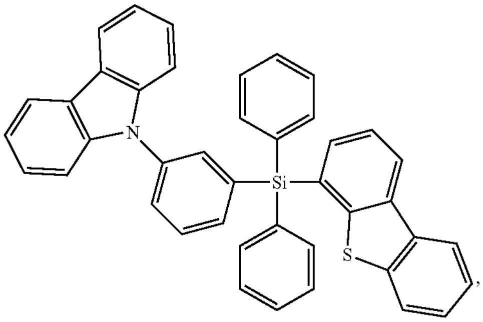
,
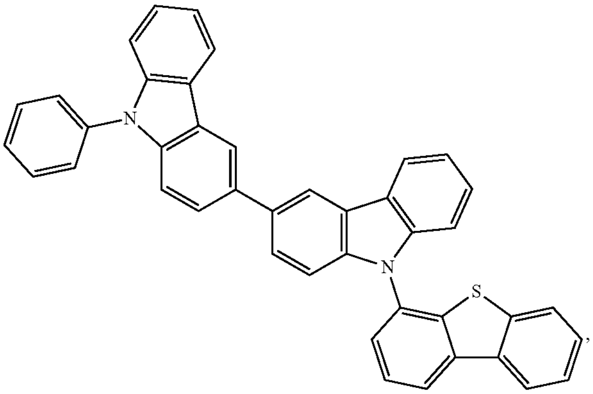
,
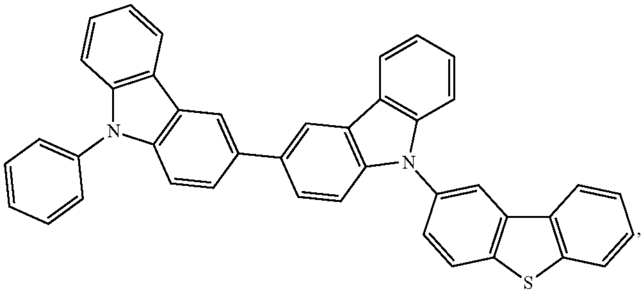
,
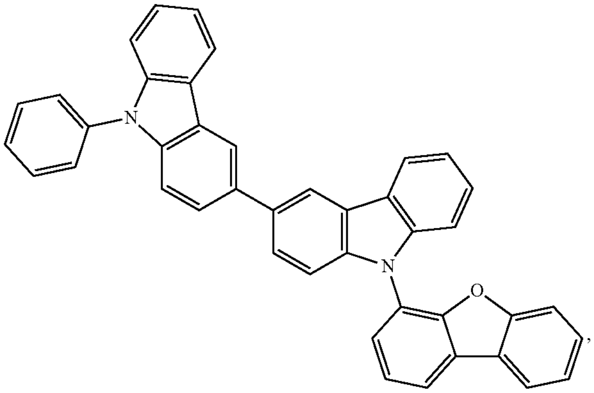
, -continued
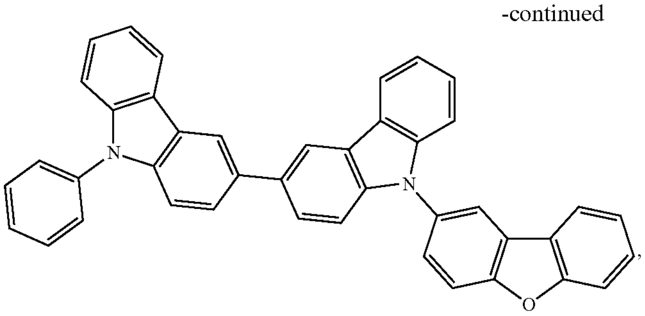
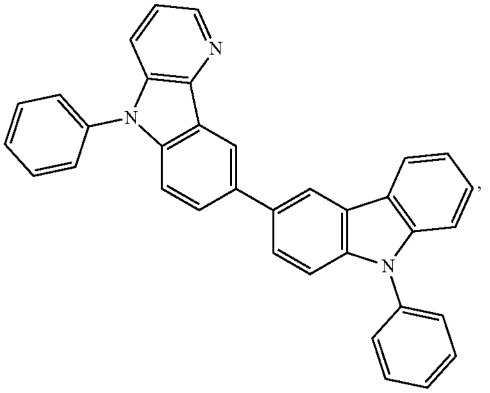
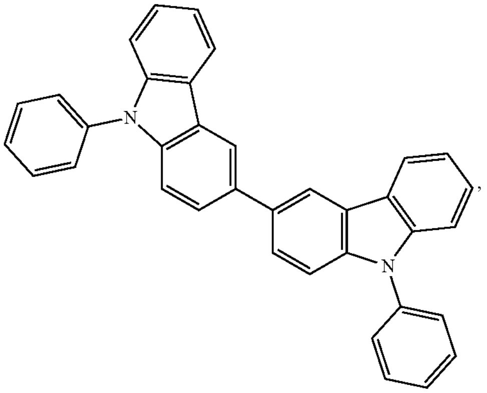
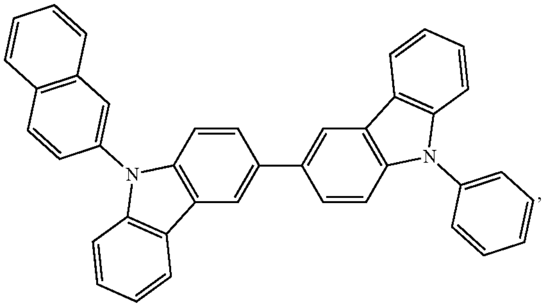
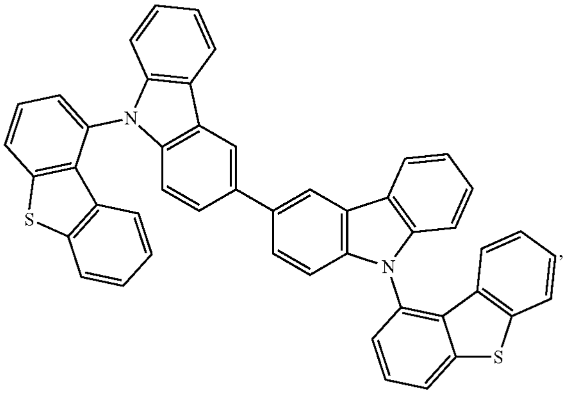
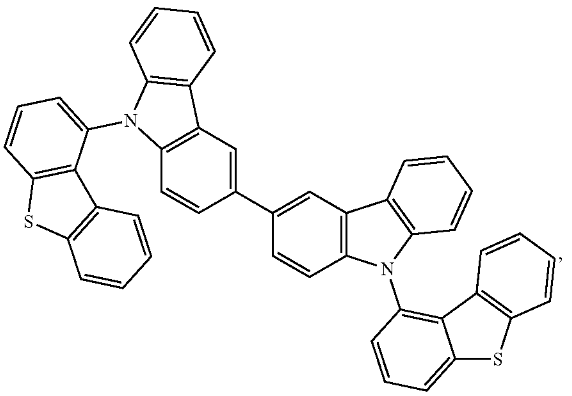

-continued
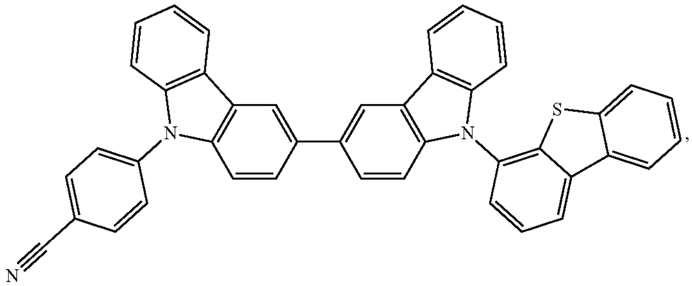
,
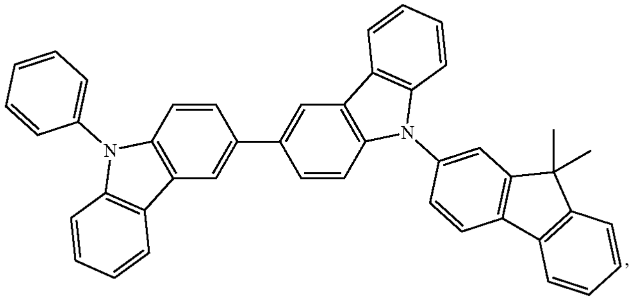
,
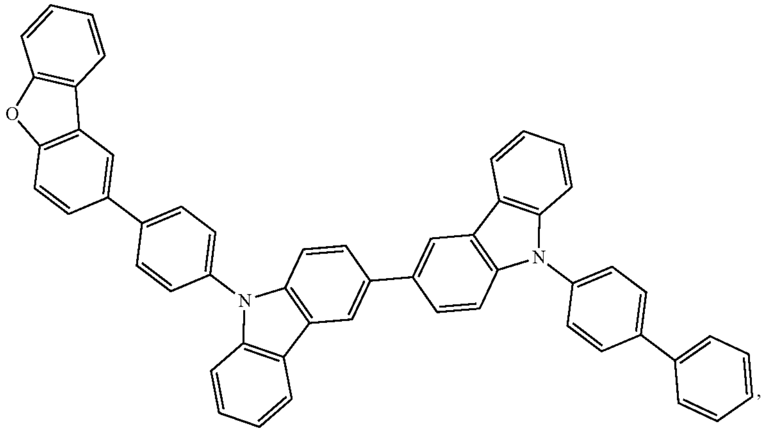
,
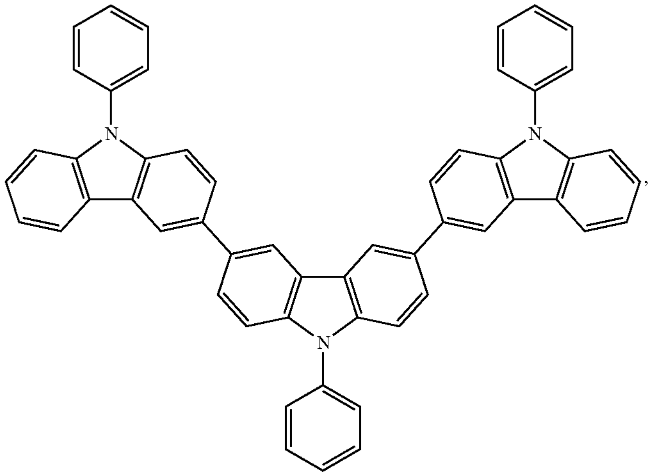
,

-continued
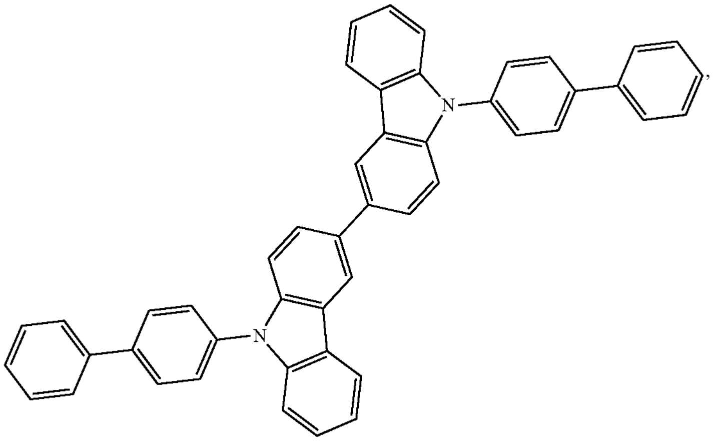
,
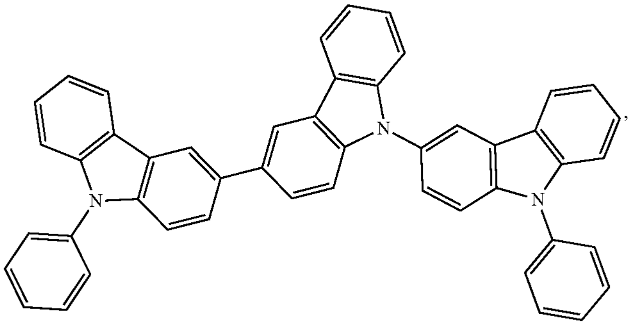
,
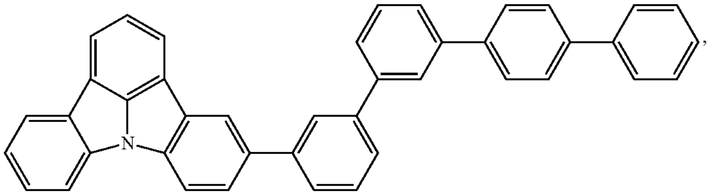
,
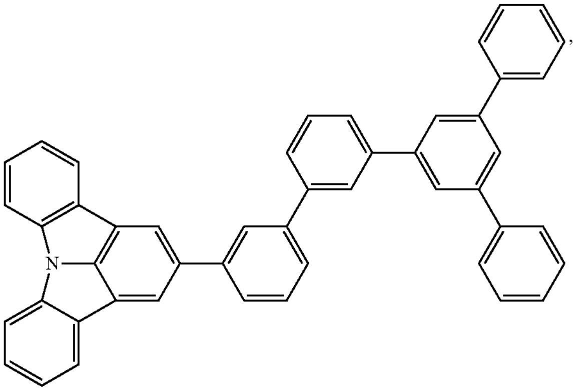
,
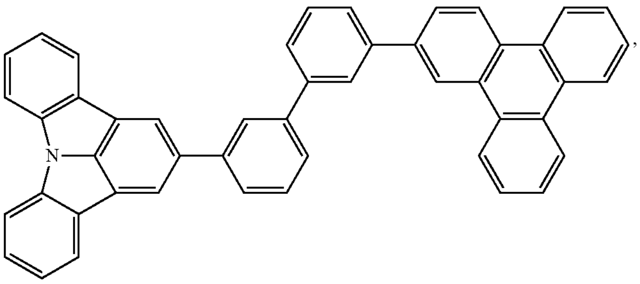
, -continued
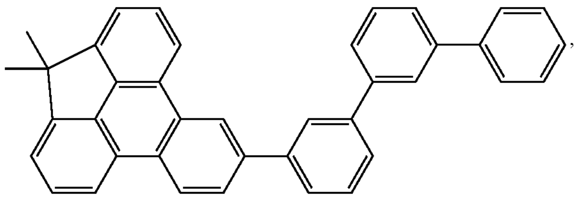
,
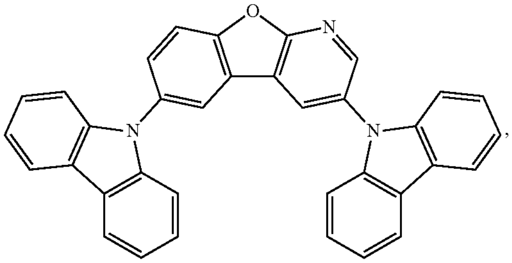
,
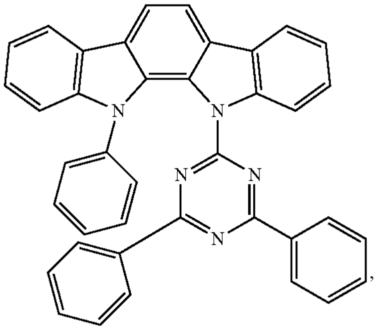
,
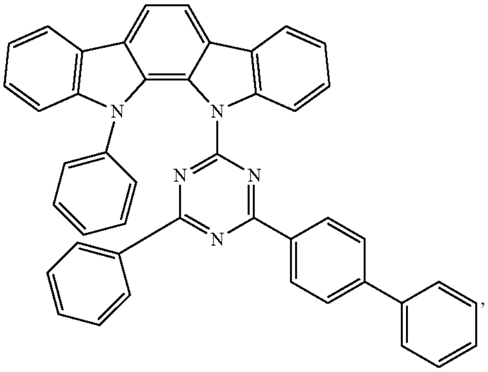
,
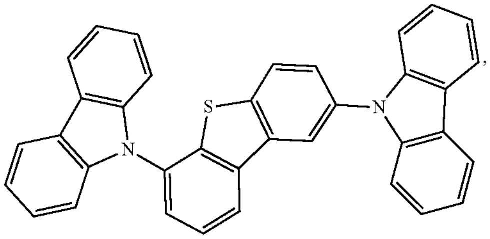
,
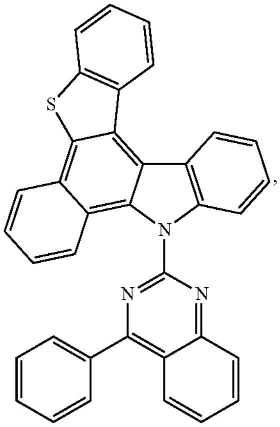
,
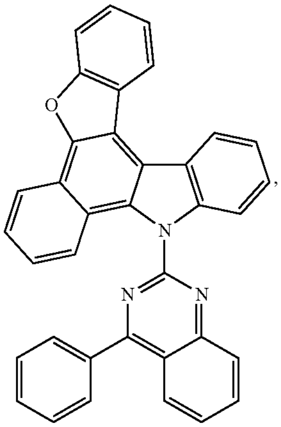
,
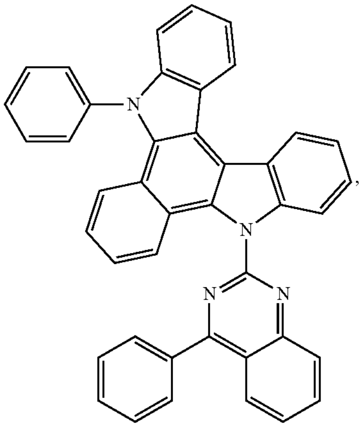
,
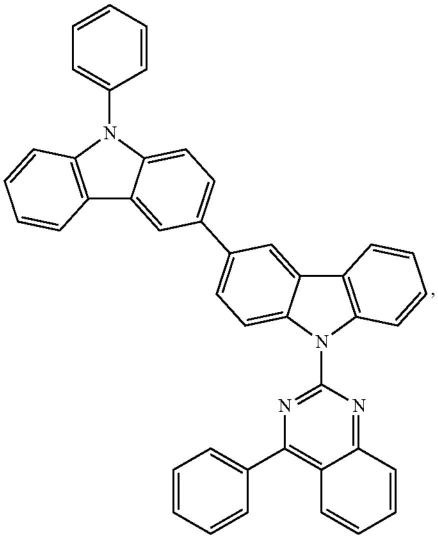
, -continued
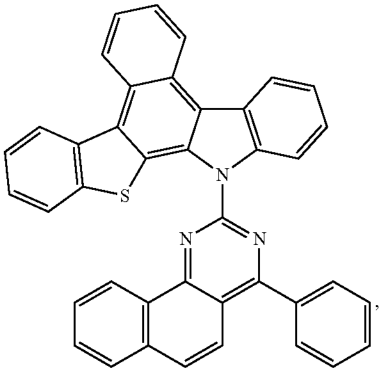,
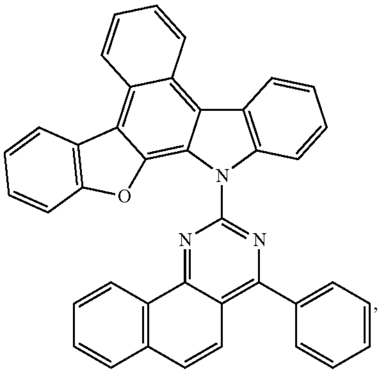,
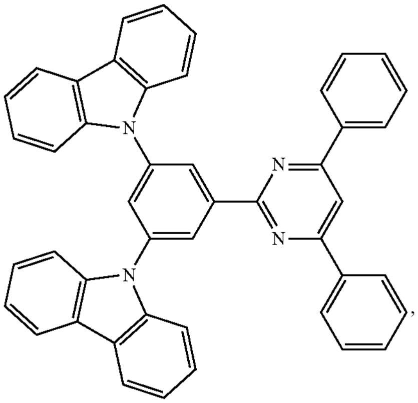,
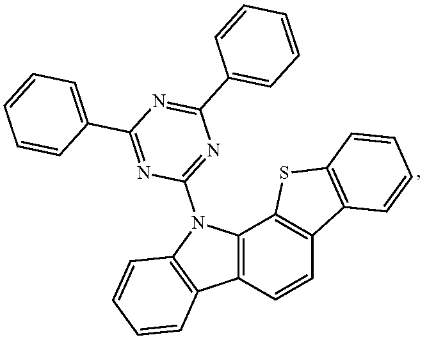,
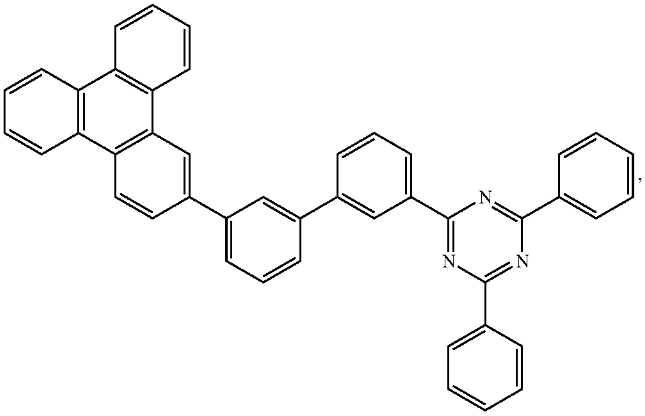,
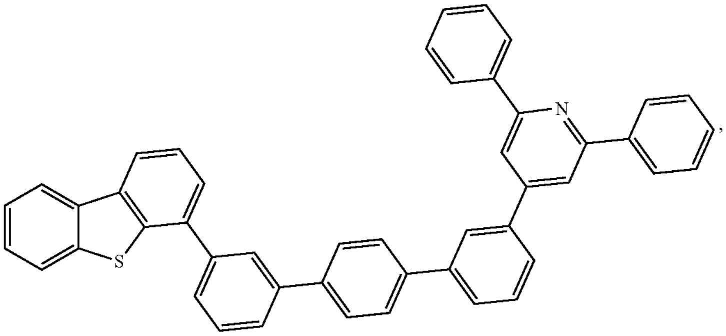, -continued
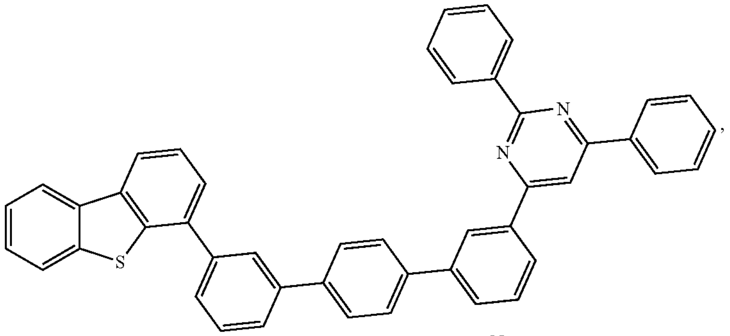
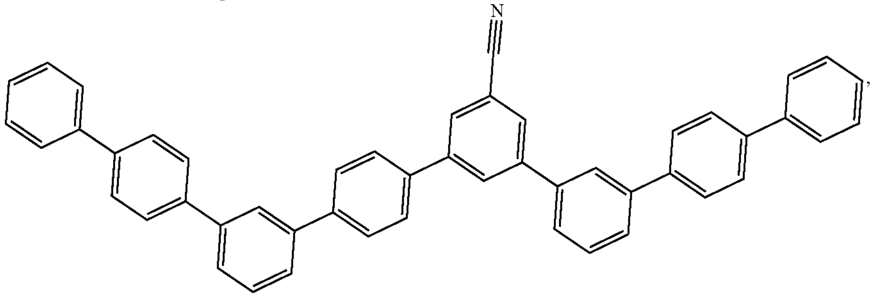
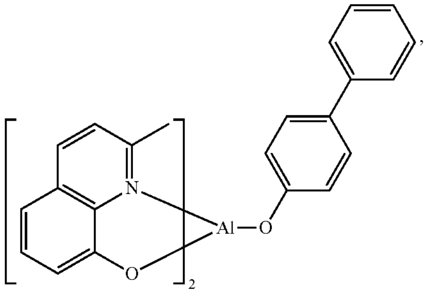
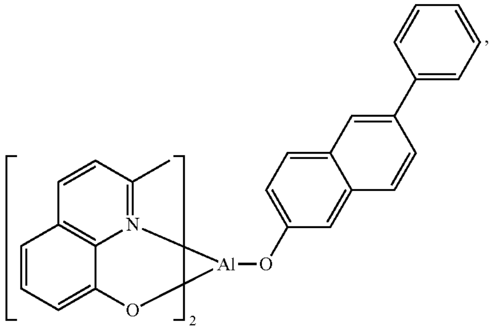
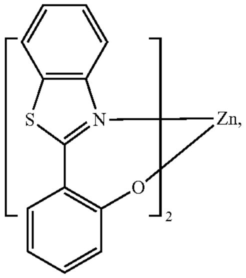
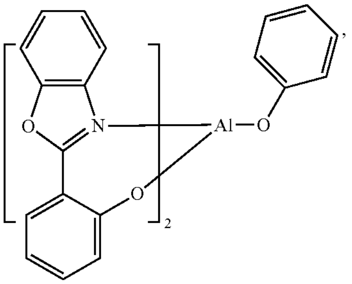
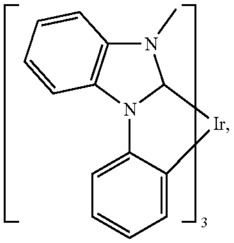
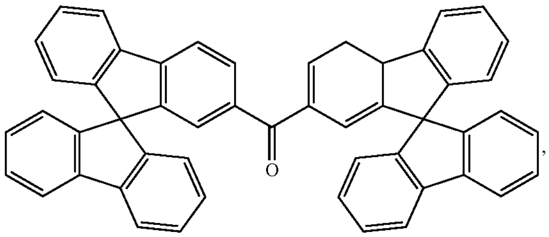

-continued

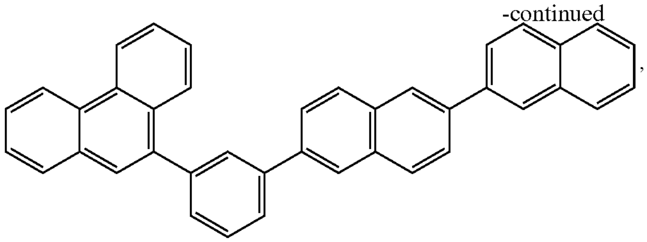

,

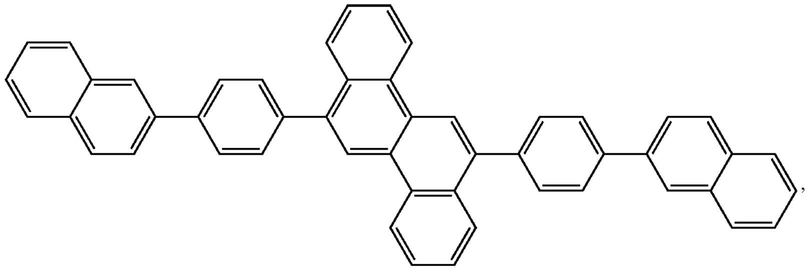

, and

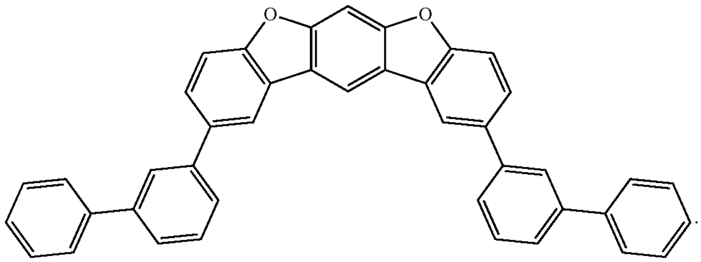

.

Additional Emitters:

One or more additional emitter dopants may be used in conjunction with the compound of the present disclosure. Examples of the additional emitter dopants are not particularly limited, and any compounds may be used as long as the compounds are typically used as emitter materials. Examples of suitable emitter materials include, but are not limited to, compounds which can produce emissions via phosphorescence, fluorescence, thermally activated delayed fluorescence, i.e., TADF (also referred to as E-type delayed fluorescence), triplet-triplet annihilation, or combinations of these processes.

Non-limiting examples of the emitter materials that may be used in an OLED in combination with materials disclosed herein are exemplified below together with references that disclose those materials: CN103694277, CN1696137, EB01238981, EP01239526, EP01961743, EP1239526, EP1244155, EP1642951, EP1647554, EP1841834, EP1841834B, EP2062907, EP2730583, JP2012074444, JP2013110263, JP4478555, KR1020090133652, KR20120032054, KR20130043460, TW201332980, U.S. Ser. No. 06/699,599, U.S. Ser. No. 06/916,554, US20010019782, US20020034656, US20030068526, US20030072964, US20030138657, US20050123788, US20050244673, US2005123791, US2005260449, US20060008670, US20060065890, US20060127696, US20060134459, US20060134462, US20060202194, US20060251923, US20070034863, US20070087321, US20070103060, US20070111026, US20070190359, US20070231600, US2007034863, US2007104979, US2007104980, US2007138437, US2007224450, US2007278936, US20080020237, US20080233410, US20080261076, US20080297033, US200805851, US2008161567, US2008210930, US20090039776, US20090108737, US20090115322, US20090179555, US2009085476, US2009104472, US20100090591, US20100148663, US20100244004, US20100295032, US2010102716, US2010105902, US2010244004, US2010270916, US20110057559, US20110108822, US20110204333, US2011215710, US2011227049, US2011285275, US2012292601, US20130146848, US2013033172, US2013165653, US2013181190, US2013334521, US20140246656, US2014103305, U.S. Pat. Nos. 6,303,238, 6,413,656, 6,653,654, 6,670,645, 6,687,266, 6,835,469, 6,921,915, 7,279,704, 7,332,232, 7,378,162, 7,534,505, 7,675,228, 7,728,137, 7,740,957, 7,759,489, 7,951,947, 8,067,099, 8,592,586, 8,871,361, WO06081973, WO06121811, WO07018067, WO07108362, WO07115970, WO07115981, WO08035571, WO2002015645, WO2003040257, WO2005019373, WO2006056418, WO2008054584, WO2008078800, WO2008096609, WO2008101842, WO2009000673, WO2009050281, WO2009100991, WO2010028151, WO2010054731, WO2010086089, WO2010118029, WO2011044988, WO2011051404, WO2011107491, WO2012020327, WO2012163471, WO2013094620, WO2013107487, WO2013174471, WO2014007565, WO2014008982, WO2014023377, WO2014024131, WO2014031977, WO2014038456, WO2014112450.

-continued
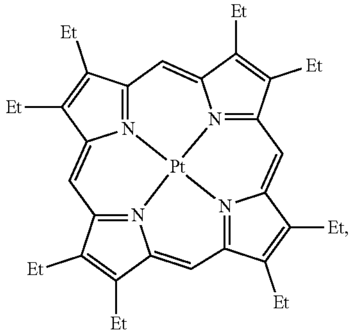
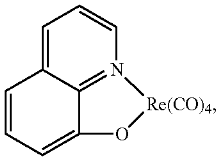
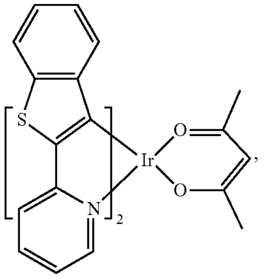
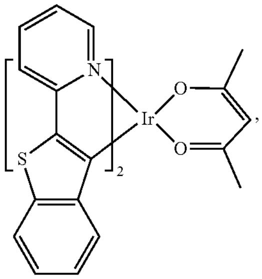
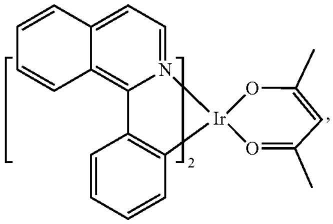
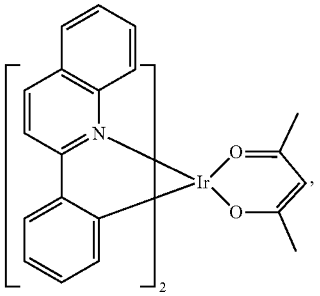
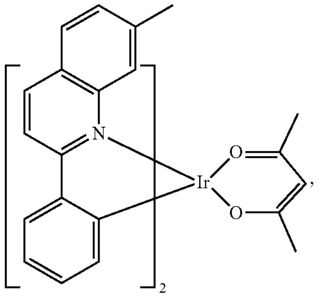
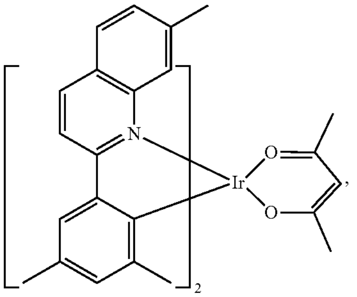
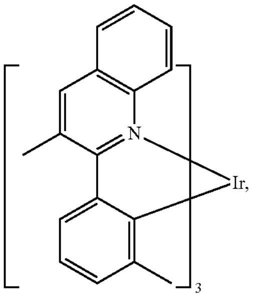
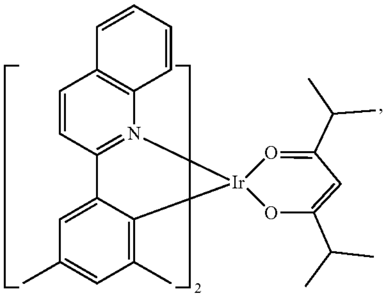
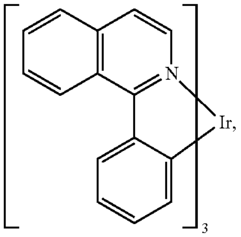
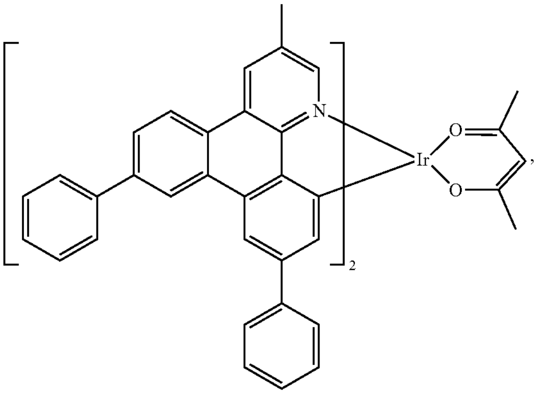

-continued
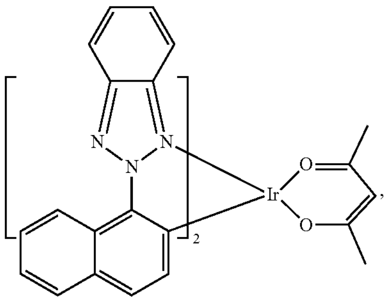
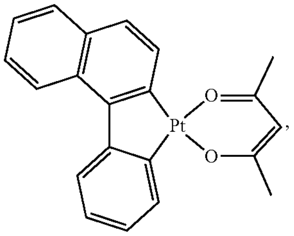
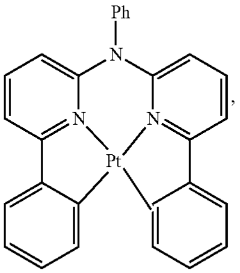
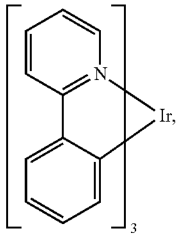
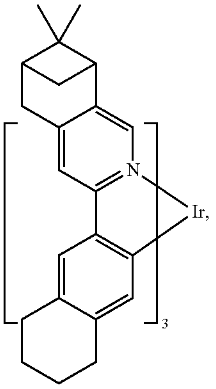
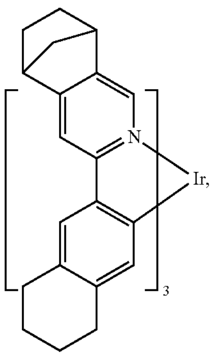
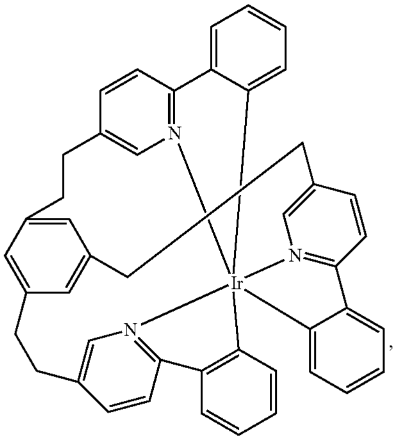
-continued
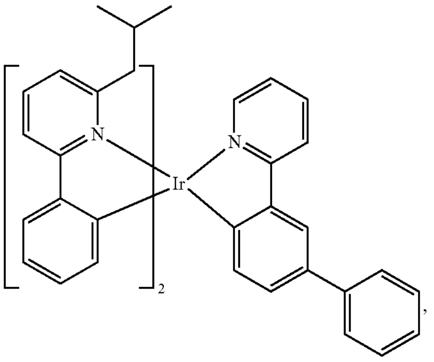
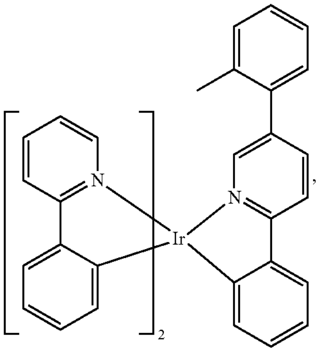
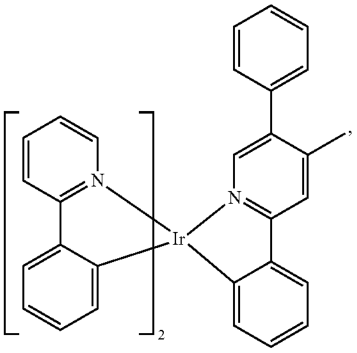
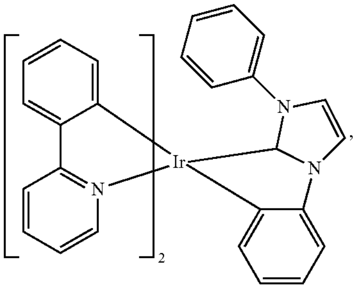
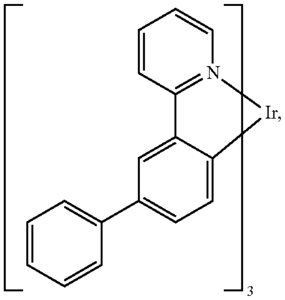

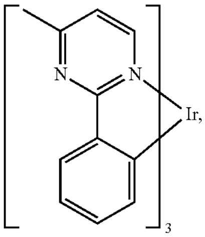
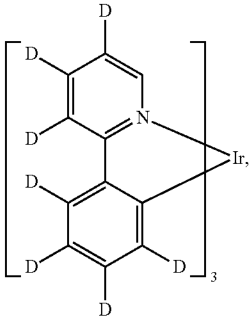
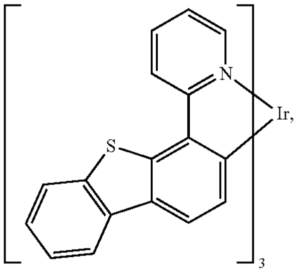
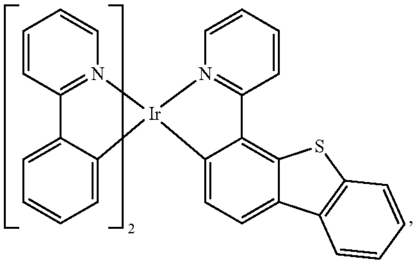
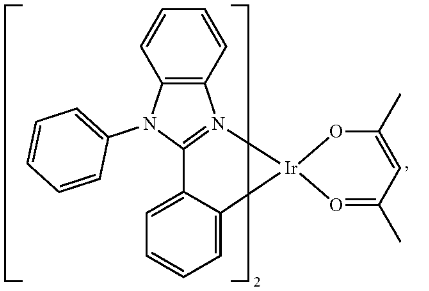
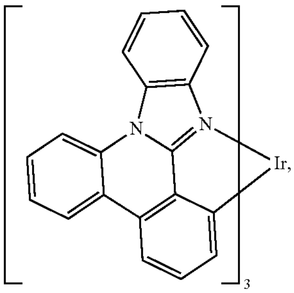
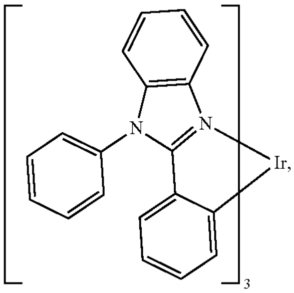
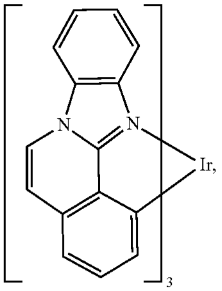
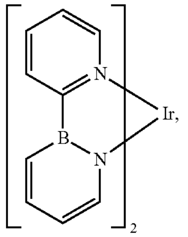
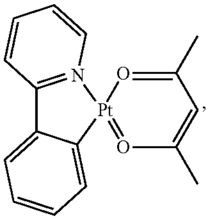
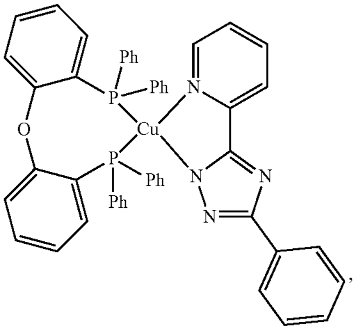
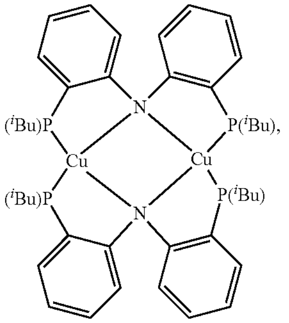
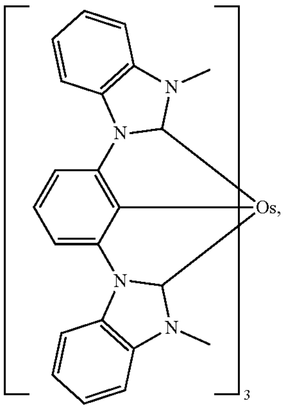
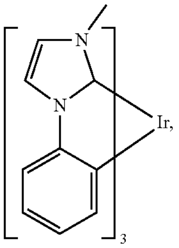

-continued
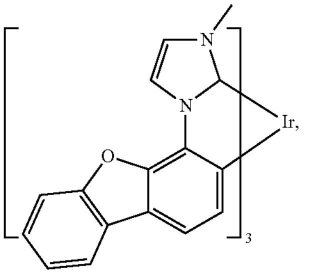
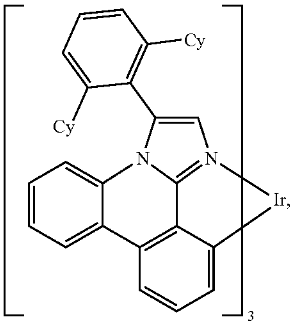
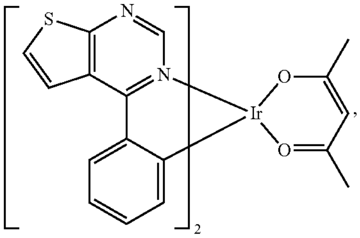
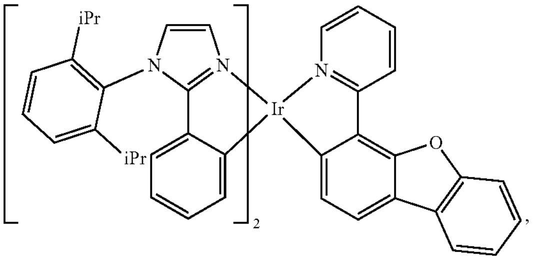
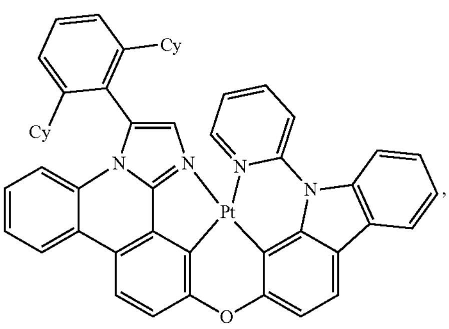
-continued
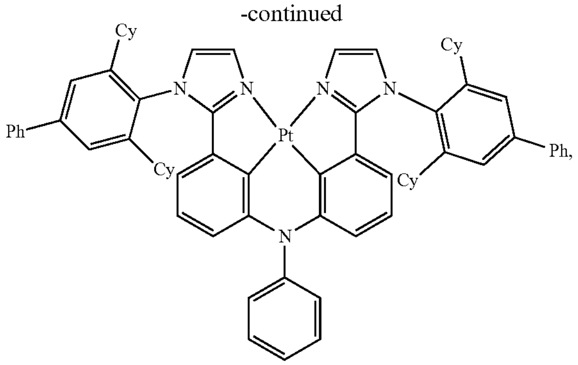
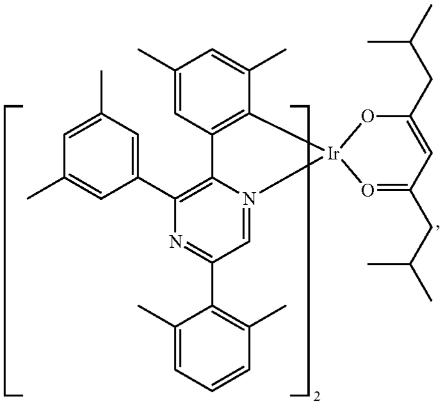
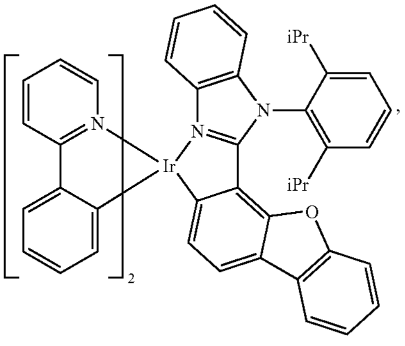
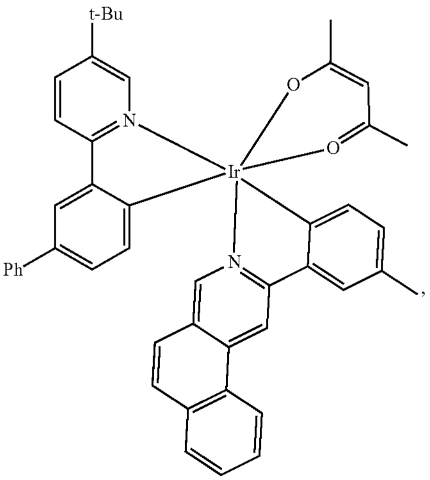

-continued
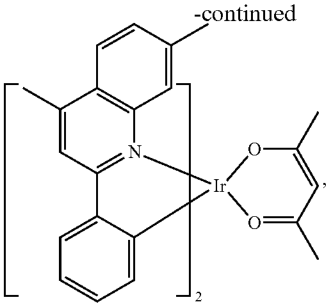
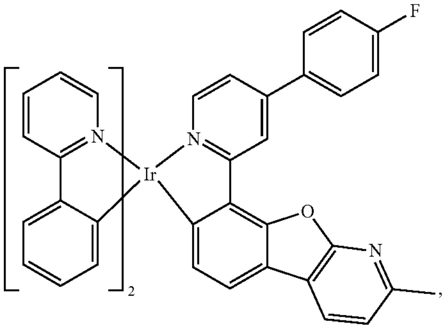
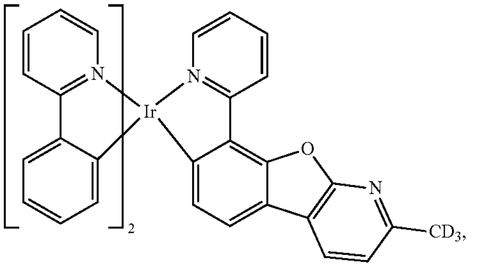
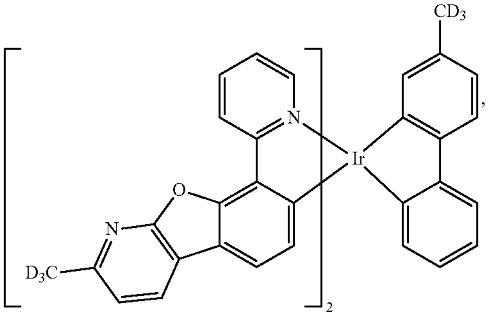
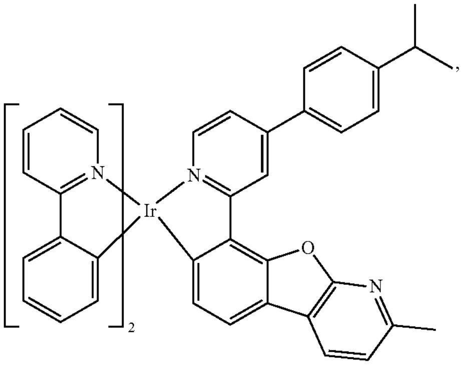
-continued
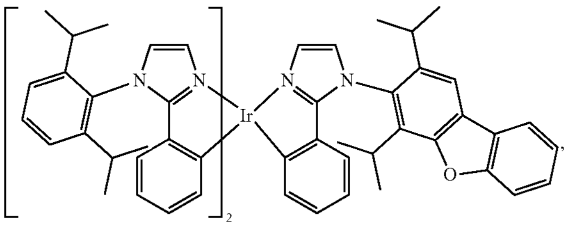
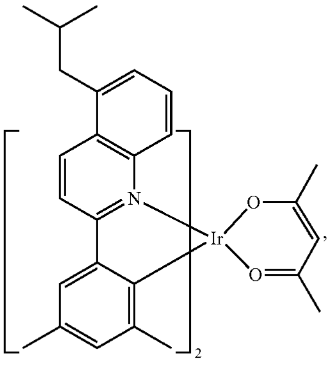
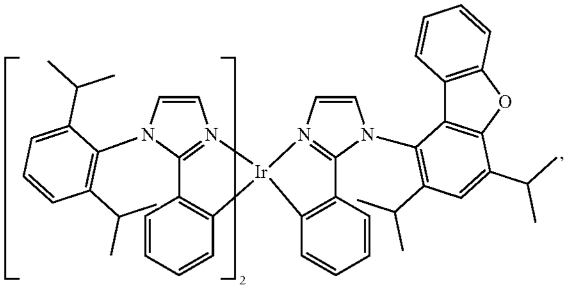
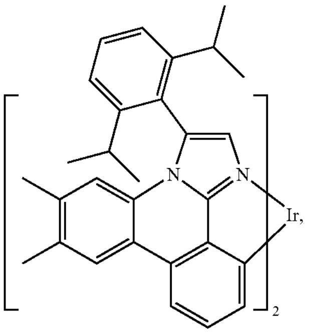
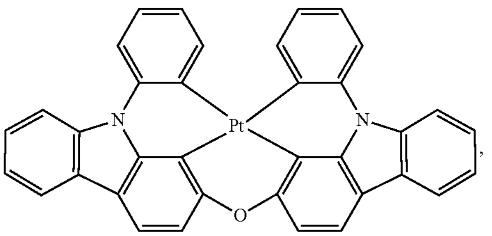

-continued
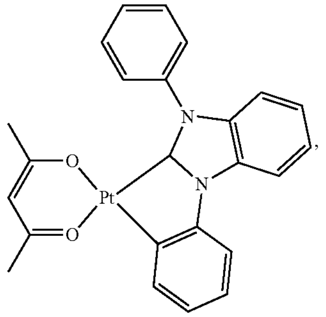
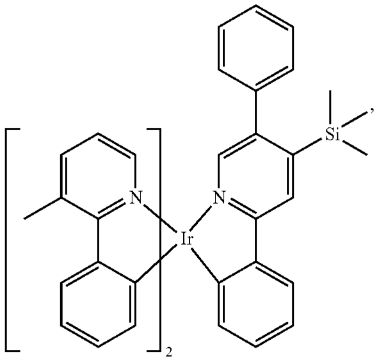
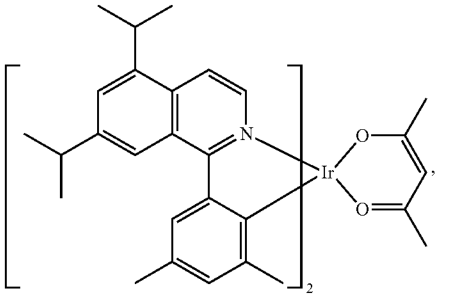
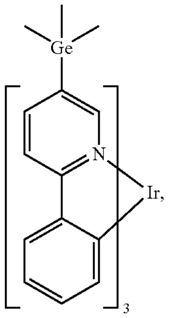
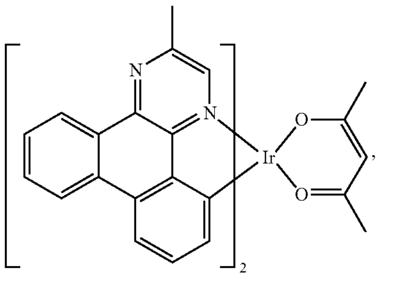
-continued
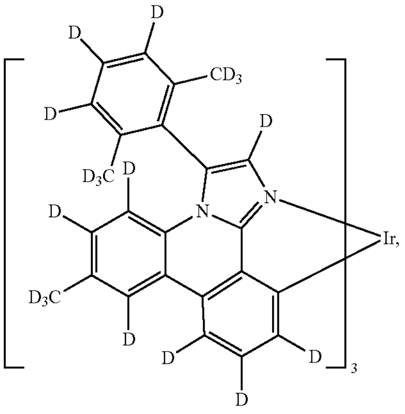
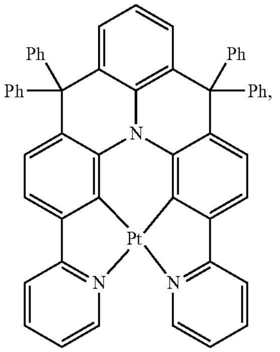
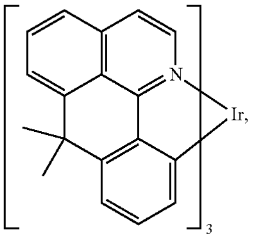
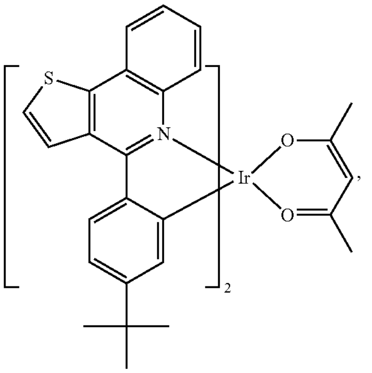
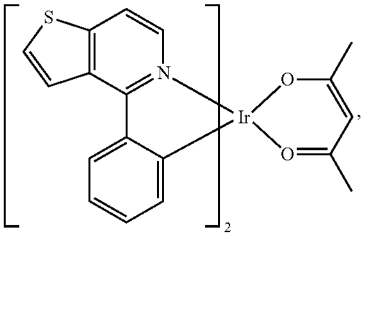

-continued
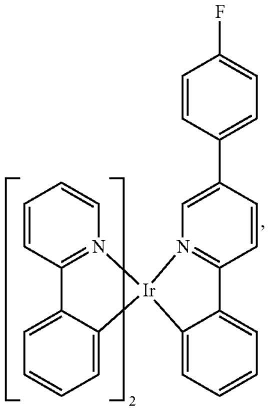
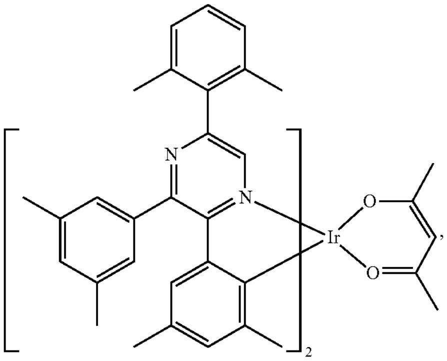
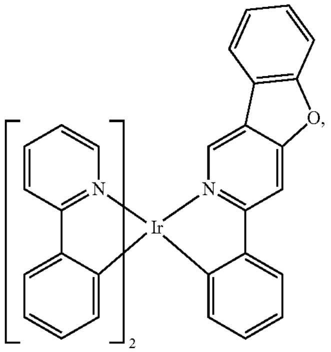
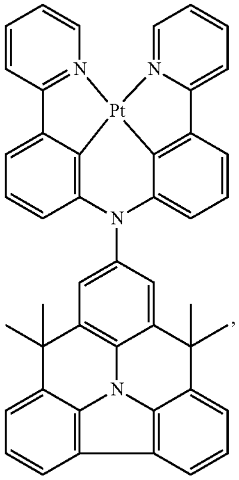
-continued
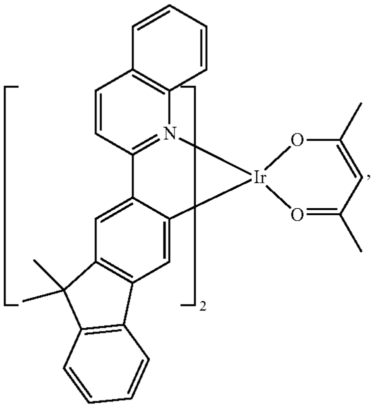
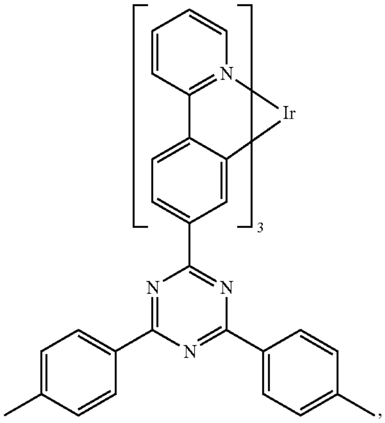
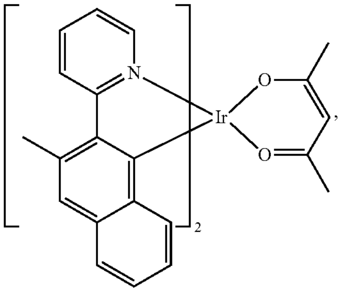
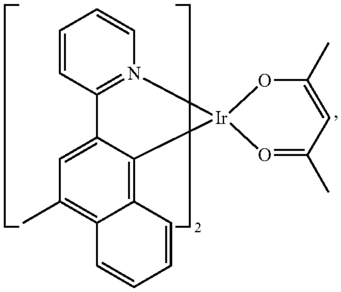
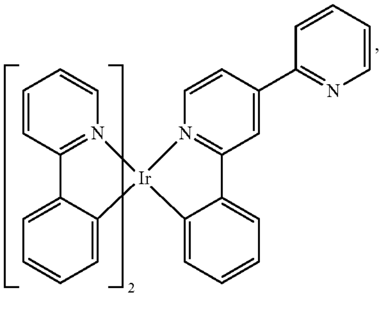

-continued
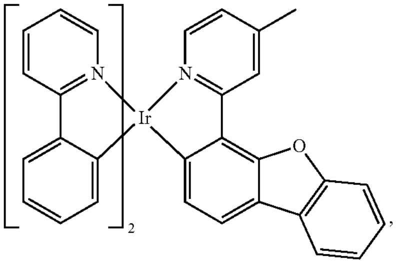
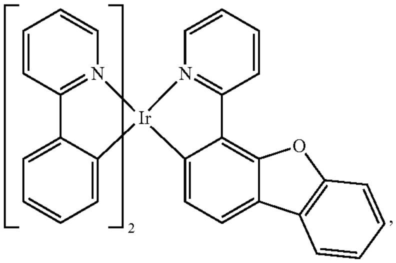
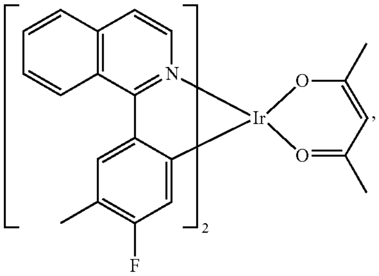
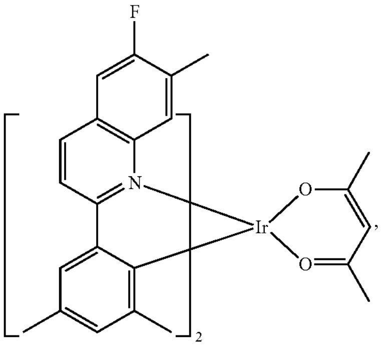
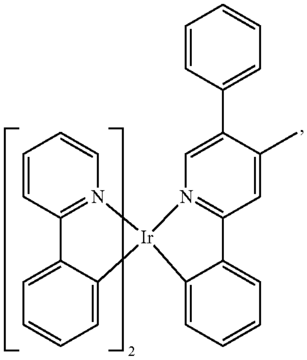
-continued
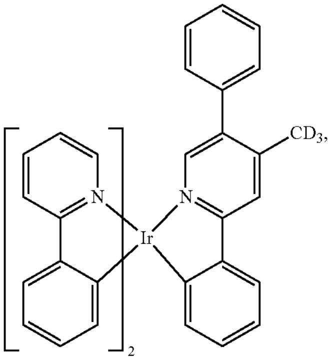
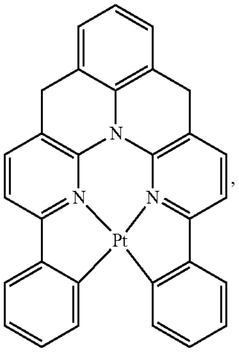
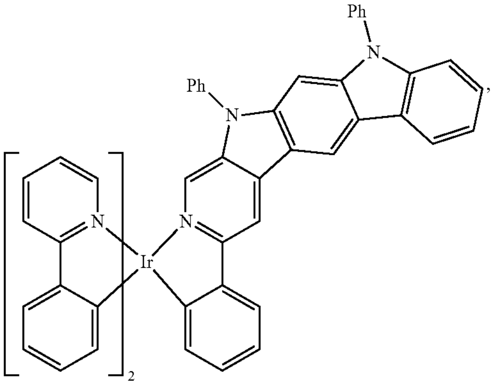
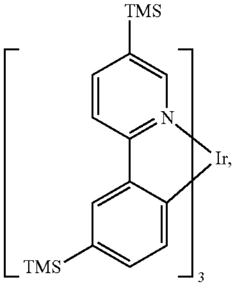
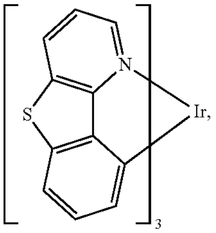
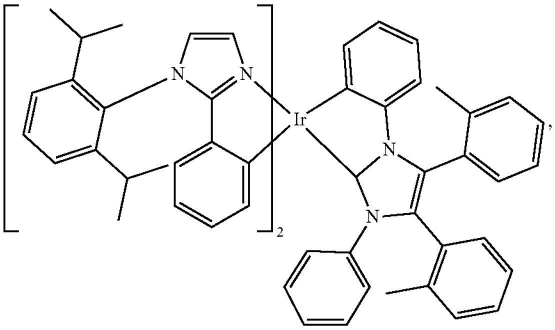

-continued
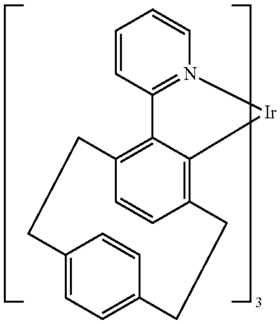
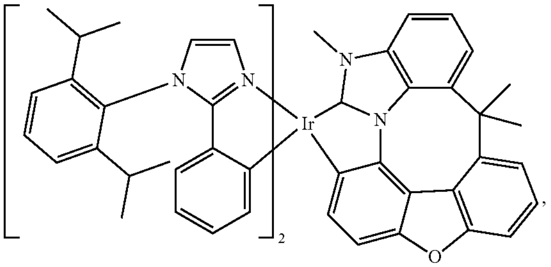
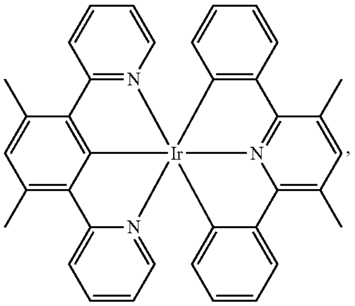
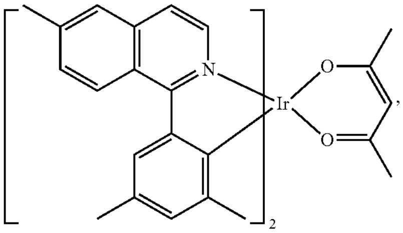
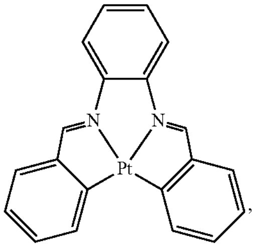
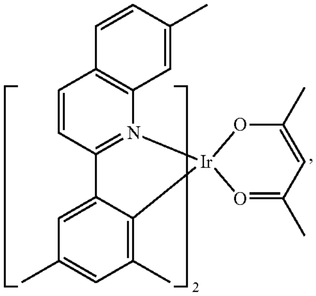
-continued
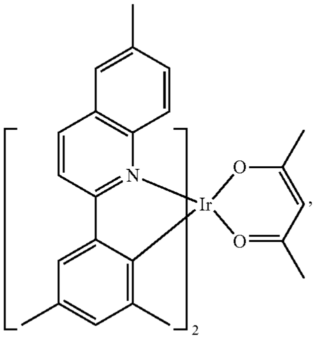
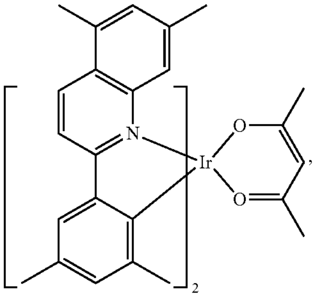
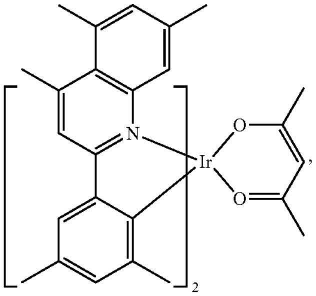
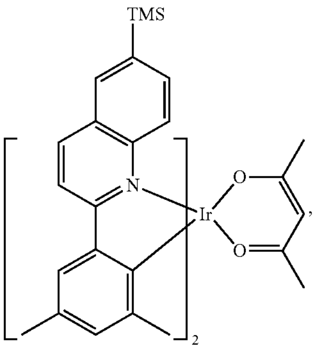
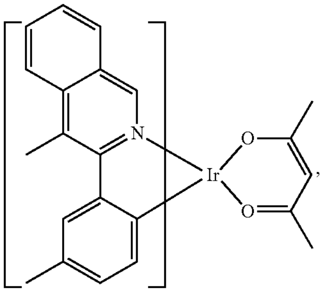

-continued
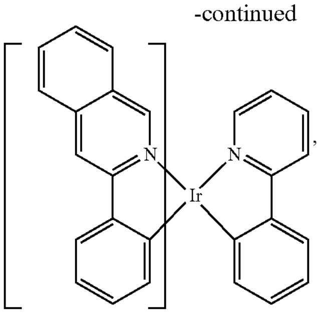
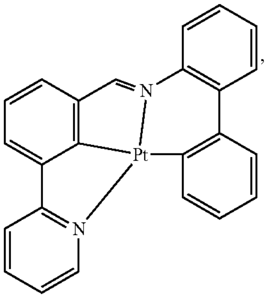
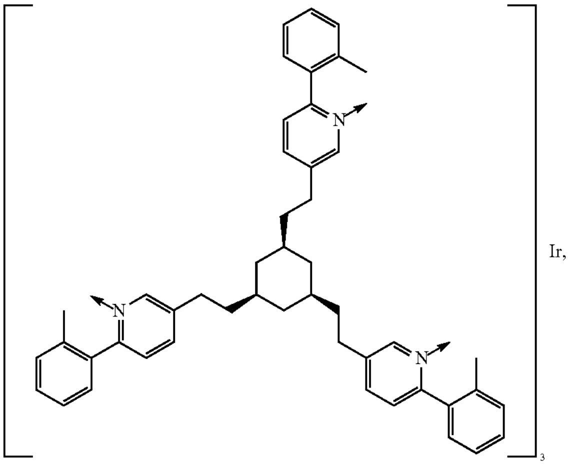
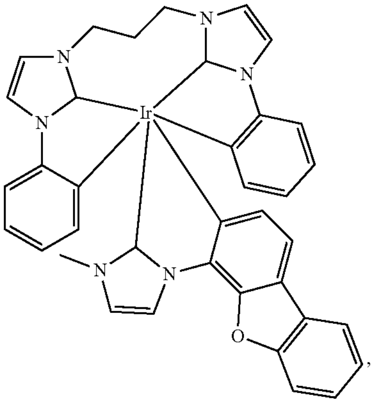
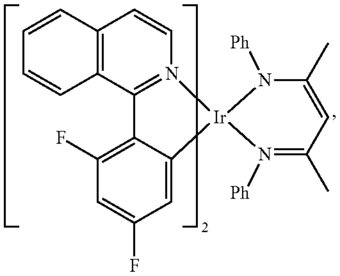
-continued
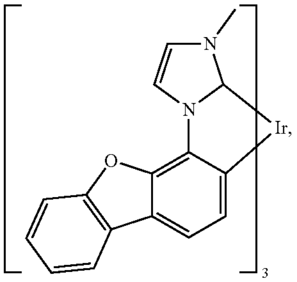
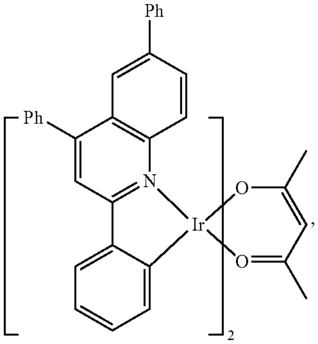
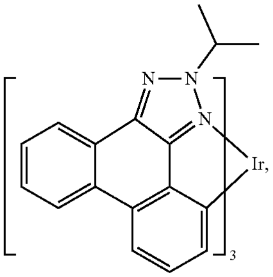
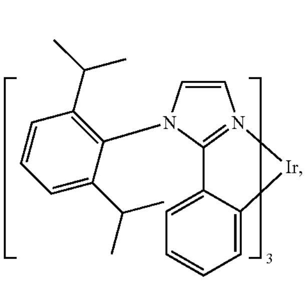
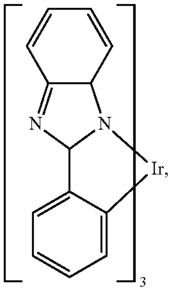
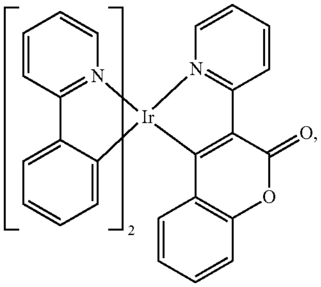

-continued

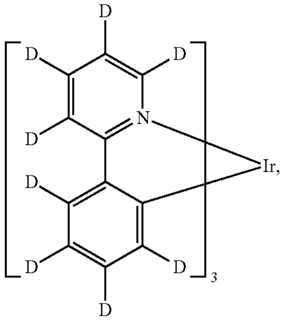

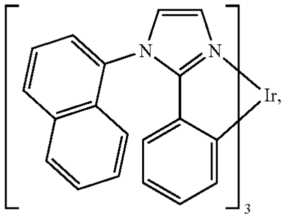

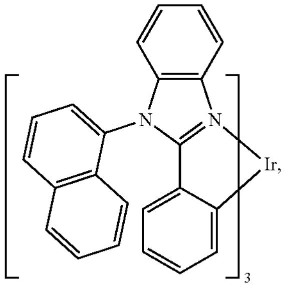

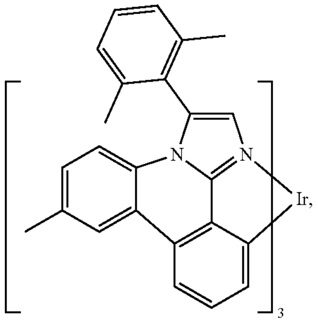

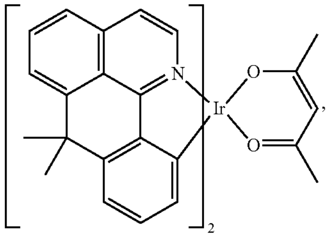

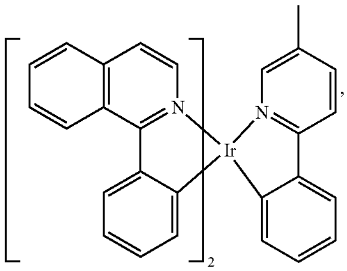

-continued

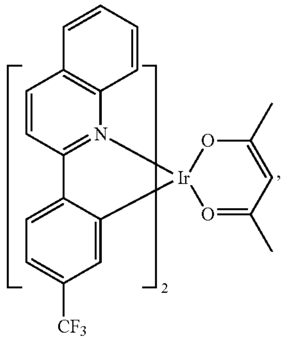

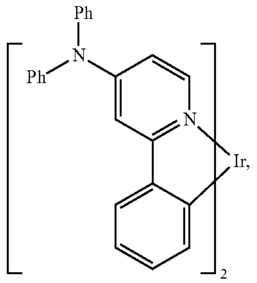

and

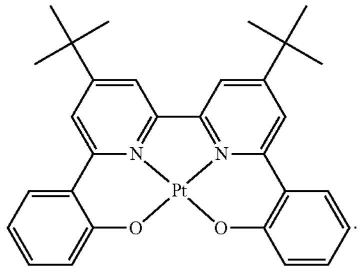

HBL:

A hole blocking layer (HBL) may be used to reduce the number of holes and/or excitons that leave the emissive layer. The presence of such a blocking layer in a device may result in substantially higher efficiencies and/or longer lifetime as compared to a similar device lacking a blocking layer. Also, a blocking layer may be used to confine emission to a desired region of an OLED. In some embodiments, the HBL material has a lower HOMO (further from the vacuum level) and/or higher triplet energy than the emitter closest to the HBL interface. In some embodiments, the HBL material has a lower HOMO (further from the vacuum level) and/or higher triplet energy than one or more of the hosts closest to the HBL interface.

In one aspect, compound used in HBL contains the same molecule or the same functional groups used as host described above.

In another aspect, compound used in HBL contains at least one of the following groups in the molecule:

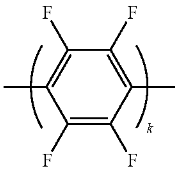

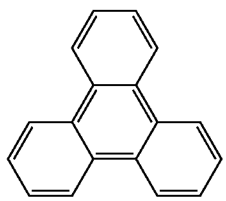

-continued

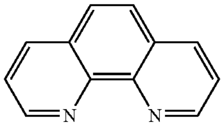

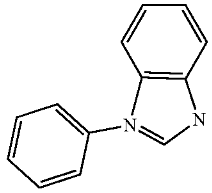

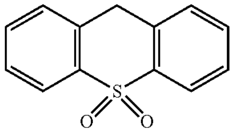

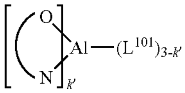

wherein k is an integer from 1 to 20; $L^{101}$ is another ligand, k' is an integer from 1 to 3.

ETL:

Electron transport layer (ETL) may include a material capable of transporting electrons. Electron transport layer may be intrinsic (undoped), or doped. Doping may be used to enhance conductivity. Examples of the ETL material are not particularly limited, and any metal complexes or organic compounds may be used as long as they are typically used to transport electrons.

In one aspect, compound used in ETL contains at least one of the following groups in the molecule:

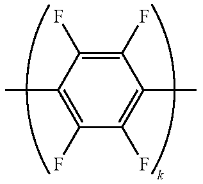

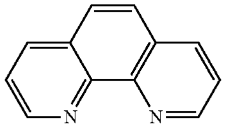

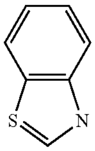

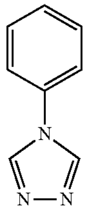

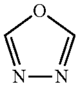

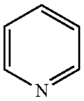

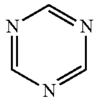

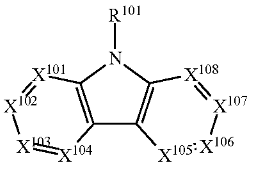

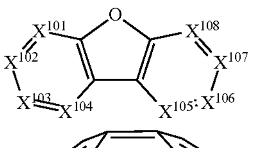

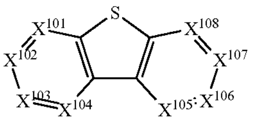

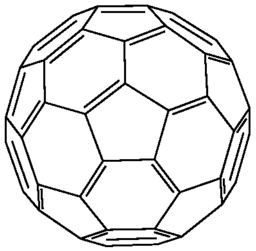

-continued

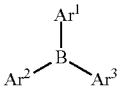

wherein $R^{101}$ is selected from the group consisting of hydrogen, deuterium, halogen, alkyl, cycloalkyl, heteroalkyl, heterocycloalkyl, arylalkyl, alkoxy, aryloxy, amino, silyl, alkenyl, cycloalkenyl, heteroalkenyl, alkynyl, aryl, heteroaryl, acyl, carboxylic acids, ether, ester, nitrile, isonitrile, sulfanyl, sulfinyl, sulfonyl, phosphino, and combinations thereof, when it is aryl or heteroaryl, it has the similar definition as Ar's mentioned above. $Ar^1$ to $Ar^3$ has the similar definition as Ar's mentioned above. k is an integer from 1 to 20. $X^{101}$ to $X^{108}$ is selected from C (including CH) or N.

In another aspect, the metal complexes used in ETL contains, but not limit to the following general formula:

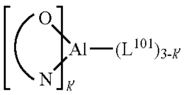

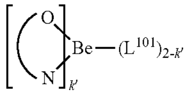

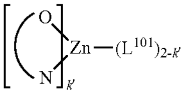

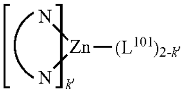

wherein (O—N) or (N—N) is a bidentate ligand, having metal coordinated to atoms O, N or N, N; $L^{101}$ is another ligand; k' is an integer value from 1 to the maximum number of ligands that may be attached to the metal.

Non-limiting examples of the ETL materials that may be used in an OLED in combination with materials disclosed herein are exemplified below together with references that disclose those materials: CN103508940, EP01602648, EP01734038, EP01956007, JP2004-022334, JP2005149918, JP2005-268199, KR0117693, KR20130108183, US20040036077, US20070104977, US2007018155, US20090101870, US20090115316, US20090140637, US20090179554, US2009218940, US2010108990, US2011156017, US2011210320, US2012193612, US2012214993, US2014014925, US2014014927, US20140284580, U.S. Pat. Nos. 6,656,612, 8,415,031, WO2003060956, WO2007111263, WO2009148269, WO2010067894, WO2010072300, WO2011074770, WO2011105373, WO2013079217, WO2013145667, WO2013180376, WO2014104499, WO2014104535,

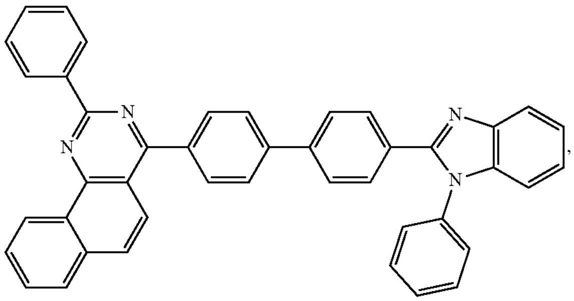,

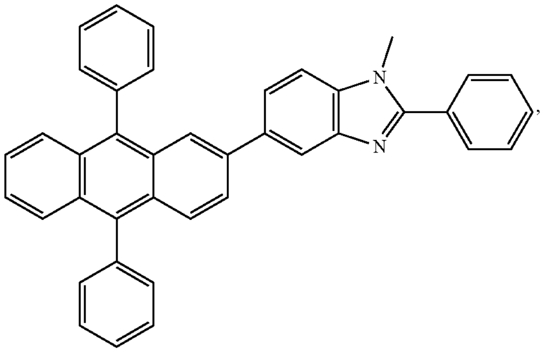
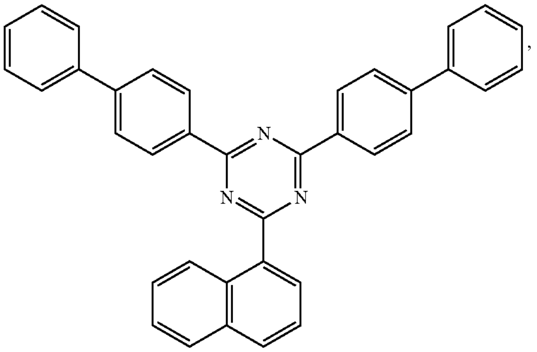
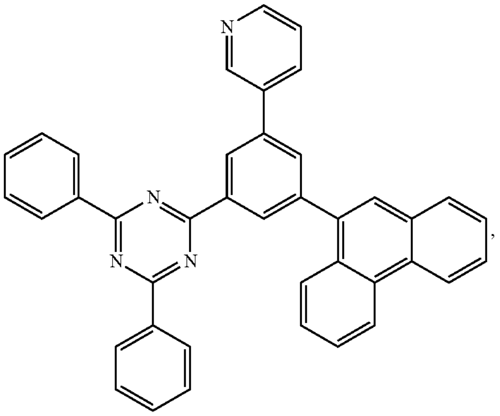
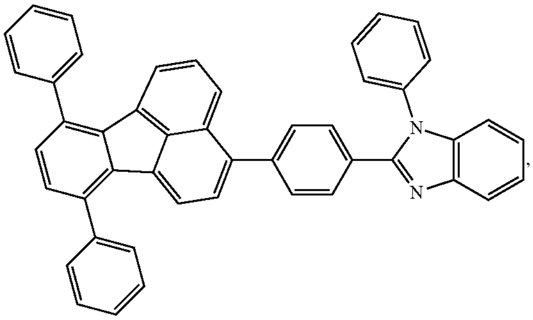
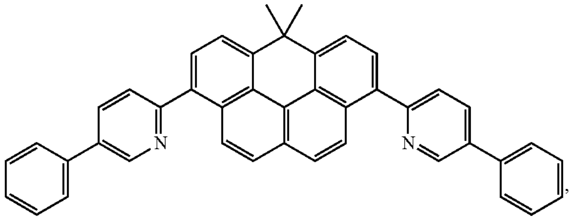
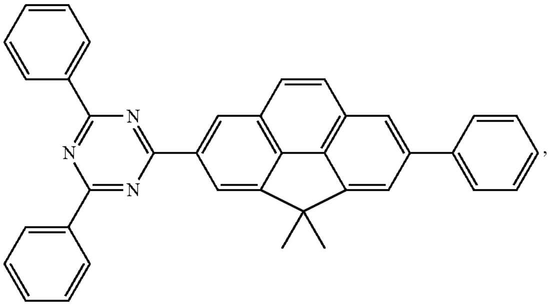
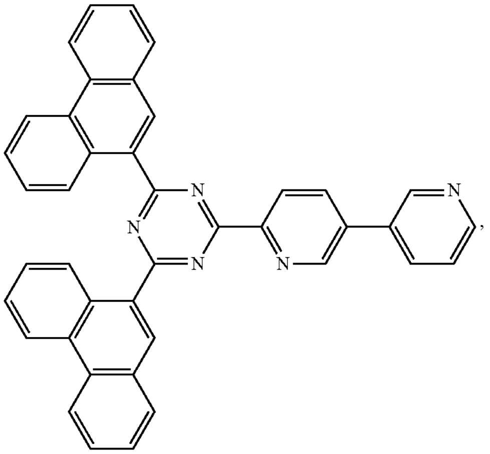
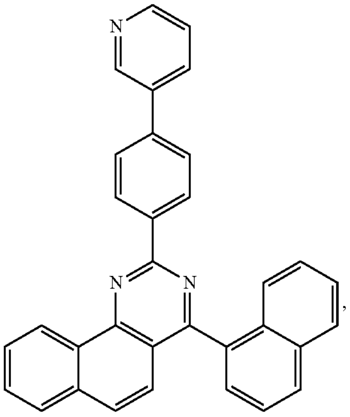

-continued
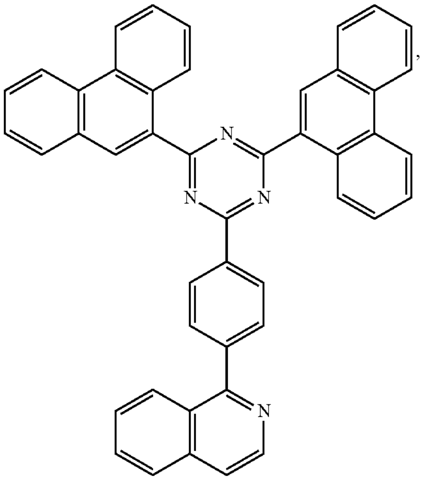
,
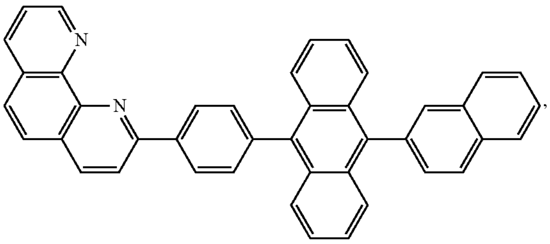
,
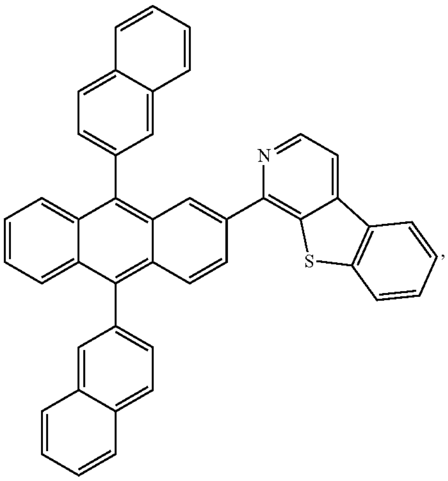
,
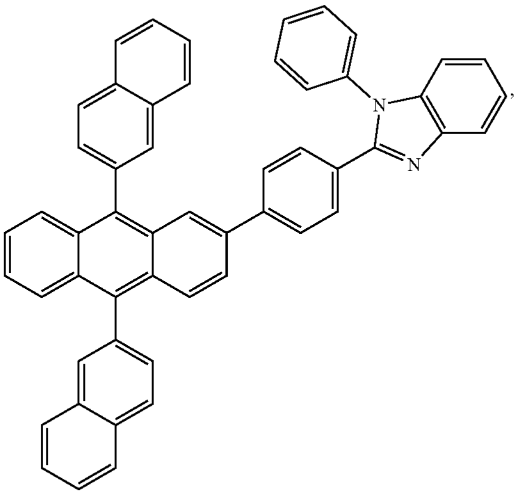
,
-continued
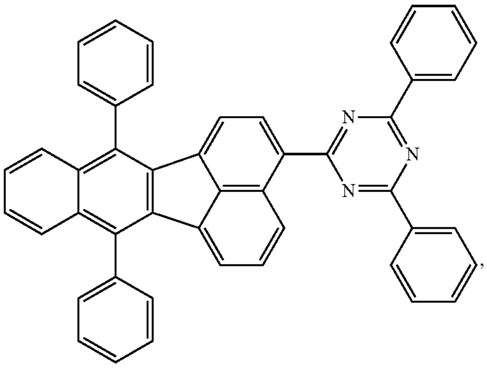
,
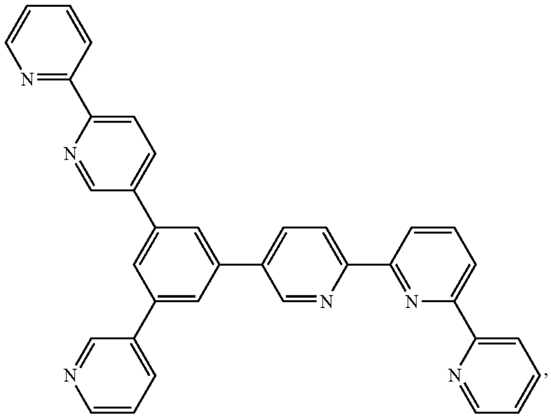
,
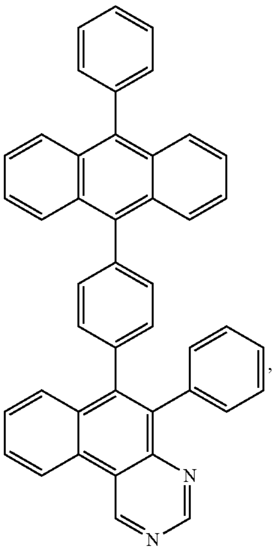
, -continued
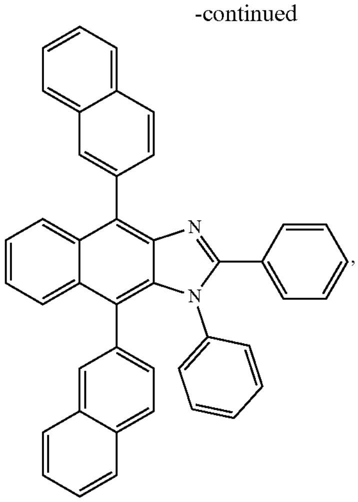
,
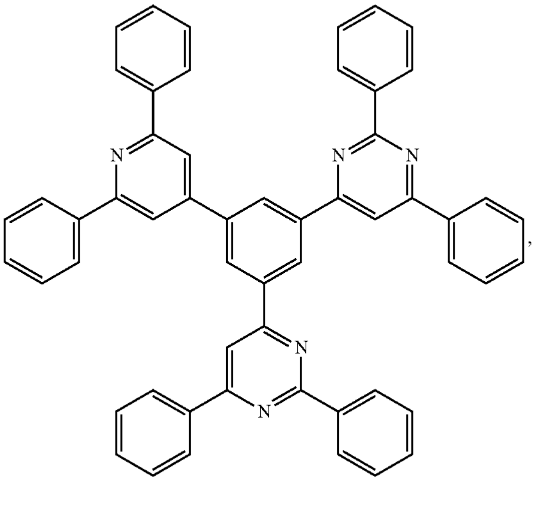
,
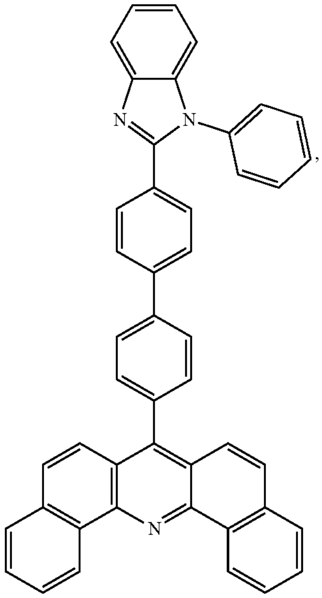
,
-continued
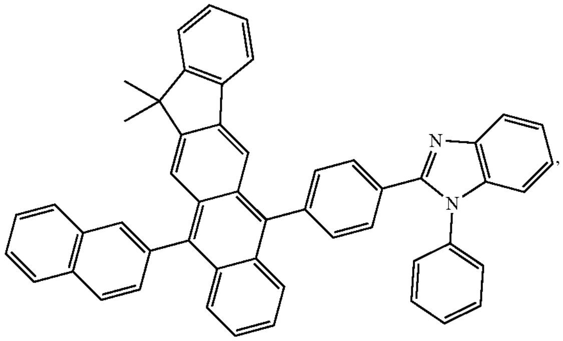
,
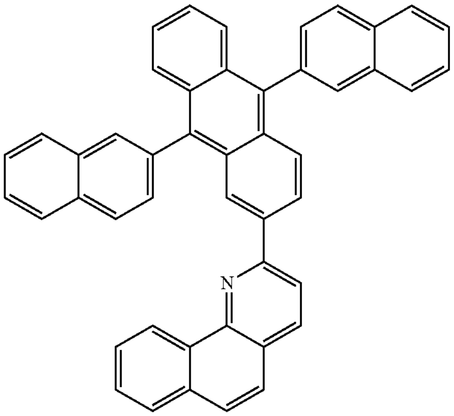
,
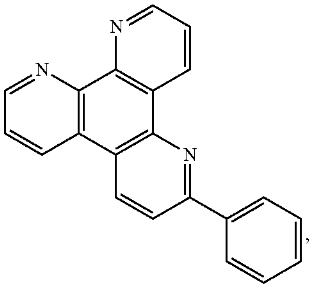
,
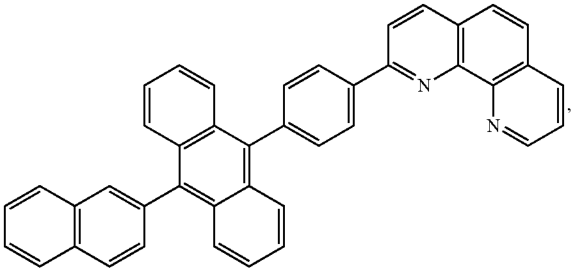
,
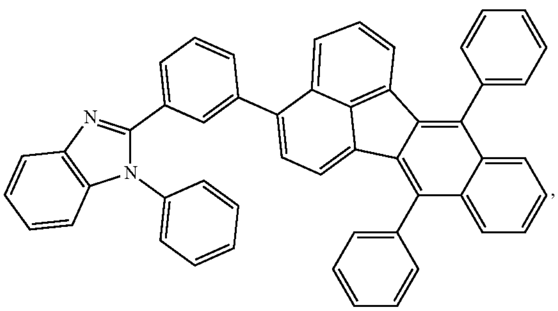
, -continued
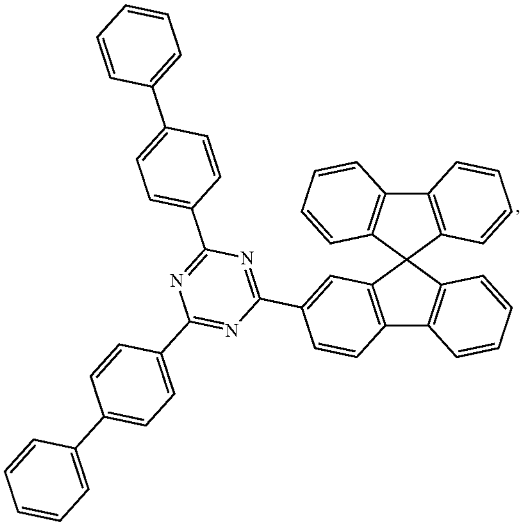
,
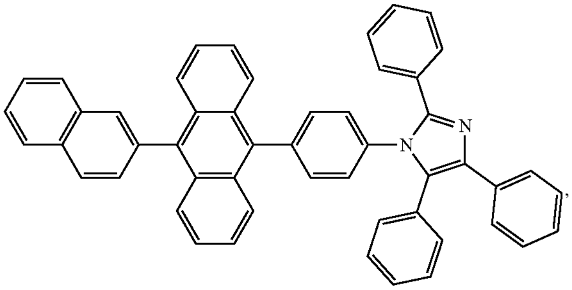
,
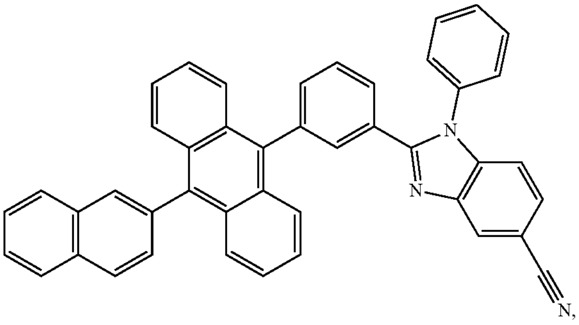
,
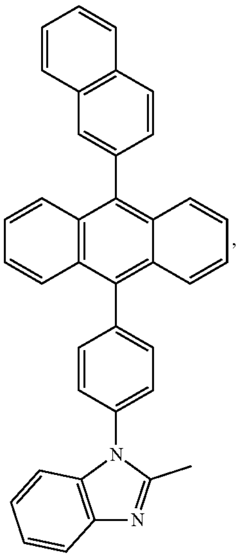
,
-continued
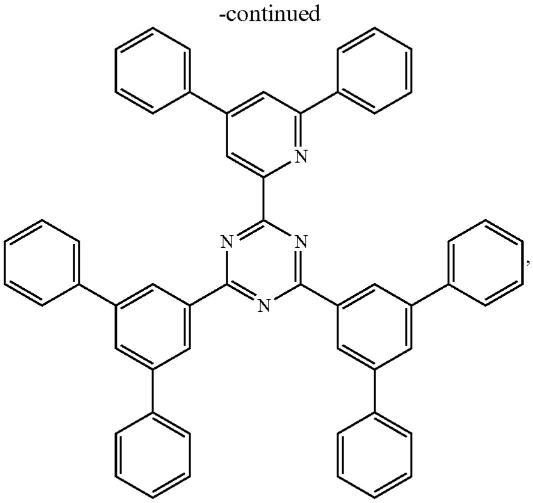
,
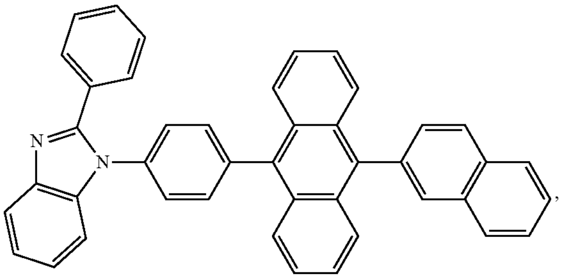
,
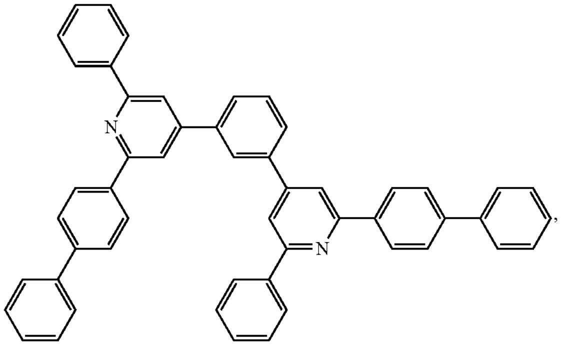
,
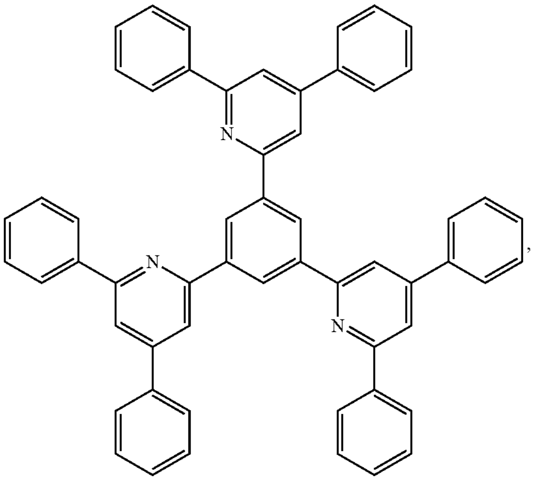
, -continued

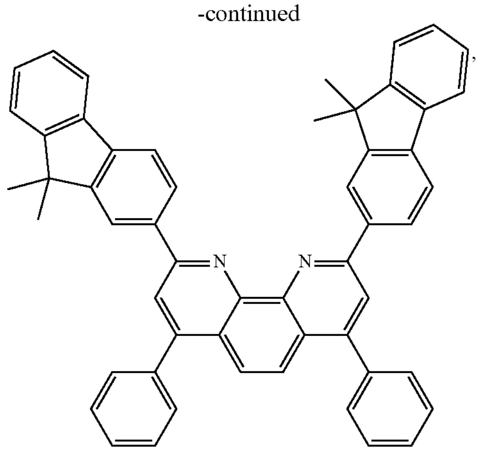

, and

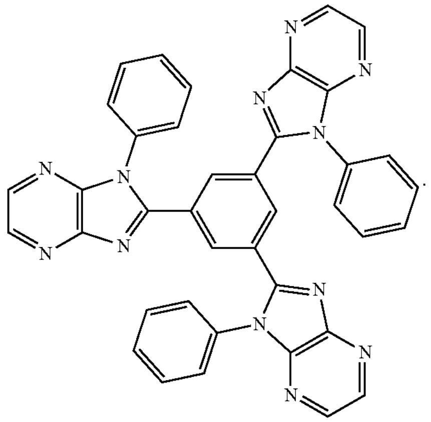 [SMILES: c1ccc(-n2c(-c3cc(-c4nc5nccnc5n4-c4ccccc4)cc(-c4nc5nccnc5n4-c4ccccc4)c3)nc3nccnc32)cc1]

.

Charge Generation Layer (CGL)

In tandem or stacked OLEDs, the CGL plays an essential role in the performance, which is composed of an n-doped layer and a p-doped layer for injection of electrons and holes, respectively. Electrons and holes are supplied from the CGL and electrodes. The consumed electrons and holes in the CGL are refilled by the electrons and holes injected from the cathode and anode, respectively; then, the bipolar currents reach a steady state gradually. Typical CGL materials include n and p conductivity dopants used in the transport layers.

In any above-mentioned compounds used in each layer of the OLED device, the hydrogen atoms can be partially or fully deuterated. Thus, any specifically listed substituent, such as, without limitation, methyl, phenyl, pyridyl, etc. may be undeuterated, partially deuterated, and fully deuterated versions thereof. Similarly, classes of substituents such as, without limitation, alkyl, aryl, cycloalkyl, heteroaryl, etc. also may be undeuterated, partially deuterated, and fully deuterated versions thereof.

EXPERIMENTAL EXAMPLES

Figure 3:
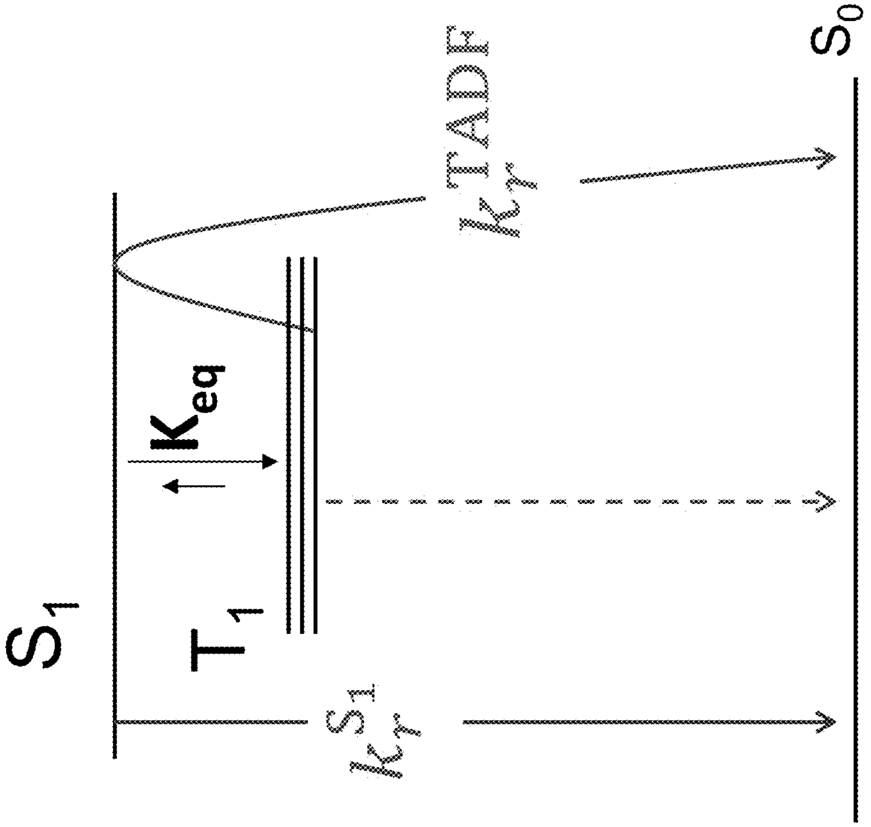
FIG. 3 depicts the kinetic scheme for emission via TADF mechanism in two-coordinate coinage metal complex, where $k_r^{S_1}$ and $k_r^{TADF}$ are radiative decay rates of $S_1$ state and TADF process, $K_{eq}$ indicates the equilibrium constant between $S_1$ and $T_1$ states via ISC transitions.

Example 1: Towards Rational Design of TADF Two-Coordinate Coinage Metal Complexes: Understanding the Relationship Between Natural Transition Orbital Overlap and Photophysical Properties Thermally assisted delayed fluorescence (TADF), also known as E-type delayed fluorescence, has been investigated in a wide range of photophysical and photochemical applications (C. A. Parker and C. G. Hatchard, Trans. Faraday Society, 1961, 57, 1894-1904; R. Greinert, et al., Journal of Biochemical and Biophysical Methods, 1979, 1, 77-83; V. Jankus, et al., Adv. Mater., 2013, 25, 1455-1459; I. Lukomsky, et al., Journal of Fluorescence, 1994, 4, 49-51; N. A. Borisevich, et al., Journal of Fluorescence, 2006, 16, 649-653; Y. Zhang, et al., Appl. Phys. Lett., 2008, 92, 013905; B. Frederichs and H. Staerk, Chem. Phys. Lett., 2008, 460, 116-118; J. C. Deaton, et al., Journal of the American Chemical Society, 2010, 132, 9499-9508; G. V. Zakharova, et al., High Energ. Chem., 2014, 48, 76-80; I S Vinklárek, et al., Photochemical & Photobiological Sciences, 2017, 16, 507-518; B. Vigante, et al., Chemistry—A European Journal, 2019, 25, 3325-3336). The process involves the endothermic intersystem crossing (ISC) from the triplet excited state ($T_1$) to singlet ($S_1$) excited state followed by emission from the $S_1$ state (FIG. 3) (D. S. M. Ravinson and M. E. Thompson, Materials Horizons, 2020, 7, 1210-1217). A recent promising application of TADF emitters is to replace heavy-metal (Ir, Pt and Rh etc.) phosphorescent complexes used as luminescent dopants in commercial organic light-emitting diodes (OLEDs) (Q. Zhang, B et al., Nature Photonics, 2014, 8, 326-332). Both TADF and heavy-metal phosphors provide a means to achieve near 100% efficiency in these devices (T.-Y. Li, et al., Coord. Chem. Rev., 2018, 374, 55-92; A. Endo, et al., Adv. Mater., 2009, 21, 4802-4806; A. Endo, et al., Appl. Phys. Lett., 2011, 98, 083302; S. Lamansky, et al., Journal of the American Chemical Society, 2001, 123, 4304-4312). Organic TADF luminophores adopt donor-acceptor (D-A) structure with large dihedral angle between the D-A moieties (Z. Yang, et al., Chem. Soc. Rev., 2017, 46, 915-1016). Such a twisted geometry leads to weak coupling between D and A, and thus a small energy gap between the $S_1$ and $T_1$ states ($\Delta E_{ST}$), favoring thermal activation to the singlet state at room temperature.

Three- and four-coordinate Cu(I) complexes have also been reported that demonstrate TADF behavior, from largely metal to ligand charge transfer (MLCT) transitions (H. Yersin, et al., Coord. Chem. Rev., 2011, 255, 2622-2652; R. Czerwieniec, et al., Inorganic Chemistry, 2011, 50, 8293-8301; M. J. Leitl, et al., Journal of the American Chemical Society, 2014, 136, 16032-16038; T. Hofbeck, et al., Journal of the American Chemical Society, 2015, 137, 399-404; R. Czerwieniec, et al., Coord. Chem. Rev., 2016, 325, 2-28; H. Yersin, et al., Chemphyschem, 2017, 18, 3508-3535). Recently, a significant advance in $Cu^{(I)}$-based TADF materials was achieved using two-coordinate complexes with a carbene ligand to serve as an acceptor and an amide ligand as a donor (D. Di, et al., Science, 2017, 356, 159; A. S. Romanov, et al., Chemistry—A European Journal, 2017, 23, 4625-4637; P. J. Conaghan, et al., Adv. Mater., 2018, 30, 1802285; A. S. Romanov, et al., Chem. Mater., 2019, 31, 3613-3623; R. Hamze, et al., Science, 2019, 363, 601; S. Shi, et al., Journal of the American Chemical Society, 2019, 141, 3576-3588; R. Hamze, et al., Journal of the American Chemical Society, 2019, 141, 8616-8626; A. S. Romanov, et al., Chemical Science, 2020, 11, 435-446; P. J. Conaghan, et al., Nature Communications, 2020, 11, 1758; M. Gernert, et al., Journal of the American Chemical Society, 2020, 142, 8897-8909; A. Ying, et al., ACS Applied Materials & Interfaces, 2021, 13, 13478-13486; F. Chotard, et al., Chem. Mater., 2020, 32, 6114-6122). In addition to the copper complexes, isoelectronic silver and gold based complexes have been shown to give highly efficient TADF (A. S. Romanov, et al., Advanced Optical Materials, 2018, 6, 1801347; T.-y. Li, et al., Journal of the American Chemical Society, 2020, 142, 6158-6172). Here the (carbene)M(amide) family of complexes will be referred to as cMa for M=Cu$^{(I)}$, Ag$^{(I)}$ and Au$^{(I)}$. Early reports of complexes with cMa structures and their promising luminescent properties (H. M. J. Wang, et al., Organometallics, 2005, 24, 486-493) led to further study (V. W.-W. Yam, et al., Journal of the American Chemical Society, 2009, 131, 912-913; M. C. Gimeno, et al., Organometallics, 2012, 31, 7146-7157; A. Gomez-Suarez, et al., Beilstein J. Org. Chem., 2013, 9, 2216-2223) and successful application in OLEDs generated new enthusiasm for these types of emitters. Investigations have been carried out focusing on two-coordinate TADF complexes experimentally and theoretically, to develop structure-property relationships and design strategies to achieve high radiative (kr) and low non-radiative (km) decay rates (J. Feng, et al., Adv. Funct. Mater., 2020, 30, 1908715; C. R. Hall, et al., The Journal of Physical Chemistry Letters, 2018, 9, 5873-5876; J. Feng, et al., Adv. Funct. Mater., 2021, 31, 2005438; S. Thompson, et al., J. Chem. Phys., 2018, 149, 014304; E. J. Taffet, et al., The Journal of Physical Chemistry Letters, 2018, 9, 1620-1626; T.-y. Li, et al., Chemistry—A European Journal, 2021, 27, 6191-6197).

TADF molecules fall into two basic categories, depending on whether they have slow or fast rates for intersystem crossing (ISC). Organic TADF materials generally have slow ISC rates ($k_{ISC}$=$10^5$~$10^8$ $s^{-1}$) owing to weak spin-orbital coupling (SOC), which makes fluorescent radiative decay ($k_r^{S_1}$) competitive with intersystem crossing (Y. Tsuchiya, et al., The Journal of Physical Chemistry A, 2021, 125, 8074-8089). Consequently, the radiative decay rate for TADF ($k_r^{TADF}$) is intimately tied to $k_{ISC}$ (both $S_1 \rightarrow T_1$ and $T_1 \rightarrow S_1$) and the radiative rate of $S_1$ ($k_r^{S_1}$). In contrast, cMa complexes have ISC rates that are markedly faster ($k_{ISC}$=$10^{10}$~$10^{11}$ $s^{-1}$) than $k_r^{S_1}$ owing to high SOC imparted by the central metal ion (R. Hamze, et al., Journal of the American Chemical Society, 2019, 141, 8616-8626). Such rapid rates for $k_{ISC}$ means the equilibrium between singlet and triplet excited states is established rapidly, well before the emission from $S_1$. Compounds where the ISC rate exceeds $k_r^{S_1}$ allow one to employ the pre-equilibrium approximation such that the equilibrium constant ($K_{eq}$) becomes a principal factor that determines $k_r^{TADF}$ as shown in eq 1:

$$k_r^{TADF} = k_r^{S_1} \cdot K_{eq}(T_1 \leftrightarrows S_1) \quad \text{(eq 1)}$$

In this equation, $k_r^{TADF}$ is dependent on $k_r^{S_1}$ and $K_{eq}$, the latter which is related to $\Delta E_{ST}$. Thus, it is not necessary to know the exact ISC rates in these cMa emitters provided they are faster than $k_r^{S_1}$. The pronounced differences in ISC rates of organic versus cMa TADF emitters result in characteristic transient decay behavior from the excited state. Luminescence decay traces from organic TADF emitters typically display a short lived "prompt" fluorescence (ns time scale) and a longer lived "delayed" fluorescence (usually >1 μs, even up to ms timescale). The prompt signal is a combination of radiative fluorescence from the $S_1$ state and nonradiative ISC to the triplet state, where the delayed $k_r^{TADF}$ is controlled by ISC back to the $S_1$ state ($T_1 \rightarrow S_1$). However, the absence of a "prompt" process is often manifested in the cMa emitters since equilibration between the $S_1$ and $T_1$ states is typically faster than the instrument response function of the detector (on the order of less than 200 ps). Consequently, the emissive decay traces of cMa molecules is usually observed as a single exponential signal on μs scale, similar to those seen in phosphorescent complexes.

According to the analysis above, predictions can be made regarding the TADF properties of cMa complexes without prior knowledge about ISC rates since only $k_r^{S_1}$ and $\Delta E_{ST}$ need to be determined to determine $k_r^{TADF}$. The values of $k_r^{S_1}$ can be obtained experimentally from absorption spectra according to Stickler-Berg equation, whereas fits of temperature dependent luminescence data can be used to accurately derive $\Delta E_{ST}$ values. In this contribution, we explore the use of the spatial overlap between the hole and electron natural transition orbitals (NTOs) to predict $k_r^{TADF}$ in cMa emitters. The value of the NTO overlap can range from zero—which indicates purely CT transitions with no spatial overlap—to unity where excitation is localized on the same molecular orbital. The use of NTO overlap to predict TADF properties has been reported; however, this analysis only considered the impact of NTO overlap on the magnitude of $\Delta E_{ST}$ (T. Chen, et al., Sci. Rep., 2015, 5, 10923). Although a small $\Delta E_{ST}$ will give rise to more efficient ISC for $T_1 \rightarrow S_1$, a small NTO overlap also results in a low oscillator strength for emission from the $S_1$ state, and thus a lower $k_r^{S_1}$ which is detrimental for $k_r^{TADF}$. As the value for NTO overlap influences both variables critical for $k_r^{TADF}$, but with countervailing effects, a question is raised: is there an optimal value of NTO overlap where the two parameters are ideal? Here, by investigating a large family of cMa complexes with NTO overlaps ranging from 0.2 to 0.4, together with insight into their photophysical parameters, an optimal region for high $k_r^{TADF}$ in cMa complexes was identified to be from 0.25 to 0.30. Such analysis was also applied for organic TADF emitters, providing useful trends for these materials as well.

The general synthetic route to the compounds studied here is presented in Scheme 1, detailed synthetic procedures and characterization are included below. The N-heterocyclic carbene (NHC) precursor triflate salts 2 were prepared according to a published Ag(I) catalyzed 6-endo-dig cyclization (C. Zhang, et al., New J. Chem., 2017, 41, 1889-1892). The diisopropyl phenyl (dipp) substituents on the carbene nitrogen atoms hinder axial rotation around the metal-ligand bonds (R. Hamze, et al., Science, 2019, 363, 601; T.-y. Li, et al., Journal of the American Chemical Society, 2020, 142, 6158-6172). The preparation of the intermediate complex 3 varied depending on the metal ions. For Cu complexes, deprotonation of 2 with strong base provided the free carbene in-situ, and the products were obtained by reacting it with CuCl. For Ag complexes, 2 was treated with $Ag_2O$ and the triflate salt was isolated. The Au chloride complexes were synthesized via a metal exchange reaction with the Ag triflate salts using chloro(dimethylsulfide) gold. The cMa complexes were then prepared by reacting 3 with deprotonated carbazole or 3-cyanocarbazole, in yields over 70%. All these complexes were obtained as light yellow to orange crystalline powders. No obvious decomposition is observed in the $^1$H NMR spectra when the complexes are stored under ambient conditions.

Acronyms to distinguish the complexes are given as $R_1$-M or $R_1$-$M^{CN}$, where $R_1$ is Me (methyl) or Ph (phenyl) according to the substituent group, M is Cu, Ag or Au and the superscript CN is shown when $R_2$ is CN.

Scheme 1: General synthetic route for the coinage metal complexes, note, the counter ion for 3 is triflate in Ag complex.

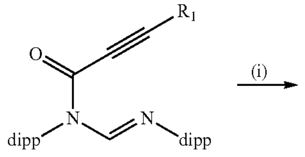

1

-continued

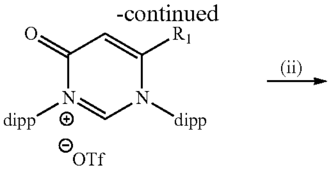

2

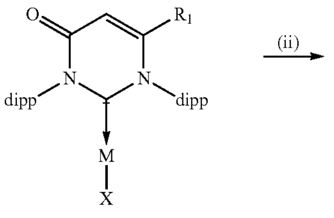

3

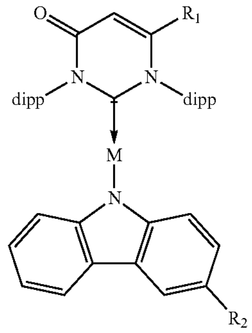

R1 = Methyl or Phenyl;
M = Cu, Ag or Au;
R2 = H or CN.
X = Cl, Otf

Figure 4:
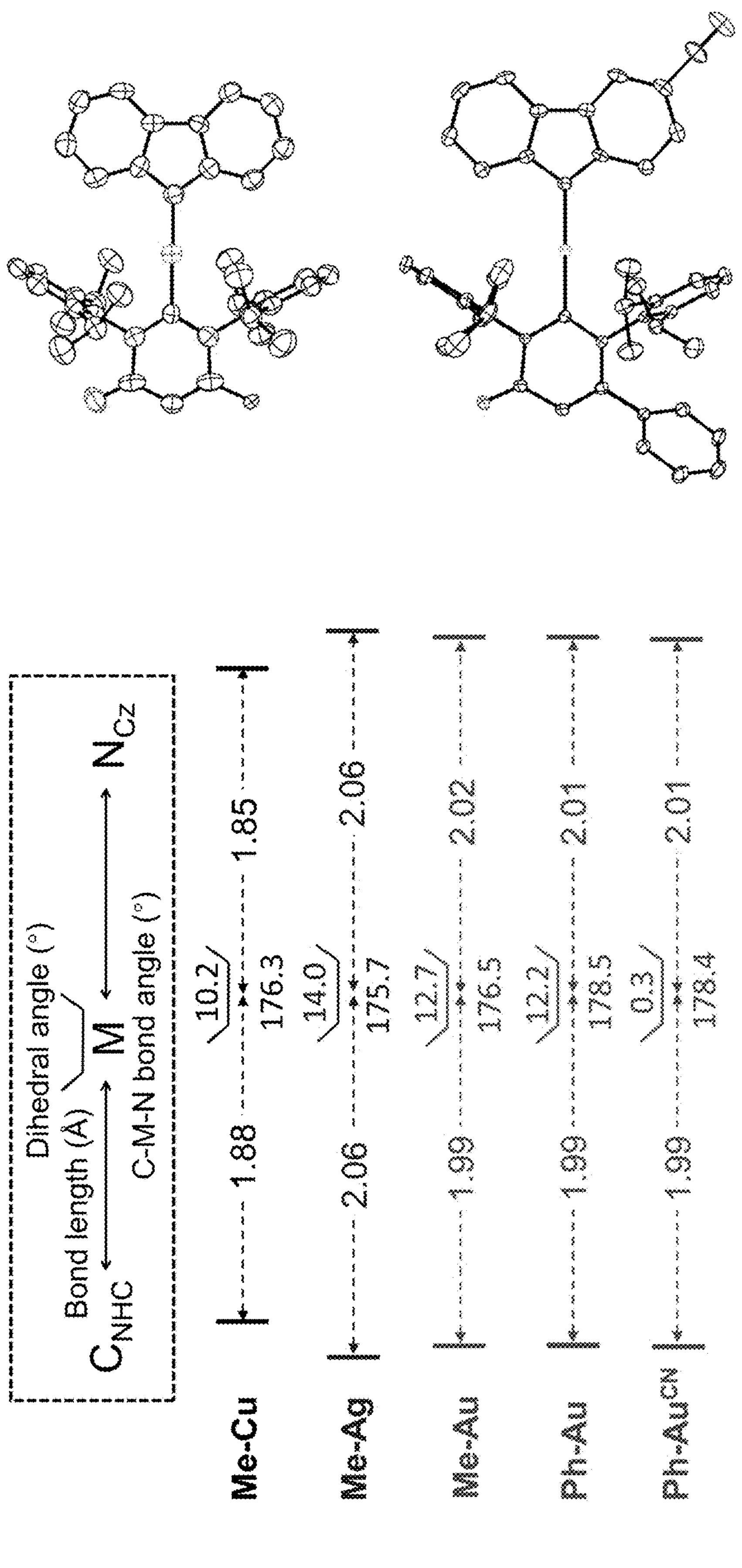
FIG. 4 depicts the critical crystallographic data from X-ray single crystal diffraction measurements, $C_{NHC}$ denotes the carbene carbon and $N_{Cz}$ is the carbazolyl nitrogen. Thermal ellipsoid figures of Me-Cu (top) and Ph-$Au^{CN}$ (bottom).

Molecular structures for five of the complexes were determined using single crystal X-ray analysis. Critical crystallographic data was presented and molecular structures of MeCu and Ph-Au$^{CN}$ were shown in FIG. 4. As revealed by the diffraction results, the molecules present linear two-coordination geometry with near coplanar orientation of NHC and carbazole ligands in agreement with data from analogous cMa derivatives (R. Hamze, et al., Science, 2019, 363, 601; S. Shi, et al., Journal of the American Chemical Society, 2019, 141, 3576-3588; R. Hamze, et al., Journal of the American Chemical Society, 2019, 141, 8616-8626; T.-y. Li, et al., Chemistry—A European Journal, 2021, 27, 6191-6197). The dihedral angles between the two ligands planes range from 0.3° to 14°. The $C_{NHC}$-M bond is longer than the M-$N_{Cz}$ bond in Me-Cu, but they become near equal in Me-Ag. In Au complexes, the $C_{NHC}$—Au is shorter than the M-$N_{Cz}$. The $C_{NHC}$ . . . $N_{Cz}$ distances in these complexes agree with our previous observations in related (carbene)M(amide) complexes Cu (~3.7 Å)<Au (~4.0 Å)<Ag (~4.1 Å).

The electrochemical properties of the complexes were investigated using cyclic voltammetry (CV) and differential pulsed voltammetry (DPV) methods (see below for the electrochemical traces and data). All the complexes undergo irreversible oxidation in DMF solution. For complexes with same ligands, the metal ion influenced $E_{ox}$ in a sequence of Ag<Cu<Au in steps of 0.1 V. Upon introduction of CN on the Cz ligand, the oxidation potential ($E_{ox}$) positively shifted by 0.24-0.29 V. A single reversible reduction ($E_{red}$=−2.25 to −2.37 V) is observed for complexes with methyl substituted carbenes within the measurable solvent window. Complexes with phenyl substituted carbenes show two reversible reductions, a reversible reduction near −2.0 V and an irreversible reduction at roughly −2.6 V. It is noteworthy that variations in $E_{red}$ between complexes with the same ligands and different metal ions are relatively small, i.e., the range for Cu, Ag and Au complexes is 0.07 V.

Figure 5:
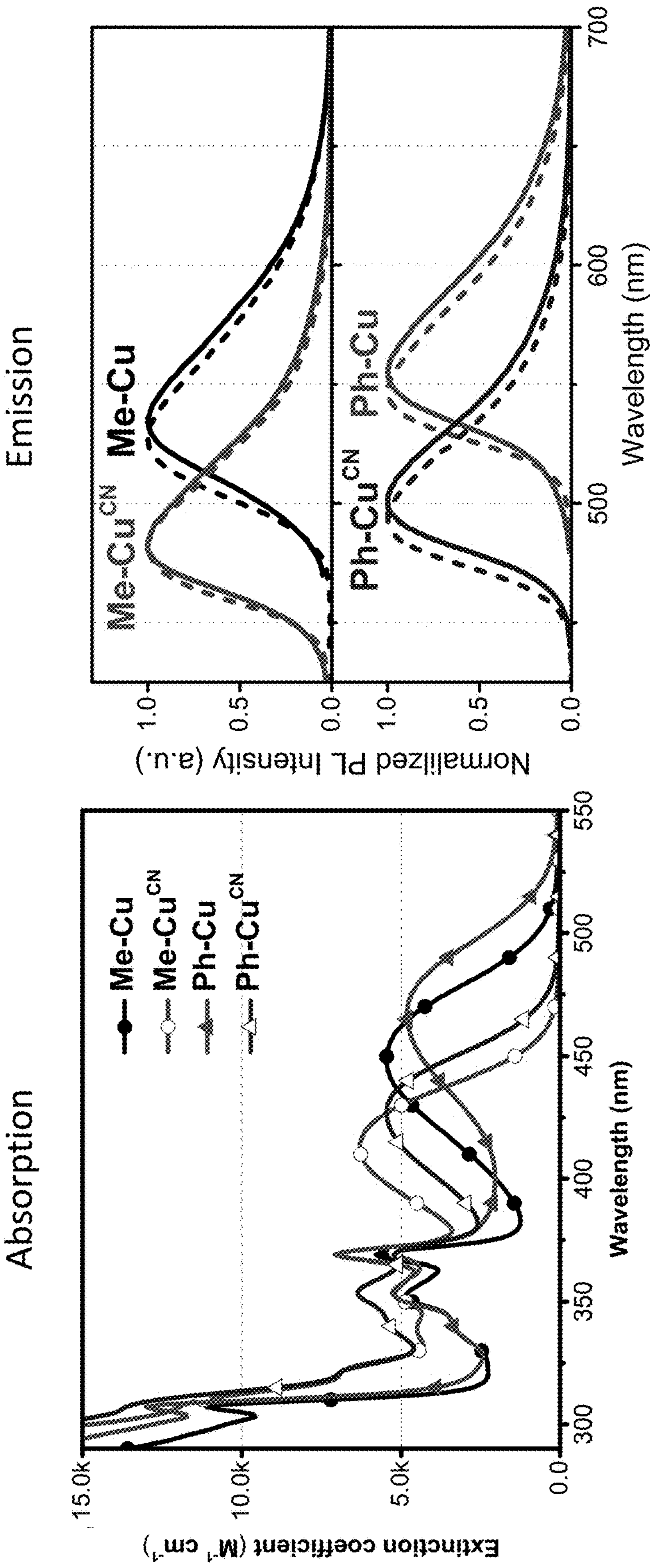
FIG. 5 is a series of plots of absorption (left) and emission (right) spectra of Cu-based complexes. Absorption spectra recorded in toluene solution at room temperature and emission spectra in doped PS (1 wt %) films at room temperature (solid) and 77 K (dash).

The photophysical properties of the two-coordinate complexes were studied in fluid solution and in doped polystyrene (PS) films. Other than a difference in extinction coefficients between the three metals (vide infra) the absorption and emission spectra for Cu, Ag and Au complexes with identical ligands show very similar profiles. Representative spectra for the Cu derivatives are shown in FIG. 5, spectra for the Ag and Au derivatives are given in the materials and methods section below, and data for all complexes is tabulated in Table 1. UV-visible absorption spectra for the copper-based complexes (FIG. 5, left) show π-π* transitions of the carbene ligands below 300 nm, transitions on the Cz ligands appear as well-structured bands from 300 to 375 nm and the broad, featureless bands at lowest energy are assigned to ICT transitions (Cz→carbene). Introduction of the CN substituent on Cz ligand stabilizes the HOMO and leads to a blue shift of 20 nm in the ICT absorption band. Replacing the methyl group with phenyl in the carbene ligand destabilizes the LUMO and leads to a further blue shift of roughly 15 nm. The effect of both substituents increases the energy of the ICT transition, resulting in blue shifted $S_0 \rightarrow S_1$ absorption bands. The principal difference between the complexes imparted by the three metal ions is that the extinction coefficients for the ICT transitions fall in the order Au>Cu>Ag. This trend can be rationalized as reflecting the effects of an extensive polarizability of the Au complexes and the large separation between the donor (carbazolyl) and acceptor (carbene) ligands in Ag complexes, with the Cu derivative falling between those two extremes.

TABLE 1

Photophysical properties of the cMa complexes at room temperature.[a]

| Complex | $\lambda_{max}^{abs}$(nm) | ε ($M^{-1}cm^{-1}$) | $\lambda_{max}^{em}$(nm) | $\Phi_{PL}$ | τ (μs) | $k_r$ (×$10^6$ $s^{-1}$) | $k_{nr}$ (×$10^{-6}$ $s^{-1}$) |
|---|---|---|---|---|---|---|---|
| Me—Cu$^{CN}$ | 413 | 6300 | 482 | 0.77 | 1.4 | 0.55 | 0.16 |
| Ph—Cu$^{CN}$ | 427 | 5460 | 500 | 0.83 | 1.1 | 0.75 | 0.15 |
| Me—Cu | 449 | 5470 | 534 | 0.58 | 1.5 | 0.39 | 0.28 |
| Ph—Cu | 468 | 4820 | 556 | 0.70 | 0.97 | 0.72 | 0.31 |
| Me—Ag$^{CN}$ | 398 | 1990 | 476 | 0.83 | 0.41 | 2.0 | 0.41 |
| Ph—Ag$^{CN}$ | 412 | 2120 | 498 | 0.88 | 0.60 | 1.5 | 0.20 |
| Me—Ag | 438 | 1960 | 530 | 0.77 | 0.41 | 1.9 | 0.56 |
| Ph—Ag | 456 | 2070 | 558 | 0.56 | 0.53 | 1.1 | 0.83 |
| Me—Au$^{CN}$ | 409 | 8670 | 484 | 0.50 | 0.81 | 0.62 | 0.62 |
| Ph—Au$^{CN}$ | 421 | 8330 | 504 | 1.00 | 0.82 | 1.2 | <0.01 |

TABLE 1-continued

| Photophysical properties of the cMa complexes at room temperature.[a] | | | | | | | |
|---|---|---|---|---|---|---|---|
| Complex | $\lambda_{max}^{abs}$(nm) | ε ($M^{-1}cm^{-1}$) | $\lambda_{max}^{em}$(nm) | $\Phi_{PL}$ | τ (μs) | $k_r$ ($\times 10^6$ $s^{-1}$) | $k_{nr}$ ($\times 10^{-6}$ $s^{-1}$) |
| Me—Au | 442 | 8180 | 528 | 0.50 | 1.1 | 0.45 | 0.45 |
| Ph—Au | 459 | 7550 | 554 | 0.77 | 0.80 | 0.96 | 0.29 |

[a]Absorption data recorded in toluene solution, luminescence data in doped PS (1 wt %) films. Ftje c The cMa complexes all display a broad visible ICT emission band when doped in a PS film at room temperature (FIG. 5, right). The emission energies are principally controlled by substituents on the ligands, with changes in the metal ion leading to only minor shifts in energy. The introduction of the CN substituent on Cz ligand induces a hypsochromic shift of around 50 nm. Complexes with the phenyl substituted carbene are red shifted by 25 nm from the methyl substituted analogs. These shifts can be explained by stabilization of the HOMO and LUMO, respectively, in analogy to shifts in the corresponding ICT absorption transitions. The complexes are all highly efficient luminophores ($\Phi_{PL}\geq 0.5$) with short emission lifetimes. The high $\Phi_{PL}$ values are a consequence of radiative decay rates on the order of $10^5$ to $10^6$ $s^{-1}$. The radiative decay rates for complexes with CN substituted Cz are faster than the analogues with Cz ligand, consistent with their blue shifted emission. Nearly all the complexes retain broad ICT emission profiles at 77 K in PS film (Me-Ag$^{CN}$ is the only one that gives structured emission at 77 K). The luminescence lifetimes become substantially longer upon cooling, with larger changes observed for the Cu (τ=93-256 μs) and Au (τ=47-82 μs) derivatives than for the Ag complexes (τ=2.7-7.2 μs). The large increase in decay lifetimes is comparable to changes found in related two-coordinated cMa derivatives and consistent with TADF phenomenon being responsible for luminescence in these compounds.

Figure 6:
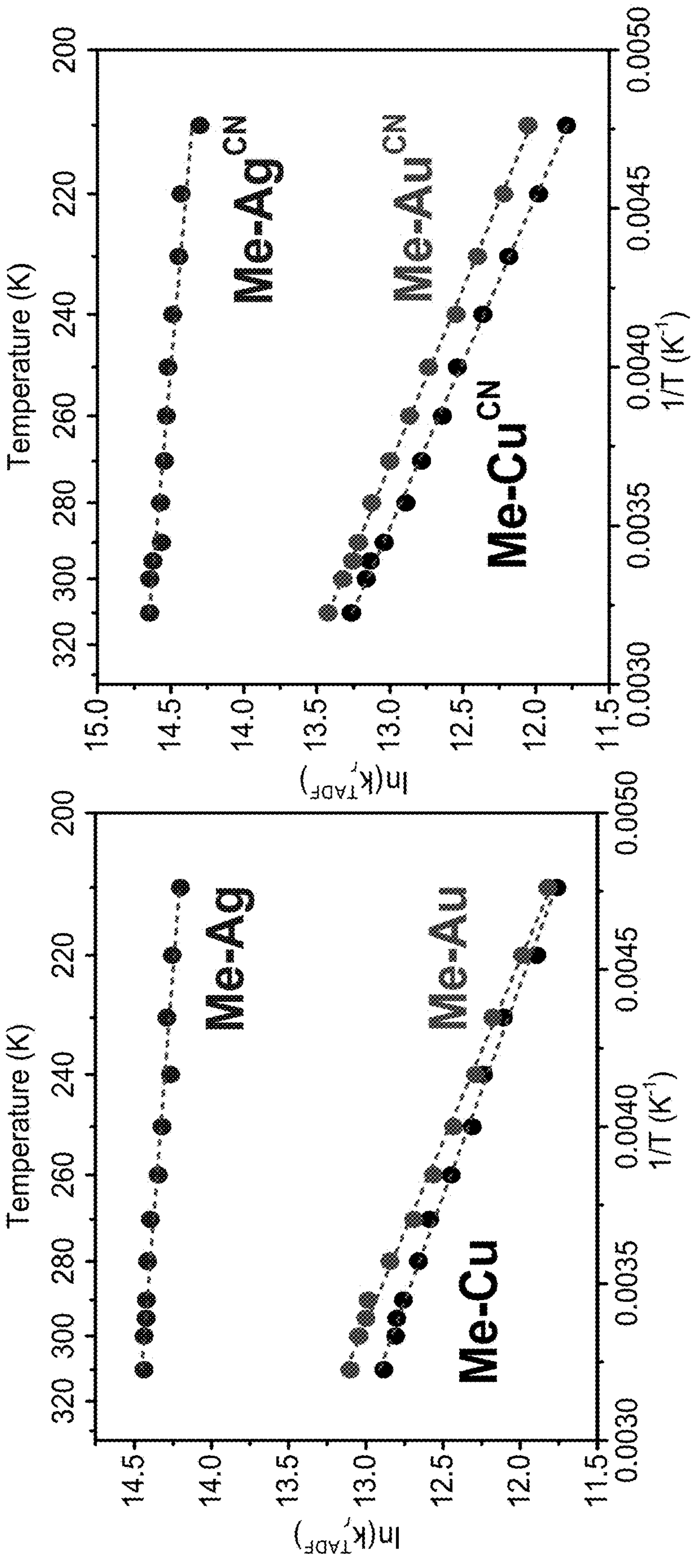
FIG. 6 depicts fits to the temperature dependent TADF radiative decay rate from 210 to 310 K according to the full kinetic dynamic scheme.

As discussed above, the rate of emission is controlled by $k_r^{S_1}$ and $\Delta E_{ST}$ in TADF luminophores that have fast ISC rates (where $S_1$ is the $^1$ICT state for cMa complexes discussed in this paper). In a study of related cMa complexes it was shown that both parameters could be accurately determined from fits to the temperature dependent luminescent decay rates between 200 and 300° C. The kinetic scheme employed to fit the temperature dependent lifetime data uses a modified Arrhenius type equation (eq 2). The slope of this fit gives $\Delta E_{ST}$ whereas the intercept provides $k_r^{S_1}$. For this fit to be valid the zero-field splitting of the triplet sublevels (ZFS) must be <<$\Delta E_{ST}$ to ensure that the emission in the 200-300° C. range is due solely to TADF and that temperature dependent phosphorescence is not contributing to the decay rate. This is a valid assumption for cMa complexes (M. Gernert, et al., Journal of the American Chemical Society, 2020, 142, 8897-8909). Fits for the methyl-substituted carbene complexes are shown in FIG. 6 (fits for the phenyl-substituted carbazole complexes are given in the SI) and the values for $\Delta E_{ST}$ are given in Table 2.

eq 2

$$\ln\left(k_r^{TADF}\right) = \ln\left(\frac{k_{ISC}^{S_1\to T_1}}{3}\left(1-\frac{k_{ISC}^{S_1\to T_1}}{k_r^{S_1}+k_{ISC}^{S_1\to T_1}}\right)\right)-\frac{\Delta E_{ST}}{k_B T}=\ln(b)-\frac{1}{T}\left(\frac{\Delta E_{ST}}{k_B}\right)$$

TABLE 2

| TADF related photophysical data and calculated NTO overlap values. | | | | | | | | |
|---|---|---|---|---|---|---|---|---|
| Complex | Cpd. No. | $k_r^{TADF}$ ($10^6$ $s^{-1}$) | $k_r^{TADF}/E^3$ ($10^4$ $s^{-1}eV^{-3}$) | $\Delta E_{ST}$ (meV) | $k_{r,KT}^{S_1}$ ($10^6$ $s^{-1}$) | $k_{r,SB}^{S_1}$ ($10^6$ $s^{-1}$) | NTO overlap ($S_1$) | NTO overlap ($T_1$) |
| Me—Cu$^{CN}$ | 1 | 0.55 | 3.1 | 83 | 38 | 34 | 0.361 | 0.456 |
| Ph—Cu$^{CN}$ | 2 | 0.75 | 4.8 | 55 | 19 | 25 | 0.301 | 0.433 |
| Me—Cu | 3 | 0.39 | 3.0 | 64 | 13 | 24 | 0.377 | 0.450 |
| Ph—Cu | 4 | 0.72 | 6.5 | 55 | 19 | 18 | 0.311 | 0.418 |
| Me—Ag$^{CN}$ | 5 | 2.0 | 11 | 16 | 13 | 14 | 0.272 | 0.360 |
| Ph—Ag$^{CN}$ | 6 | 1.5 | 9.5 | 10 | 6.7 | 15 | 0.211 | 0.309 |
| Me—Ag | 7 | 1.9 | 15 | 14 | 9.5 | 11 | 0.268 | 0.343 |
| Ph—Ag | 8 | 1.1 | 9.6 | 14 | 5.5 | 11 | 0.212 | 0.289 |
| Me—Au$^{CN}$ | 9 | 0.62 | 3.6 | 78 | 37 | 46 | 0.391 | 0.509 |
| Ph—Au$^{CN}$ | 10 | 1.2 | 8.2 | 61 | 38 | 39 | 0.364 | 0.498 |
| Me—Au | 11 | 0.45 | 3.6 | 75 | 25 | 37 | 0.411 | 0.500 |
| Ph—Au | 12 | 0.96 | 8.6 | 59 | 28 | 29 | 0.342 | 0.477 |

In previous studies of related cMa complexes values for $k_r^{S_1}$ were determined from the intercept of linear fits to eq 3; however, this approach was for samples where nonradiative decay was slow and temperature independent ($\Phi_{PL}$~1). Although some of the samples here have $\Phi_{PL}$~1, others are markedly below this value. Therefore, to correct for any temperature dependence of $k_n^{S_1}$, $k_r^{TADF}$ was calculated from the PL efficiency determined at each temperature and those values were used to estimate $k_r^{S_1}$ from fits to equation 2. Alternately, a method for estimating $k_r^{S_1}$ described by Strickler and Berg can be used based on the absorption spectra (S. J. Strickler and R. A. Berg, The Journal of Chemical Physics, 1962, 37, 814-822; N. J. Turro, et al., University Science Book, Sausali-to, California, 2009). This analysis uses the integrated extinction spectrum for the $^1$ICT band to estimate the oscillator strength and Einstein equation to give the radiative rate. To evaluate both methods for determining $k_r^{S_1}$, radiative rates from the temperature dependent studies ($k_{r,KT}^{S_1}$) were compared to estimates for $k_r^{S_1}$ from a Strickler-Berg analysis of the absorption spectra in toluene solution ($k_{r,SB}^{S_1}$). The relationship between the two values was plotted (FIG. 7) and a linear correlation was established, $k_{r,KT}^{S_1}=0.90(k_{r,SB}^{S_1})-1.59\times10^{6}\ s^{-1}$ with Pearson correlation coefficient of 0.93. A good agreement is found between the $k_r^{S_1}$ values derived from fitting eq 2 and the Strickler-Berg analysis in cases where $\Phi_{PL}\sim1$. However, the correspondence between values from the two methods shows pronounced divergence for compounds that have the lowest $\Phi_{PL}$ (Table 3). This leads to the consideration that the correction made for $\Phi_{PL}<1$ is inadequate to fully account for the temperature dependence of nonradiative decay. For this reason, values for $k_r^{S_1}$ from the Stickler-Berg analysis were used to obtain correlations with the NTO overlap in the subsequent plots.

Figure 8:
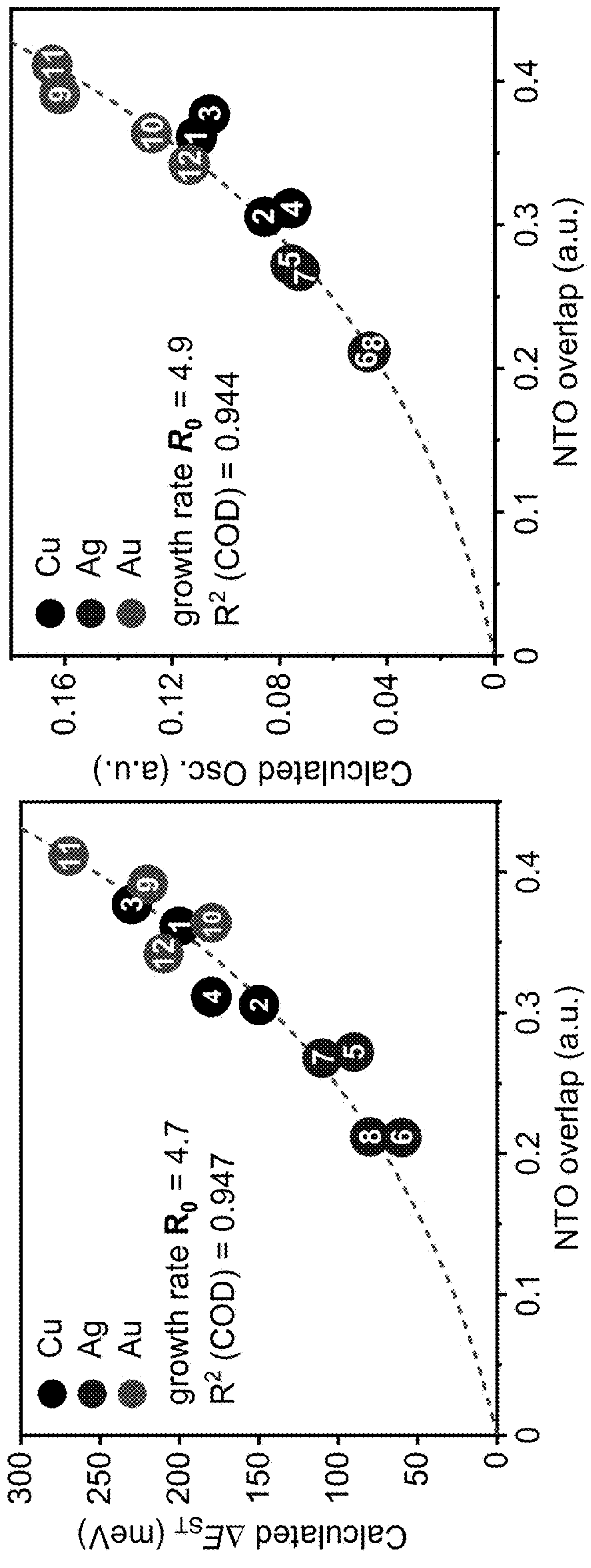
FIG. 8 is a series of plots showing the relationship between $^1$ICT NTO overlap value versus theoretically calculated $\Delta E_{ST}$ (left) and oscillator strength (right) of the $S_1$ state by TD-DFT method; fits to the data are obtained using the exponential growth function: $y=A(e^{R_0x}-1)$.

The radiative decay rate for TADF ($k_r^{TADF}$) for systems with fast ISC is determined principally by $k_r^{S_1}$ and $\Delta E_{ST}$, i.e. $k_r^{TADF}=k_r^{S_1}\cdot K_{eq}=k_r^{S_1}\cdot 0.33\exp(-\Delta E_{ST}/kT)$. It is inferred that these two parameters are closely related to the change of electron density distribution between the initial and final states in the $^1$ICT ($S_1$) transition, which can be quantified by the overlap between the h-NTO and e-NTO for the emissive $^1$ICT state. In other words, greater overlap between these NTOs will increase the oscillator strength (and $k_r^{S_1}$) as well as the $\Delta E_{ST}$ owing to an increase in the exchange energy (N. J. Turro, et al., University Science Book, Sausali-to, California, 2009; S. P. McGlynn, et al., Adv. Funct. Mater., 2021, 31, 2101175). Since a large $k_r^{S_1}$ and small $\Delta E_{ST}$ is preferred when aiming for a rapid $k_r^{TADF}$, optimizing these two conflicting effects should lead to an ideal value for the NTO overlap to achieve the fastest $k_r^{TADF}$. The spatial NTO overlap integral between the electron and hole associated with the electronic transitions from ground state to both $S_1$ and $T_1$ state can be computed according to the following expression:

$$NTO\ \text{overlap integral} = \frac{\sum_k \sigma_k \int |{}_e^k\varphi||{}_h^k\varphi|\,d\tau}{\sum_k \sigma_k}$$

where ${}_e^k\varphi$ and ${}_h^k\varphi$ are the electron and hole orbital pairs and $\sigma_k$ is the amplitude of a given orbital pair that contributes to the total NTO. The overlap value was numerically evaluated as described previously (S. P. McGlynn, et al., Adv. Funct. Mater., 2021, 31, 2101175). Table 3 gives the NTO overlap values for the $S_1$ and $T_1$ (ICT) states, $^1$ICT and $^3$ICT, respectively. As observed previously (T. Chen, et al., Sci. Rep., 2015, 5, 10923), the NTO overlap is larger for the triplet state than the singlet state, however the trends are the same as a function of metal, i.e. $^3$ICT NTO overlaps fall in the order Au>Cu>Ag. These twelve complexes present ideal candidates to examine the dependence of $k_r^{S_1}$ and $\Delta E_{ST}$ on NTO overlap, since the different metal ions and substituents involved in the electronic transitions lead to a wide range of NTO overlap values ($^1$ICT NTO overlap from 0.21 to 0.41). The role of NTO overlap on these parameters was first investigated using values for $\Delta E_{ST}$ and oscillator strength obtained from TD-DFT calculations for the $^1$ICT state. Plots of the two parameters versus $^1$ICT NTO overlap are shown in FIG. 8. It is evident that $\Delta E_{ST}$ will be zero and $k_r^{S_1}$ will be vanishingly small when the NTO overlap is zero. Thus, these parameters were fit to the following exponential growth function: $y=A(e^{R_0x}-1)$, where $R_0$ is referred to as the growth rate. The values for both parameters obtained from TD-DFT calculations ($R_0$=4.7 and 4.9 for $\Delta E_{ST}$ and the oscillator strength, respectively) are proportional to the $^1$ICT NTO overlap.

Figure 9:
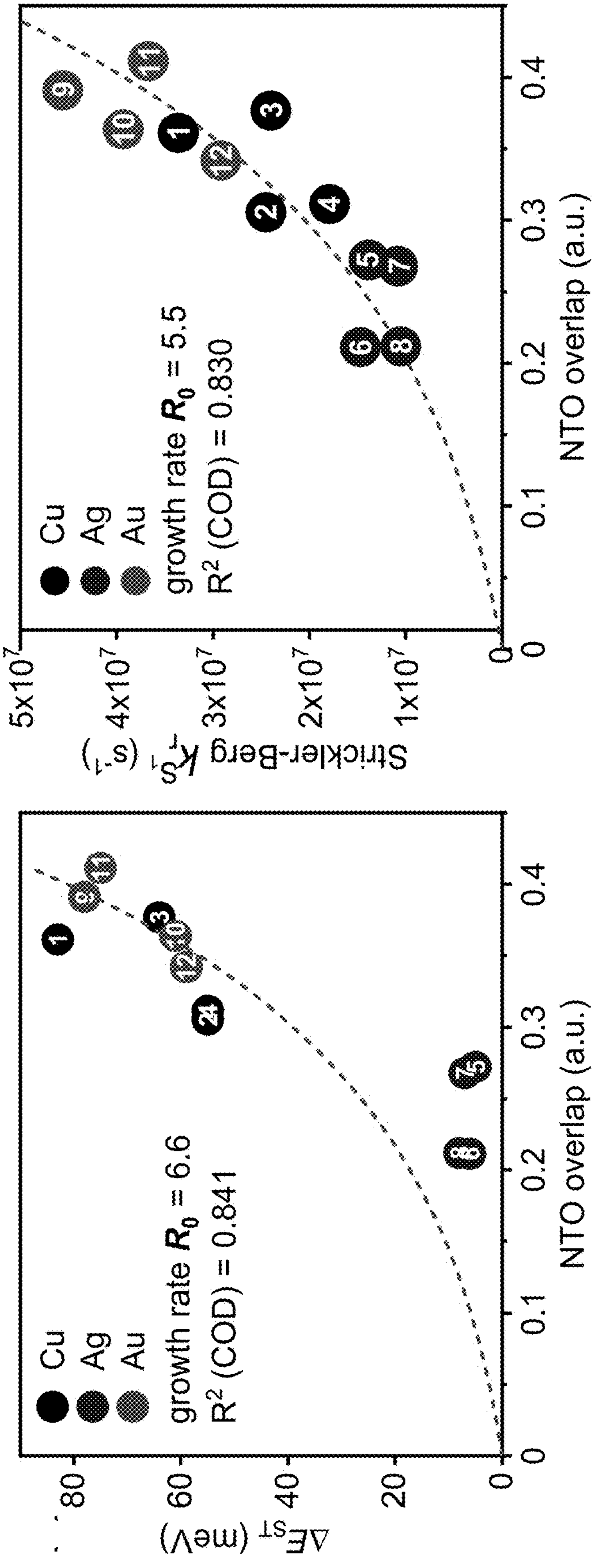
FIG. 9 is a series of plots showing the relationship between $^1$ICT NTO overlap value versus $\Delta E_{ST}$ (left) and radiative decay rate of the $^1$ICT state (right) according to the Strickler-Berg equation; fits to the data are obtained from on the twelve complexes in this work using the exponential growth function: $y=A(e^{R_0x}-1)$.

Experimental values for $\Delta E_{ST}$ and $k_{r,SB}^{S_1}$ are plotted versus the $^1$ICT NTO overlap in FIG. 9. These plots can also be fit to an exponential growth function with an $R_0$ of 6.6 and 5.5, respectively. It is interesting to note that the exponential fits to both theoretical and experimental results give similar values. Thus, the theoretical studies and temperature dependent photophysical investigations support the hypothesis that the NTO overlap of the emissive $^1$ICT state is indeed a key parameter controlling $\Delta E_{ST}$ and $k_r^{S_1}$, which consequently determines $k_r^{TADF}$.

Figure 10:
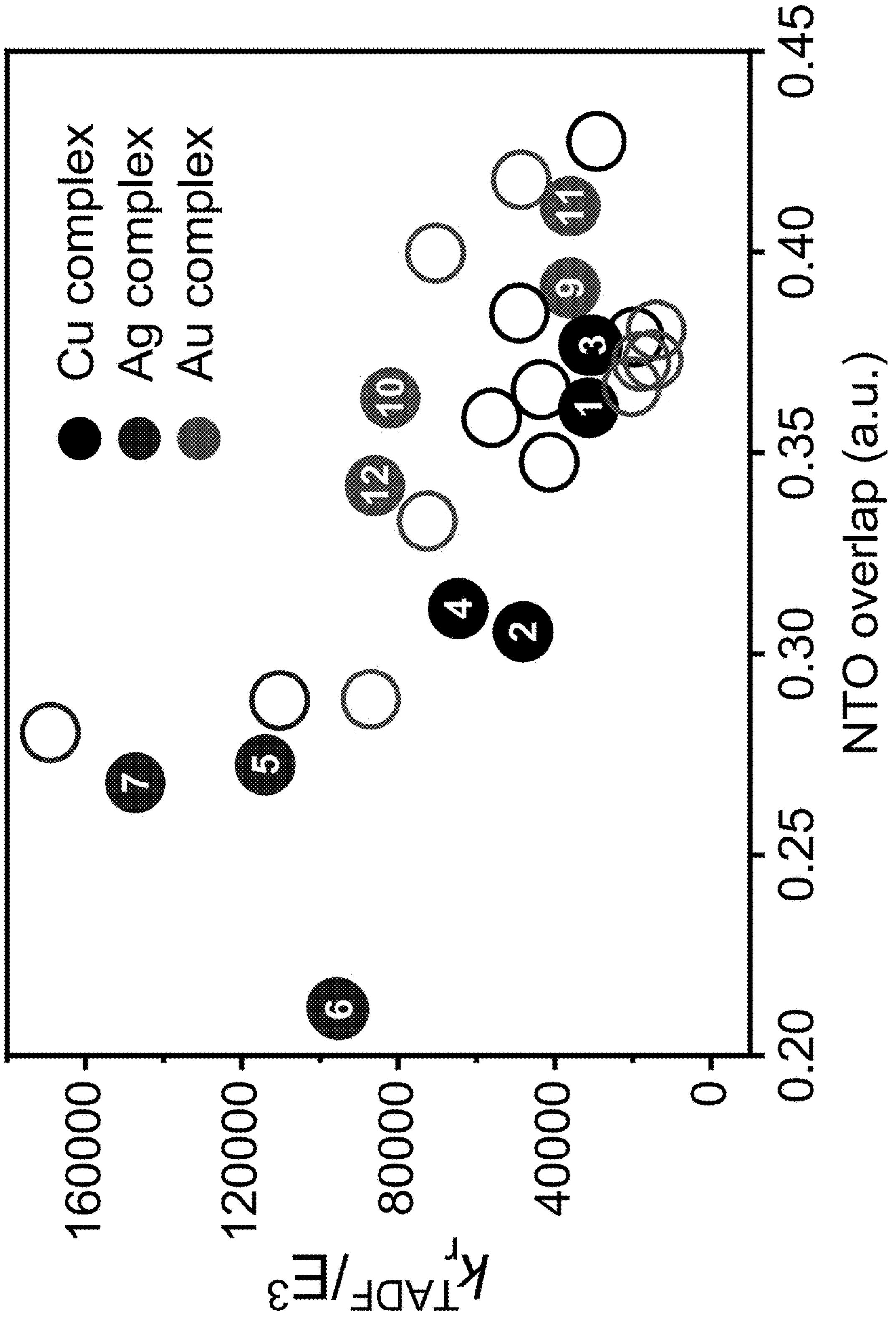
FIG. 10 is a plot of the relationship between the reduced TADF radiative decay rate versus NTO overlap of the $^1$ICT state. The closed symbols are from this work and the open symbols are for previously reported (carbene)M(carbazolyl) complexes.

According to the Einstein radiation law, the radiative decay rate is proportional to the cube of the emission energy. The reduced $k_r^{TADF}$ ($k_r^{TADF}/E^3$, where E is the emission energy derived from the emission maximum) for complexes in this work, as well as other monometallic and bimetallic (carbene)M(N-carbazolyl) complexes previously reported, was plotted as a function of the NTO overlap values calculated for $^1$ICT state (FIG. 10). Note here, only those cMa complexes that emit from ICT states were selected to eliminate discrepancies caused by influence from the higher lying $^3$Cz state. From this data, rates for $k_r^{TADF}$ are found to be fastest for complexes with NTO overlaps of 0.27-0.30 and decrease with higher and lower NTO overlap values.

Figure 11:
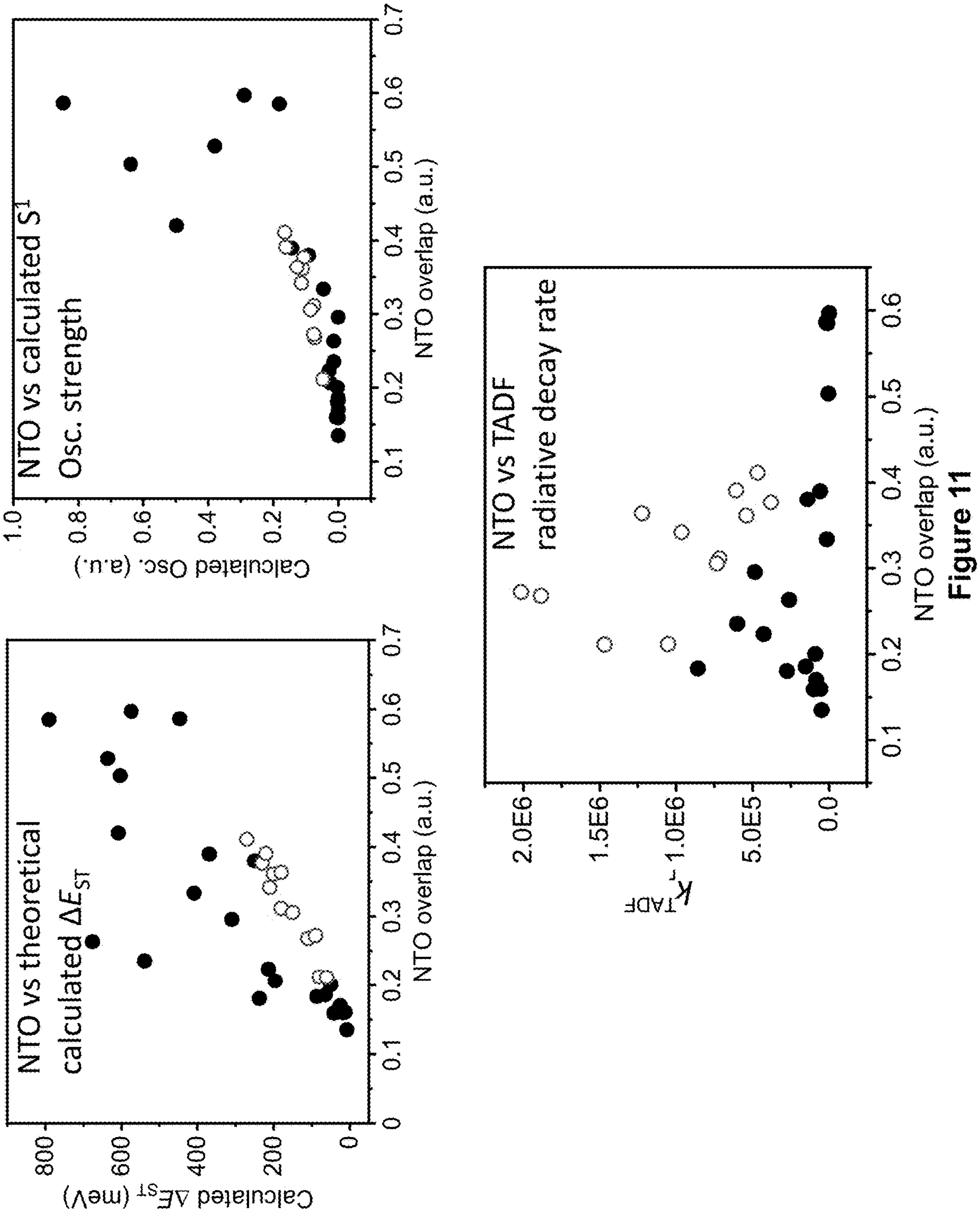
FIG. 11 is a series of plots of the relationship between NTO overlap versus theoretical calculated $\Delta E_{ST}$ (top left) (b) calculated $S_1$ state oscillator strength (top right), and TADF radiative decay rate (bottom) in organic TADF molecules, data of exemplary organometallic TADF complexes of the present disclosure are shown as empty red circles.

A similar analysis of NTO overlap was carried out for selected organic TADF molecules to evaluate the scope of the correlations. Organic TADF molecules were chosen as listed in Table S12 and their photophysical properties were collected from literature (H. Tanaka, et al., Chem. Commun, 2012, 48, 11392-11394; Y. Liu, et al., Nature Reviews Materials, 2018, 3, 18020; M. Godumala, et al., Journal of Materials Chemistry C, 2019, 7, 2172-2198; H. Noda, et al., Nature Materials, 2019, 18, 1084-1090; H. Noda, et al., Science Advances, 2018, 4, 6910; L.-S. Cui, et al., Nature Photonics, 2020, 14, 636-642; Y. Kondo, et al., Nature Photonics, 2019, 13, 678-682; J. U. Kim, et al., Nature Communications, 2020, 11, 1765; N. Aizawa, et al., Nature Communications, 2020, 11, 3909; D. Hall, et al., Advanced Optical Materials, 2020, 8, 1901627; J. Lee, et al., Chem. Mater., 2017, 29, 8012-8020; S. Jeong, et al., Journal of Materials Chemistry C, 2018, 6, 9049-9054; I. S. Park, et al., Adv. Funct. Mater., 2018, 28, 1802031; S. Wang, et al., Angew. Chem. Int. Ed., 2015, 54, 13068-13072; K. Shizu, et al., The Journal of Physical Chemistry C, 2015, 119, 26283-26289; S. Hirata, et al., Nature Materials, 2015, 14, 330-336; T. Hatakeyama, et al., Adv. Mater., 2016, 28, 2777-2781; T.-A. Lin, et al., Adv. Mater., 2016, 28, 6976-6983; Q. Zhang, et al., Adv. Mater., 2015, 27, 2096-2100; J. Guo, et al., Adv. Funct. Mater., 2017, 27, 1606458; G. Xie, et al., Adv. Mater., 2016, 28, 181-187). Although the theoretical methods used to determine values for the NTO overlap were the same as those applied for the coinage metal complexes, different methods used to obtain experimental values for organic TADF molecules make the comparisons problematic. Nevertheless, the theoretical $\Delta E_{ST}$ values can still be evaluated as all compounds were calculated using the same method and basis set and show a clear increase with greater NTO overlap (FIG. 11, top left). It is apparent that coinage metal TADF complexes give smaller $\Delta E_{ST}$ than organic compounds with the same NTO overlap value. It is also noteworthy that for organic TADF molecules the calculated oscillator strength of the S1 state increases significantly only when the NTO overlap is greater than 0.45 (FIG. 11, top right). The variation of the measured $k_r^{TADF}$ values for organic TADF emitters as a function of NTO overlap is shown in FIG. 11 (bottom). The value for $k_r^{TADF}$ in organic TADF molecules also peaks at NTO overlaps of 0.2-0.3, albeit with slower rates than values found for two-coordinate coinage metal TADF complexes having comparable NTO overlaps. Thus, analysis of NTO overlaps can provide meaningful insight for the design of organic TADF molecules as well.

In summary, a series of twelve two-coordinate Cu, Ag and Au complexes were synthesized with cMa structure. They all display TADF emission from ICT states with fast decay lifetimes and high luminescence efficiency. NTO overlaps of the emissive $^1$ICT states were quantified using theoretical calculations. The use of different metal ions and chemical modification on both ligands leads to NTO overlap values that cover a wide range (from 0.21 to 0.41). Detailed theoretical and experimental investigations shed light on the influence of NTO overlap on $\Delta E_{ST}$ and $k_r^{S_1}$, indicating that both parameters increase exponentially with increasing NTO overlap. However, since increasing $\Delta E_{ST}$ and $k_r^{ICT}$ exerts opposing effects on $k_r^{TADF}$, the radiative rate will increase up to a maximum value with greater NTO overlap before subsequently declining Thus, an ideal zone for fast $k_r^{TADF}$ occurs between NTO overlap values of 0.25 to 0.30. More importantly, other cMa complexes agree well with these trends, whether monometallic or bimetallic and regardless of the identity of the coinage metal ion. Thus, NTO overlap values can be used as a general method to evaluate $k_r^{TADF}$ in such two-coordinate TADF ICT emitters. Further studies will focus on the following points: 1) examine additional cMa complexes, especially those with NTO overlap in the range from 0.1 to 0.25 to establish more accurate trends in the photophysical properties and, 2) design molecules according to the trends explored in this work to facilitate faster $k_r^{TADF}$. This work not only provides a quantifiable metric to improve intrinsic $k_r^{TADF}$ for two-coordinate coinage metal complexes, but also provides a new perspective to evaluate photophysical properties in other molecular systems with charge transfer excited states by using NTO overlap as a method to theoretically appraise potential candidate emitters.

Materials and Methods

General information: All reactions were carried out using Schleck line system under $N_2$ in oven dried glassware. Organic and inorganic materials were used as commercial grade without further purifications. Anhydrous solvents were purified by Class Contour solvent system by SG Water USA, LLC. $^1$H and $^{13}$C NMR spectra were recorded on a Varian Mercury 400 instrument. Elemental analyses were performed at University of Southern California, using a Fisher CHNS 2000 instrument.

Syntheses and Characterization

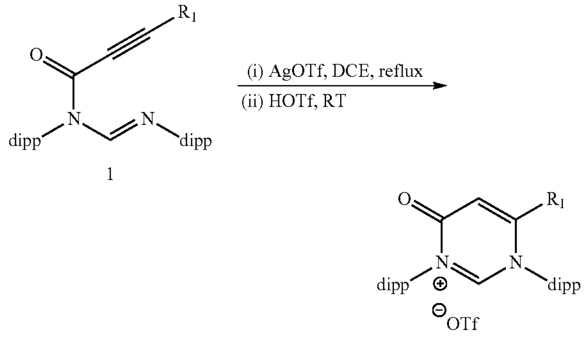

1

2

$R_1$=Methyl or Phenyl

General procedure for the carbene precursors: The methyl or phenyl substituted acetylenyl formamidine 1 was synthesized according to previous method, and the following 6-endo-dig cyclization was performed using a modified procedure (C. Zhang, et al., New J. Chem., 2017, 41, 1889-1892; J. Wang, et al., Nat. Commun., 2017, 8, 14625). Equal equivalent of 1 (500 mg) and AgOTf (300 mg) were dissolved in 20 mL dichloromethane (DCE) in a sealed glass vial. The solution was refluxed for 1 h and the clear colorless solution turned into dark brown suspension with Ag mirror on the wall. After cooling down to room temperature, the suspension was filtrated through Celite. The filtration was injected to another sealed vial and 1 equiv. of HOTf was added dropwise. The system was stirred at room temperature for another 1 h. The solution was filtered through Celite. After removing all the volatiles, the raw product was washed by cold ether for three times, giving the carbene precursors as white powder.

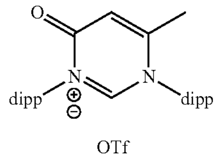

Obtained 300 mg, yield 91%. $^1$H NMR (400 MHz, acetone) δ 10.35 (s, 1H), 7.80-7.74 (m, 1H), 7.69-7.60 (m, 3H), 7.52 (d, J=7.8 Hz, 2H), 7.36 (s, 1H), 2.99 (sept, J=6.7 Hz, 2H), 2.89 (sept, J=6.8 Hz, 2H), 2.33 (d, J=1.1 Hz, 3H), 1.38 (d, J=6.7 Hz, 6H), 1.28 (d, J=6.8 Hz, 12H), 1.19 (d, J=6.7 Hz, 6H).

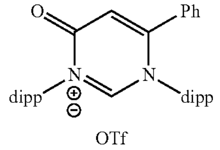

Obtained 298 mg, yield 93%. $^1$H NMR (400 MHz, acetone) δ 10.41 (d, J=0.5 Hz, 1H), 7.70-7.64 (m, 1H), 7.62-7.55 (m, 1H), 7.55-7.50 (m, 3H), 7.47 (t, J=1.4 Hz, 1H), 7.46-7.38 (m, 6H), 3.20 (sept, J=6.7 Hz, 2H), 2.98 (sept, J=6.7 Hz, 2H), 1.30 (d, J=6.8 Hz, 6H), 1.24 (d, J=6.8 Hz, 6H), 1.19 (d, J=6.7 Hz, 6H), 1.16 (d, J=6.6 Hz, 6H).

Synthesis of the Cu complexes: Carbene precursor was dissolved in 150 mL anhydrous THF at room temperature and 1.05 equiv. of KHMDS (0.5M in toluene) was injected dropwise. After stirring at room temperature for 3 h, 1.1 equiv. of CuCl was added in one portion and the system was kept stirring for overnight. Then, the mixture was filtered through Celite. After removing the volatiles, the residue was sonicated in ether giving the intermediate complex 3 as beige powder (yield around 60%), which was used in the following reactions without further purifications.

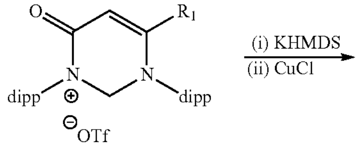

2

-continued

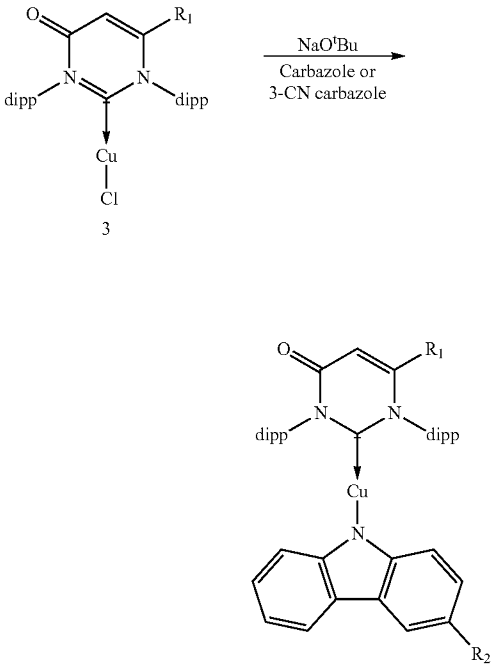

3

Me-Cu: $R_1$=Me, $R_2$=H;
Me-Cu$^{CN}$: $R_1$=Me, $R_2$=CN;
Ph-Cu: $R_1$=Ph, $R_2$=H;
Ph-Cu$^{CN}$: $R_1$=Ph, $R_2$=CN.

Me-Cu, Me-Cu$^{CN}$, Ph-Cu and Ph-Cu$^{CN}$ were synthesized according to a known procedure which was well described in previous publications (R. Hamze, et al., Science, 2019, 363, 601; S. Shi, et al., Journal of the American Chemical Society, 2019, 141, 3576-3588; R. Hamze, et al., Journal of the American Chemical Society, 2019, 141, 8616-8626).

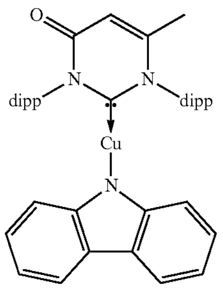

Me-Cu was obtained with a yield of 80% as yellow powder. $^1$H NMR (400 MHz, acetone) δ 7.93 (t, J=7.8 Hz, 1H), 7.81 (t, J=7.8 Hz, 1H), 7.74 (d, J=7.6 Hz, 2H), 7.69 (d, J=7.9 Hz, 2H), 7.58 (d, J=7.8 Hz, 2H), 6.85 (ddd, J=8.2, 7.0, 1.3 Hz, 2H), 6.79-6.69 (m, 3H), 5.60 (d, J=8.1 Hz, 2H), 2.99 (sept, J=6.7 Hz, 4H), 2.15 (d, J=0.9 Hz, 3H), 1.39 (d, J=6.8 Hz, 6H), 1.28 (d, J=6.8 Hz, 6H), 1.23 (dd, J=9.5, 6.9 Hz, 12H). $^{13}$C NMR (101 MHz, acetone) δ 158.51, 155.04, 149.80, 145.77, 145.62, 136.99, 135.97, 131.48, 130.39, 125.86, 124.91, 123.95, 122.78, 118.44, 115.09, 114.58, 111.72, 29.65, 28.75, 28.33, 24.72, 23.63, 23.37, 22.60, 20.18. Elemental analysis calculated C 74.57, H 7.02, N 6.36; found C 74.24, H, 7.05 N 6.13.

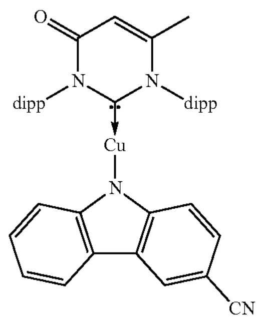

Me-Cu$^{CN}$ was obtained with a yield of 77% as bright yellow powder. $^1$H NMR (400 MHz, acetone) δ 8.18-8.12 (m, 1H), 7.97 (t, J=7.8 Hz, 1H), 7.90-7.81 (m, 2H), 7.71 (d, J=7.9 Hz, 2H), 7.59 (d, J=7.8 Hz, 2H), 7.11 (dd, J=8.5, 1.7 Hz, 1H), 6.98 (ddd, J=8.2, 7.1, 1.3 Hz, 1H), 6.88 (td, J=7.5, 1.0 Hz, 1H), 6.74 (d, J=1.0 Hz, 1H), 5.65 (d, J=8.1 Hz, 1H), 5.55 (dd, J=8.5, 0.5 Hz, 1H), 3.06-2.91 (m, 4H), 2.15 (s, 3H), 1.38 (d, J=6.8 Hz, 6H), 1.24 (dd, J=10.7, 6.8 Hz, 12H), 1.19 (d, J=6.9 Hz, 6H). $^{13}$C NMR (101 MHz, acetone) δ 158.41, 155.07, 151.55, 150.44, 145.87, 145.70, 136.99, 135.98, 131.67, 130.59, 125.98, 125.66, 125.02, 124.52, 124.19, 123.75, 123.23, 121.35, 119.26, 117.12, 115.12, 115.05, 112.01, 96.85, 28.86, 24.76, 23.64, 23.37, 22.57, 20.17. Elemental analysis calculated C 73.60, H 6.62, N 8.17; found C 73.08, H 6.44, N 7.99.

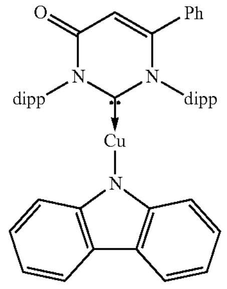

Ph-Cu was obtained with a yield of 82% as yellow powder. $^1$H NMR (400 MHz, acetone) δ 7.82 (t, J=7.8 Hz, 1H), 7.77-7.70 (m, 3H), 7.60 (d, J=7.8 Hz, 2H), 7.47 (d, J=7.9 Hz, 3H), 7.37 (dd, J=5.1, 1.5 Hz, 4H), 6.82 (ddd, J=8.2, 7.0, 1.3 Hz, 2H), 6.78 (s, 1H), 6.71 (td, J=7.4, 1.0 Hz, 2H), 5.59-5.53 (m, 2H), 3.12 (dhept, J=20.3, 6.6 Hz, 4H), 1.29 (d, J=6.8 Hz, 6H), 1.26 (d, J=6.8 Hz, 6H), 1.23 (d, J=6.9 Hz, 6H), 1.17 (d, J=6.7 Hz, 6H). $^{13}$C NMR (101 MHz, acetone) δ 158.40, 156.70, 149.77, 146.05, 145.93, 137.53, 136.00, 131.73, 131.34, 130.59, 130.50, 129.35, 128.21, 125.44, 125.03, 123.96, 122.75, 118.42, 115.06, 114.62, 113.14, 28.85, 25.51, 23.68, 23.63, 21.96. Elemental analysis calculated C 76.48, H 6.70, N 5.82; found C 76.23, H 6.44, N 5.64.

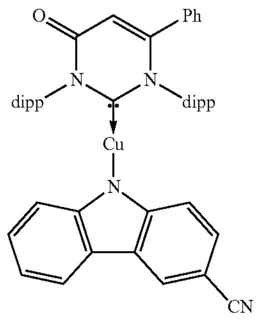

Ph-$Cu^{CN}$ was obtained with a yield of 75% as bright yellow powder. $^1H$ NMR (400 MHz, acetone) δ 8.16 (s, 1H), 7.89 (t, J=7.9 Hz, 2H), 7.81 (t, J=7.8 Hz, 1H), 7.64 (d, J=7.8 Hz, 2H), 7.51 (t, J=6.6 Hz, 2H), 7.49-7.44 (m, 1H), 7.40 (dd, J=8.7, 5.3 Hz, 4H), 7.11 (dd, J=8.5, 1.5 Hz, 1H), 6.98 (t, J=7.1 Hz, 1H), 6.89 (t, J=7.3 Hz, 1H), 6.83 (s, 1H), 5.65 (d, J=8.1 Hz, 1H), 5.54 (d, J=8.5 Hz, 1H), 3.15 (dtd, J=20.4, 13.5, 6.7 Hz, 4H), 1.29 (t, J=7.3 Hz, 12H), 1.24 (d, J=6.8 Hz, 6H), 1.19 (d, J=6.7 Hz, 6H). $^{13}C$ NMR (101 MHz, acetone) δ 158.31, 156.66, 151.51, 150.42, 146.12, 146.03, 137.58, 136.02, 131.61, 131.52, 130.70, 130.67, 129.34, 128.25, 125.63, 125.56, 125.15, 124.49, 124.20, 123.72, 123.24, 121.35, 119.24, 117.09, 115.16, 115.10, 113.41, 96.81, 28.84, 25.57, 23.69, 23.64, 21.93. Elemental analysis calculated C 75.52, H 6.34, N 7.50; found C 75.38, H 6.07, N 7.27.

Synthesis of the Ag complexes: Carbene precursor and 0.7 equiv. of $Ag_2O$ were stirred in 50 mL anhydrous $CH_2Cl_2$ at room temperature for 48 h with a coverage of aluminum foil. After removing the insoluble precipitates by filtration through Celite, the filtrate was dried to afford raw product. Then, the oily raw product was sonicated in ether to provide the final product as light purple powder (yield over 90%), which was used in the following reactions without further purifications.

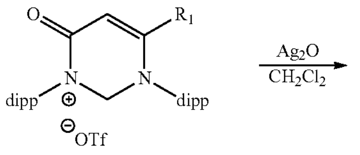

2

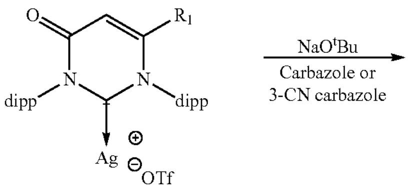

3

-continued

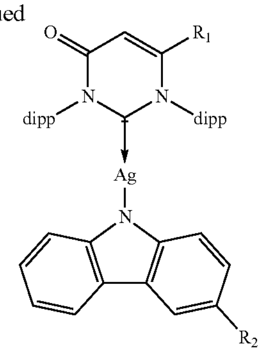

Me-Ag: $R_1$=Me, $R_2$=H;
Me-$Ag^{CN}$: $R_1$=Me, $R_2$=CN;
Ph-Ag: $R_1$=Ph, $R_2$=H;
Ph-$Ag^{CN}$: $R_1$=Ph, $R_2$=CN.

Me-Ag, Me-$Ag^{CN}$, Ph-Ag and Ph-$Ag^{CN}$ were synthesized according to a known procedure which was well described in previous publications.

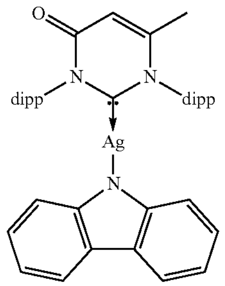

Me-Ag was obtained with a yield of 79% as orange powder. $^1H$ NMR (400 MHz, acetone) δ 7.88 (t, J=7.7 Hz, 1H), 7.77 (t, J=9.2 Hz, 3H), 7.68 (d, J=7.8 Hz, 2H), 7.56 (d, J=7.8 Hz, 2H), 6.93 (ddd, J=8.1, 7.0, 1.2 Hz, 2H), 6.80-6.70 (m, 3H), 6.04 (d, J=8.1 Hz, 2H), 2.98 (dq, J=13.4, 6.6 Hz, 4H), 2.23 (s, 3H), 1.39 (d, J=6.8 Hz, 6H), 1.34 (d, J=6.8 Hz, 6H), 1.28 (d, J=6.9 Hz, 6H), 1.24 (d, J=6.8 Hz, 6H). $^{13}C$ NMR (101 MHz, acetone) δ 158.35, 158.30, 154.91, 154.84, 150.29, 145.41, 145.28, 138.25, 137.47, 131.43, 130.36, 125.81, 124.81, 123.84, 122.79, 118.59, 114.58, 114.44, 112.21, 28.84, 28.66, 24.71, 23.63, 23.50, 22.86, 20.49, 20.48. Elemental analysis calculated C 69.88, H 6.58, N 5.96; found C 69.43, H 6.52, N 5.86.

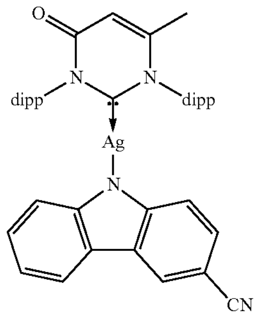

Me-$Ag^{CN}$ was obtained with a yield of 75% as yellow powder. $^1H$ NMR (400 MHz, acetone) δ 8.21 (s, 1H), 7.94 (t, J=7.9 Hz, 2H), 7.82 (t, J=7.8 Hz, 1H), 7.71 (d, J=7.8 Hz, 2H), 7.60 (d, J=7.8 Hz, 2H), 7.21 (dd, J=8.5, 1.6 Hz, 1H), 7.08 (t, J=7.6 Hz, 1H), 6.91 (t, J=7.3 Hz, 1H), 6.80 (s, 1H), 6.11 (d, J=8.1 Hz, 1H), 6.00 (d, J=8.4 Hz, 1H), 2.98 (m, 4H), 2.25 (d, J=0.8 Hz, 3H), 1.39 (d, J=6.8 Hz, 6H), 1.32 (d, J=6.8 Hz, 6H), 1.25 (dd, J=10.4, 6.8 Hz, 12H). $^{13}C$ NMR (101 MHz, acetone) δ 158.29, 158.23, 154.94, 154.87, 145.53, 145.38, 138.28, 137.55, 131.58, 130.52, 125.92, 125.70, 124.92, 124.57, 123.92, 121.51, 119.39, 116.76, 115.04, 114.91, 112.40, 96.22, 28.83, 28.65, 24.75, 23.63, 23.52, 22.85, 20.48. Elemental analysis calculated C 69.13, H 6.22, N 7.68; found C 69.08, H 6.05, N 7.43.

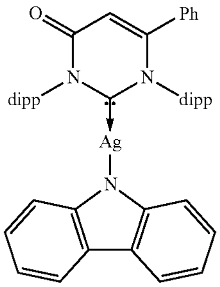

Ph-Ag was obtained with a yield of 79% as yellow powder. $^1H$ NMR (400 MHz, acetone) δ 7.85-7.70 (m, 4H), 7.60 (d, J=7.8 Hz, 2H), 7.53-7.46 (m, 3H), 7.45-7.38 (m, 4H), 6.92 (ddd, J=8.2, 7.0, 1.2 Hz, 2H), 6.87 (s, 1H), 6.78-6.69 (m, 2H), 6.02 (d, J=8.1 Hz, 2H), 3.26-2.99 (m, 4H), 1.35 (d, J=6.8 Hz, 6H), 1.29 (dd, J=12.4, 6.8 Hz, 12H), 1.15 (d, J=6.7 Hz, 6H). $^{13}C$ NMR (101 MHz, acetone) δ 158.21, 158.15, 156.44, 156.37, 150.29, 145.68, 145.56, 138.90, 137.54, 131.72, 131.32, 130.80, 130.48, 129.53, 128.31, 125.48, 124.93, 123.85, 122.76, 118.58, 114.55, 114.48, 113.61, 28.83, 28.81, 25.48, 23.88, 23.55, 22.24. Elemental analysis calculated C 72.06, H 6.31, N 5.48; found C 71.86, H 6.18, N 5.28.

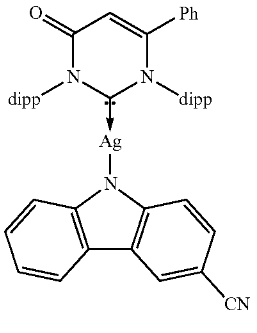

Ph-Ag$^{CN}$ was obtained with a yield of 73% as light yellow powder. $^1H$ NMR (400 MHz, acetone) δ 8.20 (d, J=1.3 Hz, 1H), 7.92 (d, J=7.6 Hz, 1H), 7.86 (t, J=7.8 Hz, 1H), 7.79 (t, J=7.8 Hz, 1H), 7.63 (d, J=7.8 Hz, 2H), 7.52 (d, J=7.9 Hz, 2H), 7.50-7.47 (m, 1H), 7.46-7.38 (m, 4H), 7.20 (dd, J=8.5, 1.7 Hz, 1H), 7.07 (ddd, J=8.2, 7.0, 1.2 Hz, 1H), 6.94-6.86 (m, 2H), 6.09 (d, J=8.2 Hz, 1H), 6.02-5.95 (m, 1H), 3.21-3.04 (m, 4H), 1.34 (d, J=6.8 Hz, 6H), 1.28 (dd, J=8.4, 6.8 Hz, 12H), 1.15 (d, J=6.7 Hz, 6H). $^{13}C$ NMR (101 MHz, acetone) δ 158.14, 158.09, 156.35, 145.76, 145.68, 139.00, 137.62, 131.62, 131.46, 130.87, 130.63, 129.52, 128.35, 125.67, 125.59, 125.03, 124.54, 123.90, 121.52, 119.38, 116.73, 115.08, 114.95, 113.79, 96.19, 28.81, 28.78, 25.53, 23.89, 23.57, 22.22. Elemental analysis calculated C 71.30, H 5.98, N 7.08; found C 71.08, H 5.97, N 7.03.

Synthesis of the Au complexes: The Au(I)—Cl intermediate complexes were obtained by a metal ion exchange reaction. Equal equivalent of Carbene-AgOTf and $(Me)_2SAuCl$ were stirred in anhydrous $CH_2Cl_2$ for overnight. After the filtration through Celite, the filtrate was dried under vacuum. Excess amount of ether was added in the raw material and the intermediate complex was obtained as light purple precipitate (yield over 90%), which was used in the following reactions without further purifications.

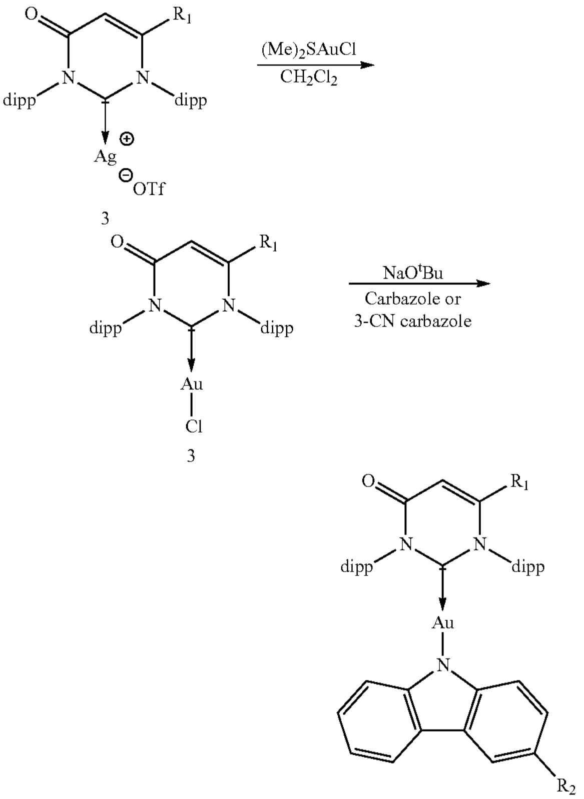

Me-Au: $R_1$=Me, $R_2$=H;
Me-Au$^{CN}$: $R_1$=Me, $R_2$=CN;
Ph-Au: $R_1$=Ph, $R_2$=H;
Ph-Au$^{CN}$: $R_1$=Ph, $R_2$=CN.

Me-Au, Me-Au$^{CN}$, Ph-Au and Ph-Au$^{CN}$ were synthesized according to a known procedure which was well described in previous publications.

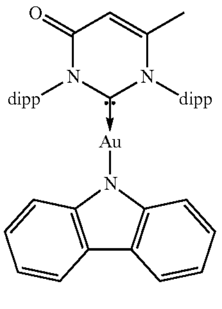

Me-Au was obtained with a yield of 80% as orange powder. $^1H$ NMR (400 MHz, acetone) δ 7.90 (t, J=7.8 Hz, 1H), 7.82-7.75 (m, 3H), 7.67 (d, J=7.8 Hz, 2H), 7.56 (d, J=7.8 Hz, 2H), 6.95 (ddd, J=8.2, 7.0, 1.3 Hz, 2H), 6.82-6.75 (m, 3H), 6.08 (dt, J=8.2, 0.9 Hz, 2H), 3.02-2.88 (m, 4H), 2.22 (d, J=1.0 Hz, 3H), 1.39 (dd, J=6.8, 5.7 Hz, 12H), 1.30 (d, J=6.9 Hz, 6H), 1.23 (d, J=6.8 Hz, 6H). $^{13}$C NMR (101 MHz, acetone) δ 201.36, 158.40, 155.16, 149.16, 145.44, 145.33, 137.11, 136.05, 131.11, 130.01, 125.41, 124.37, 123.59, 122.82, 118.41, 115.63, 113.79, 111.05, 28.74, 28.57, 24.09, 23.39, 23.05, 22.81, 20.30. Elemental analysis calculated C 62.04, H 5.84, N 5.29; found C 61.97, H 5.68, N 5.18.

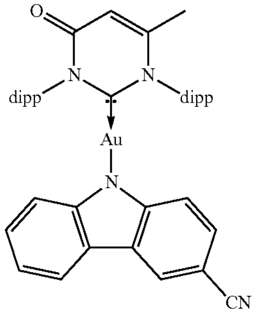

Me-Au$^{CN}$ was obtained with a yield of 78% as yellow powder. $^{1}$H NMR (400 MHz, acetone) δ 8.22 (dd, J=1.7, 0.6 Hz, 1H), 7.93 (dd, J=11.1, 4.5 Hz, 2H), 7.82 (t, J=7.8 Hz, 1H), 7.69 (d, J=7.8 Hz, 2H), 7.60-7.54 (m, 2H), 7.22 (dd, J=8.5, 1.7 Hz, 1H), 7.08 (ddd, J=8.2, 7.1, 1.2 Hz, 1H), 6.93 (ddd, J=7.9, 7.1, 1.0 Hz, 1H), 6.80 (d, J=1.0 Hz, 1H), 6.13 (dt, J=8.2, 0.8 Hz, 1H), 6.05 (dd, J=8.5, 0.6 Hz, 1H), 3.01-2.86 (m, 4H), 2.22 (d, J=1.0 Hz, 3H), 1.37 (dd, J=6.8, 1.4 Hz, 12H), 1.28 (d, J=6.8 Hz, 6H), 1.22 (d, J=6.8 Hz, 6H). $^{13}$C NMR (101 MHz, acetone) δ 200.52, 158.44, 155.37, 151.13, 150.04, 145.74, 145.61, 137.31, 136.24, 131.50, 130.41, 125.89, 125.72, 124.71, 124.67, 124.02, 123.96, 123.07, 121.07, 119.42, 117.72, 114.54, 114.51, 111.60, 97.71, 24.30, 23.59, 23.25, 23.01, 20.49. Elemental analysis calculated C 61.61, H 5.54, N 6.84; found C 61.88, H 5.53, N 6.75.

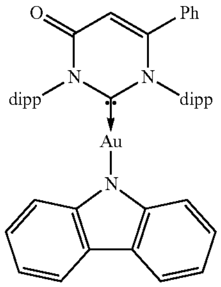

Ph-Au was obtained with a yield of 82% as orange powder. $^{1}$H NMR (400 MHz, acetone) δ 7.85-7.71 (m, 4H), 7.58 (d, J=7.8 Hz, 2H), 7.50-7.42 (m, 3H), 7.38 (d, J=4.4 Hz, 4H), 6.93 (ddd, J=8.2, 7.0, 1.3 Hz, 2H), 6.86 (s, 1H), 6.77 (ddd, J=7.9, 7.1, 1.0 Hz, 2H), 6.05 (dt, J=8.2, 0.8 Hz, 2H), 3.07 (sept, J=6.7 Hz, 4H), 1.41 (d, J=6.8 Hz, 6H), 1.32 (d, J=6.8 Hz, 6H), 1.26 (d, J=6.8 Hz, 6H), 1.11 (d, J=6.7 Hz, 6H). $^{13}$C NMR (101 MHz, acetone) δ 202.37, 158.56, 156.94, 149.36, 146.07, 145.78, 137.84, 136.36, 131.70, 131.26, 130.80, 130.32, 129.73, 128.27, 125.30, 124.70, 123.81, 123.02, 118.62, 115.84, 114.05, 112.78, 25.02, 23.81, 23.37, 22.47. Elemental analysis calculated C 64.55, H 5.65, N 4.91; found C 64.40, H 5.64, N 4.90.

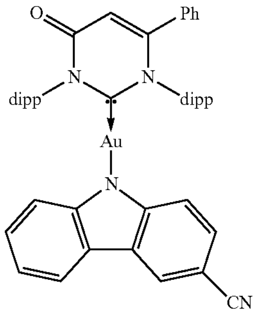

Ph-Au$^{CN}$ was obtained with a yield of 80% as yellow powder. $^{1}$H NMR (400 MHz, acetone) δ 8.23 (dd, J=1.7, 0.6 Hz, 1H), 7.97-7.92 (m, 1H), 7.84 (dt, J=20.4, 7.8 Hz, 2H), 7.62 (d, J=7.8 Hz, 2H), 7.54-7.45 (m, 3H), 7.41 (d, J=4.3 Hz, 4H), 7.22 (dd, J=8.5, 1.7 Hz, 1H), 7.08 (ddd, J=8.3, 7.1, 1.3 Hz, 1H), 6.94 (ddd, J=8.0, 7.1, 1.0 Hz, 1H), 6.91 (s, 1H), 6.13 (dd, J=8.2, 0.8 Hz, 1H), 6.05 (dd, J=8.5, 0.6 Hz, 1H), 3.18-3.00 (m, 4H), 1.42 (d, J=6.8 Hz, 6H), 1.32 (d, J=6.8 Hz, 6H), 1.27 (d, J=6.8 Hz, 6H), 1.13 (d, J=6.7 Hz, 6H). $^{13}$C NMR (101 MHz, acetone) δ 201.38, 158.39, 156.87, 151.12, 150.03, 146.13, 145.87, 137.87, 136.35, 131.57, 131.42, 130.86, 130.50, 129.72, 128.28, 125.87, 125.40, 124.78, 124.69, 124.03, 123.95, 123.08, 121.07, 119.41, 117.70, 114.58, 114.57, 113.10, 97.69, 25.03, 23.79, 23.34, 22.44. Elemental analysis calculated C 64.09, H 5.38, N 6.36; found C 63.79, H 5.44, N 6.33.

Figure 12:
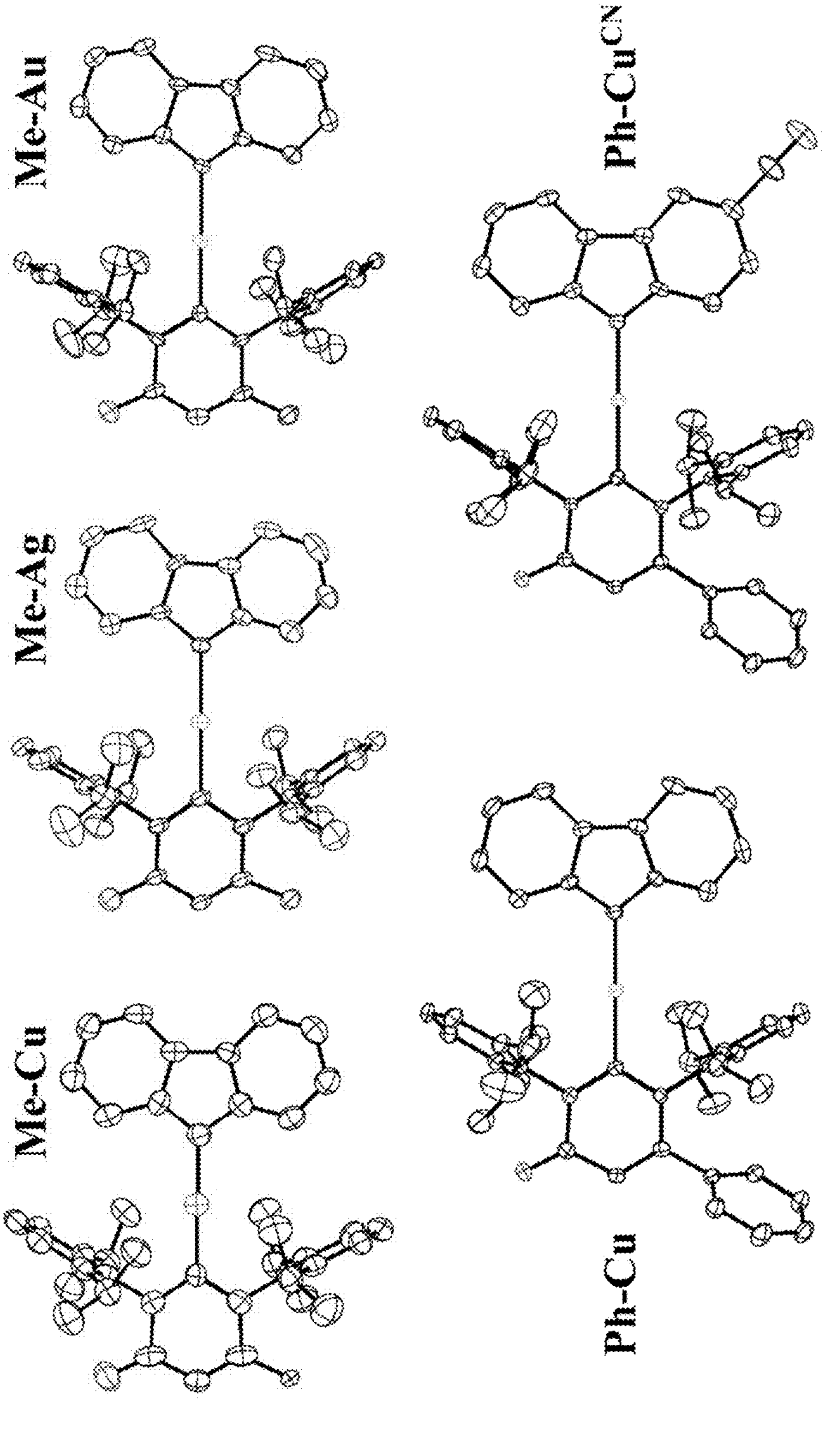
FIG. 12 depicts the single crystal structures of Me-Cu, Me-Ag, Ph-Au and Ph-$Au^{CN}$.
Figure 13:
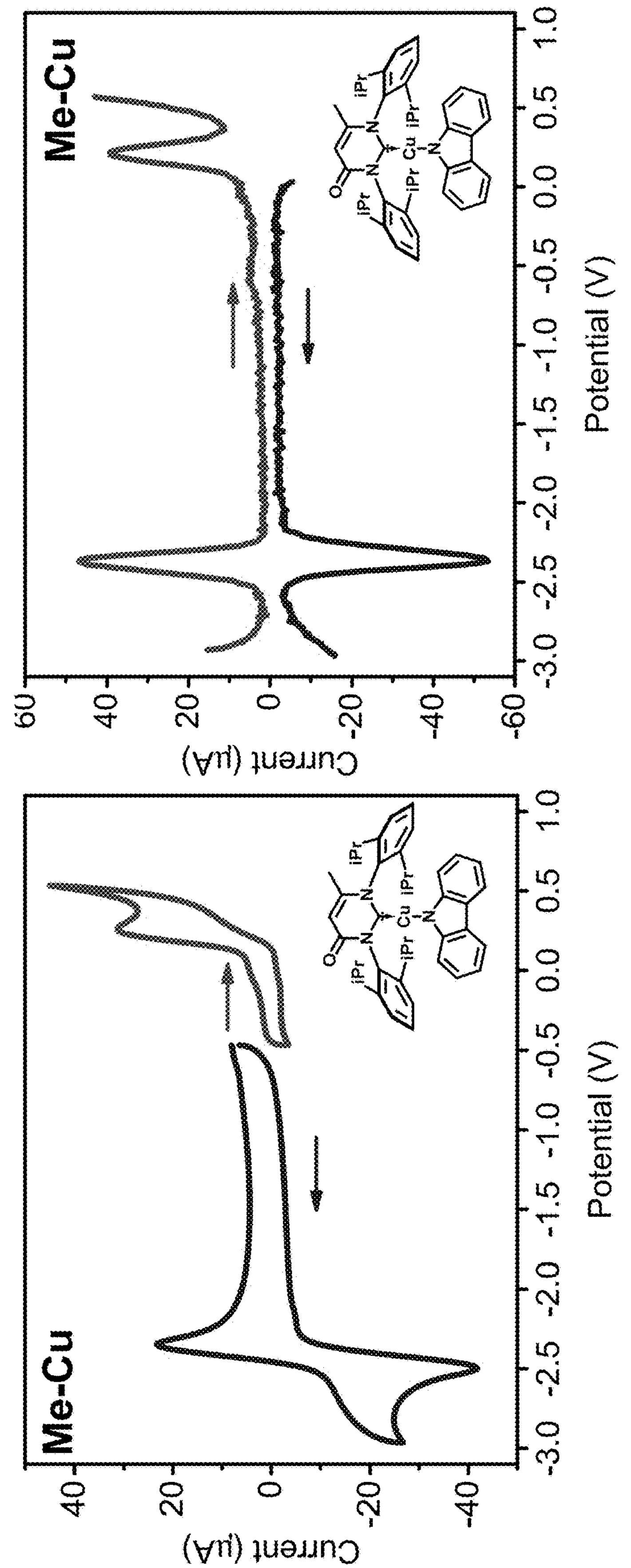
FIG. 13 depicts the CV (left) and DPV (right) curves for Me-Cu in DMF.
Figure 14:
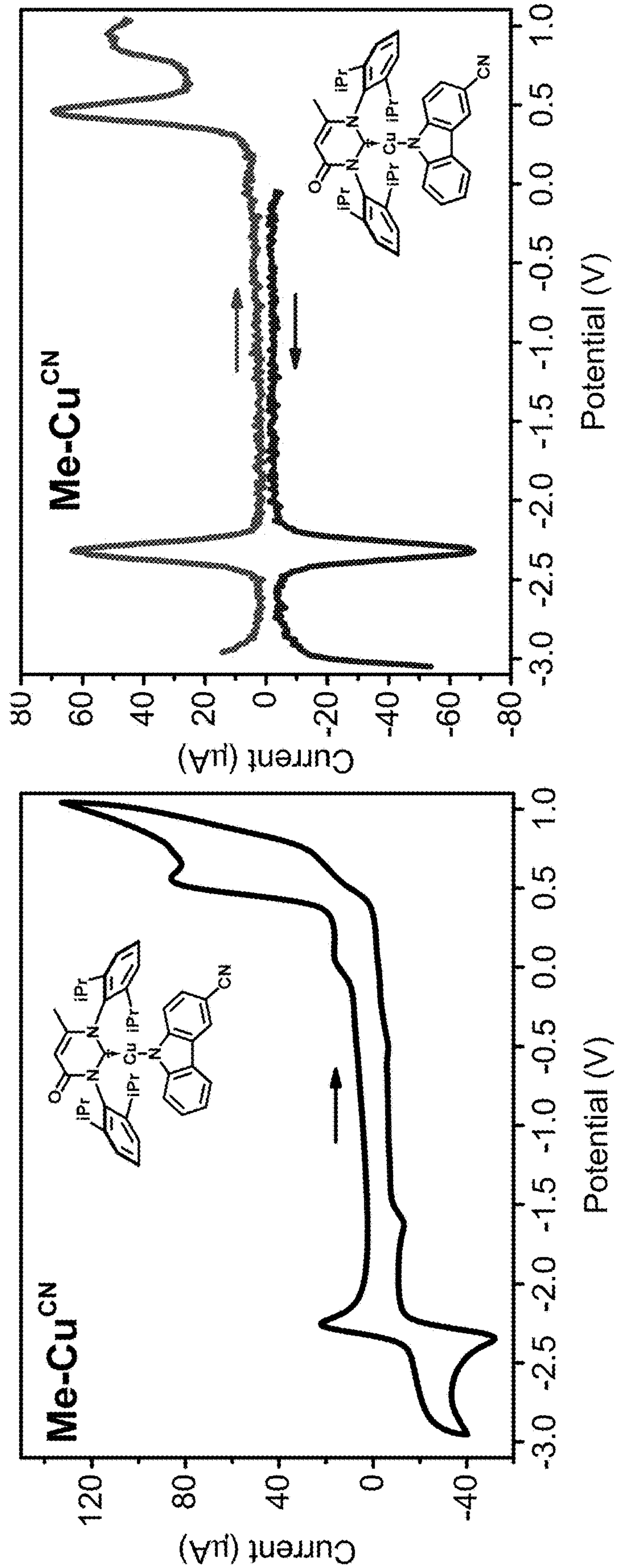
FIG. 14 depicts the CV (left) and DPV (right) curves for Me-$Cu^{CN}$ in DMF.
Figure 15:
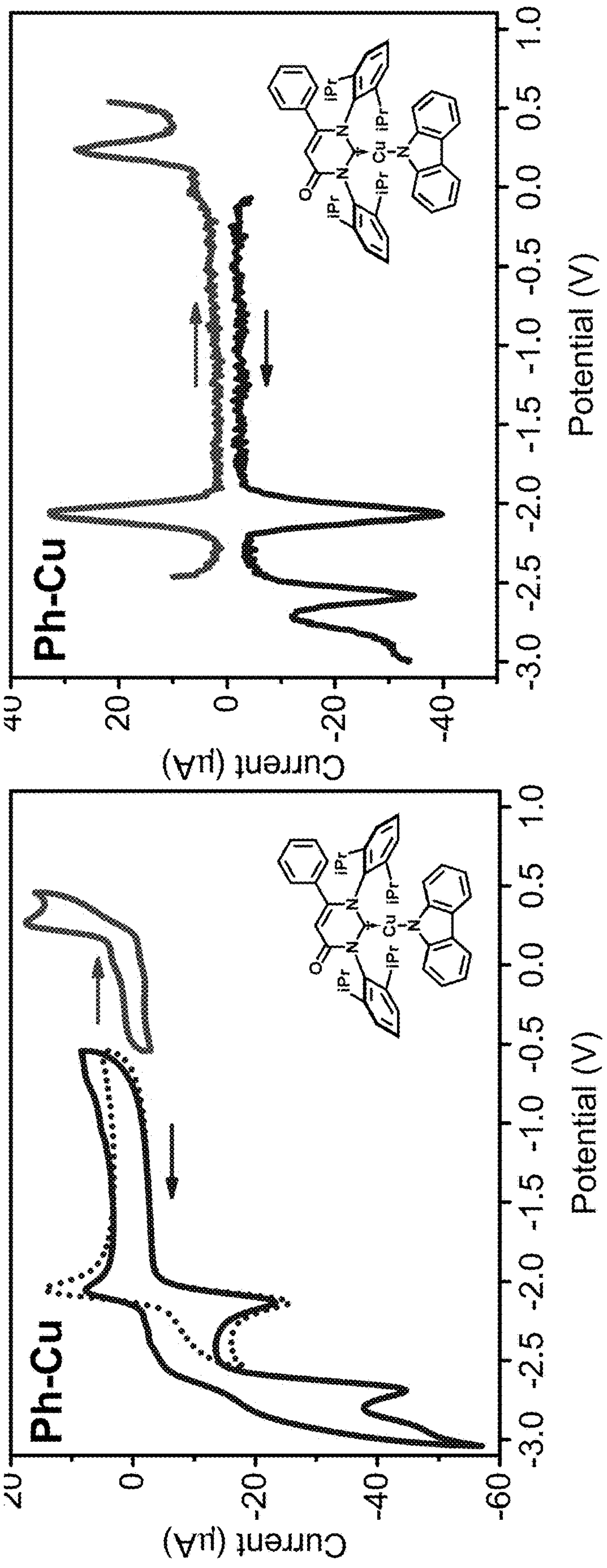
FIG. 15 depicts the CV (left) and DPV (right) curves for Ph-Cu in DMF.
Figure 16:
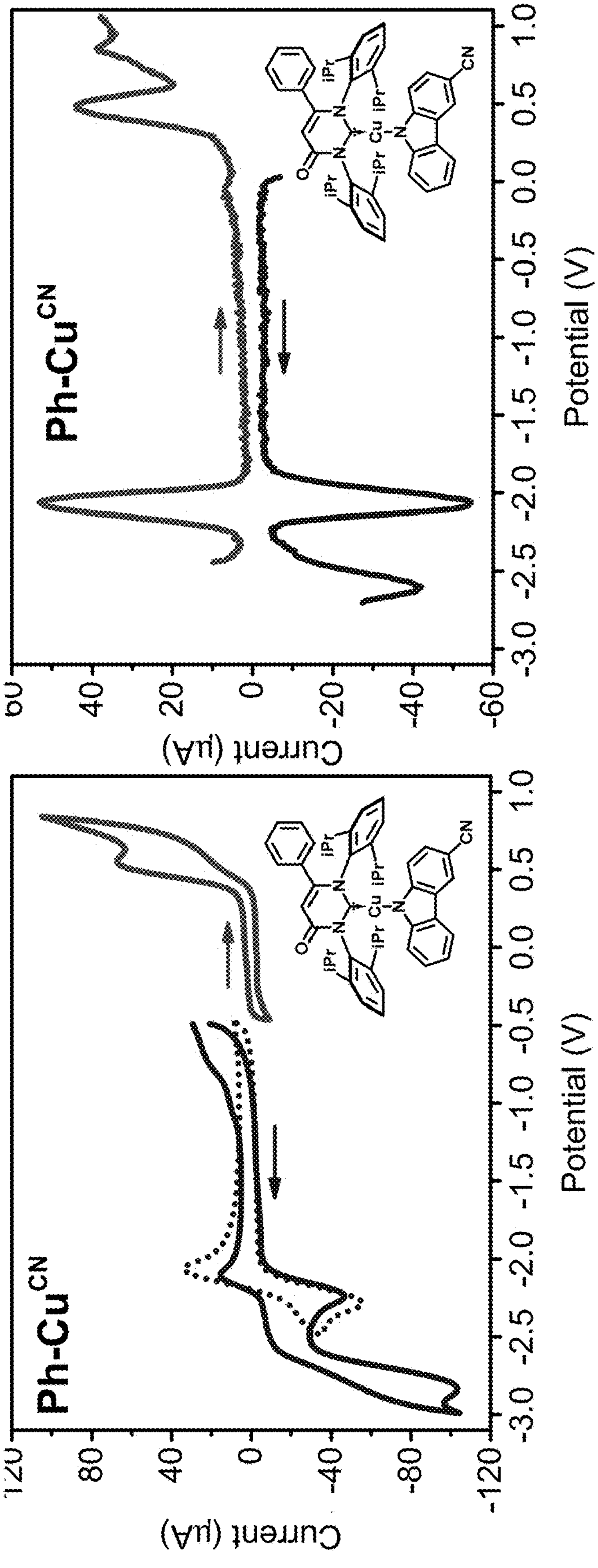
FIG. 16 depicts the CV (left) and DPV (right) curves for Ph-$Cu^{CN}$ in DMF.
Figure 17:
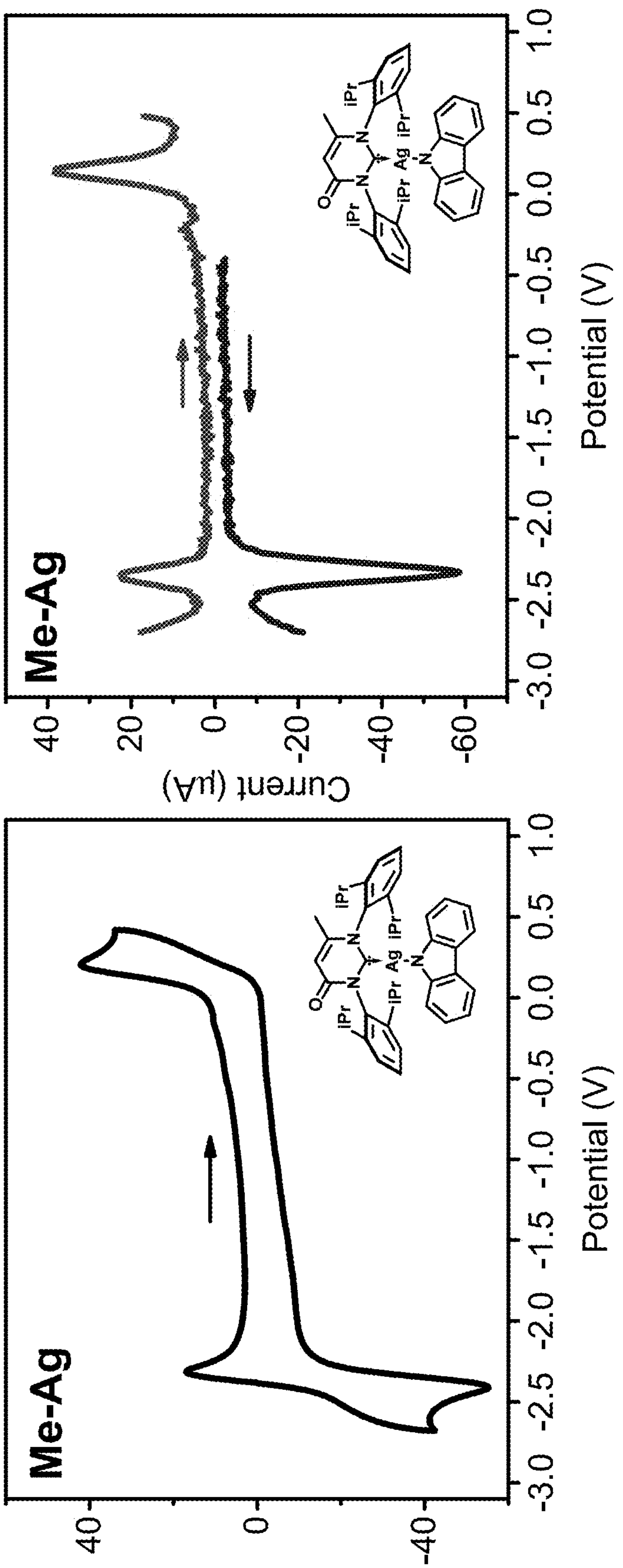
FIG. 17 depicts the CV (left) and DPV (right) curves for Me-Ag in DMF.
Figure 18:
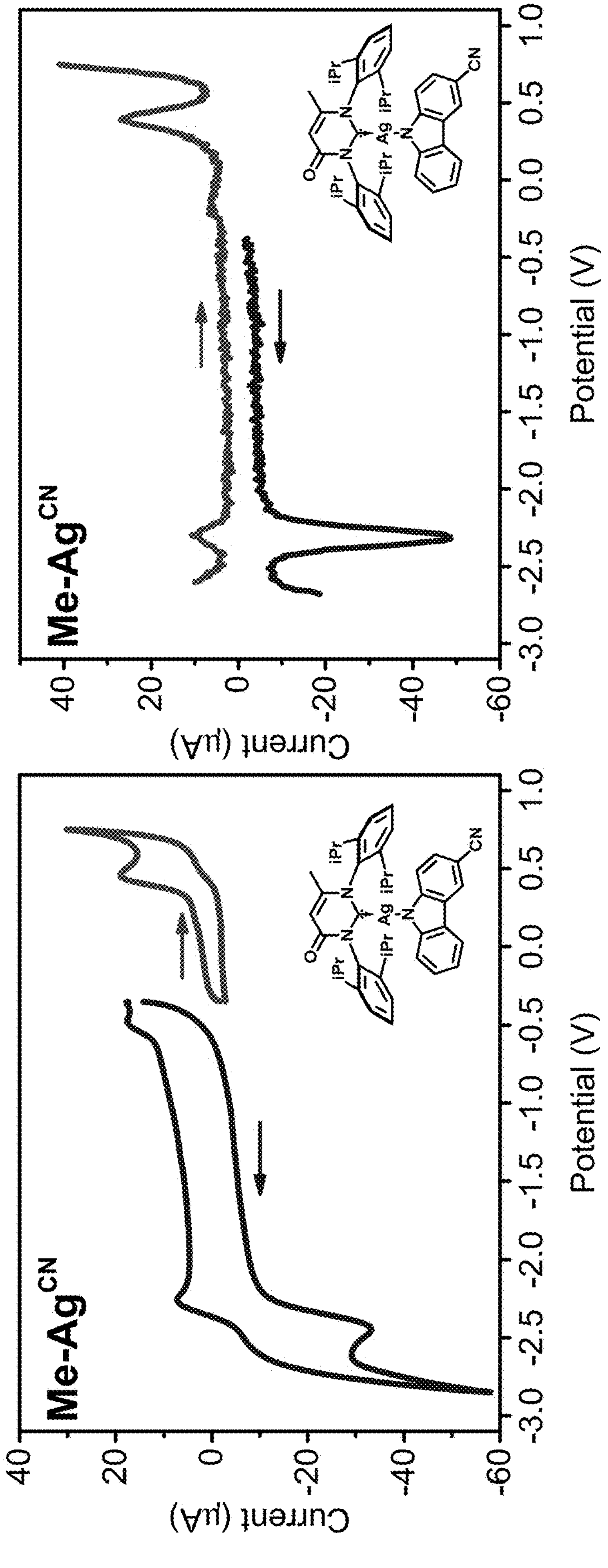
FIG. 18 depicts the CV (left) and DPV (right) curves for Me-$Ag^{CN}$ in DMF
Figure 19:
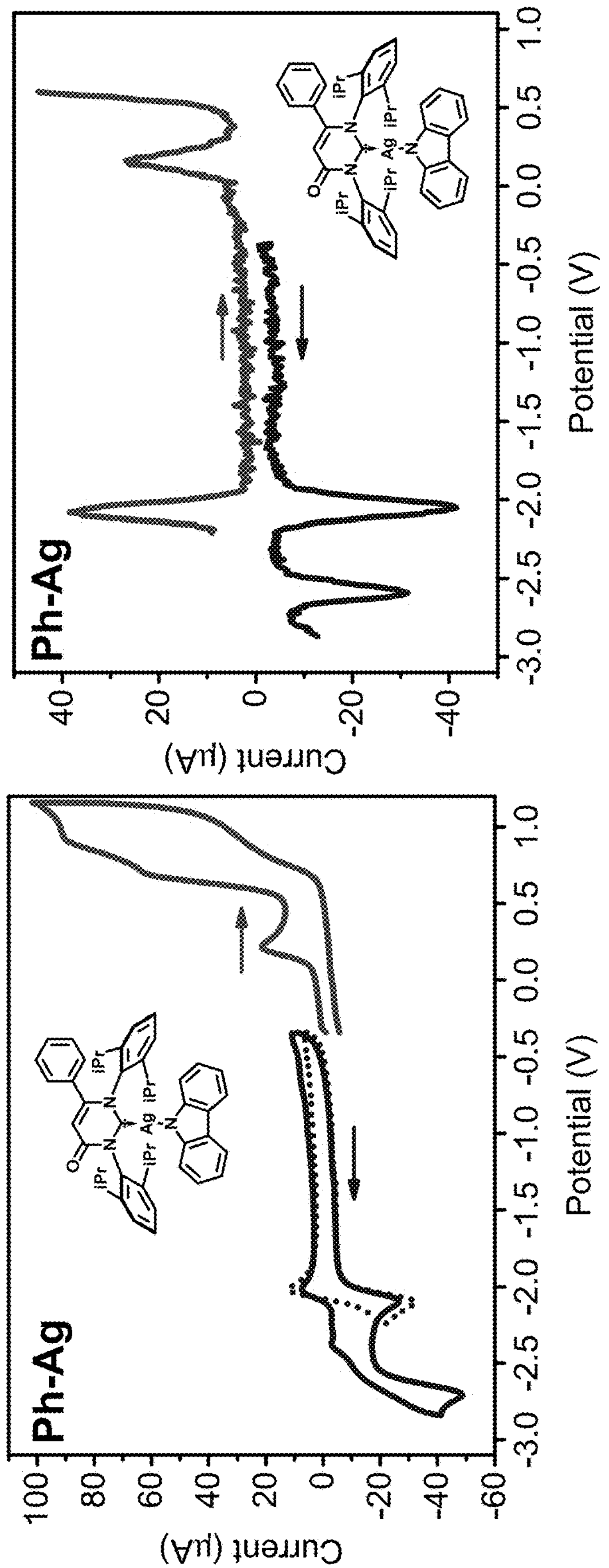
FIG. 19 depicts the CV (left) and DPV (right) curves for Ph-Ag in DMF.
Figure 20:
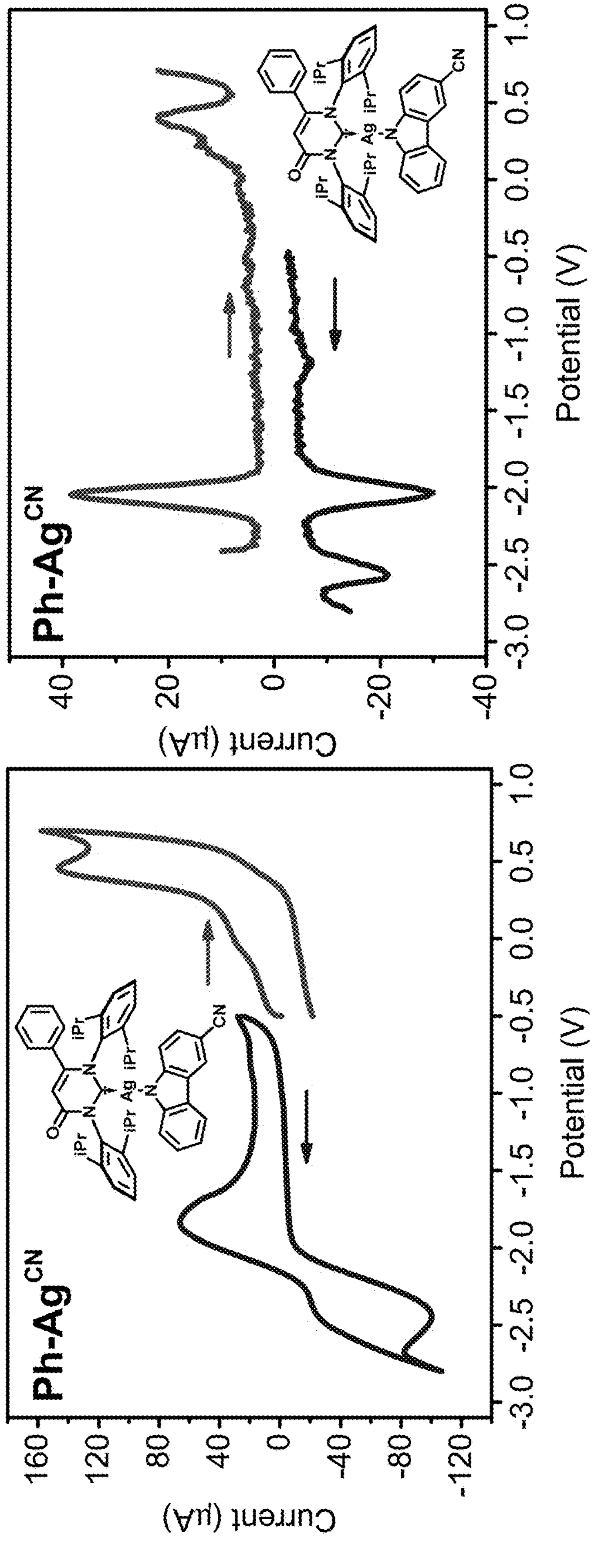
FIG. 20 depicts the CV (left) and DPV (right) curves for Ph-$Ag^{CN}$ in DMF.

Crystallography: All single crystal samples suitable for X-ray diffraction measurements were grown by slow diffusion of ether into $CH_2Cl_2$ solution. The diffraction intensity frames were collected on a Bruker APEX DUO 3-circle platform diffractometer using Cu Kα radiation (λ=1.54184 Å). The diffractometer was equipped with an APEX II CCD detector and an Oxford Cryosystems Cryostream 700 apparatus for low-temperature data collection adjusted to 100(2) K. The crystal was mounted in a Cryo-Loop using Paratone oil. The frames were integrated using the SAINT algorithm to give the hkl files. Data were corrected for absorption effects using the multiscan method (SADABS). The structures were solved by intrinsic phasing and refined with the Bruker SHELXTL software package. Crystal structures are provided in FIG. 12. Crystallographic data are provided in Table 3.

TABLE 3

Crystallographic data of Me—Cu, Me—Ag, Ph—Au and Ph—Au$^{CN}$

| Complex | Me—Cu | Me—Ag | Ph—Au | Ph—Au$^{CN}$ |
|---|---|---|---|---|
| Formula | $C_{41}H_{46}CuN_3O•CH_2Cl_2$ | $C_{41}H_{46}AgN_3O•C_3H_6O$ | $C_{46}H_{48}AuN_3O$ | $C_{47}H_{47}AuN_4O$ |
| Formula weight | 745.27 | 762.75 | 855.84 | 880.85 |

TABLE 3-continued

| Crystallographic data of Me—Cu, Me—Ag, Ph—Au and Ph—Au$^{CN}$ | | | | |
|---|---|---|---|---|
| Complex | Me—Cu | Me—Ag | Ph—Au | Ph—Au$^{CN}$ |
| Temperature | 100K | 100K | 100K | 100K |
| Wavelength | 1.54184 Å | 1.54184 Å | 1.54184 Å | 1.54184 Å |
| Crystal system | orthorhombic | orthorhombic | orthorhombic | monoclinic |
| Space group | $Pna2_1$ | $Pna2_1$ | $P2_12_12_1$ | I2/α |
| a (Å) | 23.7257(4) | 24.3212(3) | 9.113(5) | 26.0430(3) |
| b (Å) | 8.7761(2) | 8.73350(10) | 13.346(5) | 8.55063(8) |
| c (Å) | 36.4313(7) | 36.2832(4) | 33.166(16) | 39.0005(4) |
| α (deg) | 90 | 90 | 90 | 90 |
| β (deg) | 90 | 90 | 90 | 108.1204(11) |
| γ (deg) | 90 | 90 | 90 | 90 |
| Volume (Å$^3$) | 7585.7(3) | 7706.88(16) | 4034(3) | 8254.07(15) |
| Z | 8 | 8 | 4 | 8 |
| F (000) | 3136 | 3200 | 1728 | 3552 |
| θ (deg) for collection | 5.18 to 47.38 | 2.46 to 77.44 | 5.35 to 69.60 | 2.38 to 77.91 |
| Index range | $-19 \le h \le 22$ | $-30 \le h \le 27$ | $-11 \le h \le 11$ | $-32 \le h \le 31$ |
| | $-7 \le k \le 7$ | $-10 \le k \le 10$ | $-16 \le k \le 15$ | $-10 \le k \le 10$ |
| | $-32 \le l \le 29$ | $-45 \le l \le 40$ | $-38 \le l \le 40$ | $-45 \le l \le 49$ |
| Reflections measured | 28050 | 51974 | 50861 | 29356 |
| Goodness of Fit | 1.038 | 1.170 | 1.069 | 1.074 |
| Final R indices | $R_1 = 0.0340$ | $R_1 = 0.0688$ | $R_1 = 0.0151$ | $R_1 = 0.0201$ |
| [I > 2σ(I)] | $wR_2 = 0.0901$ | $wR_2 = 0.1767$ | $wR_2 = 0.0377$ | $wR_2 = 0.0480$ |
| R indices | $R_1 = 0.0362$ | $R_1 = 0.0701$ | $R_1 = 0.0153$ | $R_1 = 0.0224$ |
| (all data) | $wR_2 = 0.0919$ | $wR_2 = 0.1773$ | $wR_2 = 0.0378$ | $wR_2 = 0.0488$ |
| CCDC number | 2117673 | 2117674 | 2117675 | 2117672 |

Figure 22:
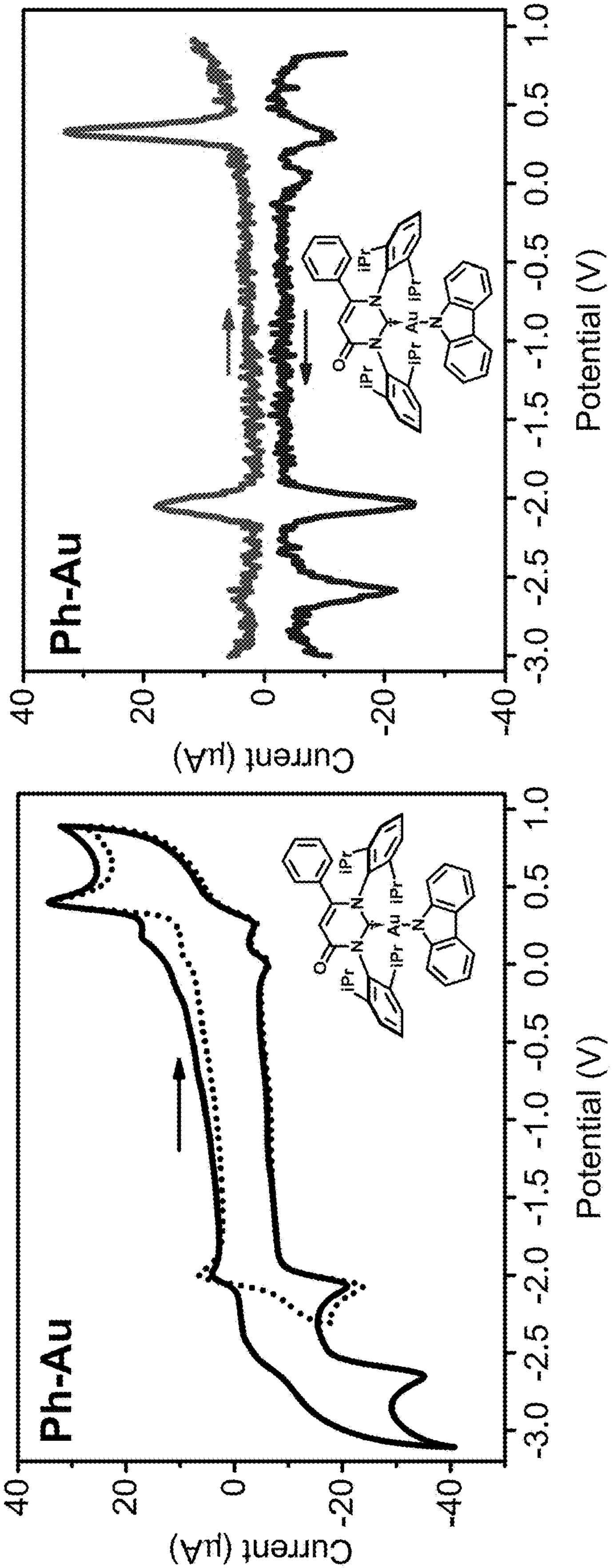
FIG. 22 depicts the CV (left) and DPV (right) curves for Ph-Au in DMF.
Figure 23:
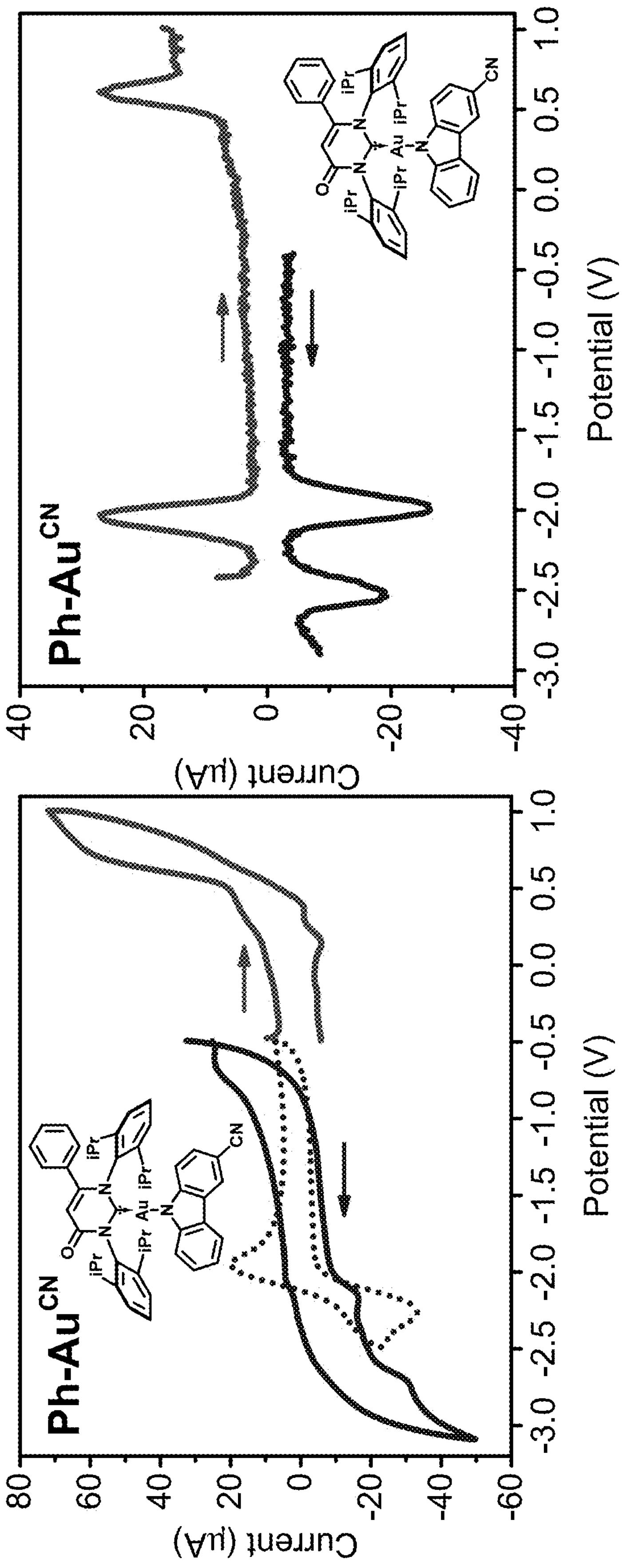
FIG. 23 depicts the CV (left) and DPV (right) curves for Ph-$Au^{CN}$ in DMF.

Electrochemistry: Cyclic voltammetry (CV) and differential pulsed voltammetry (DPV) were performed using a VersaSTAT 3 potentiostat in anhydrous DMF under $N_2$ atmosphere. A standard three-electrode system with a glassy carbon rod working electrode, a platinum wire counter electrode and a silver wire reference electrode was employed. Tetra-n-butyl ammonium hexafluorophosphate (TBAHF) was used as supporting electrolyte on a concentration of 0.1M. Ferrocene was used as internal reference and the redox potentials of the complexes were adjusting the ferrocene redox potentials as 0V. The Electrochmical data of the coinage metal complexes is provided in Table 4. CV and DPV curves for (carbene)Cu(carbazolyl) in DMF are shown in FIGS. 13-16. CV and DPV curves for (carbene)Ag (carbazolyl) in DMF are shown in FIGS. 17-20. CV and DPV curves for (carbene)Au(carbazolyl) in DMF are shown in FIGS. 21-23.

TABLE 4

| Electrochemical data of the coinage metal complexes | | | | |
|---|---|---|---|---|
| Complex | Me—Cu | Me—Cu$^{CN}$ | Ph—Cu | Ph—Cu$^{CN}$ |
| $E_{ox}^{a}$ | 0.21 | 0.46 | 0.24 | 0.48 |
| $E_{red}^{a}$ | −2.37 | −2.32 | −2.07, −2.58 | −2.06, −2.60 |
| $E_{ox\text{-}red}^{b}$ | 2.58 | 2.78 | 2.31 | 2.54 |
| Complex | Me—Ag | Me—Ag$^{CN}$ | Ph—Ag | Ph—Ag$^{CN}$ |
| $E_{ox}^{a}$ | 0.14 | 0.39 | 0.16 | 0.40 |
| $E_{red}^{a}$ | −2.33 | −2.31 | −2.05, −2.59 | −2.03, −2.56 |
| $E_{ox\text{-}red}^{b}$ | 2.47 | 2.70 | 2.21 | 2.43 |
| Complex | Me—Au$^{c}$ | Me—Au$^{CN}$ | Ph—Au | Ph—Au$^{CN}$ |
| $E_{ox}^{a}$ | 0.33 | 0.62 | 0.32 | 0.60 |
| $E_{red}^{a}$ | −2.31 | −2.25 | −2.04, −2.59 | −2.00, −2.53 |
| $E_{ox\text{-}red}^{b}$ | 2.64 | 2.87 | 2.36 | 2.60 |

[a]Potential values were obtained from DPV measurement using ferrocene/ferrocenium as internal reference whose potentials were adjusted as 0 V; [b]The first reduction potential was used to calculated the gap when two reductions were observed; [c]Known data from reference[48]

Figure 24:
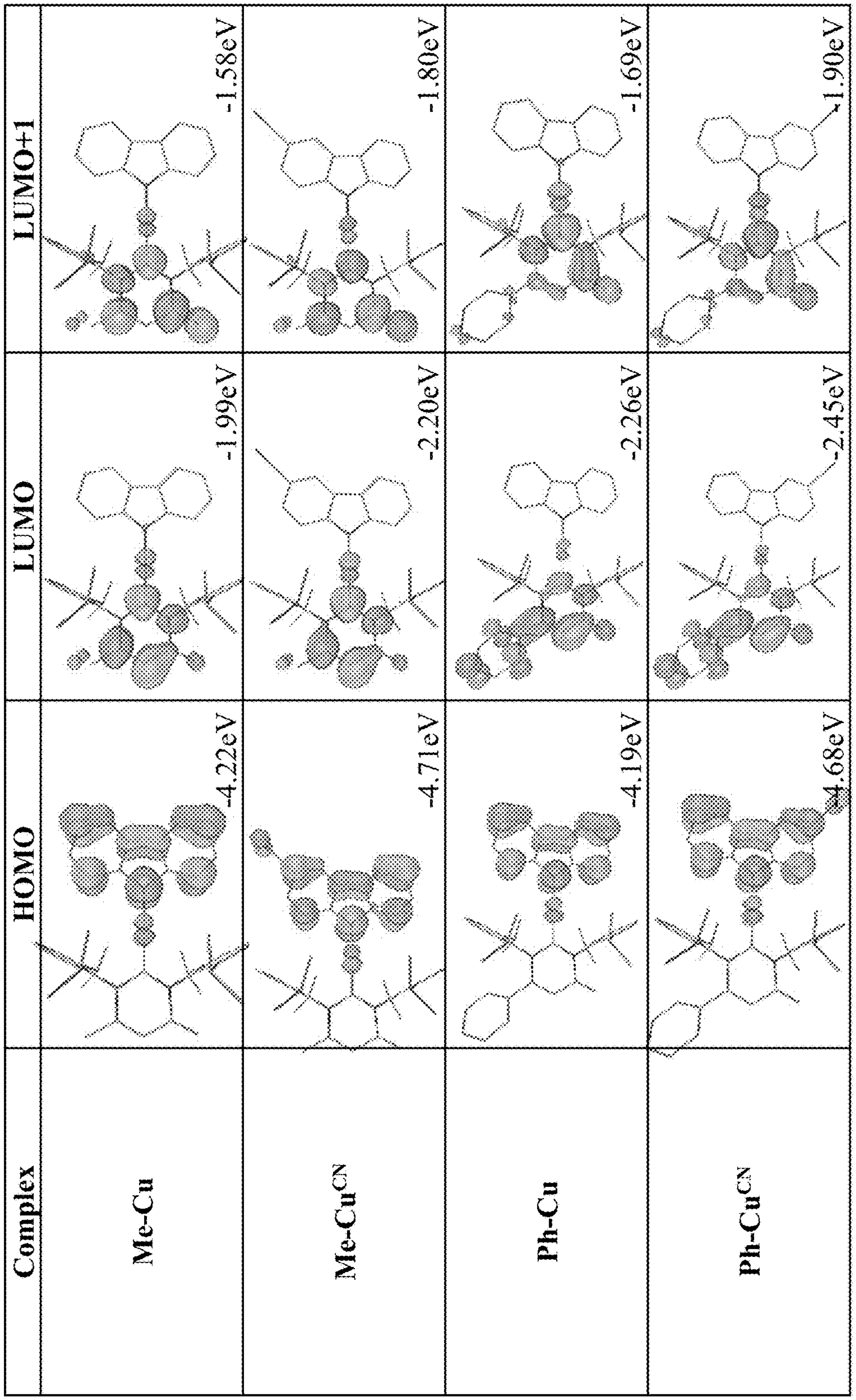
FIG. 24 is a table of frontier metal orbitals for (carbene)Cu(carbazolyl) complexes.
Figure 25:
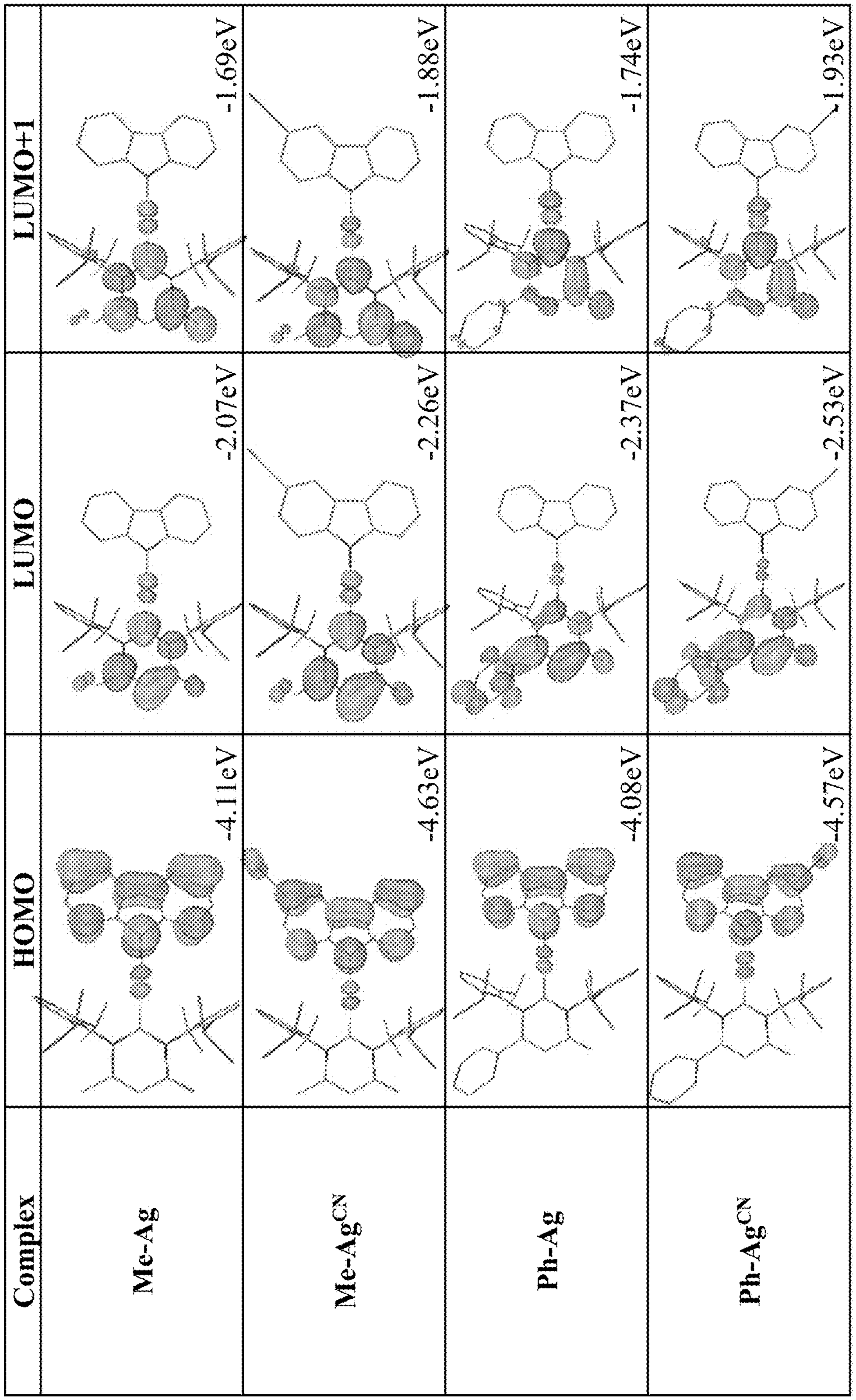
FIG. 25 is a table of frontier metal orbitals for (carbene)Ag(carbazolyl) complexes.
Figure 26:
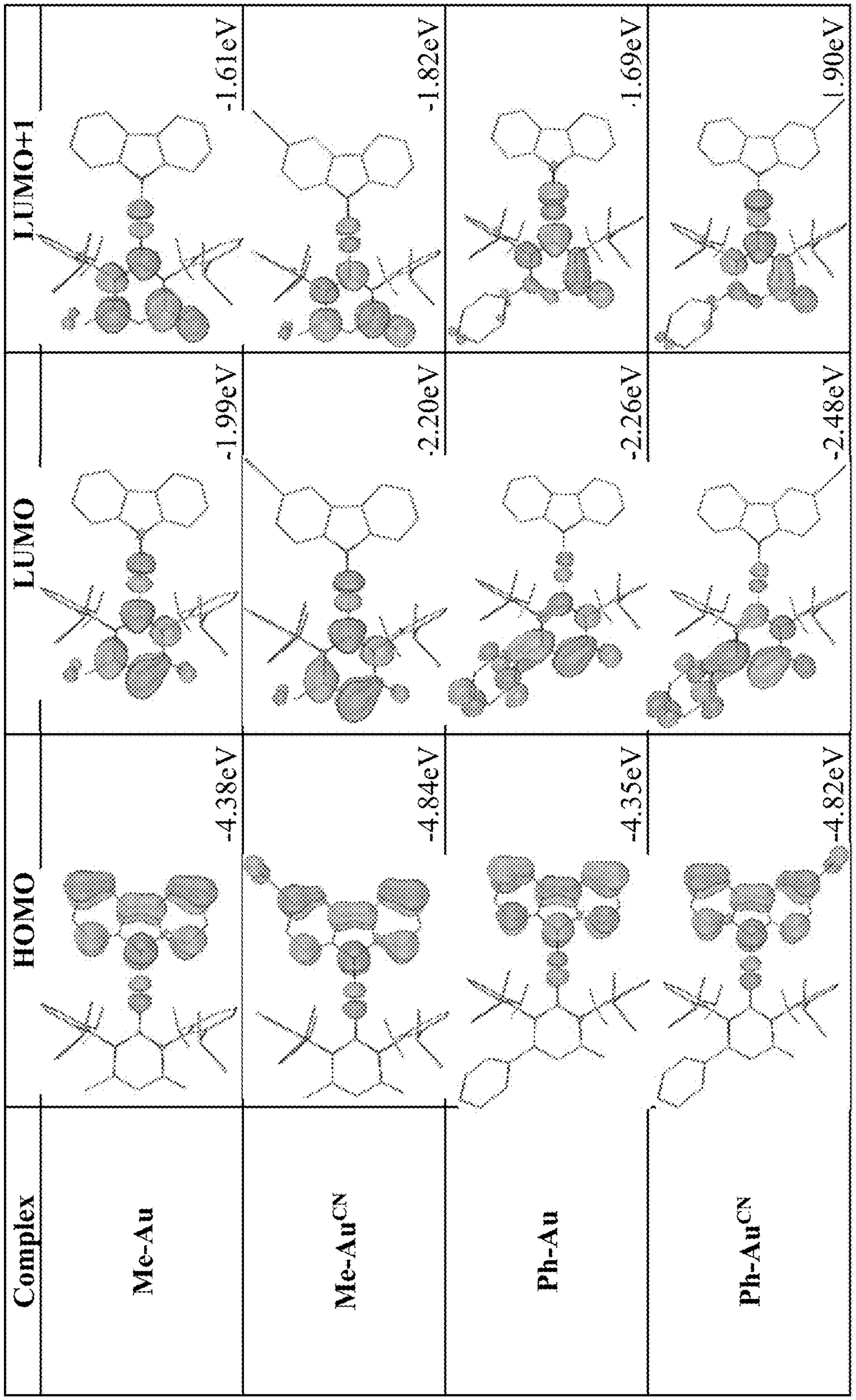
FIG. 26 is a table of frontier metal orbitals for (carbene)Au(carbazolyl) complexes.

Molecular modeling: All theoretical calculations were carried out using Q-Chem 5.1 program as in gas phase and visualized using IQmol software. The ground state molecular geometries were optimized at the B3LYP/LACVP* level, followed by the TD-DFT calculations based on the optimized structures at the CAM-B3LYP/LACVP* level, aiming for the insight of vertical transitions. Details of NTOs were obtained by another TD-DFT calculations at the same level, and the NTO overlap values were calculated using the NTOverlap software written by Dr. Daniel Sylvinson (A. C. Tadle, et al., Adv. Funct. Mater., 2021, 31, 2101175). All the plots are provided with hydrogen atoms omitted for clarity. Calculated frontier molecule orbitals are shown in FIG. 24 (Cu complexes), FIG. 25 (Ag complexes) and FIG. 26 (Au complexes). Calculated vertical transition properties of the $S_1$ and $T_1$ states are provided in Table 5. Calculated singlet-triplet energy gaps are provided in Table 6. Natural transition orbital (NTO) analyses of the $S_1$ and $T_1$ states are provided in FIG. 27 (Cu complexes), FIG. 28 (Ag complexes), and FIG. 29 (Au complexes).

TABLE 5

| Calculated vertical transition properties of the $S_1$ and $T_1$ states | | | | |
|---|---|---|---|---|
| Complex | State | Energy (eV/nm) | Ose. strength | Major contribution |
| Me—Cu | $S_1$ | 2.40/517 | 0.1061 | HOMO→LUMO (88%) |
| | | | | HOMO→LUMO + 1 (11%) |
| | $T_1$ | 2.17/571 | 0.0000 | HOMO→LUMO (80%) |
| | | | | HOMO→LUMO + 1 (15%) |
| Me—Cu$^{CN}$ | $S_1$ | 2.67/464 | 0.1110 | HOMO→LUMO (88%) |
| | | | | HOMO→LUMO + 1 (10%) |
| | $T_1$ | 2.47/502 | 0.0000 | HOMO→LUMO (81%) |
| | | | | HOMO→LUMO + 1 (13%) |
| Ph—Cu | $S_1$ | 2.28/544 | 0.0759 | HOMO→LUMO (82%) |
| | | | | HOMO→LUMO + 1 (17%) |
| | $T_1$ | 2.10/591 | 0.0000 | HOMO→LUMO (62%) |
| | | | | HOMO→LUMO + 1 (33%) |
| Ph—Cu$^{CN}$ | $S_1$ | 2.58/481 | 0.0857 | HOMO→LUMO (78%) |
| | | | | HOMO→LUMO + 1 (20%) |
| | $T_1$ | 2.43/510 | 0.0000 | HOMO→LUMO (62%) |
| | | | | HOMO→LUMO + 1 (32%) |
| Me—Ag | $S_1$ | 2.34/530 | 0.0726 | HOMO→LUMO (86%) |
| | | | | HOMO→LUMO + 1 (13%) |

TABLE 5-continued

| Calculated vertical transition properties of the $S_1$ and $T_1$ states | | | | |
|---|---|---|---|---|
| Complex | State | Energy (eV/nm) | Ose. strength | Major contribution |
| | $T_1$ | 2.23/556 | 0.0000 | HOMO→LUMO (80%)<br>HOMO→LUMO + 1 (18%) |
| Me—Ag$^{CN}$ | $S_1$ | 2.66/466 | 0.0759 | HOMO→LUMO (86%)<br>HOMO→LUMO + 1 (13%) |
| | $T_1$ | 2.57/483 | 0.0000 | HOMO→LUMO (81%)<br>HOMO→LUMO + 1 (16%) |
| Ph—Ag | $S_1$ | 2.20/564 | 0.0463 | HOMO→LUMO (89%)<br>HOMO→LUMO + 1 (10%) |
| | $T_1$ | 2.12/585 | 0.0000 | HOMO→LUMO (78%)<br>HOMO→LUMO + 1 (20%) |
| Ph-Ag$^{CN}$ | $S_1$ | 2.54/488 | 0.0471 | HOMO→LUMO (85%)<br>HOMO→LUMO + 1 (14%) |
| | $T_1$ | 2.48/500 | 0.0000 | HOMO→LUMO (77%)<br>HOMO→LUMO + 1 (21%) |
| Me—Au | $S_1$ | 2.59/479 | 0.1647 | HOMO >LUMO (89%)<br>HOMO→LUMO + 1 (10%) |
| | $T_1$ | 2.32/535 | 0.0000 | HOMO→LUMO (81%)<br>HOMO→LUMO + 1 (15%) |
| Me—Au$^{CN}$ | $S_1$ | 2.83/438 | 0.1619 | HOMO→LUMO (88%)<br>HOMO→LUMO + 1 (10%) |
| | $T_1$ | 2.61/475 | 0.0000 | HOMO→LUMO (82%)<br>HOMO→LUMO + 1 (13%) |
| Ph—Au | $S_1$ | 2.46/504 | 0.1136 | HOMO→LUMO (85%)<br>HOMO→LUMO + 1 (14%) |
| | $T_1$ | 2.25/551 | 0.0000 | HOMO→LUMO (63%)<br>HOMO→LUMO + 1 (33%) |
| Ph—Au$^{CN}$ | $S_1$ | 2.73/454 | 0.1277 | HOMO→LUMO (81%)<br>HOMO→LUMO + 1 (17%) |
| | $T_1$ | 2.55/486 | 0.0000 | HOMO→LUMO (63%)<br>HOMO→LUMO + 1 (31%) |

TABLE 6

| Calculated singlet-triplet energy gaps | | | | | |
|---|---|---|---|---|---|
| Complex | $\Delta E_{ST}$ (eV) | Complex | $\Delta E_{ST}$ (eV) | Complex | $\Delta E_{ST}$ (eV) |
| Me—Cu | 0.23 | Me—Ag | 0.11 | Me—Au | 0.27 |
| Me—Cu$^{CN}$ | 0.20 | Me—Ag$^{CN}$ | 0.09 | Me—Au$^{CN}$ | 0.22 |
| Ph—Cu | 0.18 | Ph—Ag | 0.08 | Ph—Au | 0.21 |
| Ph—Cu$^{CN}$ | 0.15 | Ph—Ag$^{CN}$ | 0.06 | Ph—Au$^{CN}$ | 0.18 |

$\Delta E_{ST}$ is the energetic difference between the $S_1$ and $T_1$ states whose energies are obtained as the vertical transition energies from the TD-DFT calculations at CAM-B3LYP/LACVP* level Photophysics: Absorption spectra were recorded in dilute $CH_2Cl_2$ and toluene solution (around $5\times10^{-5}$ mol/L) using a Hewlett-Packard 8453 diode array spectrometer. Steady state photoluminescent emission spectra were measured in dilute toluene at room temperature and in methyl cyclohexane (MeCy) at both room temperature and 77K on a Photon Technology International QuantaMaster model C-60 fluorimeter. Transient photoluminescent lifetimes were measured on an IBH Fluorocube instrument using time-correlated single-photon counting method (TCSPC) for those less than 100 ms and multichannel scaling method (MSC) for those longer than 100 ms. Photoluminescent quantum yields were determined using a Hamamatsu C9920 system equipped with a xenon lamp, calibrated integrating sphere and model C10027 photonic multichannel analyzer (PMA). Temperature-dependent lifetime measurements from 200 to 310 K were measured using IBH Fluorocube instrument in an OptistatDN Oxford cryostat. All fluid samples for luminescent measurements were deaerated by bubbling $N_2$. Doped polymer films (1 wt %) were prepared in toluene solution of polystyrene (PS). The polymer solution with samples were dropcast onto a quartz substrate and the films were air-dried for 3 h and completely dried under vacuum. The emission properties of polymer samples were measured under a stream of N2 during the measurements.

Figure 30:
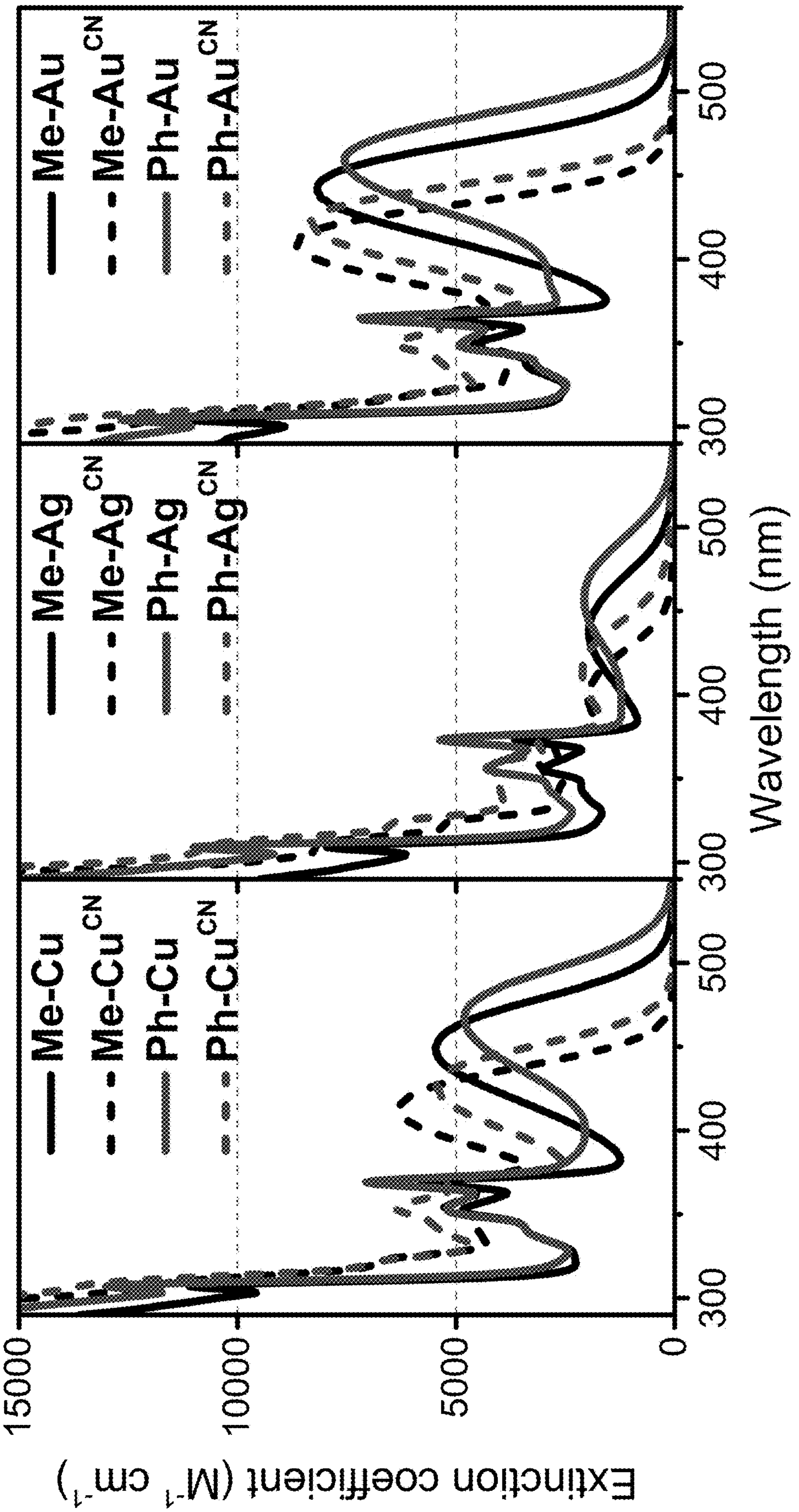
FIG. 30 is a series of plots depicting the absorption spectra of all the complexes in toluene.
Figure 31:
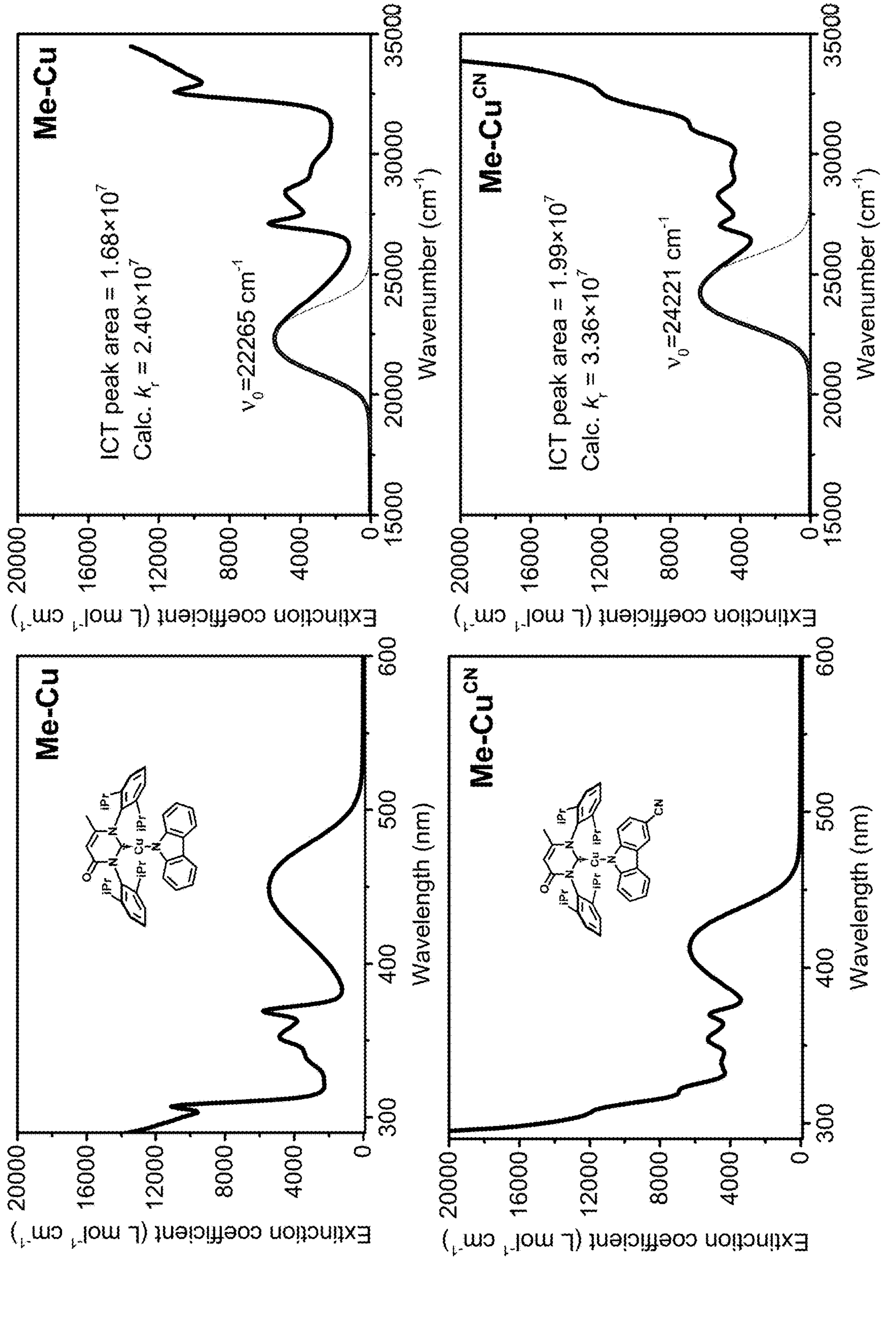
FIG. 31 is a series of plots depicting the absorption spectra in toluene and the theoretical calculations of kr based on the Strickler-Berg equation for Me-Cu and Me-$Cu^{CN}$ complexes.
Figure 32:
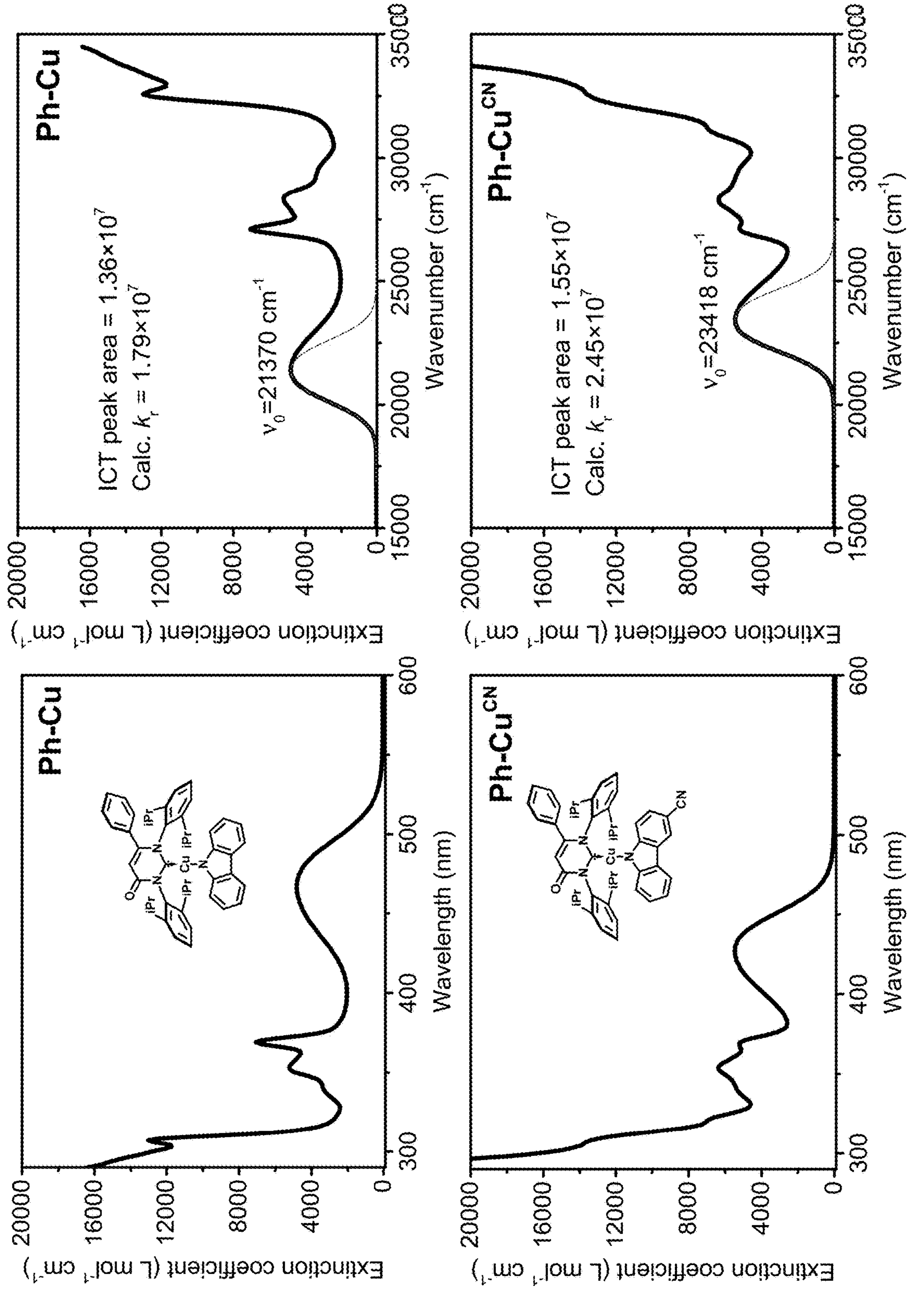
FIG. 32 is a series of plots depicting the absorption spectra in toluene and the theoretical calculations of kr based on the Strickler-Berg equation for Ph-Cu and Ph-$Cu^{CN}$ complexes.
Figure 33:
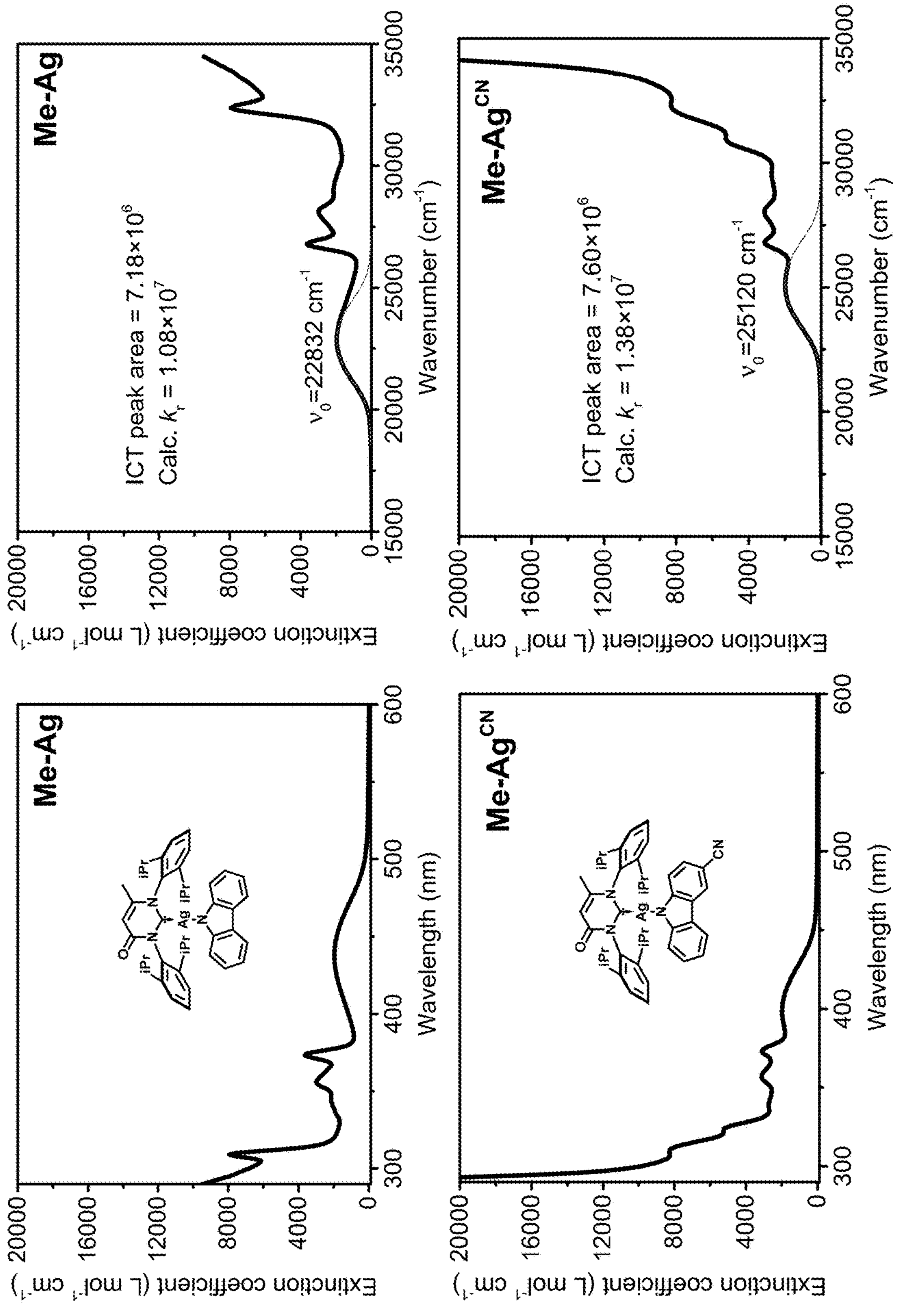
FIG. 33 is a series of plots depicting the absorption spectra in toluene and the theoretical calculations of kr based on the Strickler-Berg equation for Me-Ag and Me-$Ag^{CN}$ complexes.
Figure 34:
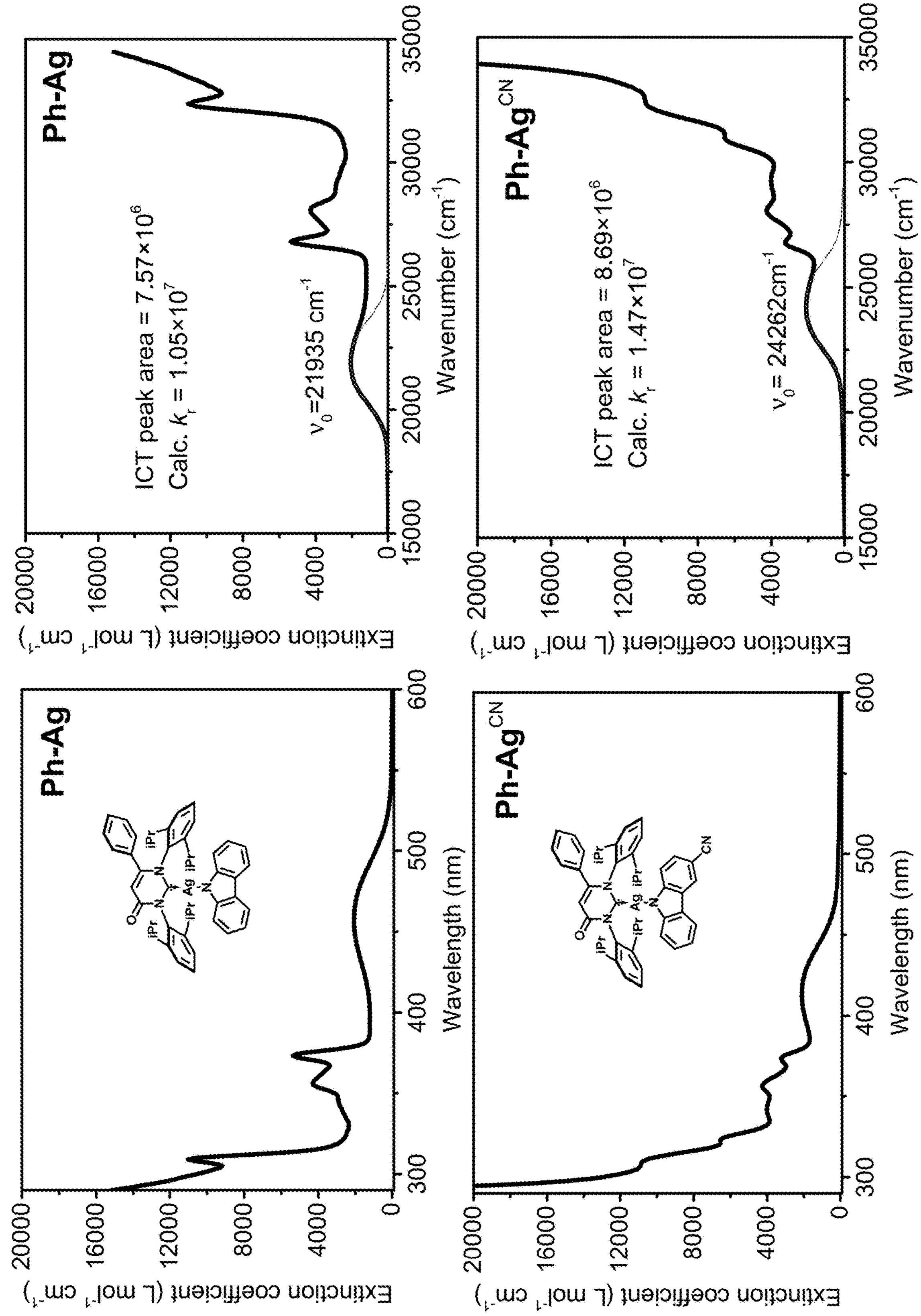
FIG. 34 is a series of plots depicting the absorption spectra in toluene and the theoretical calculations of kr based on the Strickler-Berg equation for Ph-Ag and Ph-$Ag^{CN}$ complexes.
Figure 35:
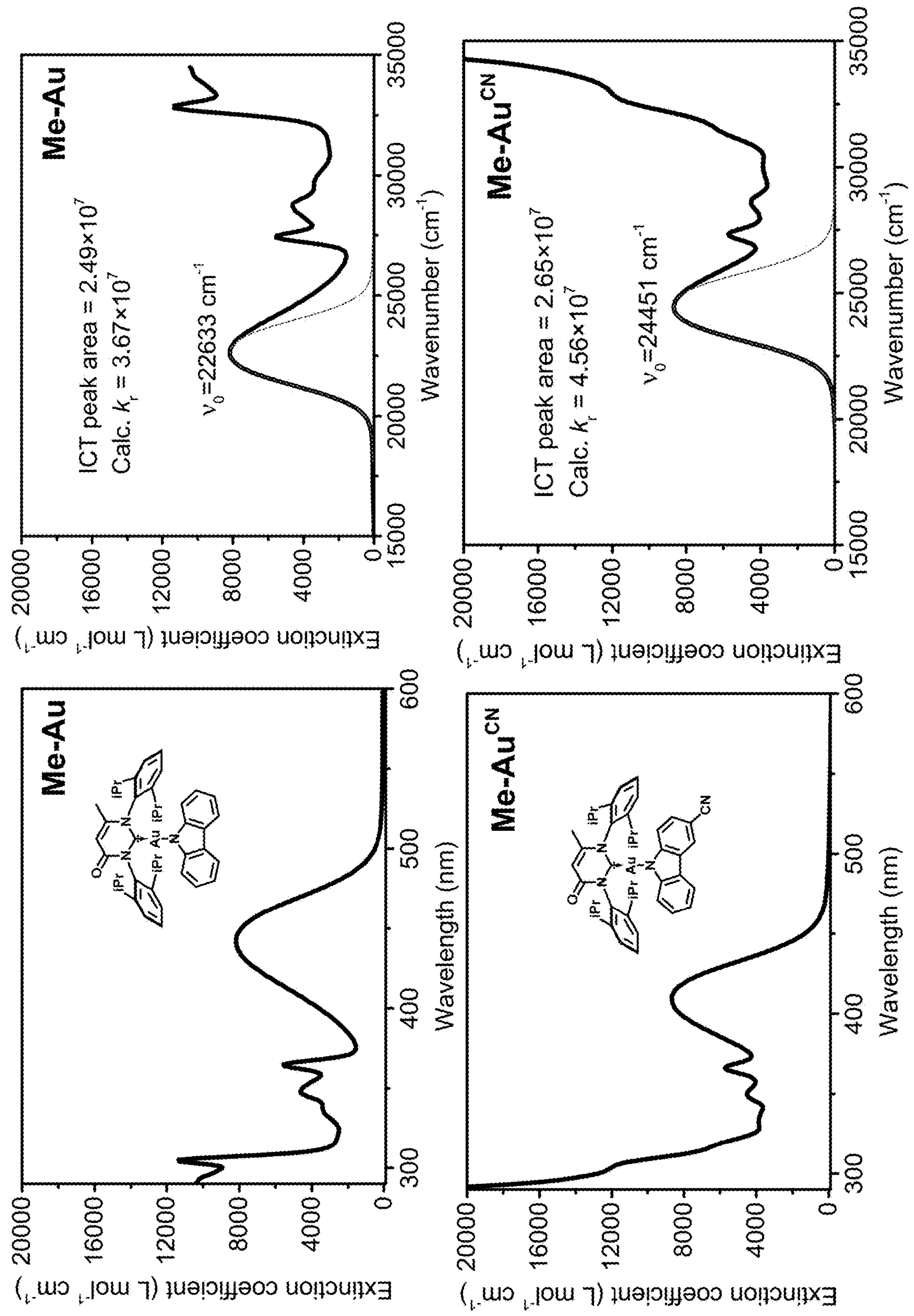
FIG. 35 is a series of plots depicting the absorption spectra in toluene and the theoretical calculations of kr based on the Strickler-Berg equation for Me-Au and Me-$Au^{CN}$ complexes.
Figure 36:
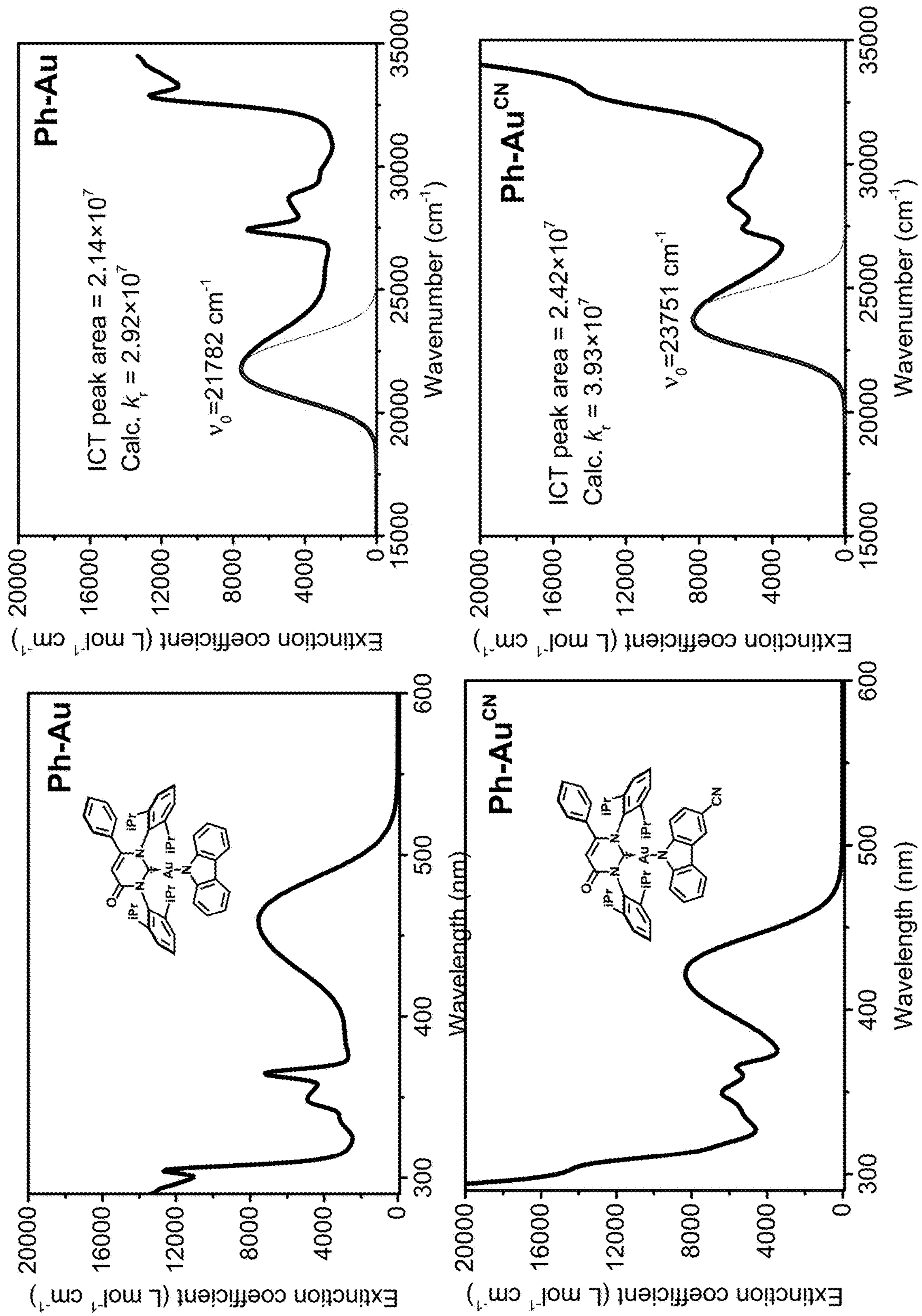
FIG. 36 is a series of plots depicting the absorption spectra in toluene and the theoretical calculations of kr based on the Strickler-Berg equation for Ph-Au and Ph-$Au^{CN}$ complexes.

Strickler Berg analysis of radiative rates: Strickler-Berg analysis, which has been proven successful for organic fluorophores, takes extinction spectral data to estimate oscillator strength for the transition between ground state and the first singlet excited state. Then, radiative decay rate for emission can be predicted in turn. The analysis requires the following data: absorption maximum in wavenumbers, integrated area of the $S_0$-$S_1$ transition in wavenumbers and the extinction coefficient in L $mol^{-1}$ $cm^{-1}$. Here, the integrated area is estimated by integrating half of the low energy ICT absorption band and double it numerically aiming to avoiding the overlap with the high-energy ligand-based absorption. The equation used is shown below:

$$k_{ft}=2.88\times10^{-9}\nu_0^2\int\varepsilon d\nu$$

where $k_{ft}$ is the predicted radiative decay rate, $\nu_0$ is the wavenumber of the absorption maximum, E is the molar extinction coefficient. The absorption spectra of all of the complexes in toluene are shown in FIG. 30. The absorption spectra in toluene and the theoretical calculations of kr based on the Stickler-Bert equation for the (carbene)Cu(carbazolyl) complexes are shown in FIG. 31 and FIG. 32. The absorption spectra in toluene and the theoretical calculations of kr based on the Stickler-Bert equation for the (carbene) Ag(carbazolyl) complexes are shown in FIG. 33 and FIG. 34. The absorption spectra in toluene and the theoretical calculations of kr based on the Stickler-Bert equation for the (carbene)Au(carbazolyl) complexes are shown in FIG. 35 and FIG. 36.

Figure 37:
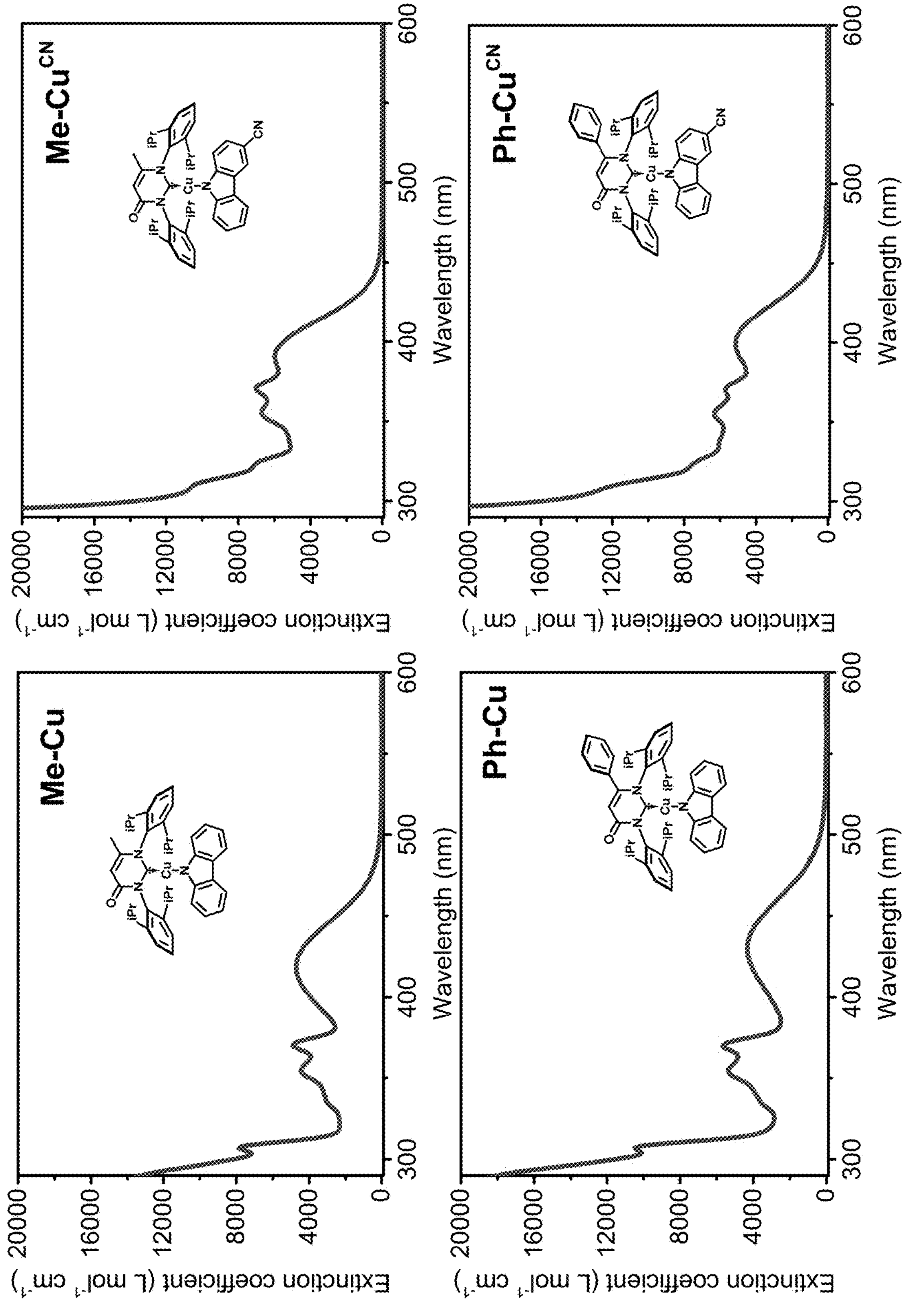
FIG. 37 is a series of plots depicting the absorption spectra in $CH_2Cl_2$ for (carbene)Cu(carbazolyl) complexes.
Figure 38:
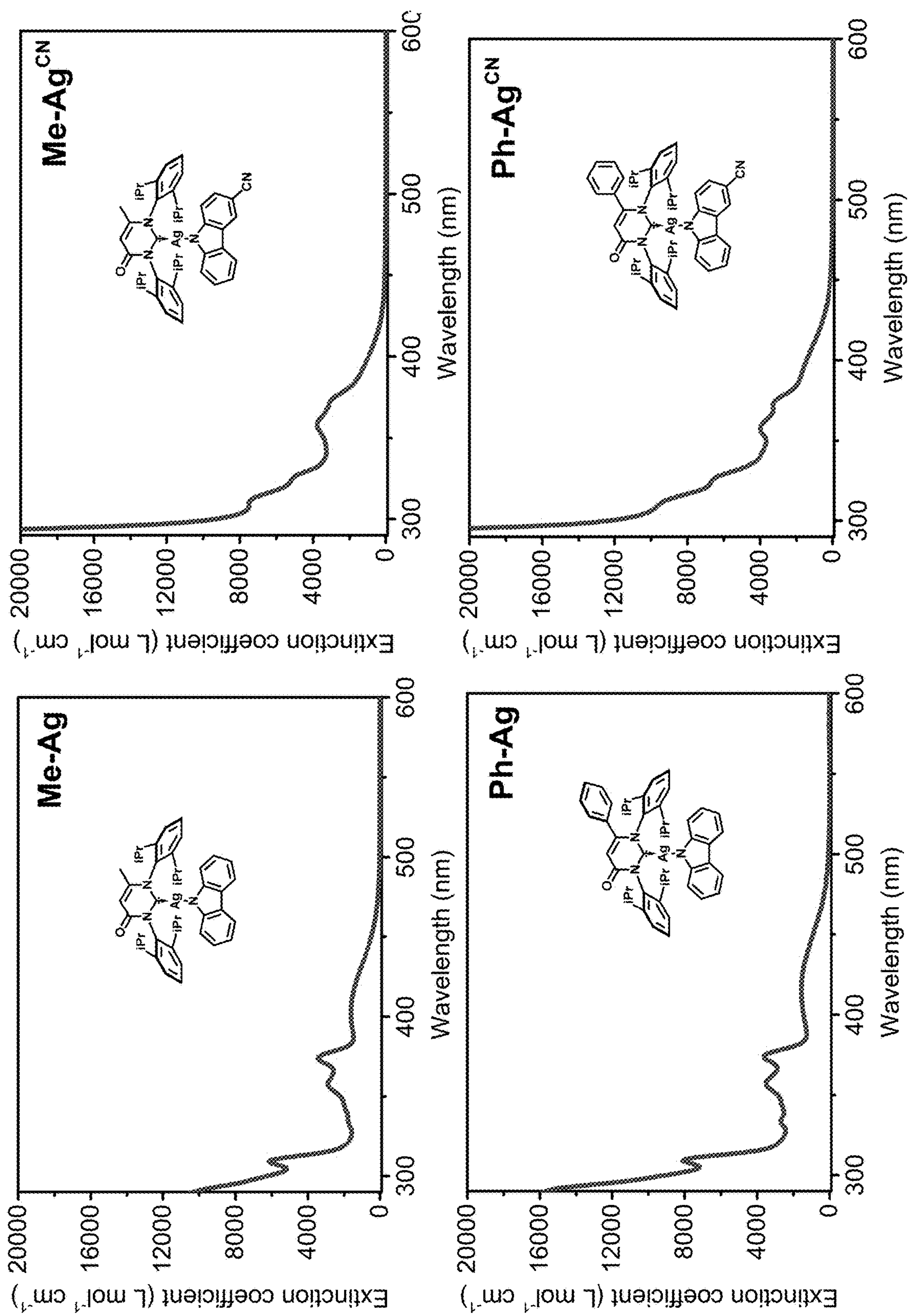
FIG. 38 is a series of plots depicting the absorption spectra in $CH_2Cl_2$ for (carbene)Ag(carbazolyl) complexes.
Figure 39:
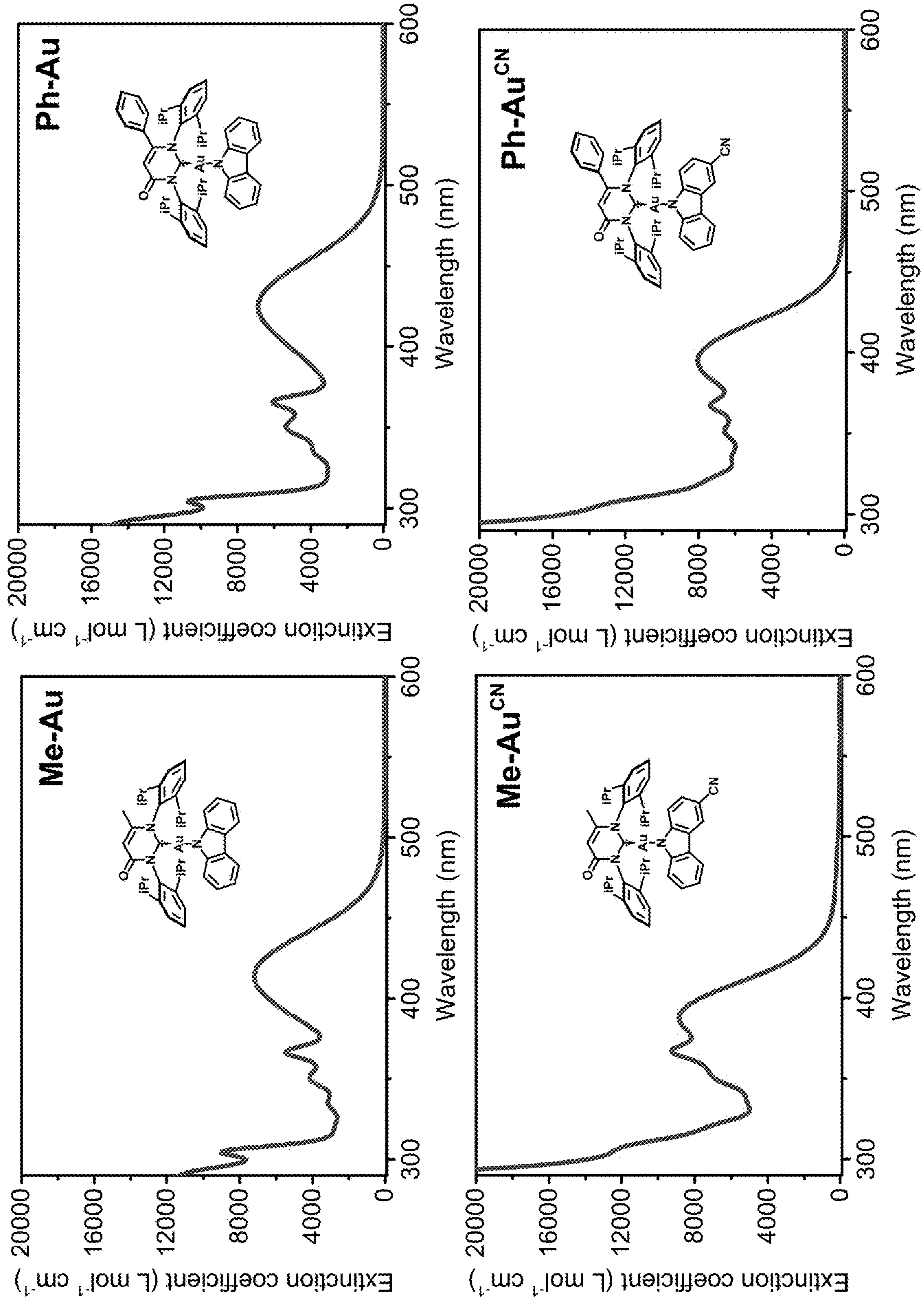
FIG. 39 is a series of plots depicting the absorption spectra in $CH_2Cl_2$ for (carbene)Au(carbazolyl) complexes.
Figure 40:
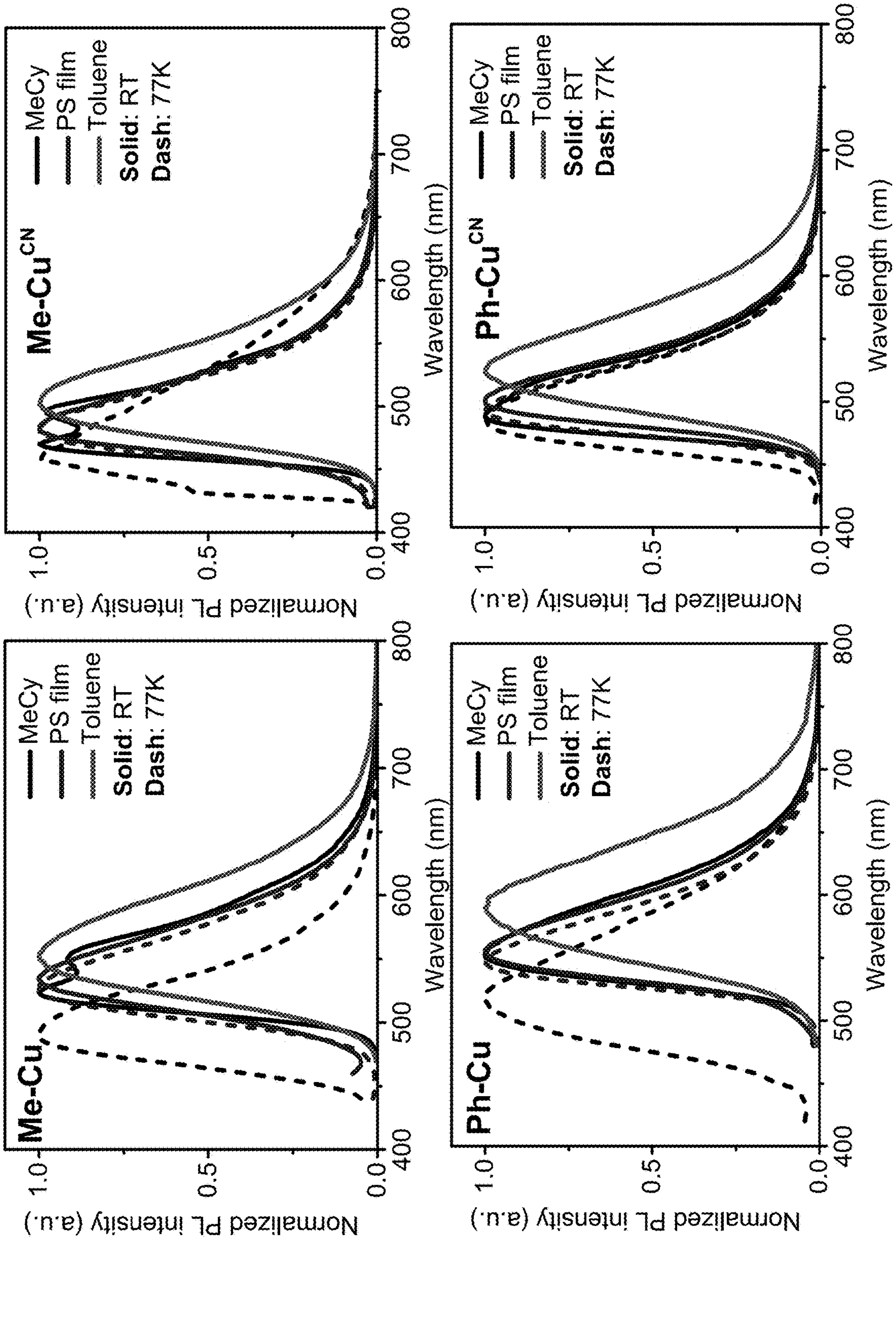
FIG. 40 is a series of plots depicting the emission spectra of the (carbene)Cu(carbazolyl) complexes.
Figure 41:
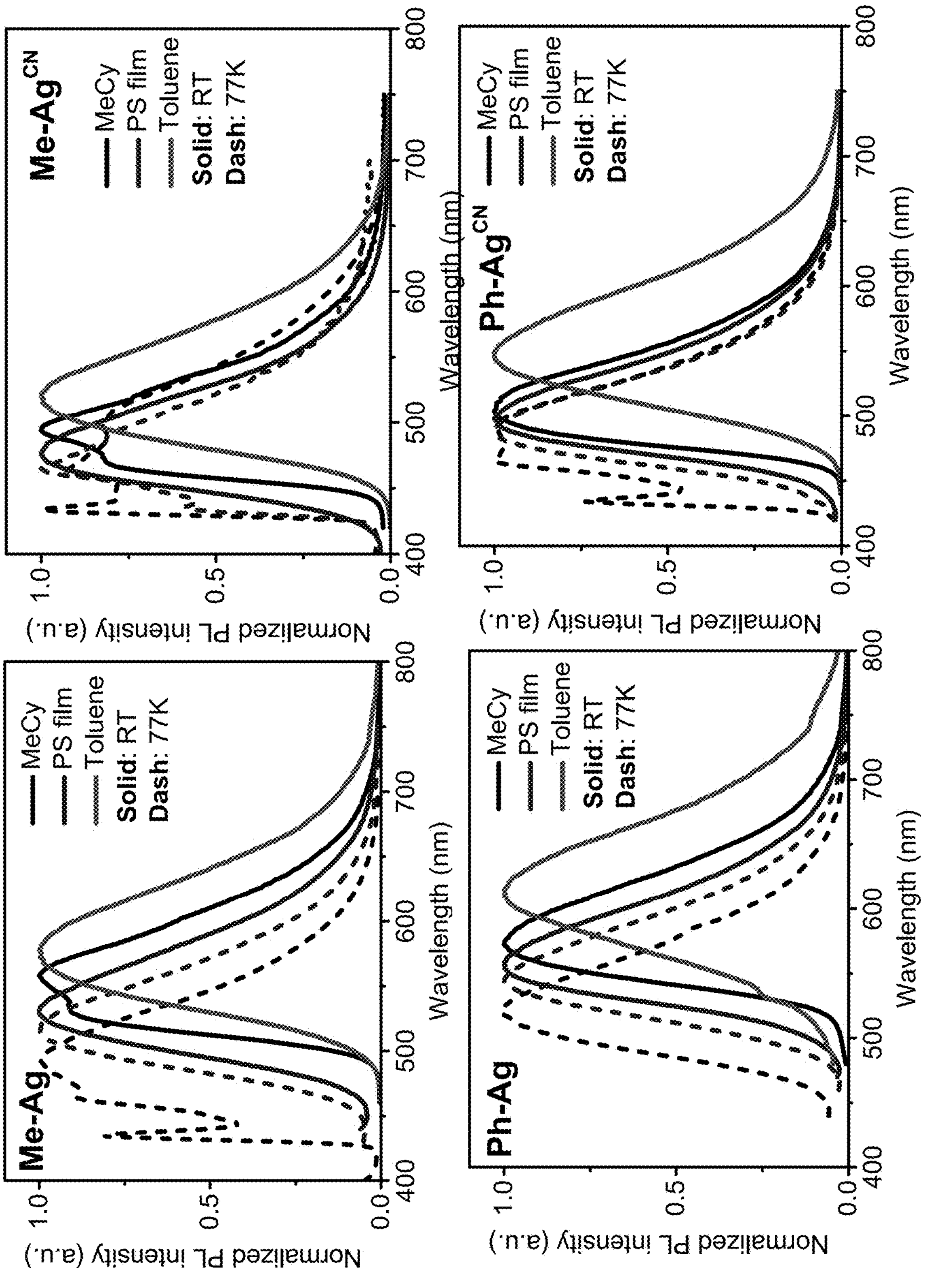
FIG. 41 is a series of plots depicting the emission spectra of the (carbene)Ag(carbazolyl) complexes.
Figure 42:
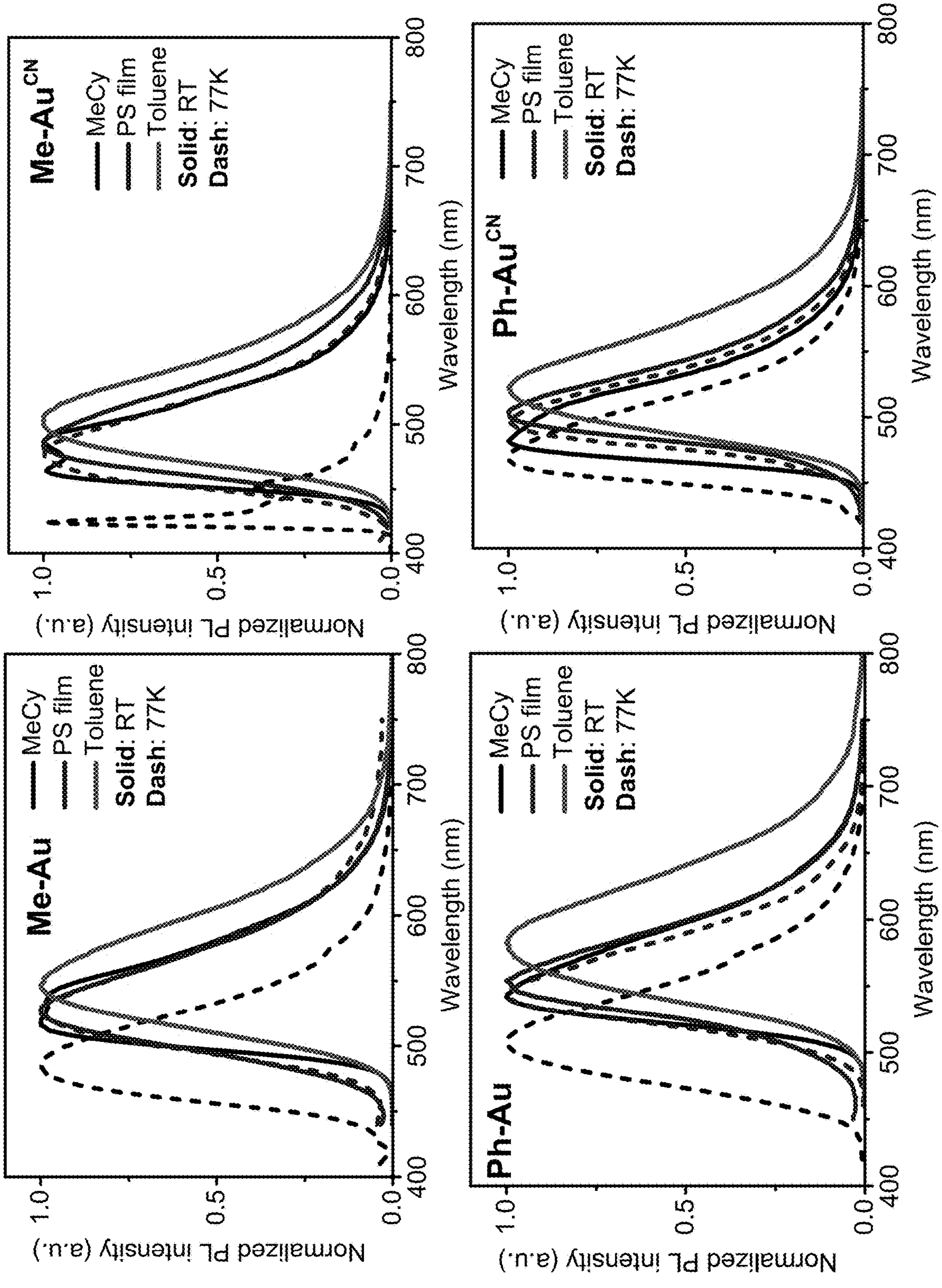
FIG. 42 is a series of plots depicting the emission spectra of the (carbene)Au(carbazolyl) complexes.
Figure 43:
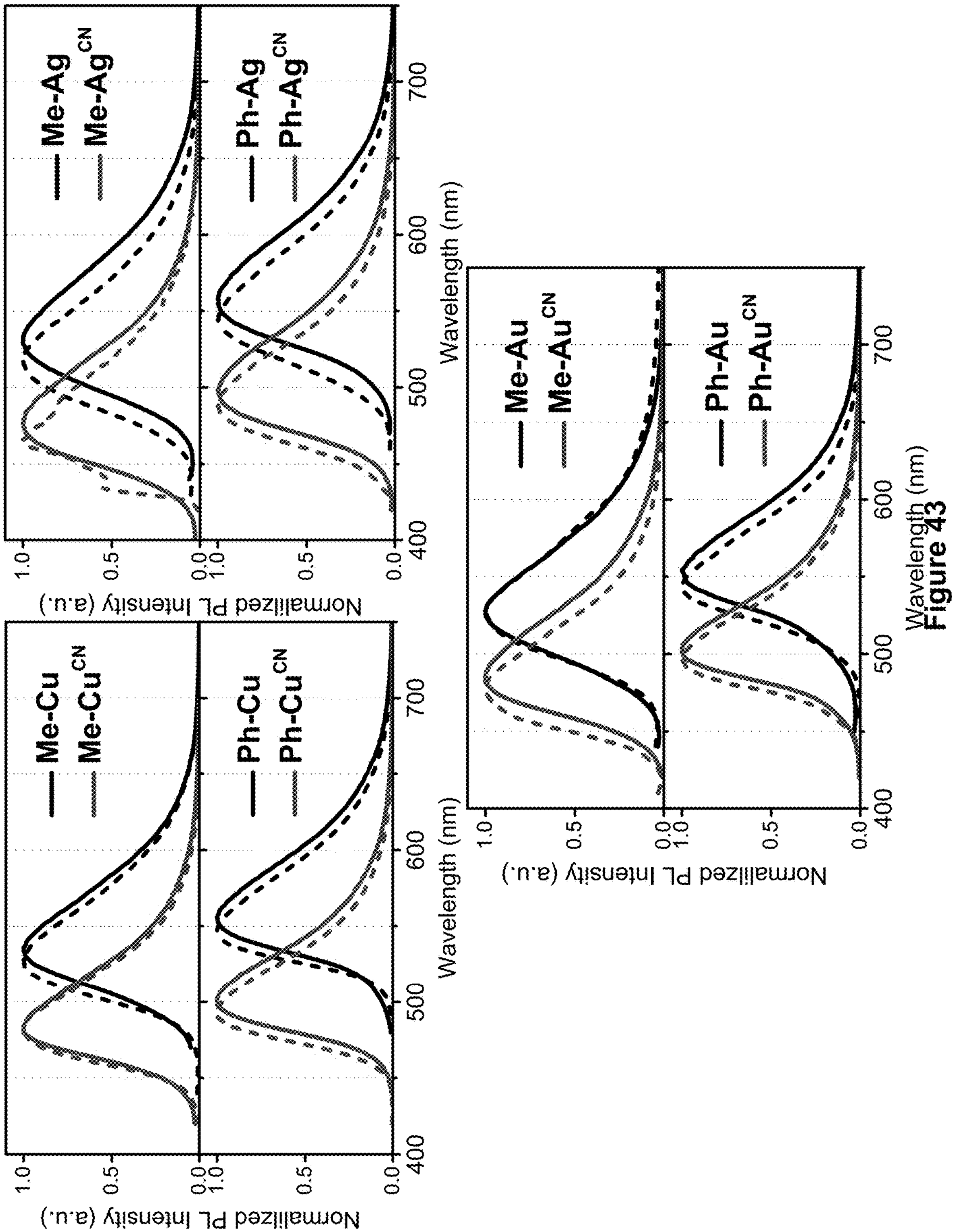
FIG. 43 is a series of plots depicting the emission spectra of the Cu, Ag, and Au complexes in doped PS film at room temperature (solid) and 77K (dash).

The absorption spectra in $CH_2Cl_2$ for the (carbene)Cu (carbazolyl) complexes are provided in FIG. 37. The absorption spectra in $CH_2Cl_2$ for the (carbene)Ag(carbazolyl) complexes are provided in FIG. 38. The absorption spectra in $CH_2Cl_2$ for the (carbene)Au(carbazolyl) complexes are provided in FIG. 39. The emission spectra of the (carbene)Cu (carbazolyl) complexes are provided in FIG. 40. The emission spectra of the (carbene)Ag(carbazolyl) complexes are provided in FIG. 41. The emission spectra of the (carbene) Au(carbazolyl) complexes are provided in FIG. 42. The emission spectra of the various complexes in doped PS film is provided in FIG. 43. Table 7 provides the complete emissive photophysical properties in MeCy and 1 wt % doped PS film.

TABLE 7

| Complete emissive photophysical properties in MeCy and 1 wt % doped PS film | | | | | | | |
|---|---|---|---|---|---|---|---|
| | Emission at room temperature | | | | | Emission at 77 K | |
| Complex | $\lambda_{max}$ (nm) | τ (μs) | $\Phi_{PL}$ | $k_r$ ($s^{-1}$) | $k_{nr}$ ($s^{-1}$) | $\lambda_{max}$ (nm) | τ (μs) |
| MeCy | | | | | | | |
| Me—Cu | 524, 550 | 1.8 | 0.73 | $4.1\times10^5$ | $1.5\times10^5$ | 490 | 143 |
| Me—Cu$^{CN}$ | 470, 496 | 1.5 | 0.63 | $4.2\times10^5$ | $2.5\times10^5$ | 459 | 66 |
| Ph—Cu | 552 | 0.87 | 0.50 | $5.7\times10^5$ | $5.7\times10^5$ | 519 | 127[a] |
| Ph—Cu$^{CN}$ | 488 | 1.1 | 0.73 | $6.6\times10^5$ | $2.4\times10^5$ | 486 | 74 |

TABLE 7-continued

| Complete emissive photophysical properties in MeCy and 1 wt % doped PS film | | | | | | | |
|---|---|---|---|---|---|---|---|
| | Emission at room temperature | | | | | Emission at 77 K | |
| Complex | $\lambda_{max}$ (nm) | τ (μs) | $\Phi_{PL}$ | $k_r$ ($s^{-1}$) | $k_{nr}$ ($s^{-1}$) | $\lambda_{max}$ (nm) | τ (μs) |
| Me—Ag | 533sh, 558 | 0.42 | 0.44 | $1.0 \times 10^6$ | $1.3 \times 10^6$ | 434, 493 | 12000[a] |
| Me—$Ag^{CN}$ | 470sh, 494 | 0.43 | 0.67 | $1.6 \times 10^6$ | $7.7 \times 10^6$ | 434, 463, 497 | 9000[a] |
| Ph—Ag | 572 | 0.32 | 0.26 | $8.1 \times 10^5$ | $2.3 \times 10^6$ | 522 | 3.1 |
| Ph—$Ag^{CN}$ | 504 | 0.61 | 0.55 | $9.0 \times 10^5$ | $7.4 \times 10^5$ | 433, 466, 490 | 22000[a] |
| Me—Au | 518, 534 | 1.4 | 0.71 | $5.1 \times 10^5$ | $2.1 \times 10^5$ | 486 | 60 |
| Me—$Au^{CN}$ | 464, 486 | 0.97 | 0.67 | $6.9 \times 10^5$ | $3.4 \times 10^5$ | 424, 452 | 328[a] |
| Ph—Au | 542 | 0.80 | 0.60 | $7.5 \times 10^5$ | $5.0 \times 10^5$ | 507 | 85 |
| Ph—$Au^{CN}$ | 482 | 0.85 | 0.76 | $8.9 \times 10^5$ | $2.8 \times 10^5$ | 469 | 54 |
| 1 wt % doped PS film | | | | | | | |
| Me—Cu | 534 | 1.5 | 0.58 | $3.9 \times 10^5$ | $2.8 \times 10^5$ | 527 | 265 |
| Me—$Cu^{CN}$ | 482 | 1.4 | 0.77 | $5.5 \times 10^5$ | $1.6 \times 10^5$ | 482 | 108 |
| Ph—Cu | 556 | 0.97 | 0.70 | $7.2 \times 10^5$ | $3.1 \times 10^5$ | 547 | 93 |
| Ph—$Cu^{CN}$ | 500 | 1.1 | 0.83 | $7.5 \times 10^5$ | $1.5 \times 10^5$ | 494 | 115 |
| Me—Ag | 530 | 0.41 | 0.77 | $1.9 \times 10^6$ | $5.6 \times 10^5$ | 516 | 7.2 |
| Me—$Ag^{CN}$ | 476 | 0.41 | 0.83 | $2.0 \times 10^6$ | $4.1 \times 10^5$ | 464 | 6000[a] |
| Ph—Ag | 558 | 0.53 | 0.56 | $1.1 \times 10^6$ | $8.3 \times 10^5$ | 544 | 2.7 |
| Ph—$Ag^{CN}$ | 498 | 0.60 | 0.88 | $1.5 \times 10^6$ | $2.0 \times 10^5$ | 487 | 3.0 |
| Me—Au | 528 | 1.1 | 0.50 | $4.5 \times 10^5$ | $4.5 \times 10^5$ | 526 | 82 |
| Me—$Au^{CN}$ | 484 | 0.81 | 0.50 | $6.2 \times 10^5$ | $6.2 \times 10^5$ | 478 | 57 |
| Ph—Au | 554 | 0.80 | 0.77 | $9.6 \times 10^5$ | $2.9 \times 10^5$ | 544 | 47 |
| Ph—$Au^{CN}$ | 504 | 0.82 | 1.00 | $1.2 \times 10^6$ | $<0.1 \times 10^5$ | 498 | 68 |

[a] calculated as a weighted average of the two contributions from a biexponential decay trace at emission maximum Table 8 provides $\Phi_{PL}$ values of the doped PS films under air and $N_2$. Table 9 provides emission properties in toluene.

TABLE 8

| $\Phi_{PL}$ values of the doped PS films under air and $N_2$ | | | | | |
|---|---|---|---|---|---|
| Complex | in air | in $N_2$ | Complex | in air | in $N_2$ |
| Me—Cu | 0.45 | 0.58 | Me—$Cu^{CN}$ | 0.61 | 0.77 |
| Ph—Cu | 0.56 | 0.70 | Ph—$Cu^{CN}$ | 0.70 | 0.83 |
| Me—Ag | 0.68 | 0.77 | Me—$Ag^{CN}$ | 0.71 | 0.83 |
| Ph—Ag | 0.45 | 0.56 | Ph—$Ag^{CN}$ | 0.77 | 0.88 |
| Me—Au | 0.39 | 0.50 | Me—$Au^{CN}$ | 0.43 | 0.50 |
| Ph—Au | 0.63 | 0.77 | Ph—$Au^{CN}$ | 0.88 | 1.00 |

$\Phi_{PL}$ values in $N_2$ were recorded when the PS film samples were fixed under $N_2$ stream

TABLE 9

| Emission properties in toluene | | | | | |
|---|---|---|---|---|---|
| | Emission at room temperature | | | | |
| Complex | $\lambda_{max}$ (nm) | τ(μs) | $\Phi_{PL}$ | $k_r$ ($s^{-1}$) | $k_{nr}$ ($s^{-1}$) |
| Me—Cu | 552 | 1.5 | 0.66 | $4.4 \times 10^5$ | $2.3 \times 10^5$ |
| Me—$Cu^{CN}$ | 502 | 1.3 | 0.84 | $6.5 \times 10^5$ | $1.2 \times 10^5$ |
| Ph—Cu | 590 | 0.17 | 0.10 | $5.9 \times 10^5$ | $5.3 \times 10^6$ |
| Ph—$Cu^{CN}$ | 524 | 0.86 | 0.66 | $7.7 \times 10^5$ | $4.0 \times 10^5$ |

TABLE 9-continued

| Emission properties in toluene | | | | | |
|---|---|---|---|---|---|
| | Emission at room temperature | | | | |
| Complex | $\lambda_{max}$ (nm) | τ(μs) | $\Phi_{PL}$ | $k_r$ ($s^{-1}$) | $k_{nr}$ ($s^{-1}$) |
| Me—Ag | 578 | 0.18 | 0.23 | $1.3 \times 10^6$ | $4.3 \times 10^6$ |
| Me—$Ag^{CN}$ | 522 | 0.39 | 0.73 | $1.9 \times 10^6$ | $6.9 \times 10^5$ |
| Ph—Ag | 610 | 0.038 | 0.02 | $5.3 \times 10^5$ | $2.6 \times 10^7$ |
| Ph—$Ag^{CN}$ | 548 | 0.40 | 0.38 | $9.5 \times 10^5$ | $1.6 \times 10^6$ |
| Me—Au | 546 | 1.1 | 0.59 | $5.4 \times 10^5$ | $3.7 \times 10^5$ |
| Me—$Au^{CN}$ | 502 | 0.87 | 0.71 | $8.2 \times 10^5$ | $3.3 \times 10^5$ |
| Ph—Au | 582 | 0.19 | 0.15 | $7.9 \times 10^5$ | $4.5 \times 10^6$ |
| Ph—$Au^{CN}$ | 522 | 0.66 | 0.74 | $1.1 \times 10^6$ | $3.9 \times 10^5$ |

Figure 44:
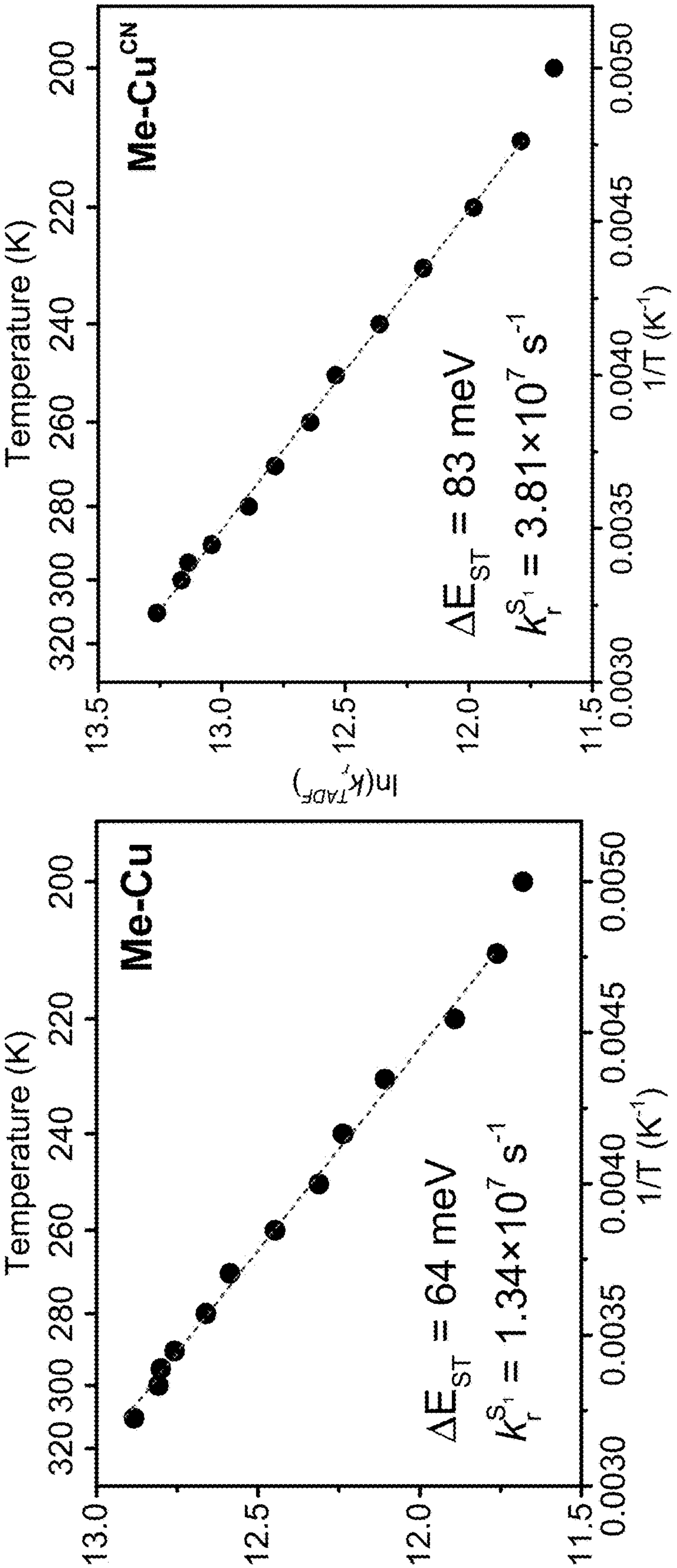
FIG. 44 is a series of plots depicting the full kinetic fits of the temperature dependent lifetime from 210 to 310 K for Me-Cu and Me-$Cu^{CN}$.
Figure 45:
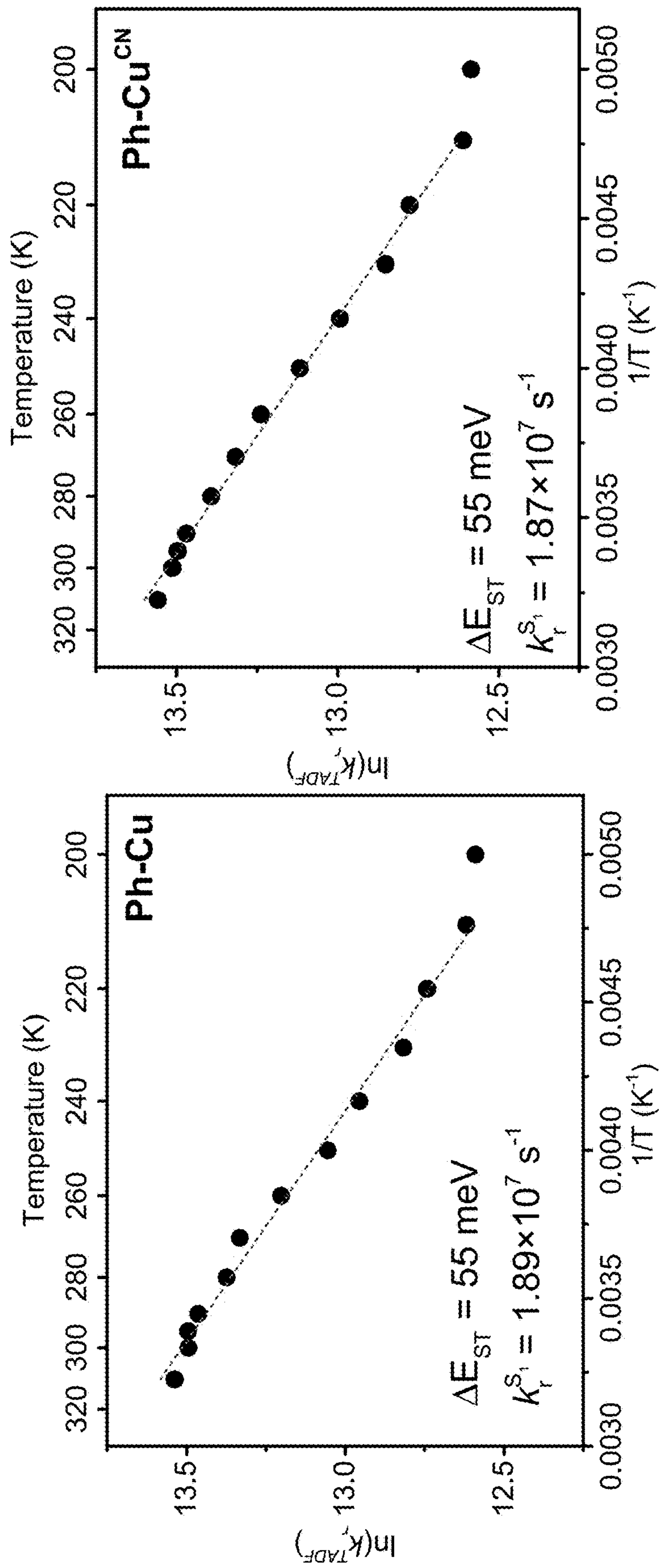
FIG. 45 is a series of plots depicting the full kinetic fits of the temperature dependent lifetime from 210 to 310 K for Ph-Cu and Ph-$Cu^{CN}$.
Figure 46:
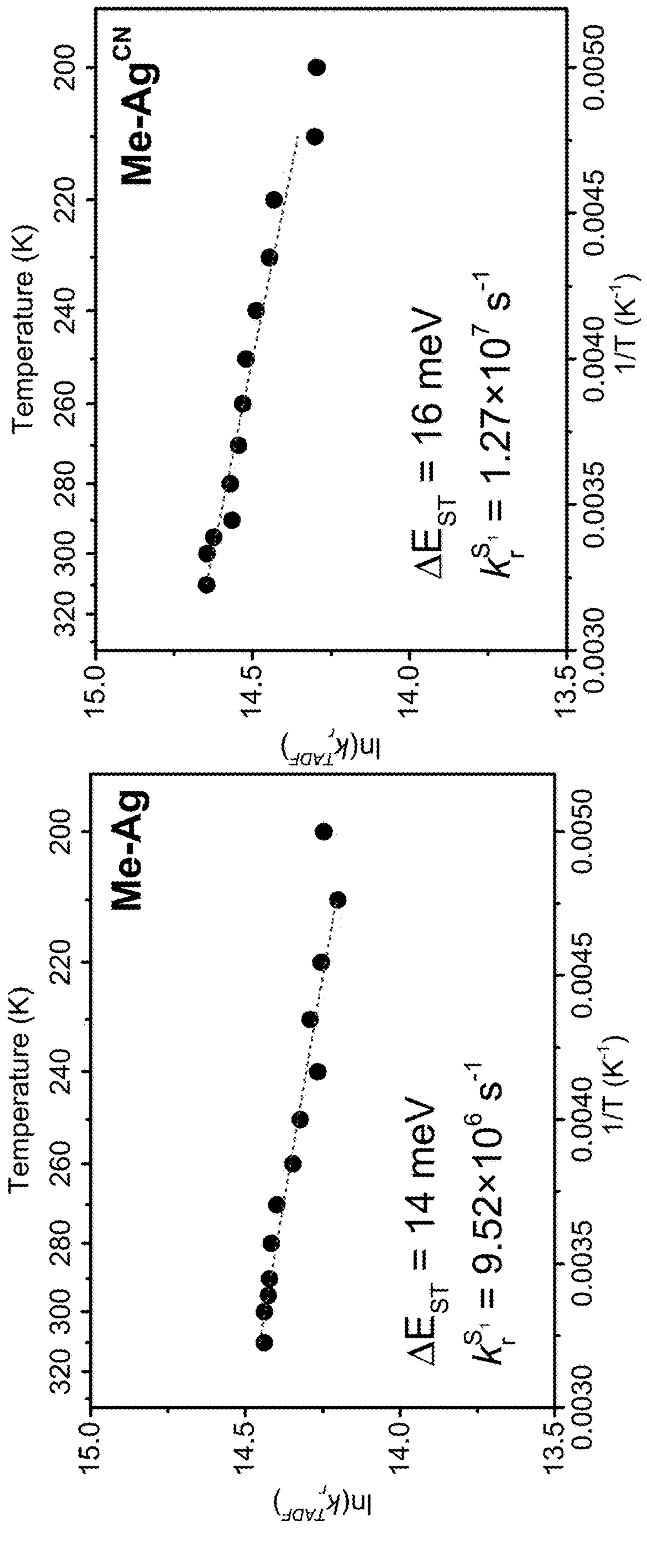
FIG. 46 is a series of plots depicting the full kinetic fits of the temperature dependent lifetime from 210 to 310 K for Me-Ag and Me-$Ag^{CN}$.
Figure 47:
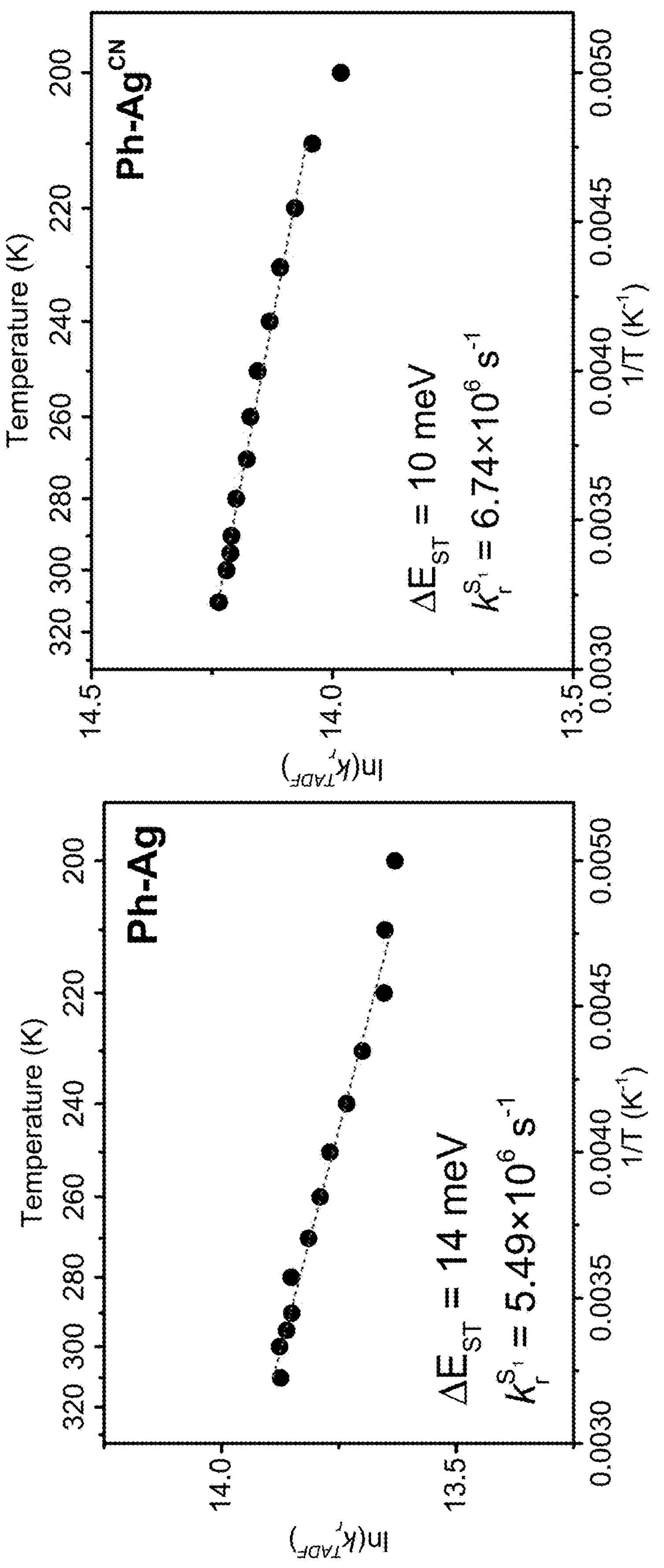
FIG. 47 is a series of plots depicting the full kinetic fits of the temperature dependent lifetime from 210 to 310 K for Ph-Ag and Ph-$Ag^{CN}$.
Figure 48:
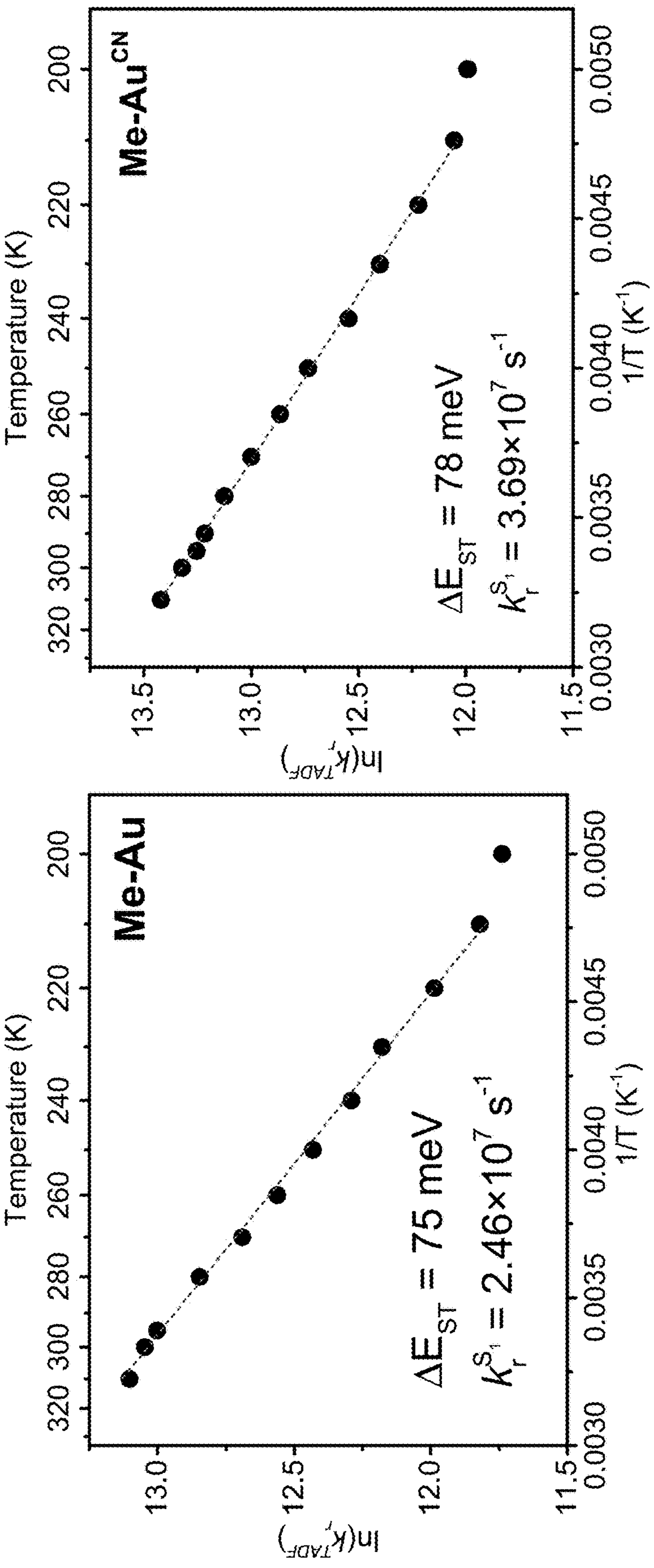
FIG. 48 is a series of plots depicting the full kinetic fits of the temperature dependent lifetime from 210 to 310 K for Me-Au and Me-$Au^{CN}$.
Figure 49:
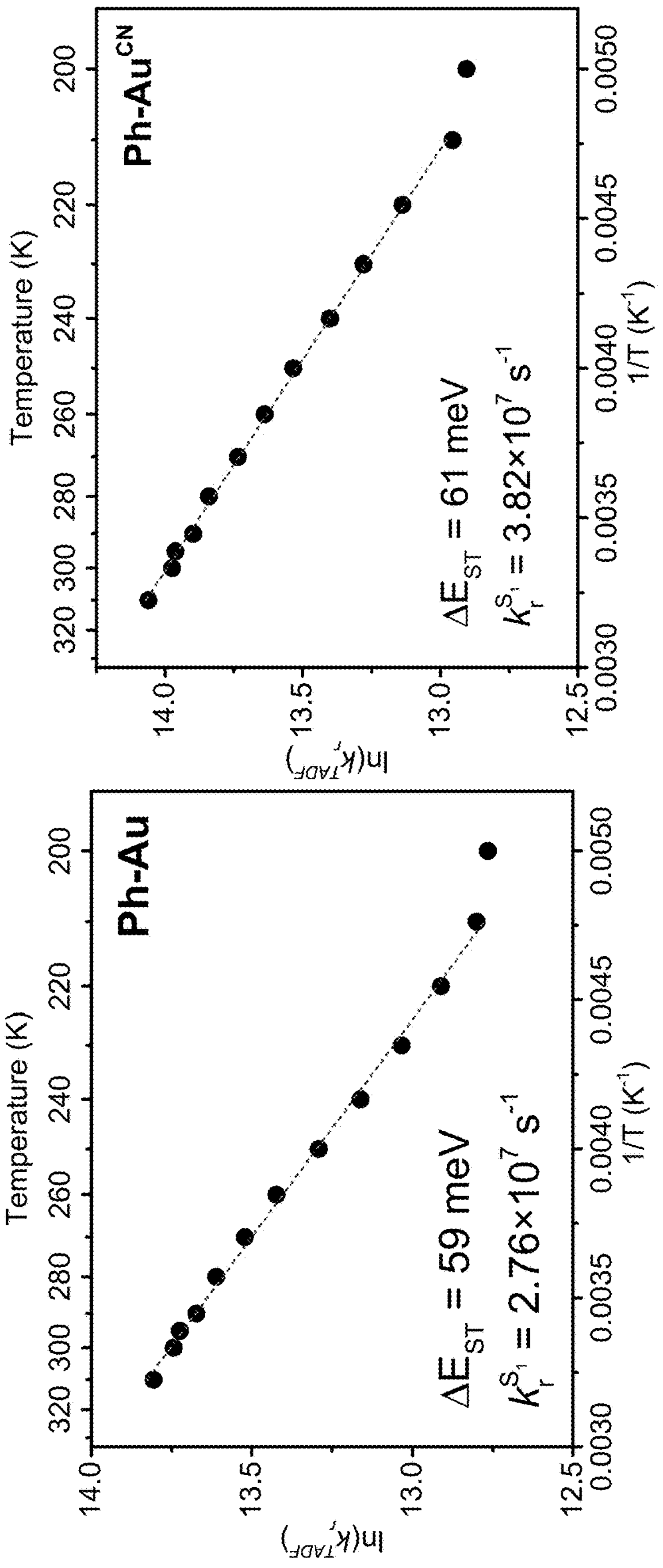
FIG. 49 is a series of plots depicting the full kinetic fits of the temperature dependent lifetime from 210 to 310 K for Ph-Au and Ph-$Au^{CN}$.

Full kinetic fits of the temperature dependent lifetime from 210 to 310 K for (carbene)Cu(carbazolyl) complexes are provided in FIG. 44 and FIG. 45. Full kinetic fits of the temperature dependent lifetime from 210 to 310 K for (carbene)Ag(carbazolyl) complexes are provided in FIG. 46 and FIG. 47. Full kinetic fits of the temperature dependent lifetime from 210 to 310 K for (carbene)Au(carbazolyl) complexes are provided in FIG. 48 and FIG. 49.

Table 10 provides complete photophysical properties of TADF coinage metal complexes. Relevant chemical structures are provided below the table. In the chemical structures, dipp refers to 2,6-diisopropylphenyl.

TABLE 10

| Complete photophysical properties of TADF coinage metal complexes including reported examples | | | | | | | | | |
|---|---|---|---|---|---|---|---|---|---|
| Complex | NTO overlap | $\Phi_{PL}$ | τ (μs) | $k_r$ ($s^{-1}$) | $\lambda_{max}^{em}$ (nm) | $E_{em}$ (eV) | $k_r/E^3$ ($s^{-1}eV^{-3}$) | $k_r^{ICT}$ ($s^{-1}$) | $\Delta E_{ST}$ (meV) |
| Me—Cu | 0.377 | 0.58 | 1.5 | $3.8 \times 10^5$ | 534 | 2.32 | $3.0 \times 10^4$ | $1.3 \times 10^7$ | 64 |
| Me—$Cu^{CN}$ | 0.361 | 0.77 | 1.4 | $5.4 \times 10^5$ | 480 | 2.58 | $3.1 \times 10^4$ | $3.8 \times 10^7$ | 83 |
| Ph—Cu | 0.311 | 0.70 | 0.98 | $7.2 \times 10^5$ | 556 | 2.23 | $6.5 \times 10^4$ | $1.9 \times 10^7$ | 55 |
| Ph—$Cu^{CN}$ | 0.301 | 0.83 | 1.1 | $7.3 \times 10^5$ | 500 | 2.48 | $4.8 \times 10^4$ | $1.9 \times 10^7$ | 55 |
| (CAAC)CuCz[29] | 0.379 | — | — | $3.5 \times 10^5$ | 474 | 2.62 | $1.9 \times 10^4$ | $1.4 \times 10^7$ | 73 |

TABLE 10-continued

| Complete photophysical properties of TADF coinage metal complexes including reported examples | | | | | | | | | |
|---|---|---|---|---|---|---|---|---|---|
| Complex | NTO overlap | $\Phi_{PL}$ | τ (μs) | $k_r$ ($s^{-1}$) | $\lambda_{max}^{em}$ (nm) | $E_{em}$ (eV) | $k_r/E^3$ ($s^{-1}eV^{-3}$) | $k_r^{ICT}$ ($s^{-1}$) | $\Delta E_{ST}$ (meV) |
| (MAC)CuCz[30] | 0.366 | — | — | $6.4 \times 10^5$ | 506 | 2.45 | $4.3 \times 10^4$ | $3.6 \times 10^7$ | 71 |
| Me—Ag | 0.268 | 0.77 | 0.41 | $1.9 \times 10^6$ | 530 | 2.34 | $1.5 \times 10^5$ | $9.5 \times 10^6$ | 14 |
| Me—$Ag^{CN}$ | 0.272 | 0.83 | 0.41 | $2.0 \times 10^6$ | 476 | 2.60 | $1.1 \times 10^5$ | $1.3 \times 10^7$ | 16 |
| Ph—Ag | 0.212 | 0.56 | 0.53 | $1.1 \times 10^6$ | 558 | 2.22 | $9.6 \times 10^4$ | $5.5 \times 10^6$ | 14 |
| Ph—$Ag^{CN}$ | 0.211 | 0.88 | 0.60 | $1.5 \times 10^6$ | 498 | 2.49 | $9.5 \times 10^4$ | $6.7 \times 10^6$ | 10 |
| (CAAC)AgCz | 0.288 | — | — | $2.0 \times 10^6$ | 472 | 2.63 | $1.1 \times 10^5$ | $1.2 \times 10^7$ | 19 |
| (MAC)AgCz | 0.280 | — | — | $2.4 \times 10^6$ | 512 | 2.42 | $1.7 \times 10^5$ | $2.2 \times 10^7$ | 22 |
| Me—Au | 0.411 | 0.50 | 1.1 | $4.7 \times 10^5$ | 528 | 2.35 | $3.6 \times 10^4$ | $2.5 \times 10^7$ | 75 |
| Me—$Au^{CN}$ | 0.391 | 0.50 | 0.81 | $6.1 \times 10^5$ | 484 | 2.56 | $3.6 \times 10^4$ | $3.7 \times 10^7$ | 78 |
| Ph—Au | 0.342 | 0.77 | 0.79 | $9.6 \times 10^5$ | 554 | 2.24 | $8.6 \times 10^4$ | $2.8 \times 10^7$ | 59 |
| Ph—$Au^{CN}$ | 0.364 | 1.0 | 0.82 | $1.2 \times 10^6$ | 504 | 2.46 | $8.2 \times 10^4$ | $3.8 \times 10^7$ | 61 |
| (CAAC)AuCz | 0.418 | — | — | $8.8 \times 10^5$ | 472 | 2.63 | $4.9 \times 10^4$ | $4.0 \times 10^7$ | 71 |
| (MAC)AuCz | 0.400 | — | — | $1.0 \times 10^6$ | 512 | 2.42 | $7.0 \times 10^4$ | $4.2 \times 10^7$ | 71 |
| Au-1c | 0.333 | — | — | $5.8 \times 10^5$ | 620 | 2.00 | $7.3 \times 10^4$ | $6.7 \times 10^7$ | 100 |
| Au-2d | 0.373 | — | — | $2.2 \times 10^5$ | 504 | 2.46 | $1.5 \times 10^4$ | $4.2 \times 10^7$ | 119 |
| Au-2d-Me | 0.381 | — | — | $1.9 \times 10^5$ | 520 | 2.38 | $1.4 \times 10^4$ | $3.0 \times 10^7$ | 105 |
| Au-2e | 0.367 | — | — | $2.4 \times 10^5$ | 544 | 2.28 | $2.0 \times 10^4$ | $4.0 \times 10^7$ | 109 |
| Au-2e-Me | 0.373 | — | — | $2.0 \times 10^5$ | 554 | 2.24 | $1.8 \times 10^4$ | $4.0 \times 10^7$ | 113 |
| $Au_2^{CC}$ | 0.289 | — | — | $1.5 \times 10^6$ | 480 | 2.58 | $8.7 \times 10^4$ | $3.1 \times 10^7$ | 50 |

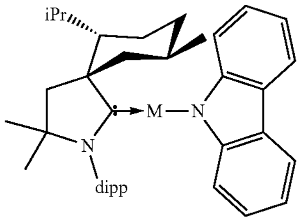

(CAAC)MCz
M = Cu, Ag, Au

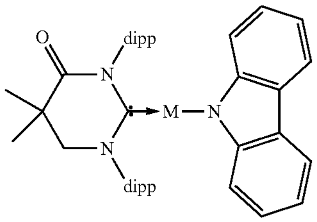

(MAC)MCz
M = Cu, Ag, Au dipp = 2,6-diisopropylphenyl

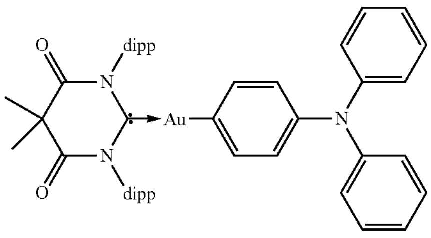

Au-1c

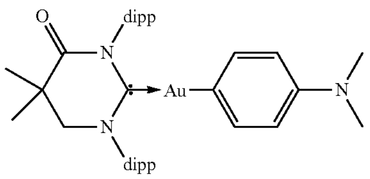

Au-2d

-continued

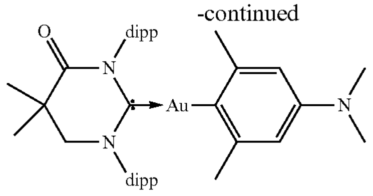

Au-2d-Me

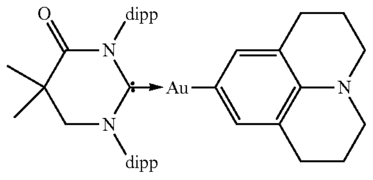

Au-2e

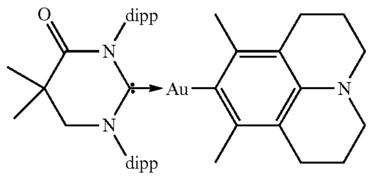

Au-2e-Me

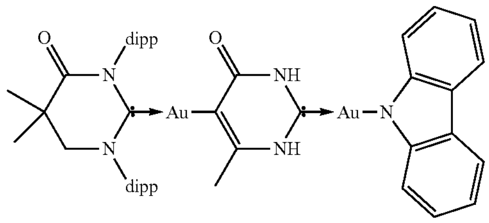

$Au_2^{cc}$

The relative PLQY DPL at different temperature is calculated according to the following equation $$\Phi_{PL} = \frac{A}{A_{295K}} \times \Phi_{PL,295K}$$

where A and $A_{295K}$ are the integrated emission spectra area at the corresponding temperature and 295K, respectively. $\Phi_{PL,295K}$ is the absolute PLQY at 295K. The relative DPL in doped PS at different temperatures is are presented in Table 11.

TABLE 11

Relative $\Phi_{PL}$ in doped PS film at different temperature

| Temperature (K.) | Me—Cu | Me—$Cu^{CN}$ | Ph—Cu | Ph—$Cu^{CN}$ |
|---|---|---|---|---|
| 210 | 0.69 | 0.68 | 0.72 | 0.89 |
| 220 | 0.68 | 0.69 | 0.72 | 0.88 |
| 230 | 0.66 | 0.70 | 0.72 | 0.87 |
| 240 | 0.65 | 0.72 | 0.72 | 0.88 |
| 250 | 0.63 | 0.73 | 0.72 | 0.88 |
| 260 | 0.62 | 0.74 | 0.73 | 0.8 |
| 270 | 0.61 | 0.75 | 0.73 | 0.88 |
| 280 | 0.60 | 0.74 | 0.73 | 0.86 |
| 290 | 0.58 | 0.76 | 0.74 | 0.84 |
| 300 | 0.57 | 0.77 | 0.70 | 0.82 |
| 310 | 0.55 | 0.77 | 0.69 | 0.81 |

| Temperature (K.) | Me—Ag | Me—$Ag^{CN}$ | Ph—Ag | Ph—$Ag^{CN}$ |
|---|---|---|---|---|
| 210 | 0.94 | 0.88 | 0.59 | 0.92 |
| 220 | 0.92 | 0.86 | 0.58 | 0.92 |
| 230 | 0.90 | 0.85 | 0.58 | 0.91 |
| 240 | 0.85 | 0.85 | 0.58 | 0.91 |
| 250 | 0.84 | 0.84 | 0.58 | 0.92 |
| 260 | 0.82 | 0.83 | 0.58 | 0.91 |
| 270 | 0.81 | 0.83 | 0.57 | 0.90 |
| 280 | 0.80 | 0.82 | 0.57 | 0.89 |
| 290 | 0.78 | 0.81 | 0.57 | 0.88 |
| 300 | 0.76 | 0.84 | 0.55 | 0.88 |
| 310 | 0.74 | 0.83 | 0.55 | 0.86 |

| Temperature (K.) | Me—Au | Me—$Au^{CN}$ | Ph—Au | Ph—$Au^{CN}$ |
|---|---|---|---|---|
| 210 | 0.54 | 0.78 | 0.75 | 1.0 |
| 220 | 0.54 | 0.48 | 0.75 | 1.0 |
| 230 | 0.54 | 0.49 | 0.76 | 1.0 |
| 240 | 0.53 | 0.50 | 0.76 | 1.0 |
| 250 | 0.53 | 0.50 | 0.77 | 1.0 |
| 260 | 0.52 | 0.50 | 0.77 | 1.0 |
| 270 | 0.52 | 0.50 | 0.77 | 1.0 |
| 280 | 0.51 | 0.50 | 0.77 | 1.0 |
| 290 | 0.51 | 0.50 | 0.77 | 1.0 |
| 300 | 0.50 | 0.50 | 0.76 | 1.0 |
| 310 | 0.49 | 0.50 | 0.75 | 1.0 |

Figure 50:
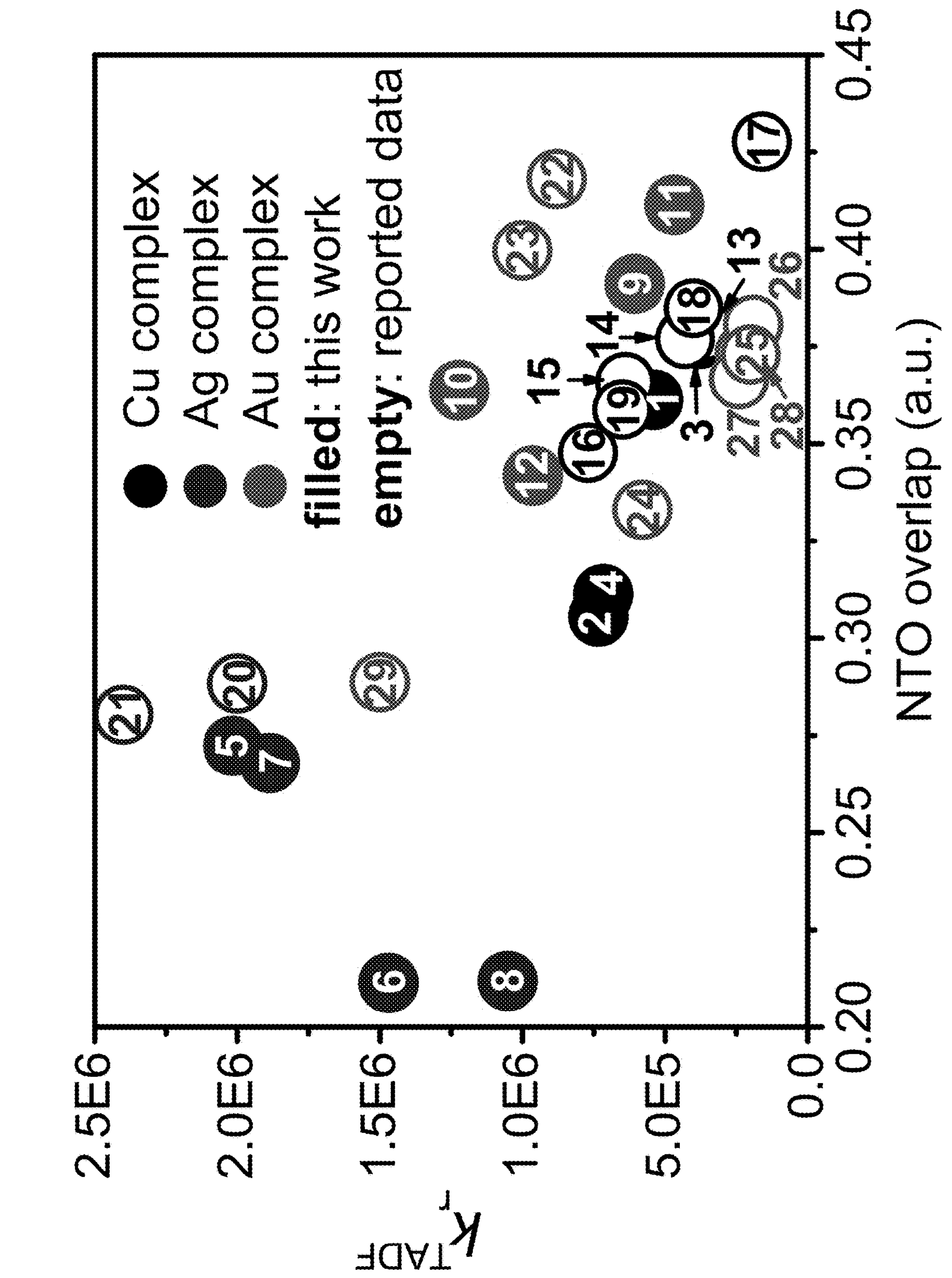
FIG. 50 is a plot of TADF radiative decay rate as a function of NTO overlap with structures of reported molecules.

The TADF decay rate as a function of NTO overlap is provided in FIG. 50. The structures of the compounds are shown below.

13

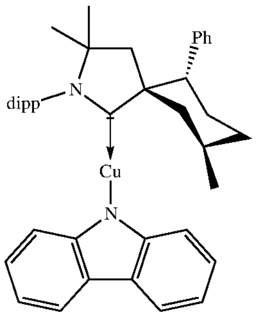

14

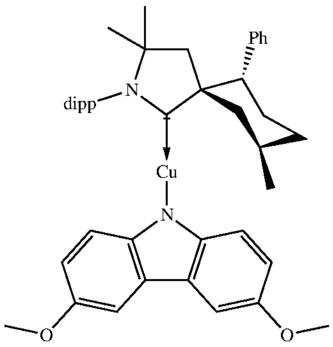

15

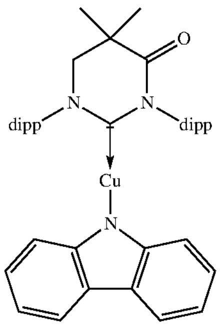

16

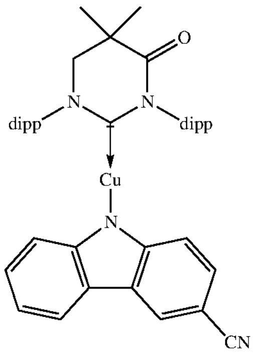

17
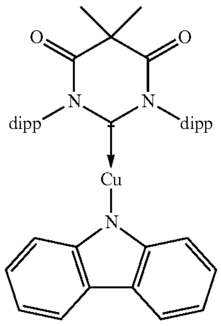
18
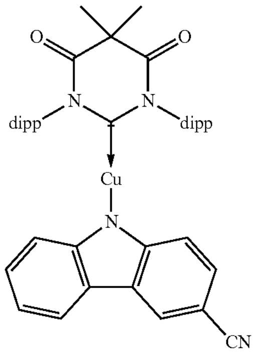
19
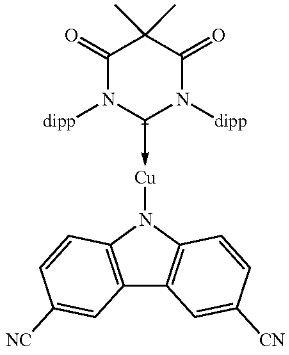
20
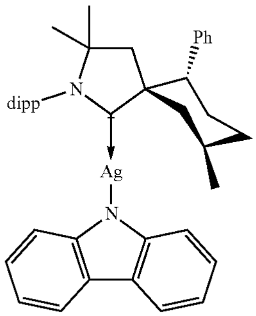
21
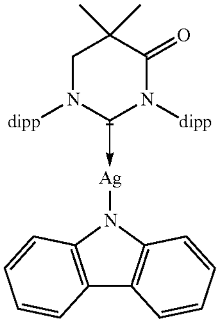
22
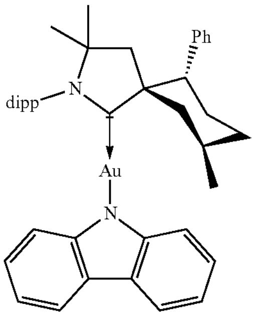
24
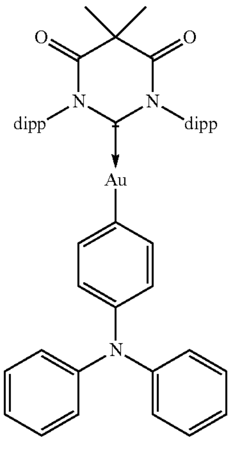
25
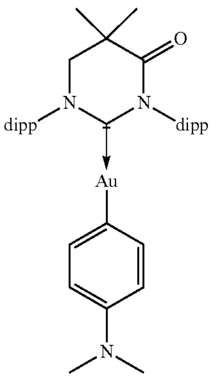

-continued

26

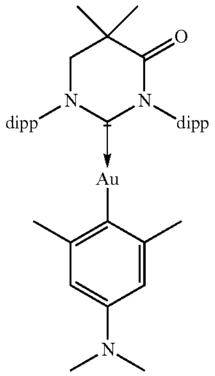

27

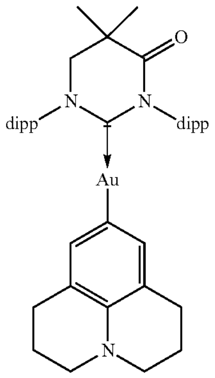

-continued

28

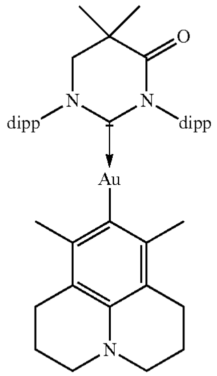

29

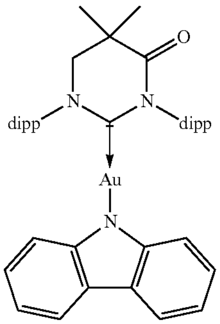

Figure 7:
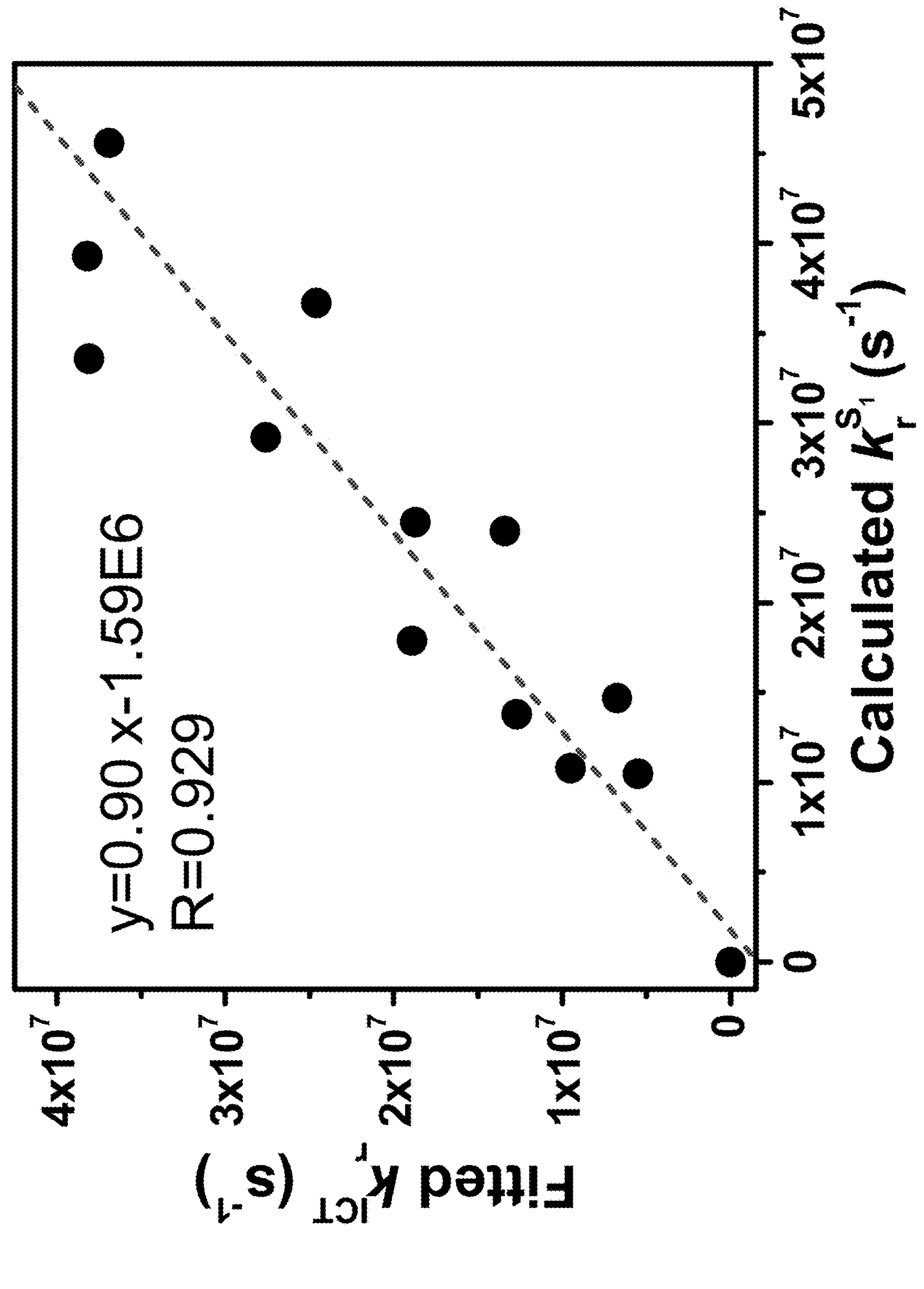
FIG. 7 is a plot of the relationship between the experimentally fitted $k_r^{S_1}$ and calculated $k_r^{S_1}$ by Stickler-Berg equation.
Figure 51:
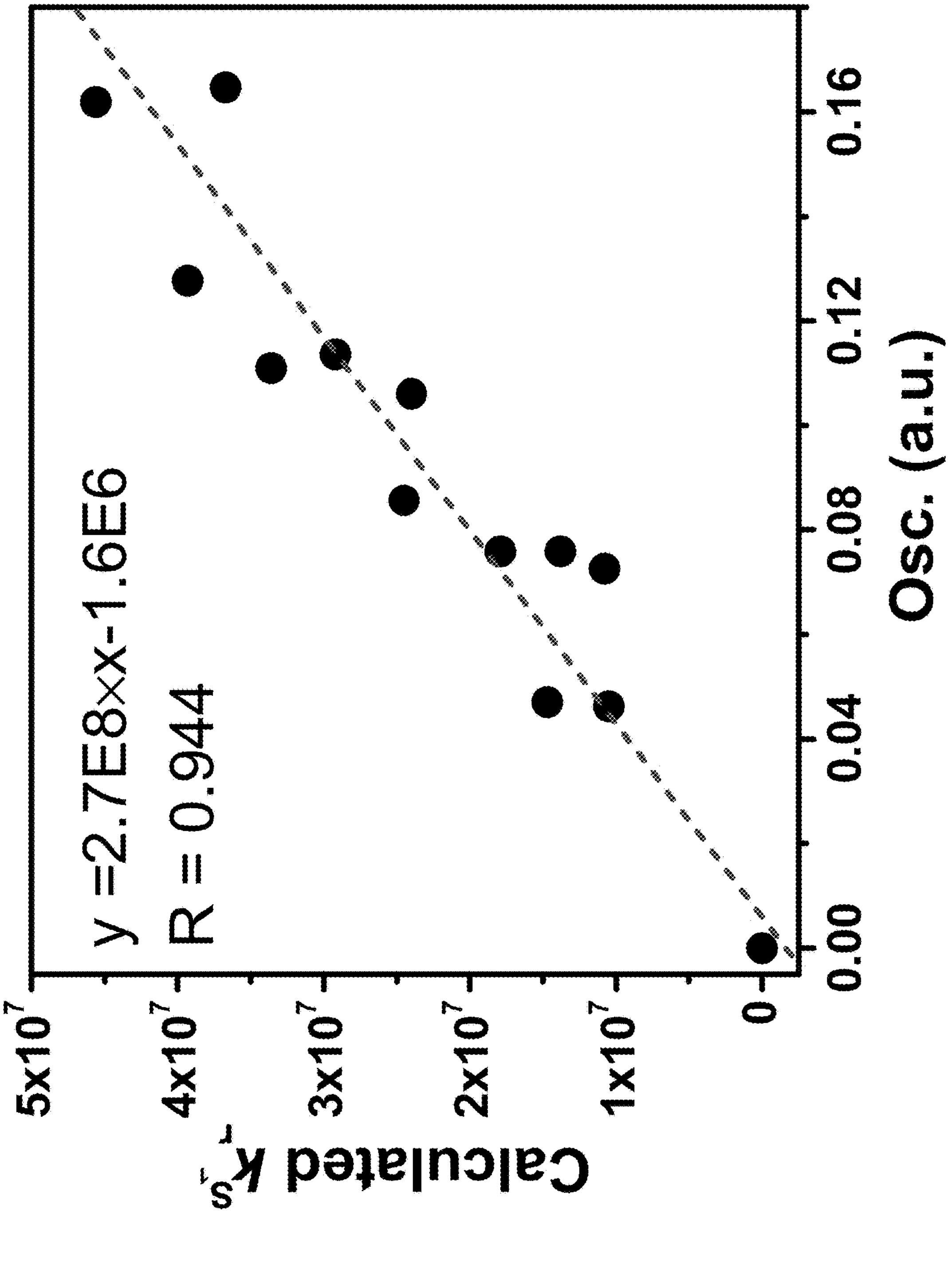
FIG. 51 is a plot of the relationship between calculated $k_r^{S_1}$ by Strickler-Berg equation and oscillator strength based on exemplary coinage metal complexes.
Figure 52:
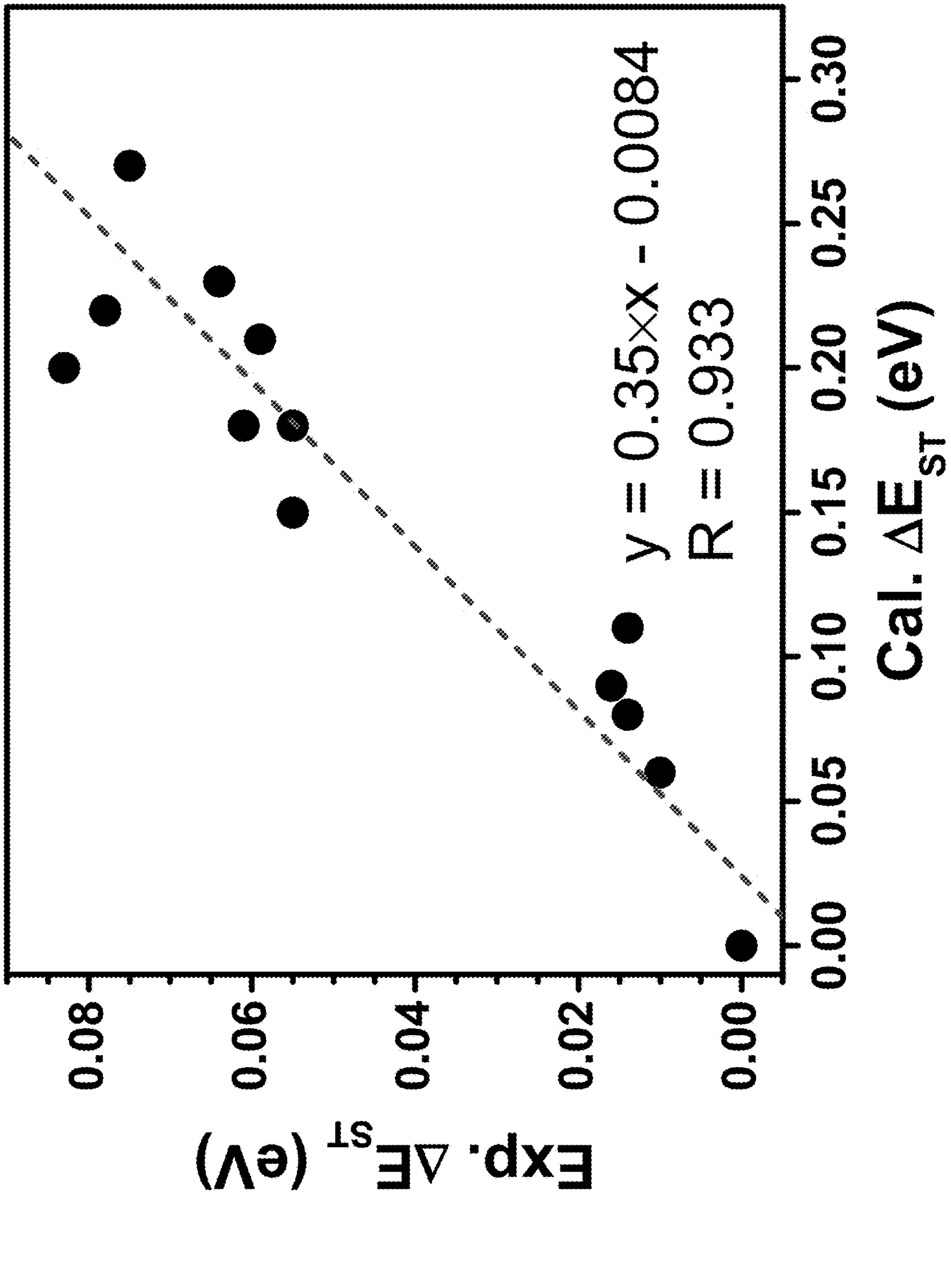
FIG. 52 is a plot of the Relationship between experimental and theoretically calculated $\Delta E_{ST}$.

The relationship between calculated $k_r^{S_1}$ by Strickler-Berg equation and Osc. Strength based on the new coinage metal complexes is shown in FIG. 51. The relationship between the experimentally fitted $k_r^{S_1}$ and calculated $k_r^{S_1}$ by Strickler-Berg equation is shown in FIG. 7. The relationship between experimental and theoretically calculated $\Delta E_{ST}$ is presented in FIG. 52. Table 12 presents photophysical properties of some reported highly efficient organic TADF molecules.

TABLE 12

Photophysical properties of some reported highly efficient organic TADF molecules

| Acronym | Molecular structure | NTO over-lap | $\Delta E_{ST}$ (Exp.) | $\Delta E_{ST}$ (Cal.) | $k_r$(S1) ($s^{-1}$) | ISC rate ($s^{-1}$) | $k_r$ (TADF) ($s^{-1}$) | Ref. |
|---|---|---|---|---|---|---|---|---|
| 4CzIPN | 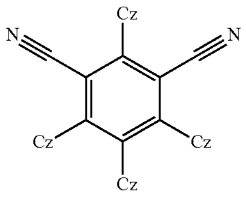 | 0.3802 | 0.04 eV in toluene | 0.25 eV | 1.8E7 | $k_{ISC}$ 7.0E7<br>$k_{RISC}$ 8.8E5 | 1.41E5 | a |
| 5CzBN | 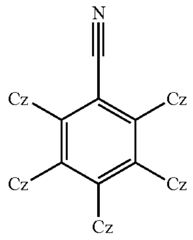 | 0.3336 | 0.17 eV in toluene | 0.17 eV | 1.9E7 | $k_{ISC}$ 25E7<br>$k_{RISC}$ 2.2E5 | 1.45E4 | a |

TABLE 12-continued

Photophysical properties of some reported highly efficient organic TADF molecules

| Acronym | Molecular structure | NTO over-lap | $\Delta E_{ST}$ (Exp.) | $\Delta E_{ST}$ (Cal.) | $k_r$(S1) ($s^{-1}$) | ISC rate ($s^{-1}$) | $k_r$ (TADF) ($s^{-1}$) | Ref. |
|---|---|---|---|---|---|---|---|---|
| 3Cz2DPh CzBN | 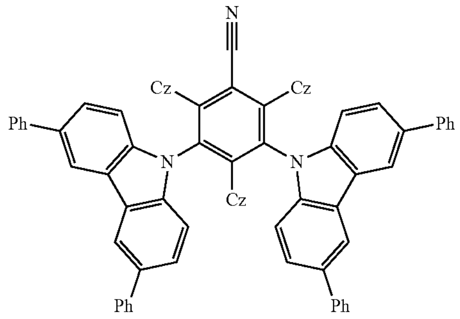 | 0.3900 | 0.15 eV in toluene | 0.37 eV | 1.5E7 | $k_{ISC}$ 15E7 $k_{RISC}$ 7.2E5 | 5.90E4 | b |
| 5Cz-TRZ | 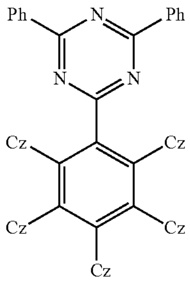 | 0.2956 | 0.06 eV in toluene | 0.31 eV | 0.544E7 | $k_{ISC}$ 17E7 $k_{RISC}$ 1.5E7 | 4.84E5 | c |
| n-DABNA | 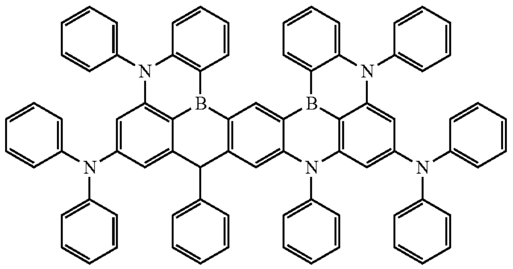 [SMILES: c1ccc(C2c3cc4c(cc3B3c5ccccc5N(c5ccccc5)c5cc(N(c6ccccc6)c6ccccc6)cc2c53)B2c3ccccc3N(c3ccccc3)c3cc(N(c5ccccc5)c5ccccc5)cc(c32)N4c2ccccc2)cc1] | 0.5864 | 0.017 eV in toluene | 0.45 eV | 20E7 | $k_{ISC}$ 2.3E7 $k_{RISC}$ 2.0E5 | 1.95E4 | d |
| TMCz-BO | 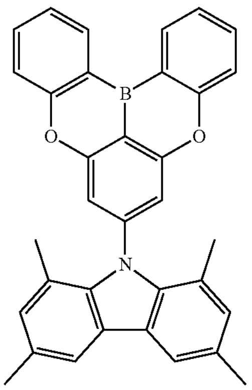 | 0.2236 | 0.020 eV in 30% doped PPF | 0.21 eV | 1.7E7 | $k_{ISC}$ 0.9E7 $k_{RISC}$ 19E5 | 4.27E5 | e |

TABLE 12-continued

Photophysical properties of some reported highly efficient organic TADF molecules

| Acronym | Molecular structure | NTO over-lap | $\Delta E_{ST}$ (Exp.) | $\Delta E_{ST}$ (Cal.) | $k_r$(S1) ($s^{-1}$) | ISC rate ($s^{-1}$) | $k_r$ (TADF) ($s^{-1}$) | Ref. |
| --- | --- | --- | --- | --- | --- | --- | --- | --- |
| Br-3-PXZ-XO | 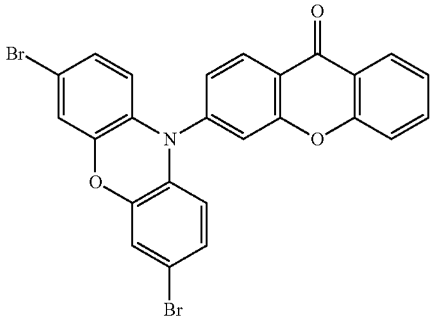 [SMILES: O=c1c2ccccc2oc2cc(N3c4ccc(Br)cc4Oc4cc(Br)ccc43)ccc12] | 0.1836 | N/A | 0.09 eV | 0.68E7 | $k_{ISC}$ 19E7 $k_{RISC}$ 260E5 | 8.57E5 | f |
| DiKTa | 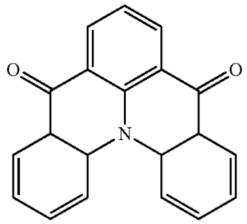 [SMILES: O=C1c2cccc3c2N(C2C=CC=CC12)C1C=CC=CC1C3=O] | 0.5852 | 0.20 eV in 3.5% doped mCP | 0.79 eV | 4.9E7 | $k_{ISC}$ 0.75E7 $k_{RISC}$ 0.46E5 | 1.13E4 | g |
| DMAC-DPS | 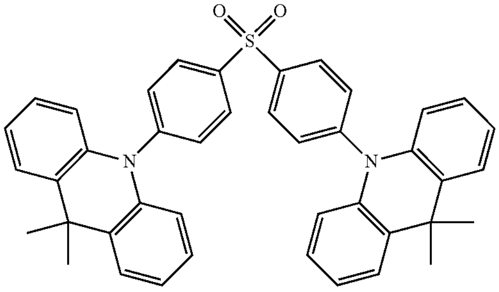 [SMILES: CC1(C)c2ccccc2N(c2ccc(S(=O)(=O)c3ccc(N4c5ccccc5C(C)(C)c5ccccc54)cc3)cc2)c2ccccc21] | 0.2006 | 0.08 eV in toluene | 0.05 eV | On the order of E7 | $k_{ISC}$ 3.7E7 | 9.01E4 | h |
| MXAc-CM | 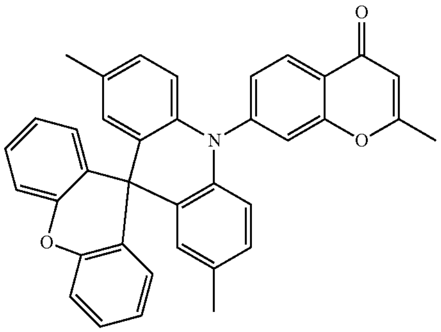 [SMILES: Cc1ccc2c(c1)C1(c3ccccc3Oc3ccccc31)c1cc(C)ccc1N2c1ccc2c(=O)cc(C)oc2c1] | 0.1860 | 0.08 eV in 25% doped PPF film | 0.06 eV | 1.1E7 | $k_{ISC}$ 2.0E7 $k_{RISC}$ 6.7E5 | 1.52E5 | i |

TABLE 12-continued

Photophysical properties of some reported highly efficient organic TADF molecules

| Acronym | Molecular structure | NTO over-lap | $\Delta E_{ST}$ (Exp.) | $\Delta E_{ST}$ (Cal.) | $k_r$(S1) ($s^{-1}$) | ISC rate ($s^{-1}$) | $k_r$ (TADF) ($s^{-1}$) | Ref. |
|---|---|---|---|---|---|---|---|---|
| AmT | 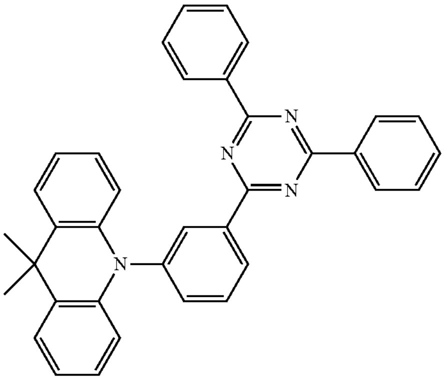 [SMILES: CC1(C)c2ccccc2N(c2cccc(-c3nc(-c4ccccc4)nc(-c4ccccc4)n3)c2)c2ccccc21] | 0.1704 | 0.034 eV In neat film | 0.03 eV | 1.7E6 | $k_{ISC}$ 3.3E6 $k_{RISC}$ 1.3E6 | 8.33E4 | j |
| MPAc-BS | 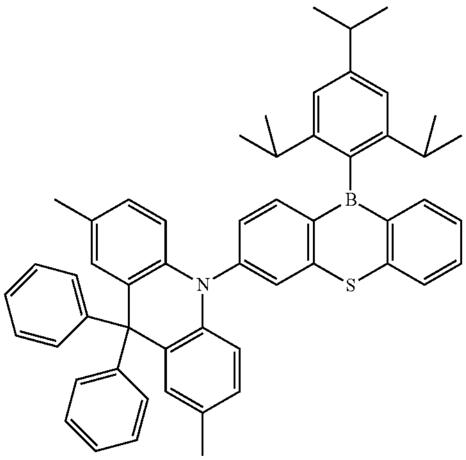 [SMILES: Cc1ccc2c(c1)C(c1ccccc1)(c1ccccc1)c1cc(C)ccc1N2c1ccc2c(c1)Sc1ccccc1B2c1c(C(C)C)cc(C(C)C)cc1C(C)C] | 0.2355 | 0.023 eV 50% doped PPF host matrix | 0.54 eV | 2.8E7 | $k_{ISC}$ 9.9E7 $k_{RISC}$ 3.5E6 | 6E5 | k |
| MPAc-BO | 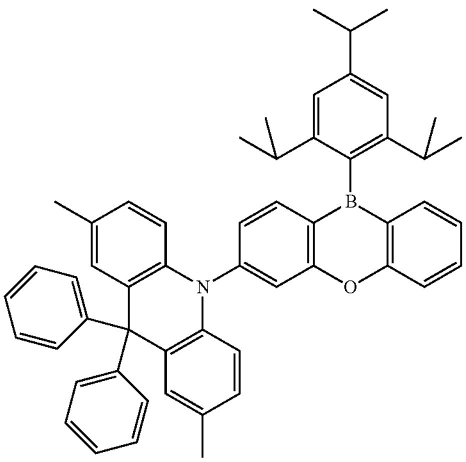 [SMILES: Cc1ccc2c(c1)C(c1ccccc1)(c1ccccc1)c1cc(C)ccc1N2c1ccc2c(c1)Oc1ccccc1B2c1c(C(C)C)cc(C(C)C)cc1C(C)C] | 0.2633 | 0.024 eV 50% doped PPF host matrix | 0.68 eV | 1.9E7 | $k_{ISC}$ 1.7E7 $k_{RISC}$ 1.0E6 | 2.61E5 | k |

TABLE 12-continued

| Photophysical properties of some reported highly efficient organic TADF molecules | | | | | | | | |
|---|---|---|---|---|---|---|---|---|
| Acronym | Molecular structure | NTO over-lap | $\Delta E_{ST}$ (Exp.) | $\Delta E_{ST}$ (Cal.) | $k_r(S1)$ ($s^{-1}$) | ISC rate ($s^{-1}$) | $k_r$ (TADF) ($s^{-1}$) | Ref. |
| TPA-DCPP | 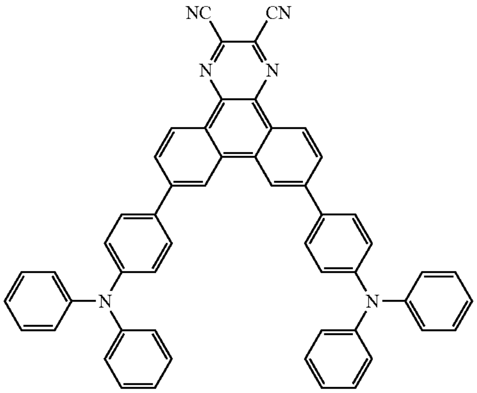 [SMILES: N#Cc1nc2c3ccc(-c4ccc(N(c5ccccc5)c5ccccc5)cc4)cc3c3cc(-c4ccc(N(c5ccccc5)c5ccccc5)cc4)ccc3c2nc1C#N] | 0.5281 | 0.13 eV In toluene By emission onset differ-ences | 0.64 eV | 10.7E7 | N/A | N/A | m |
| BCzT | 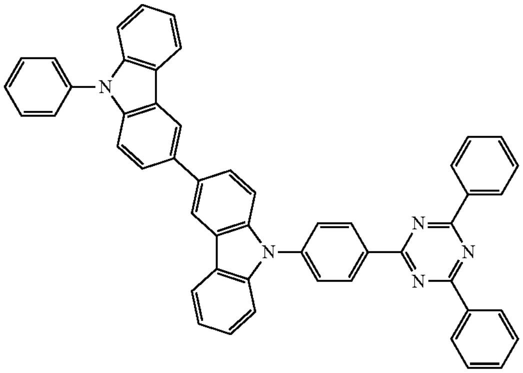 [SMILES: c1ccc(-c2nc(-c3ccccc3)nc(-c3ccc(-n4c5ccccc5c5cc(-c6ccc7c(c6)c6ccccc6n7-c6ccccc6)ccc54)cc3)n2)cc1] | 0.5034 | 0.31 eV In doped DPEPO film By emission onset differ-ences | 0.60 eV | 18.2E7 | $k_{ISC}$ = 2.7E7 $k_{RISC}$ = 4.0E3 | 4.27E3 | n |
| Ph3Cz-TRZ | 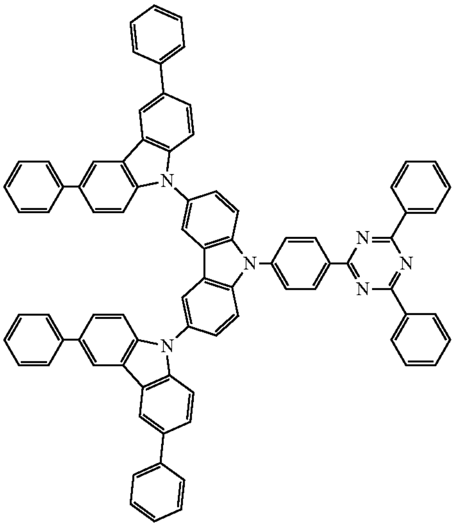 [SMILES: c1ccc(-c2ccc3c(c2)c2cc(-c4ccccc4)ccc2n3-c2ccc3c(c2)c2cc(-n4c5ccc(-c6ccccc6)cc5c5cc(-c6ccccc6)ccc54)ccc2n3-c2ccc(-c3nc(-c4ccccc4)nc(-c4ccccc4)n3)cc2)cc1] | 0.4205 | 0.11 eV In 6 wt % doped DPEPO film | 0.61 eV | 1.6E7 | $k_{ISC}$ = 2.9E7 | N/A | o |
| DABNA-1 | 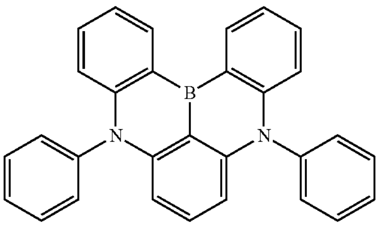 [SMILES: c1ccc(N2c3ccccc3B3c4ccccc4N(c4ccccc4)c4cccc2c43)cc1] | 0.5970 | 0.20 eV In 1% doped mCBP film | 0.57 eV | 11.4E7 | $k_{ISC}$ = 4.5E6 $k_{RISC}$ = 9.9E3 | 3.74E2 | p |

TABLE 12-continued

| Photophysical properties of some reported highly efficient organic TADF molecules | | | | | | | | |
|---|---|---|---|---|---|---|---|---|
| Acronym | Molecular structure | NTO over-lap | $\Delta E_{ST}$ (Exp.) | $\Delta E_{ST}$ (Cal.) | $k_r$(S1) ($s^{-1}$) | ISC rate ($s^{-1}$) | $k_r$ (TADF) ($s^{-1}$) | Ref. |
| SpiroAc-TRZ | 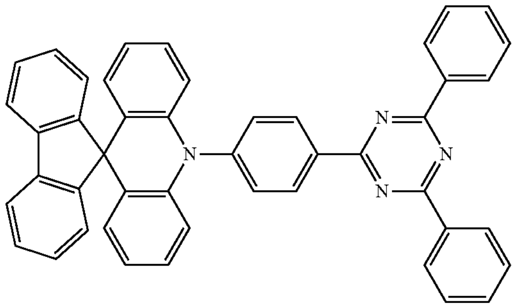 [SMILES: c1ccc(-c2nc(-c3ccccc3)nc(-c3ccc(N4c5ccccc5C5(c6ccccc6-c6ccccc65)c5ccccc54)cc3)n2)cc1] | 0.1594 | 0.072 12% doped mCPCN film | 0.04 eV | 5.9E7 | $k_{ISC}$ = 9.8E6 $k_{RISC}$ = 1.26E5 | 1.00E5 | q |
| DMAC-BP | 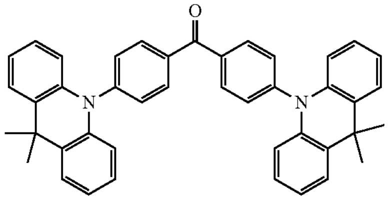 | 0.2065 | 0.07 In 10% doped mCP film | 0.20 eV | N/A | N/A | N/A | r |
| DBT-BZ-DMAC | 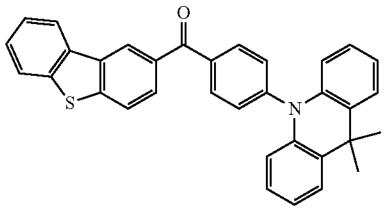 [SMILES: CC1(C)c2ccccc2N(c2ccc(C(=O)c3ccc4sc5ccccc5c4c3)cc2)c2ccccc21] | 0.1807 | 0.08 eV in neat film | 0.24 eV | 2.5E7 | $k_{ISC}$ = 1.6E7 $k_{RISC}$ = 4.6E5 | 2.75E5 | s |
| ACRDSO2 | 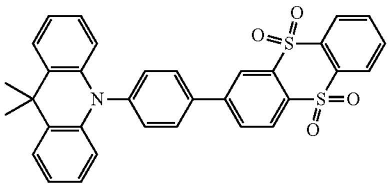 [SMILES: CC1(C)c2ccccc2N(c2ccc(-c3ccc4c(c3)S(=O)(=O)c3ccccc3S4(=O)=O)cc2)c2ccccc21] | 0.1353 | 0.058 eV In 6% doped CBP | 0.008 eV | 2.4E7 | $k_{ISC}$ = 5.11E6 $k_{RISC}$ = 9.6E4 | 4.94E4 | t |
| PXZDSO2 | 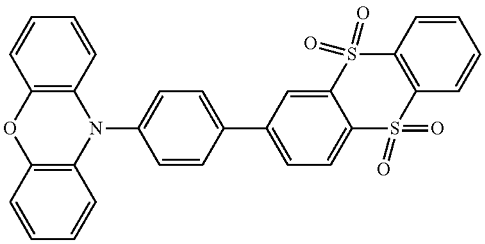 [SMILES: O=S1(=O)c2ccccc2S(=O)(=O)c2cc(-c3ccc(N4c5ccccc5Oc5ccccc54)cc3)ccc21] | 0.1599 | 0.048 eV In 6% doped CBP | 0.018 eV | 2.8E7 | $k_{ISC}$ = 6.2E6 $k_{RISC}$ = 4.6E4 | 5.80E4 | t |

TABLE 12-continued

| Photophysical properties of some reported highly efficient organic TADF molecules | | | | | | | | |
|---|---|---|---|---|---|---|---|---|
| Acronym | Molecular structure | NTO over-lap | $\Delta E_{ST}$ (Exp.) | $\Delta E_{ST}$ (Cal.) | $k_r$(S1) ($s^{-1}$) | ISC rate ($s^{-1}$) | $k_r$ (TADF) ($s^{-1}$) | Ref. |
| PXZ-TRZ | 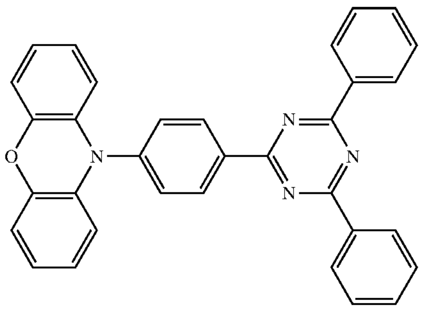 [SMILES: c1ccc(-c2nc(-c3ccccc3)nc(-c3ccc(N4c5ccccc5Oc5ccccc54)cc3)n2)cc1] | 0.1608 | 0.08 eV In 6% doped CBP film | 0.012 eV | 5E7 | N/A | N/A | u |

References: a) H. Noda, et al., Nature Materials, 2019, 18, 1084-1090; b) H. Noda, et al., Science Advances, 2018, 4, 6910; c) L.-S. Cui, et al., Nature Photonics, 2020, 14, 636-642; d) Y. Kondo, et al., Nature Photonics, 2019, 13, 678-682; e) J. U. Kim, et al., Nature Communications, 2020, 11, 1765; f) N. Aizawa, et al., Advanced Optical Materials, 2020, 8, 19-01627; g) D. Hall, et al., Adv. Opt. Mater., 2020, 8, 1901627; h) Q. Zhang, et al., Nature Photonics, 2014, 8, 326-332; i) J. Lee, et al., Chem. Mater., 2017, 29, 8012-8020; j) S. Jeong, et al., Journal of Materials Chemistry C, 2018, 6, 9049-9054; k) I. S. Park, et al., Adv. Funct. Mater., 2018, 28, 1802031; m) S. Wang, et al., Angew. Chem. Int. Ed., 2015, 54, 13068-13072; n) K. Shizu, et al., The Journal of Physical Chemistry C, 2015, 119, 26283-26289; o) S. Hirata, et al., Nature Materials, 2015, 14, 330-336; p) T. Hatakeyama, et al., Adv. Mater., 2016, 28, 2777-2781; q) T.-A. Lin, et al., Adv. Mater., 2016, 28, 6976-6983; r) Q. Zhang, et al., Adv. Mater., 2015, 27, 2096-2100; s) J. Guo, et al., Adv. Funct. Mater., 2017, 27, 1606458; t) G. Xie, et al., Adv. Mater., 2016, 28, 181-187; u) H. Tanaka, et al., Chem. Commun., 2012, 48, 11392-11394.

Example 2: Two-Coordinate Complexes Having Carbene Ligands Appended with Electron Acceptors This invention describes luminescent two-coordinate carbene-metal-amide/aryl (cMa) complexes where the carbene ligands are appended with electron acceptor groups. The donor can be either an amide or aryl ligand. The pi-appended carbene ligands are used to increase the radiative rate for luminescence. The cMa complexes can display highly efficient photoluminescence quantum yields from intramolecular charge transfer (ICT) states between the electron donor amide/aryl ligands and acceptor carbene ligands. Luminescence from the ICT state is characterized as thermally activated delayed fluorescence (TADF) since emission occurs from an ICT singlet state thermally populated from an energetically lower lying triplet state. The energy separation between single and triplet states ($\Delta E_{ST}$) is an important parameter that controls the radiative rate for luminescence. The electronic interaction between single and triplet states is further enhanced by spin-orbit coupling (SOC) induced by bridging metal atom. The combined effects of a small $\Delta E_{ST}$ and SOC from the metal cause rapid intersystem crossing between the ICT singlet and triplet states that promotes fast radiative rates for emission ($k\tau > 5\times10^5\ s^{-1}$). Fast radiative rates favor high photoluminescence efficiencies in TADF compounds. The current invention describes carbene ligands used in cMa complexes that minimize the energy separation between single and triplet states ($\Delta E_{ST}$) while also maintaining a strong oscillator strength for singlet absorptivity. The most favorable situation occurs when the electron affinity of the appended electron acceptor group is greater than that of the parent unsubstituted carbene ligand.

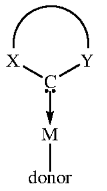

cMa complex

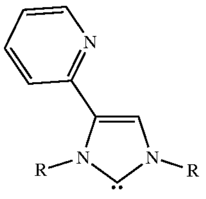

aryl-substituted carbene

The radiative rate for TADF is given by the following equation:

$$k(TADF) \propto \sum_n \frac{\langle T_n|H_{soc}|S_1\rangle}{\Delta E_{ST}} \cdot \langle S_0|\mu|S_1\rangle$$

where $H_{SOC}$ is the SOC operator and μ is the dipole operator. A high oscillator strength for the $S_1 \rightarrow S_0$ transition ($\langle S_0|\mu|S_1\rangle$) and efficiency intersystem crossing ($\langle T_n|H_{SOC}|S_1\rangle$) and a low $\Delta E_{ST}$ are important to achieve a high TADF rate. The metal center ensures that the intersystem crossing rate will be fast. Thus, the TADF rate is largely governed by the oscillator strength and $\Delta E_{ST}$, which need to be large and small, respectively, if a high TADF rate is to be achieved.

Figure 53:
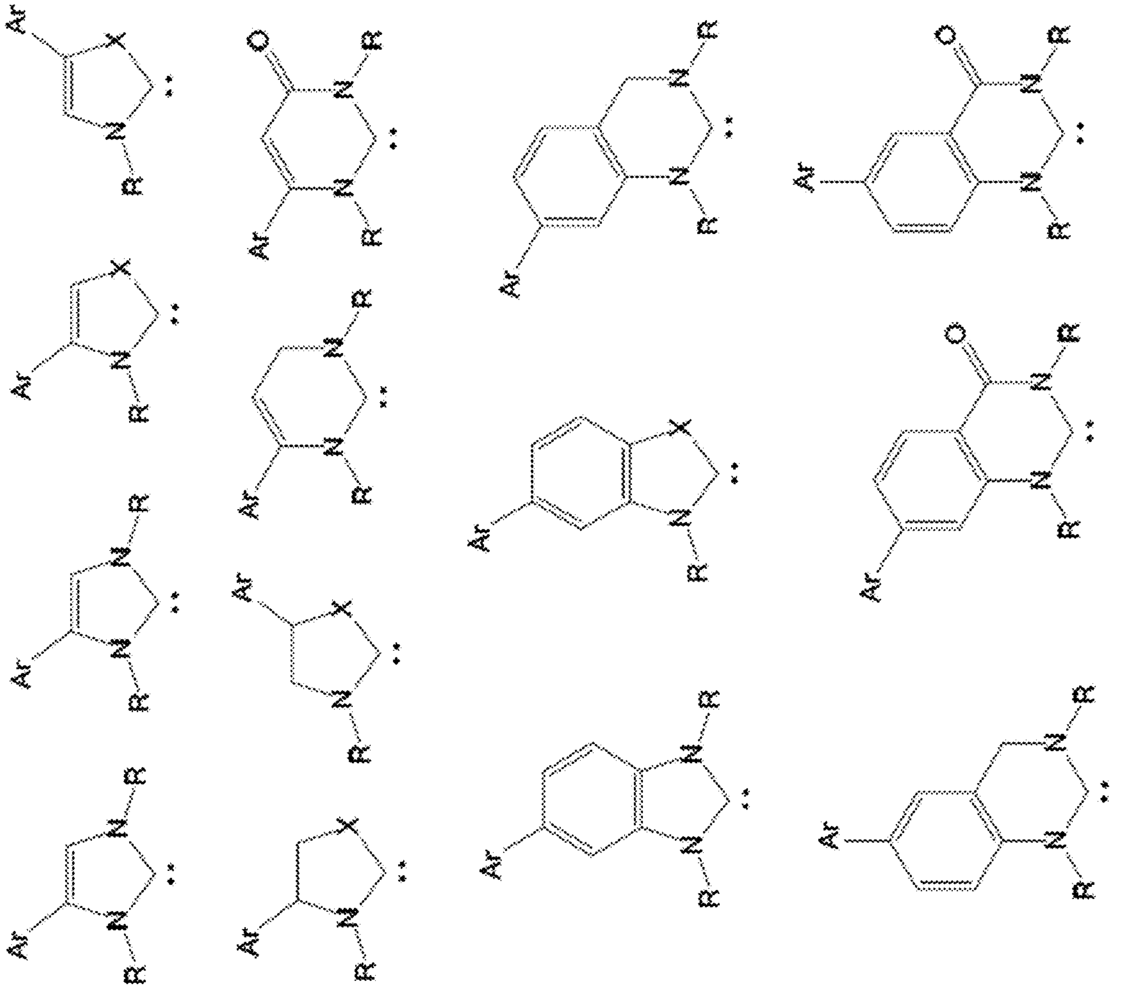
FIG. 53 depicts exemplary carbene ligands with appended aryl groups. R=alkyl, aryl; X═S, O, $CR_2$, NR, PR.
Figure 54:
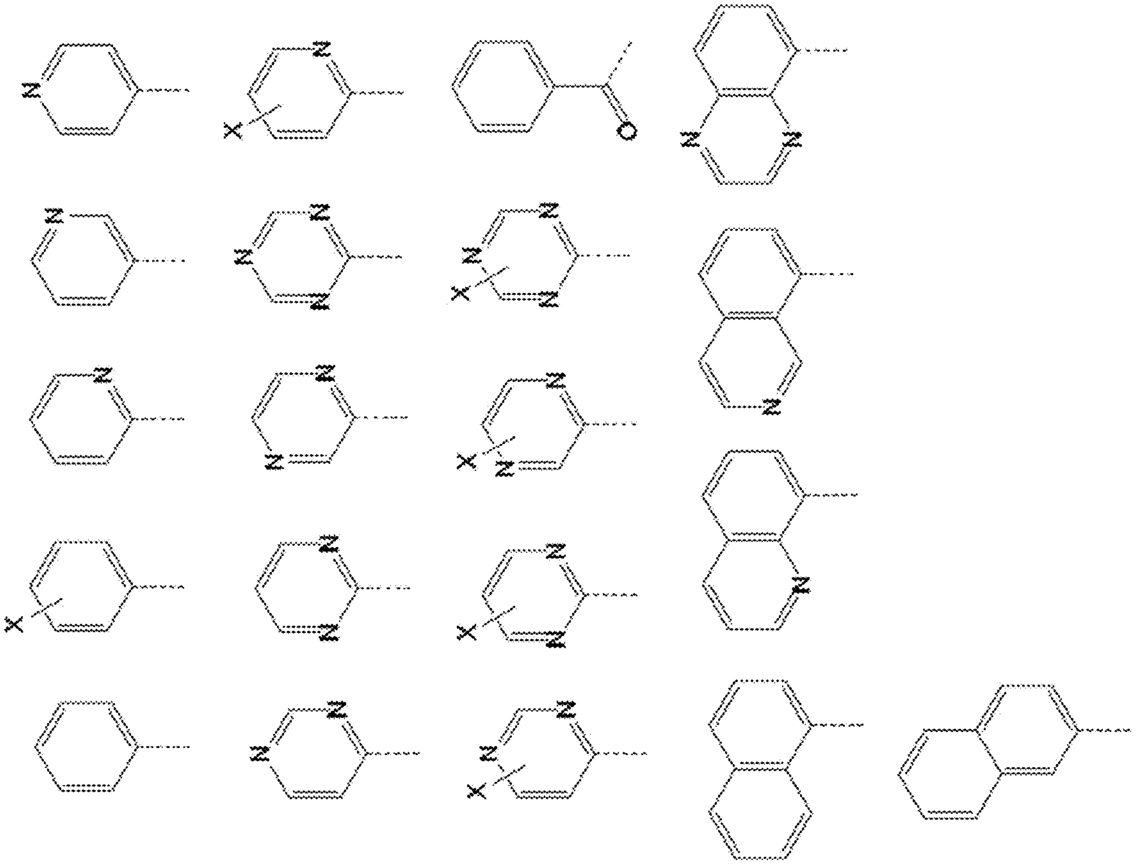
FIG. 54 depicts exemplary acceptor groups.

Examples of carbene ligands useful for making cMa complexes with pi-appended groups are shown in FIG. 53 using the appended electron acceptor groups shown in FIG. 54.

Figure 55:
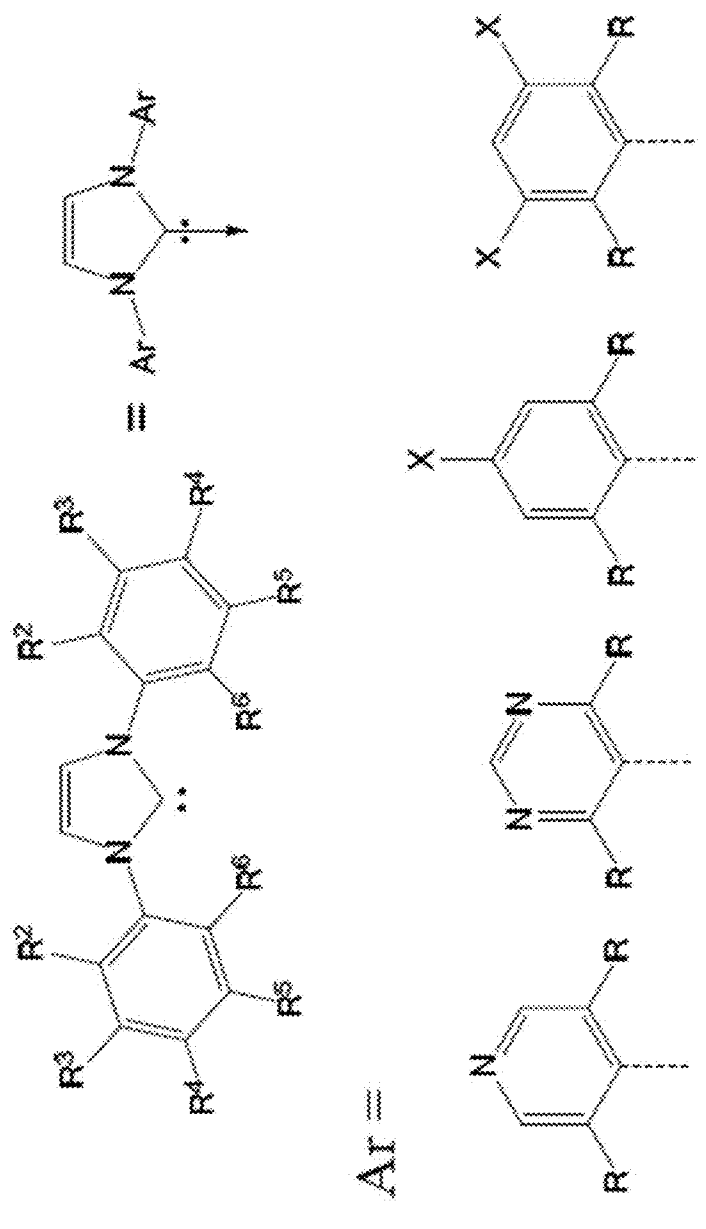
FIG. 55 depicts exemplary imidazolyl carbene ligands with aryl groups appended to N. R=alkyl, aryl; X=halogen, $CF_3$, CN, C(O)R, $CO_2R$, $SO_2R$.

In another embodiment (FIG. 55), phenyl groups bound to nitrogen in N-heterocyclic carbenes (NHC) are modified to increase their electron affinity by either employing aza-substitution of CH moieties in the ring or appending electron withdrawing groups to aromatic ring. In particular, substitution at the 3,5-positions of the phenyl ring are preferred as substitution at these sites leads to enhanced oscillator strength for the lowest singlet state in the complex.

Figure 56:
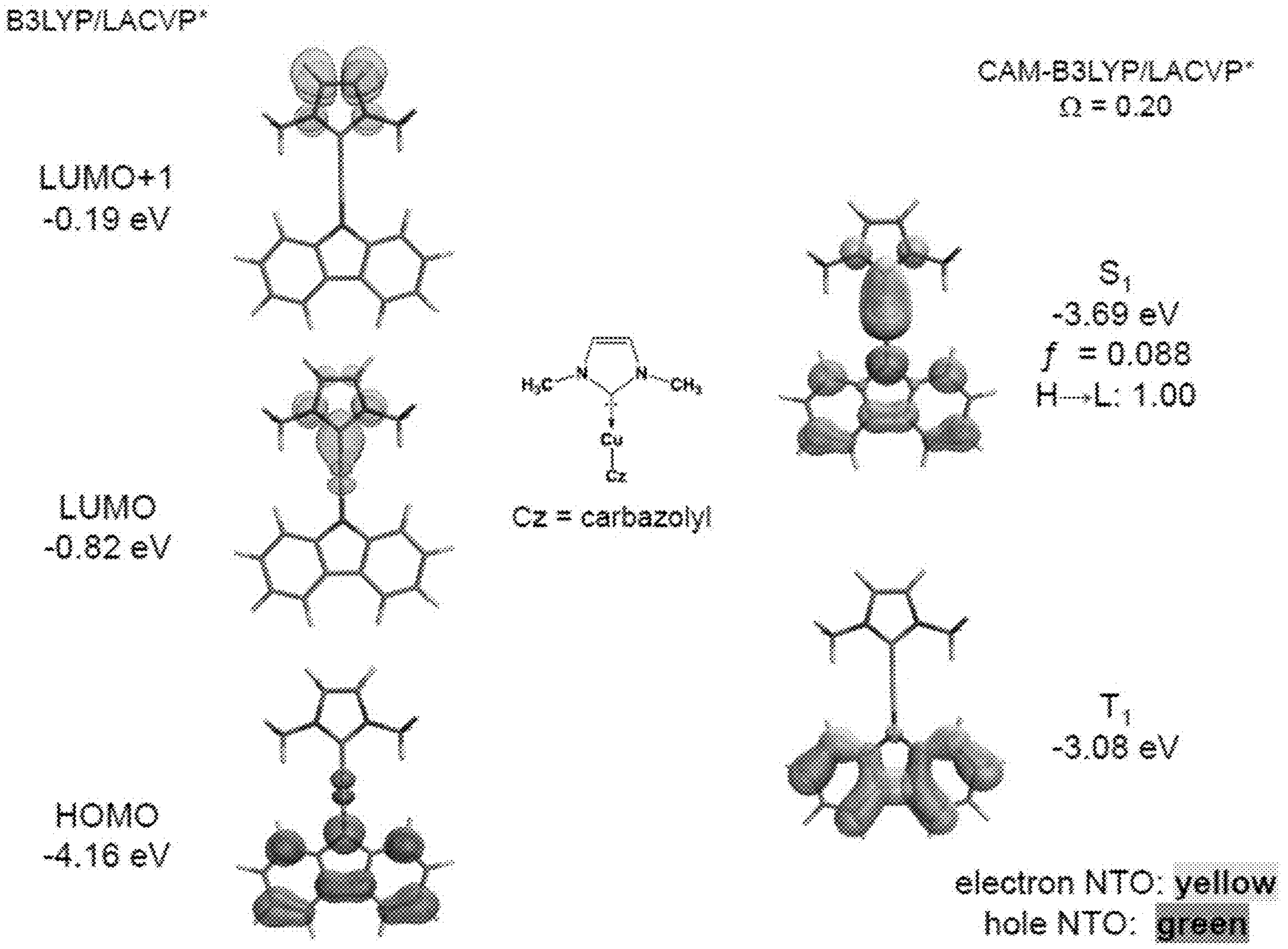
FIG. 56 shows calculated frontier MOs and NTOs for ($Me_2$imid)Cu(Cz).

The concepts behind the invention are illustrated in the figures at the end of this document that show the results of density functional theory (DFT) and time-dependent (TD) DFT calculations. The methods used are B3LYP/LACVP* for DFT and CAM-B3LYP/LACVP* for TDDFT calculations. The attenuation factor (Q) in the latter calculation was set to 0.20. These methods have been shown to accurately correlate with experimental values and trends in the opto-electronic properties of known derivatives (Shi, S., et al. J. Am. Chem. Soc. 2019, 141 (8), 3576-3588; Hamze, R., et al., Science 2019, 363 (6427), 601). In FIG. 56 the valence molecular orbitals (MOs) principally responsible for the luminescent properties are shown for a two-coordinate copper(I) complex [($Me_2$imid)Cu(Cz)] with carbazolyl (electron donor) and imidazolyl carbene (electron acceptor) ligands. The highest occupied molecular orbital (HOMO) is localized on the carbazolyl ligand whereas the lowest unoccupied molecular orbital (LUMO) and LUMO+1 are localized on the imidazolyl ligand. Lesser portions of the HOMO and LUMO density are shared by the metal atom. The distribution of the valence electrons in the excited state can visualized using natural transition orbitals (NTOs) from TDDFT calculations. The NTOs for the compound depict a lowest singlet state ($S_1$) that is an intramolecular charge transfer ($^1$ICT) transition between the HOMO (hole NTO) to a lowest occupied molecular orbital LUMO (electron NTO). It is important to note that orbital overlap on the metal center has been shown to correlate with the oscillator strength (f) for the $S_1$ transition (Hamze, R., et al., J. Am. Chem. Soc. 2019, 141(21), 8616-8626). In contrast, the lowest triplet state ($T_1$) is locally excited ($^3$LE) on orbitals of the carbazolyl ligand. The difference in electronic configuration between the two excited states leads to a large energy separation ($\Delta E_{ST}$=0.61 eV). Such a large energy gap is detrimental to thermal population of $S_1$ state needed for effective TADF emission.

Figure 57:
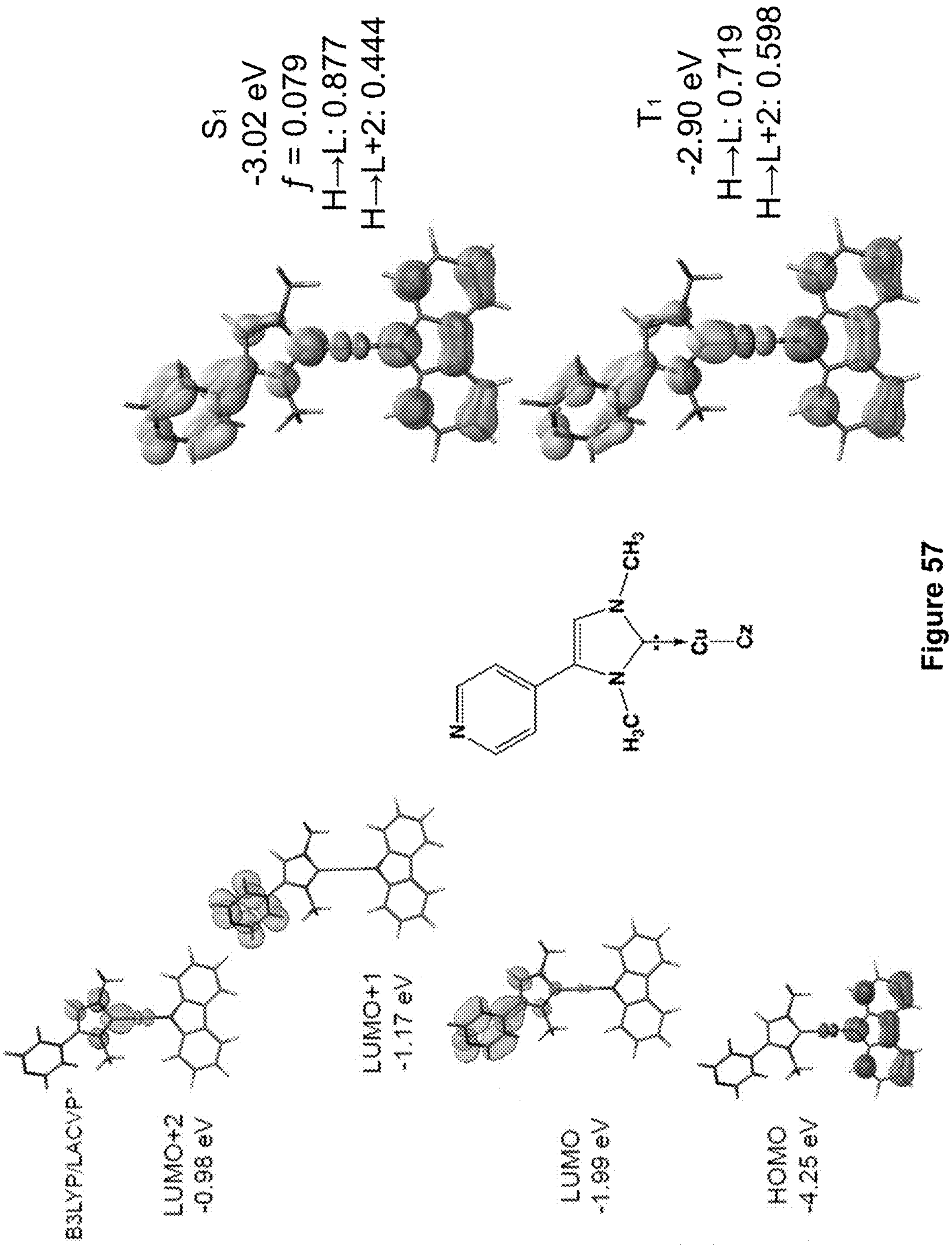
FIG. 57 shows calculated frontier MOs and NTOs for (4-pyr-$Me_2$imid)Cu(Cz).
Figure 58:
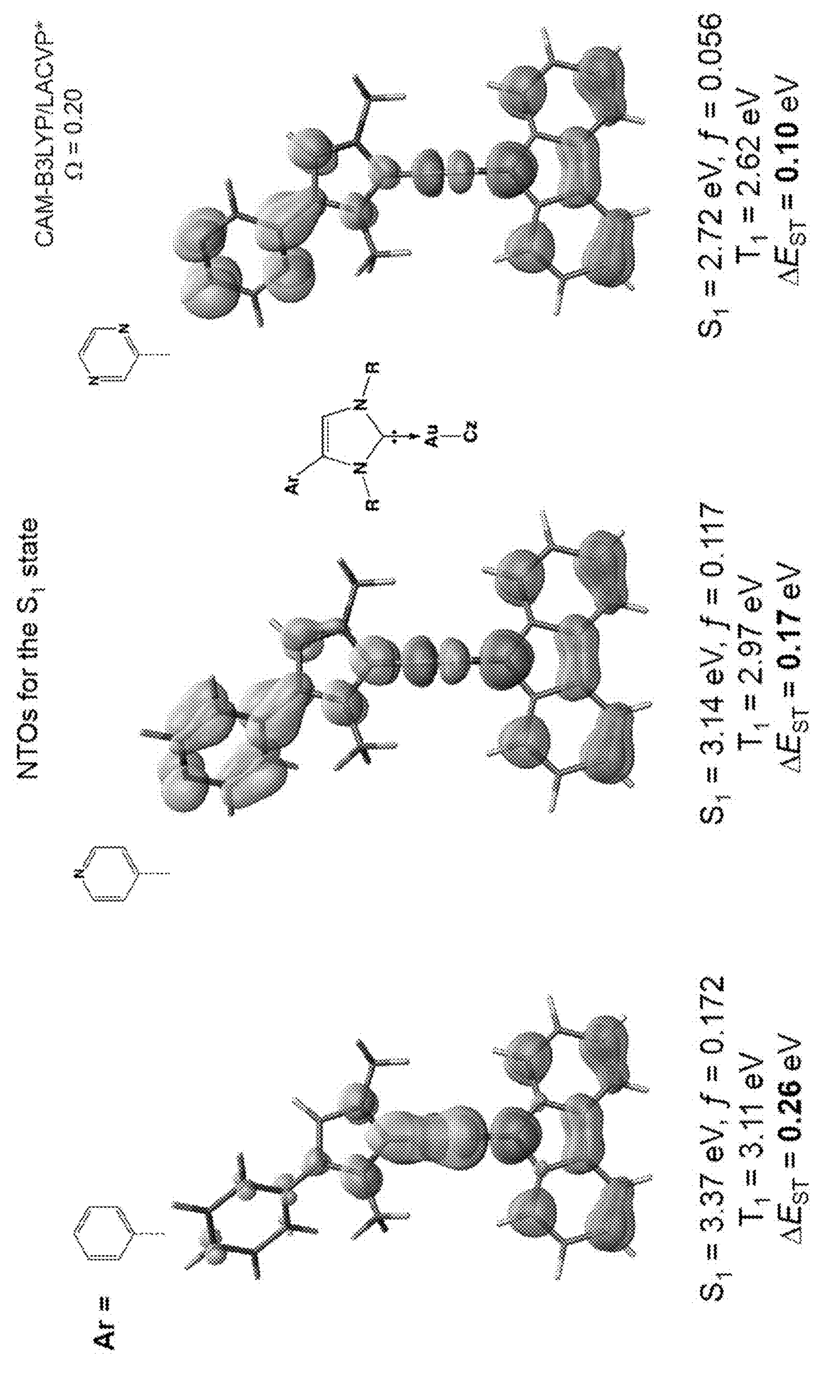
FIG. 58 shows the effect of aryl substitution on the calculated photophysical properties of ($Me_2$imid)Au(Cz) complexes.

Adding electron accepting groups to the periphery of the carbene ligand of a cMa complex can markedly alter the electronic structure of the complex. Appending a 4-pyridyl group to the imidazolyl ligand [(4-pyr-$Me_2$imid)Cu(Cz)] alters the valence MOs as shown in FIG. 57. The orbital character of the HOMO is unchanged by the substituent whereas the unoccupied orbitals are strongly perturbed. The LUMO and LUMO+1 become principally localized on the pyridyl moiety whereas the LUMO+2 is primarily on the imidazolyl portion of the ligand. The shift in the LUMO to the pyridyl group decreases the amount of orbital density distributed onto the metal atom. Likewise, the NTOs for the $S_1$ and $T_1$ states differ from those seen in ($Me_2$imid)Cu(Cz). Both lowest excited states in (4-pyr-$Me_2$imid)Cu(Cz) are ICT in character. Moreover, the transitions in both states are mixed configurations (HOMO→LUMO and HOMO→LUMO+2) where the electron NTO shows a distinct contribution from the appended pyridyl group. The difference in energy between the $^1$ICT and $^3$ICT states in (4-pyr$Me_2$imid)Cu(Cz) is much smaller ($\Delta E_{ST}$=0.12 eV) than that in ($Me_2$imid)Cu(Cz) and consequently TADF is favored in the former compound. Just as important, the oscillator strength in (4-pyr-$Me_2$imid)Cu(Cz) is still strong (f=0.079) despite the small value for $\Delta E_{ST}$. Mixing of LUMO+2 with the LUMO is presumed to be responsible for the relatively high oscillator strength of the $S_1$ state. FIG. 58 shows NTOs calculated for the $S_1$ state in three analogous Au(I) derivatives appended with respective Ph, 4-pyridyl and pyrazolyl groups. All three compounds significant contributions from the pendant groups to the electron NTOs. The expansion of electron density in the electron NTOs to the appended groups leads to small values for $\Delta E_{ST}$, yet oscillator strengths for the compounds remain relatively high.

Figure 59:
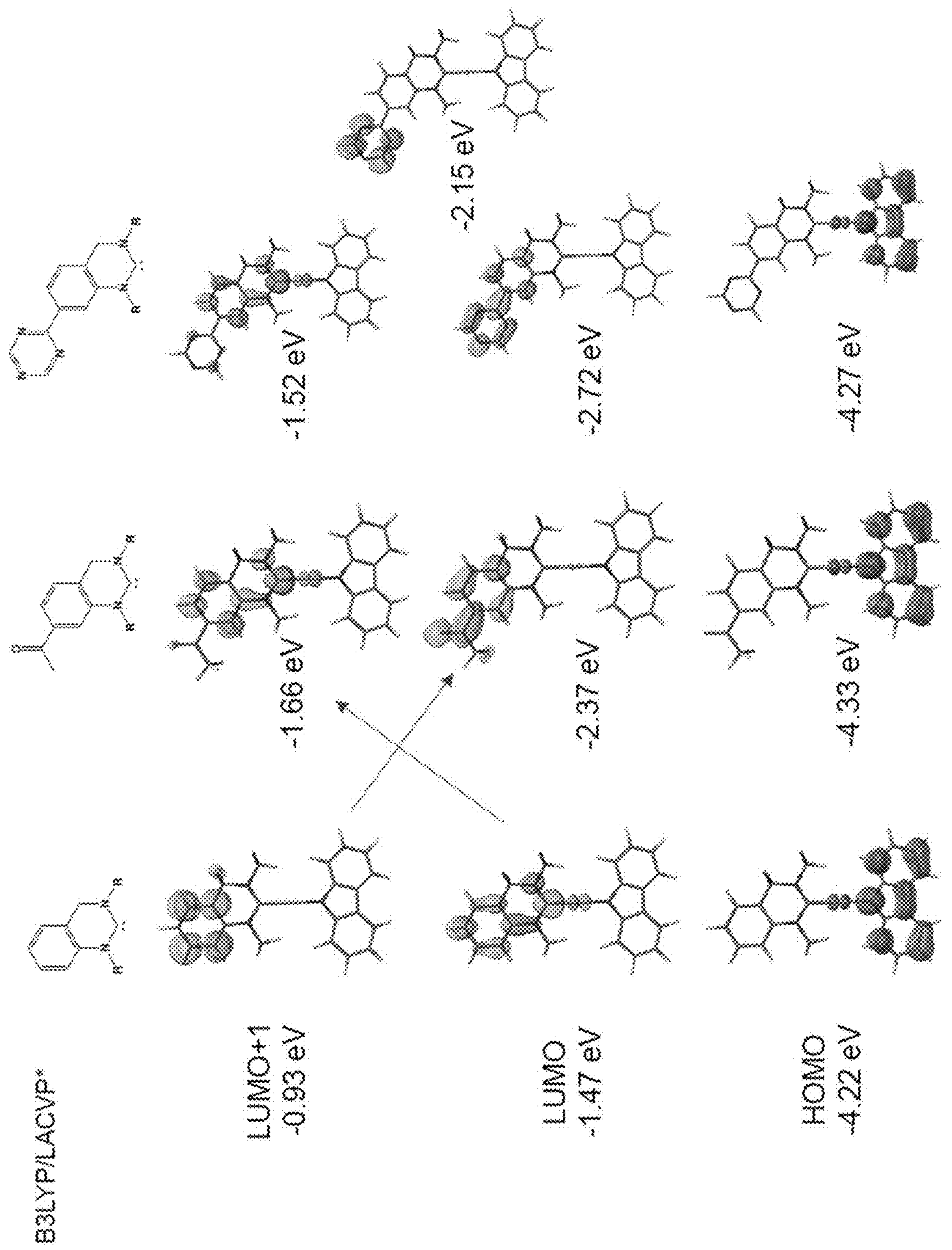
FIG. 59 shows calculated frontier MOs for (Bzac)Cu(Cz) derivatives.
Figure 60:
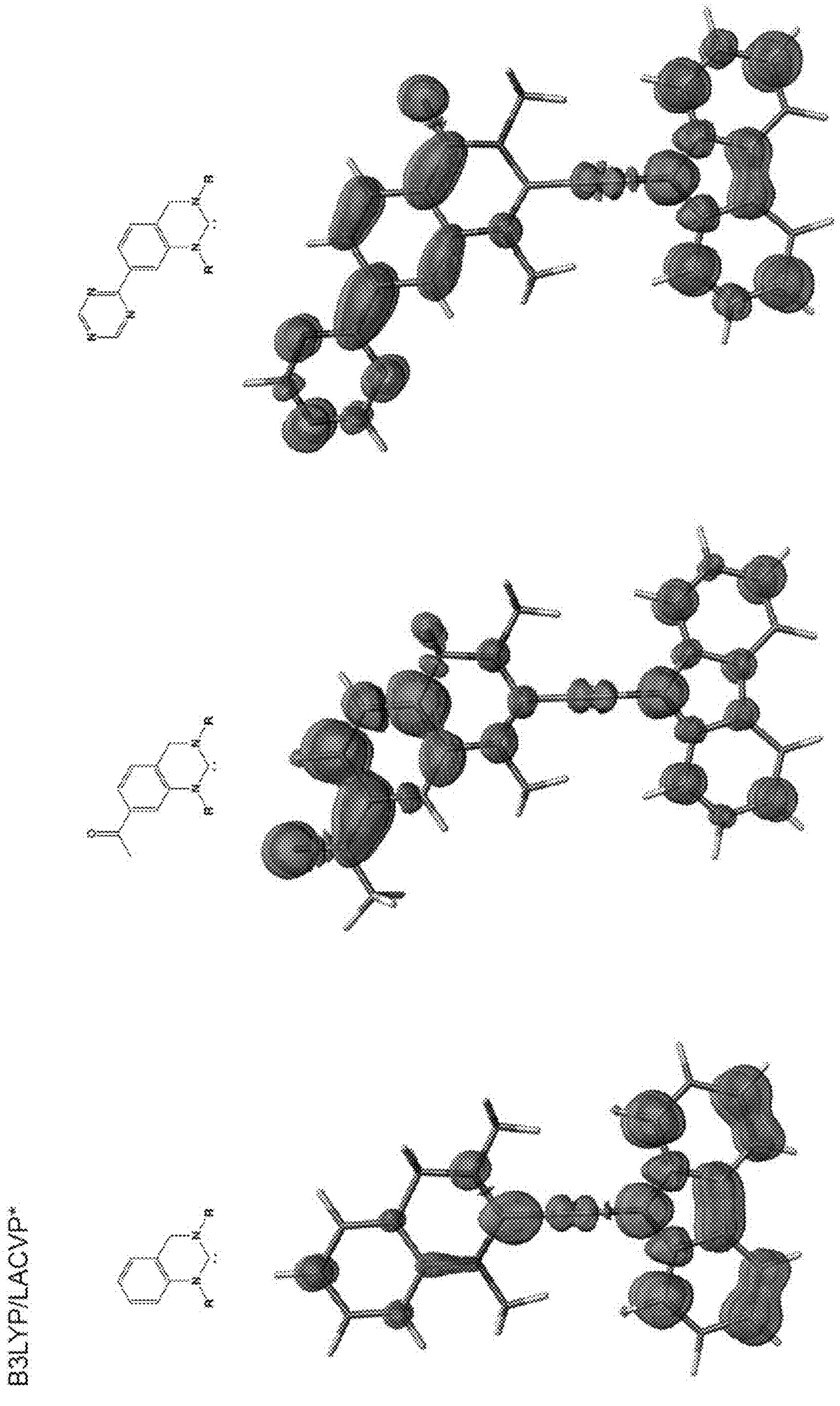
FIG. 60 shows calculated spin density for the $T_1$ state in (X-Bzac)Cu(Cz).

FIG. 59 shows the frontier MOs for two-coordinate Cu(I) complexes with a carbazolyl ligand and a fused benzylamino-carbene (Bzac) ligand. Addition of electron withdrawing substituents (acetyl and triazene) onto the aryl ring of Bzac strongly stabilizes the LUMO+1 to the point where it becomes the LUMO. In contrast, the LUMO on Bzac is only weakly stabilized and becomes LUMO+1 and LUMO+2 in the respective acetyl and triazene derivatives. The change in orbital character shifts the contours of the LUMO away from the metal center and onto the aryl ring of the carbene. FIG. 60 shows the spin density calculated for the T, state of these Bzac derivatives. The $T_1$ state in the compounds all have ICT character with the amount of spin density on the Bzac ligand increasing with increasing strength of the electron withdrawing ligand.

Figure 62:
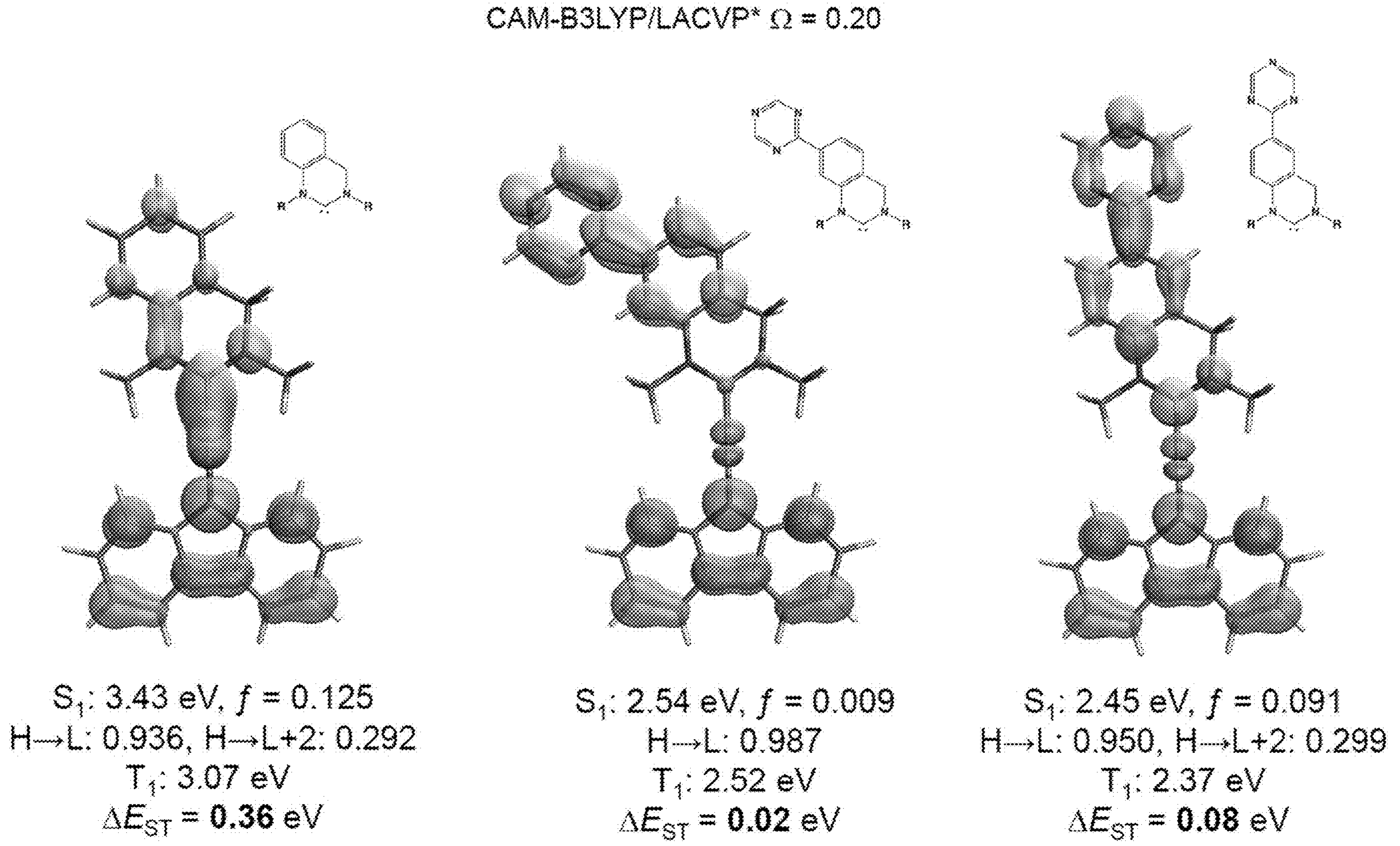
FIG. 62 shows calculated NTOs for the $S_1$ state in (triazine-Bzac)Cu(Cz) isomers.
Figure 63:
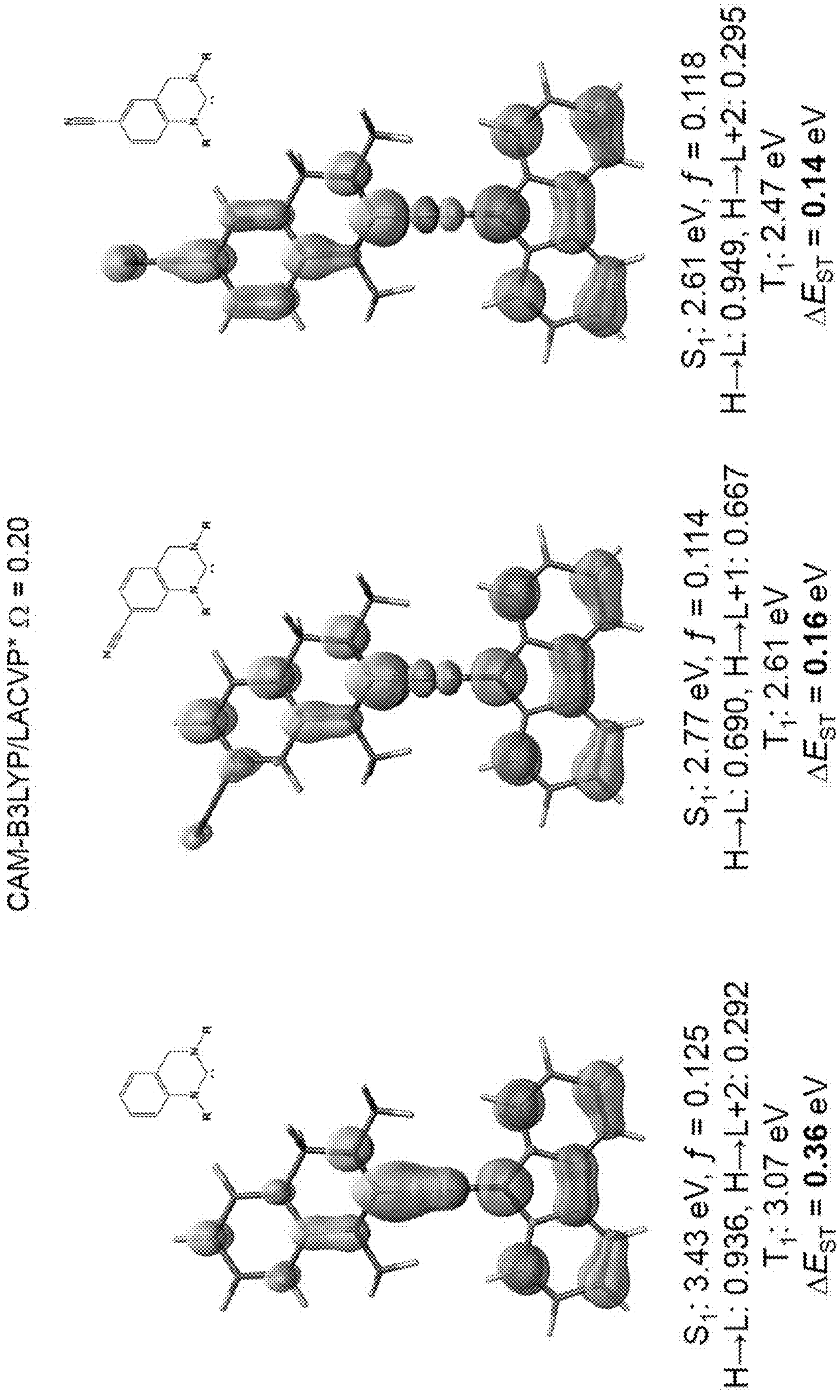
FIG. 63 shows calculated NTOs for the $S_1$ state in (CN-Bzac)Cu(Cz) isomers.
Figure 64:
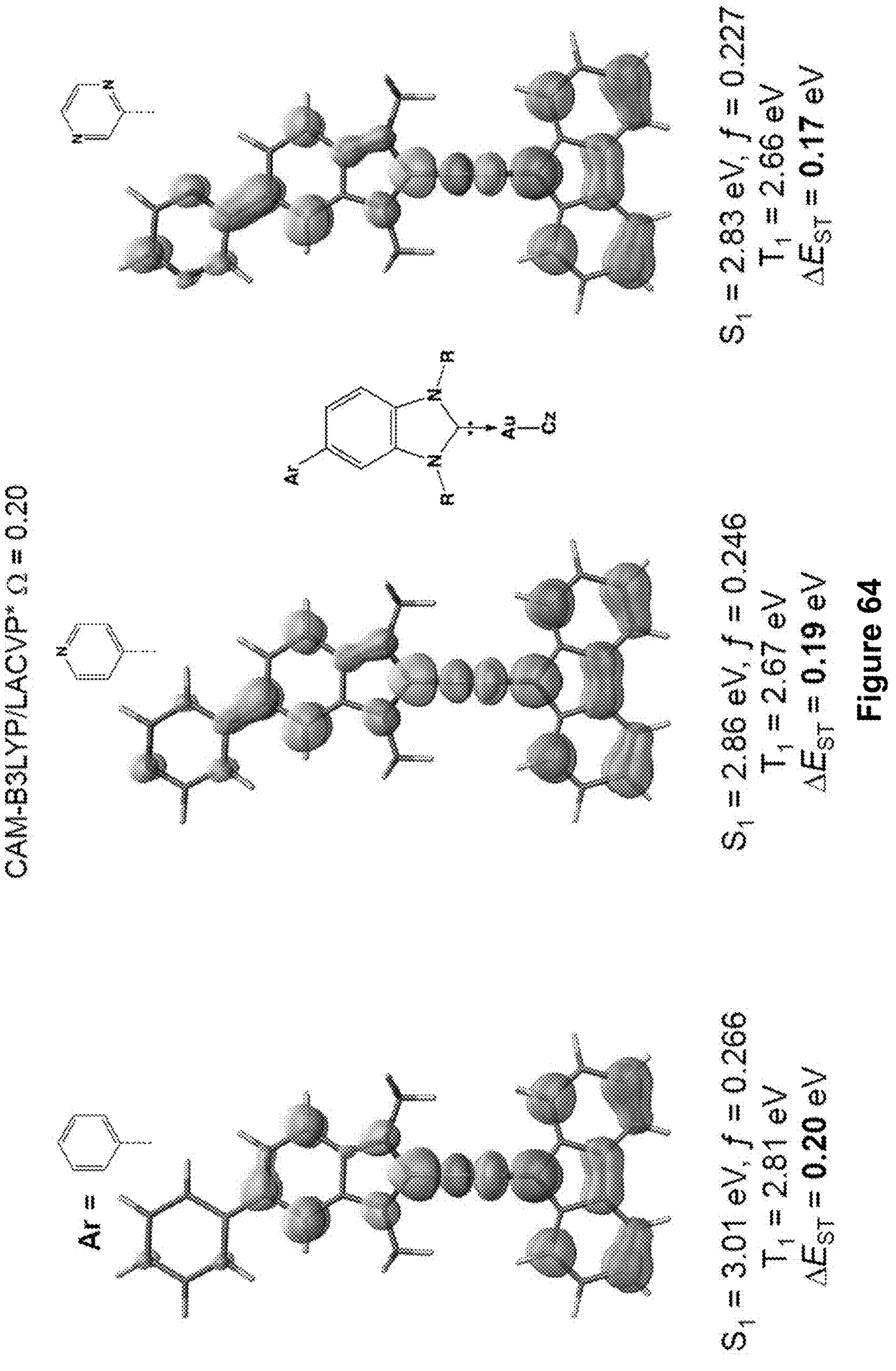
FIG. 64 shows the effect of aryl substitution on calculated NTOs for the $S_1$ state in (Bzi)Au(Cz) isomers.

FIGS. 61-63 show the NTOs for the $S_1$ state of the parent Bzac complex along with those for two isomers substituted with either acetyl (FIG. 61), triazine (FIG. 62) or cyano (FIG. 63) groups. The $S_1$ state in all the compounds is a mixed electronic configuration. Note that the LUMO, which is the principal component of the configuration, differs in character in the substituted derivatives (see FIG. 64). The substituents shift the electron density in the electron NTO of the $S_1$ state onto the aryl ring. There is subsequently a significant decrease in $\Delta E_{ST}$ relative to the parent complex yet the oscillator strength for the $S_1$ state remains high. The decrease in $\Delta E_{ST}$ is most pronounced when triazene is the substituent Similar, albeit smaller, decreases in $\Delta E_{ST}$ are found in Au(I) complexes with substituted benzimidazolyl carbenes (FIG. 64).

Figure 66:
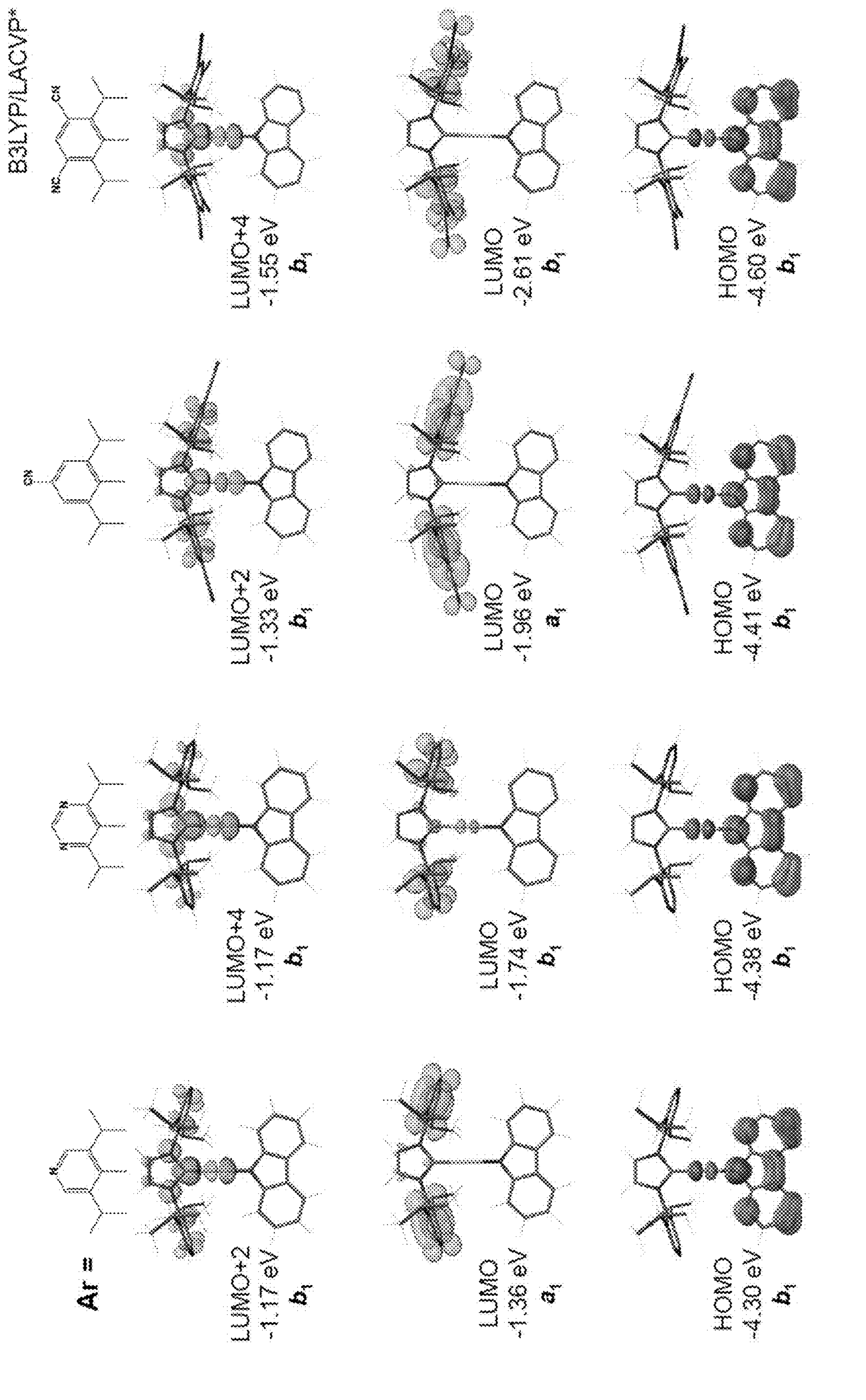
FIG. 66 shows calculated frontier MOs for ($Ar_2$imid)Au (Cz).

FIG. 65 shows the frontier MOs for a two-coordinate Au(I) complex with a carbazolyl donor ligand and bis(N,N-2,6-di-isopropylphenyl)imidazolyl (IPr) carbene ligand. The LUMO for the complex is localized principally on the imidazolyl moiety whereas the next four higher LUMOs have a significantly larger orbital contribution localized on the N-aryl rings. Consequently, aza-substitution or addition of electron withdrawing substituents to the N-aryl rings will stabilize these higher LUMOs relative to one on the imidazolyl ring. The MOs in the figure are assigned symmetry labels according to an idealized C2 symmetry for the complex. An analysis of the electronic excited state transitions using both symmetry and orbital overlap considerations shows that the only ICT transitions that are allowed along the direction of the metal-ligand axis are HOMO→LUMO and HOMO→LUMO+4 ($b_1$→$b_1$). Moreover, modification at the 3,5-positions will stabilize LUMO+4 (b1) to greater extent than will changes at the 4-position. The net result in the orbital order upon aza- or cyano-substitution at the 4- or 3,5-positions of the aryl ring is shown for selected MOs in FIG. 66. Substitution on any of the sites leads to a LUMO that is localized primarily on the N-aryl rings. However, the LUMO with substituents at the 4-positions has $a_1$ symmetry whereas the LUMO with substituents at the 3,5 positions has $b_1$ symmetry. This difference in orbital symmetry will affect the parameters ($\Delta E_{ST}$ and f) that dominate the photophysical properties of TADF. FIG. 67 shows the NTOs calculated for the $S_1$ state of Au(I) complexes with imidazolyl carbenes having various substituted N-aryl rings. Aza-substitution at the 4-position, while decreasing $\Delta E_{ST}$ relative to the parent complex, is not sufficient to perturb the electron NTO away from localization on the imidazolyl moiety. However, the other derivatives display electron NTOs with substantial contributions from the N-aryl rings. Derivatives substituted at 3,5-positions have small values for $\Delta E_{ST}$ and moderate oscillator strengths whereas the complex with cyano groups at the 4 position has a very small $\Delta E_{ST}$, albeit with an extremely weak oscillator strength due to poor overlap between the HOMO and LUMO involved in the ICT transition.

Figure 68:
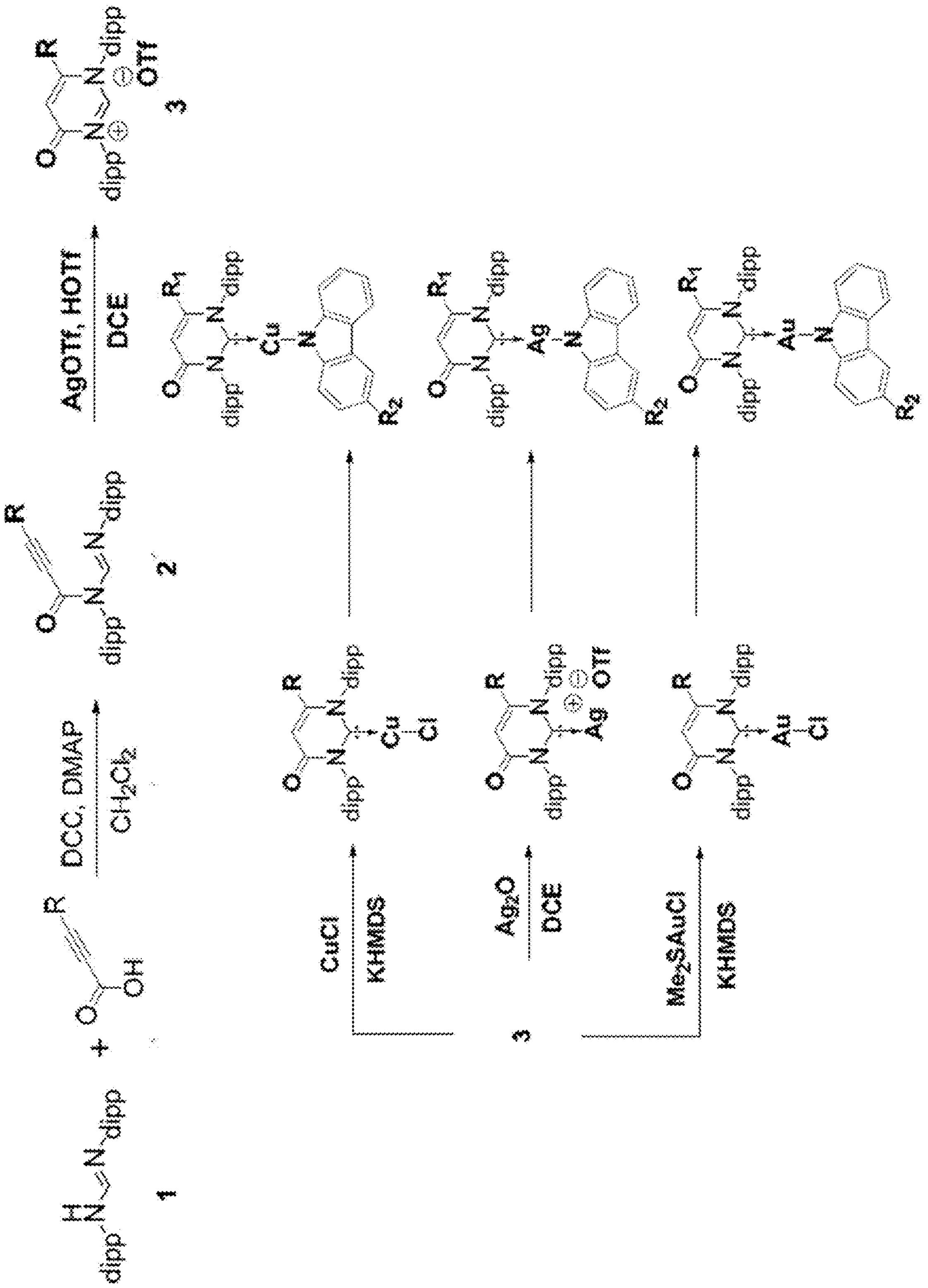
FIG. 68 depicts synthetic methods for exemplary (carbene)M(carbazolyl) complexes.

The key component of this invention is the observation that interligand charge transfer excited states in cMa complexes which involve significant mixing of the LUMO and a higher lying unoccupied MO in the transition leads to a decrease in $\Delta E_{ST}$ and only a marginal decrease in the oscillator strength, so long as one of the unoccupied MOs involved has substantial character on the carbene carbon bound to the metal ion. If this carbene carbon is not involved in the excited state both the $\Delta E_{ST}$ and the oscillator strength of the transition will be decreased. In order to have a high TADF rate the oscillator strength must be kept at a reasonable level or it will offset the benefits of decreasing $\Delta E_{ST}$. Thus, acceptor substituted carbene ligands can be used to decrease $\Delta E_{ST}$ while maintaining a high oscillator strength, leading to high TADF radiative rates Compounds 1, 2, and 3 were synthesized according to the reported method (T.-y. Li, et al, Chem. Eur. J. 2021, 27(20), 6191-6197; C. Zhang, et al. *New J. Chem.,* 2017, 41, 1889-1892; FIG. 68).

Synthesis of Carbene-Ag-OTf: 3 (1 equiv.) and Ag2O (0.6 equiv.) were stirred in anhydrous DCM at RT for 3 days. Remove the insoluble components by Celite. The carbene-Ag-OTf was obtained by adding excess amount of pentane into the condensed filtrate as grey crystalline.

Synthesis of Carbene-Au—Cl: To an anhydrous THF solution of 3 (1 equiv.), KHMDS (0.5M in toluene, 1.1 equiv.) was added dropwise at −77K. After 3 h, (Me2S)AuCl (1.1 equiv.) was added in one portion at −77K. The system is allowed to warm up to RT and stir for overnight. Remove the insoluble components by Celite. The carbene-Cu—Cl was obtained by adding excess amount of pentane into the condensed filtrate as white crystalline.

Synthesis of the Carbene-Metal-amide complexes: Carbazole or 3-cyano-carbazole (1 equiv.) and $NaO^tBu$ (1 equiv.) were dissolved in anhydrous THF and stir at RT for 2 h. Corresponding carbene-Metal intermediate complexes were added in one portion, and the solution was stirred at RT for overnight. Remove the insoluble components by Celite. Excess amount of pentane was added into the condensed filtrate. The final product was collected as crystalline powder and washed by ether or methanol.

$^{Ph}$Cu*: $^1$H NMR (400 MHz, acetone) δ 8.16 (s, 1H), 7.89 (t, J=7.9 Hz, 2H), 7.81 (t, J=7.8 Hz, 1H), 7.64 (d, J=7.8 Hz, 2H), 7.51 (t, J=6.6 Hz, 2H), 7.49-7.44 (m, 1H), 7.40 (dd, J=8.7, 5.3 Hz, 4H), 7.11 (dd, J=8.5, 1.5 Hz, 1H), 6.98 (t, J=7.1 Hz, 1H), 6.89 (t, J=7.3 Hz, 1H), 6.83 (s, 1H), 5.65 (d, J=8.1 Hz, 1H), 5.54 (d, J=8.5 Hz, 1H), 3.15 (dtd, J=20.4, 13.5, 6.7 Hz, 4H), 1.29 (t, J=7.3 Hz, 12H), 1.24 (d, J=6.8 Hz, 6H), 1.19 (d, J=6.7 Hz, 6H).

$^{Ph}$Ag: $^1$H NMR (400 MHz, acetone) δ 7.85-7.70 (m, 4H), 7.60 (d, J=7.8 Hz, 2H), 7.53-7.46 (m, 3H), 7.45-7.38 (m, 4H), 6.92 (ddd, J=8.2, 7.0, 1.2 Hz, 2H), 6.87 (s, 1H), 6.78-6.69 (m, 2H), 6.02 (d, J=8.1 Hz, 2H), 3.26-2.99 (m, 4H), 1.35 (d, J=6.8 Hz, 6H), 1.29 (dd, J=12.4, 6.8 Hz, 12H), 1.15 (d, J=6.7 Hz, 6H).

PhAu: $^1$H NMR (400 MHz, acetone) δ 7.85-7.71 (m, 4H), 7.58 (d, J=7.8 Hz, 2H), 7.50-7.42 (m, 3H), 7.38 (d, J=4.4 Hz, 4H), 6.93 (ddd, J=8.2, 7.0, 1.3 Hz, 2H), 6.86 (s, 1H), 6.77 (ddd, J=7.9, 7.1, 1.0 Hz, 2H), 6.05 (dt, J=8.2, 0.8 Hz, 2H), 3.07 (sept, J=6.7 Hz, 4H), 1.41 (d, J=6.8 Hz, 6H), 1.32 (d, J=6.8 Hz, 6H), 1.26 (d, J=6.8 Hz, 6H), 1.11 (d, J=6.7 Hz, 6H).

PhAu*: $^1$H NMR (400 MHz, acetone) δ 8.23 (dd, J=1.7, 0.6 Hz, 1H), 7.97-7.92 (m, 1H), 7.84 (dt, J=20.4, 7.8 Hz, 2H), 7.62 (d, J=7.8 Hz, 2H), 7.54-7.45 (m, 3H), 7.41 (d, J=4.3 Hz, 4H), 7.22 (dd, J=8.5, 1.7 Hz, 1H), 7.08 (ddd, J=8.3, 7.1, 1.3 Hz, 1H), 6.94 (ddd, J=8.0, 7.1, 1.0 Hz, 1H), 6.91 (s, 1H), 6.13 (dd, J=8.2, 0.8 Hz, 1H), 6.05 (dd, J=8.5, 0.6 Hz, 1H), 3.18-3.00 (m, 4H), 1.42 (d, J=6.8 Hz, 6H), 1.32 (d, J=6.8 Hz, 6H), 1.27 (d, J=6.8 Hz, 6H), 1.13 (d, J=6.7 Hz, 6H).

Figure 70:
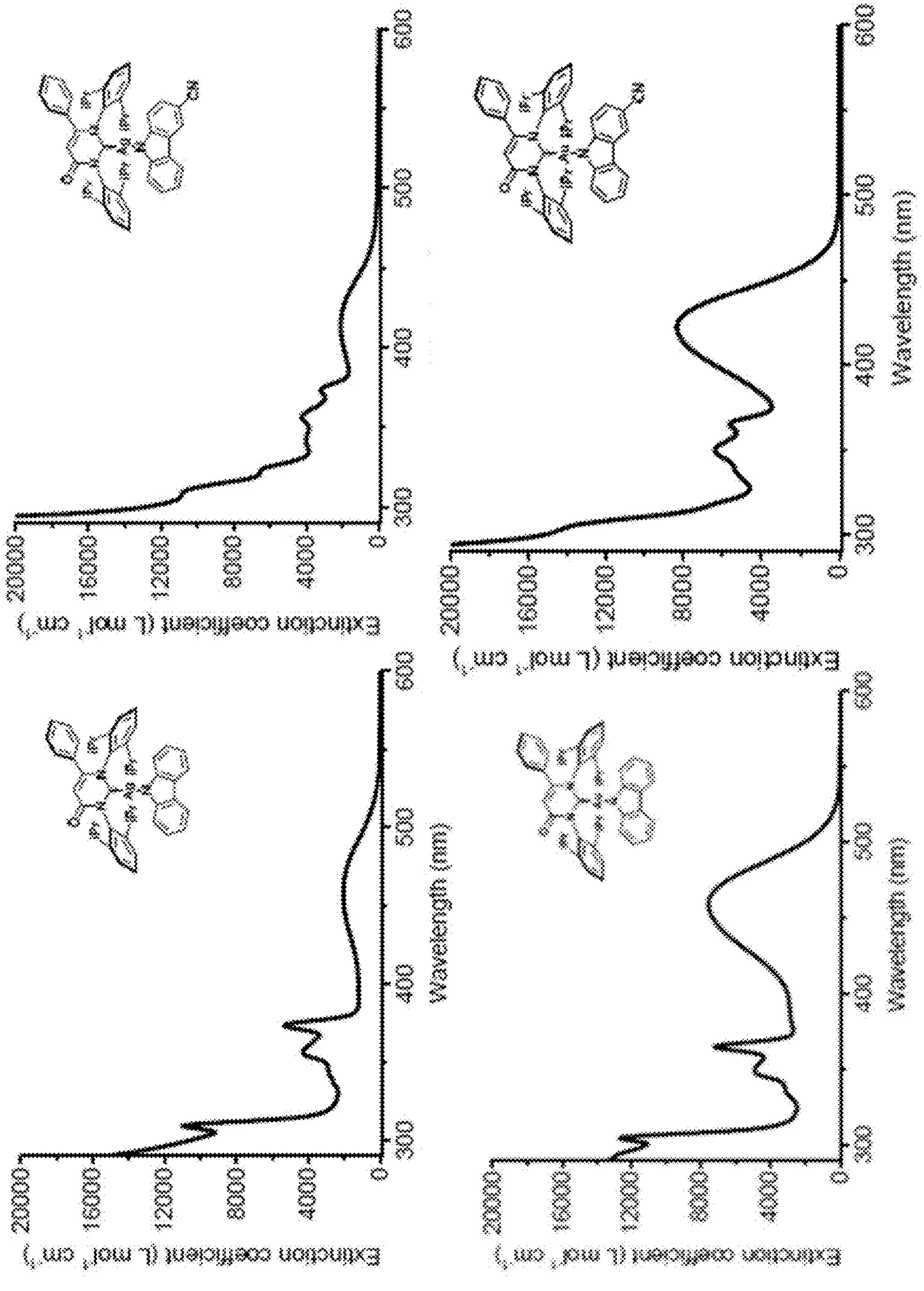
FIG. 70 depicts the absorption spectra in toluene for $^{Ph}$Ag, $^{Ph}$Ag*, $^{Ph}$Au, and $^{Ph}$Au* complexes.
Figure 71:
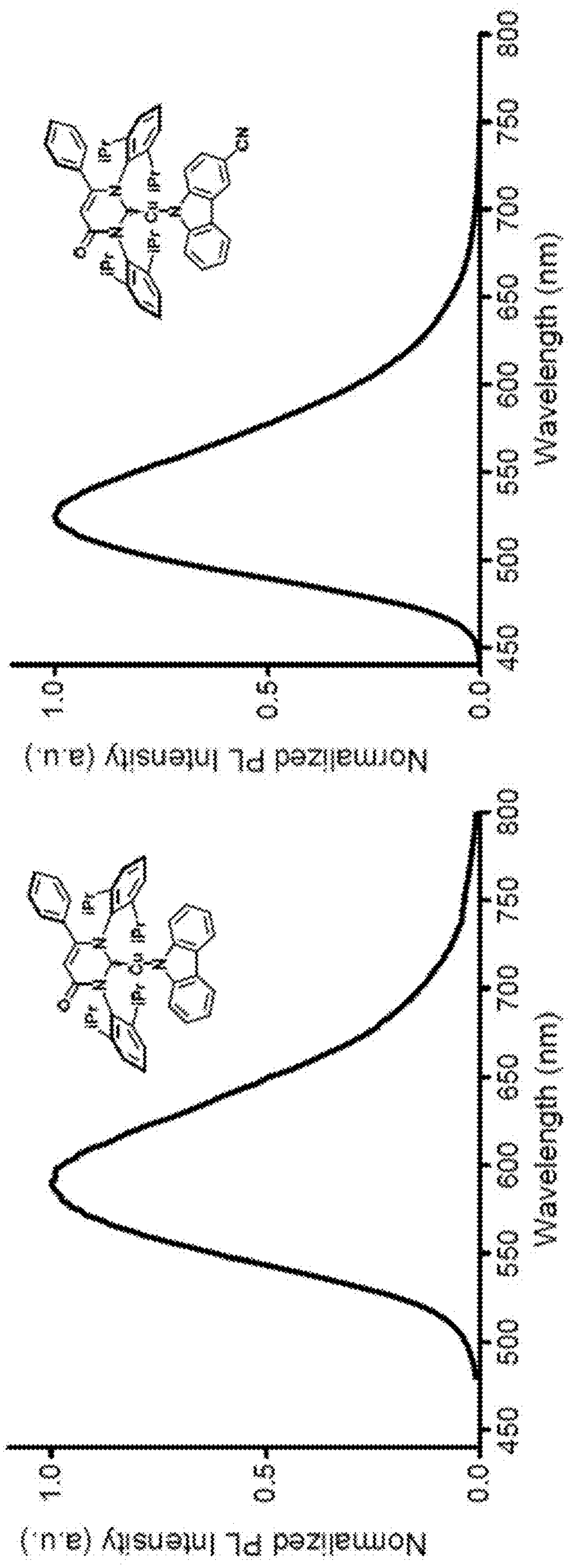
FIG. 71 depicts the emission spectra in diluted toluene solution for $^{Ph}$Cu and $^{Ph}$Cu* complexes.
Figure 72:
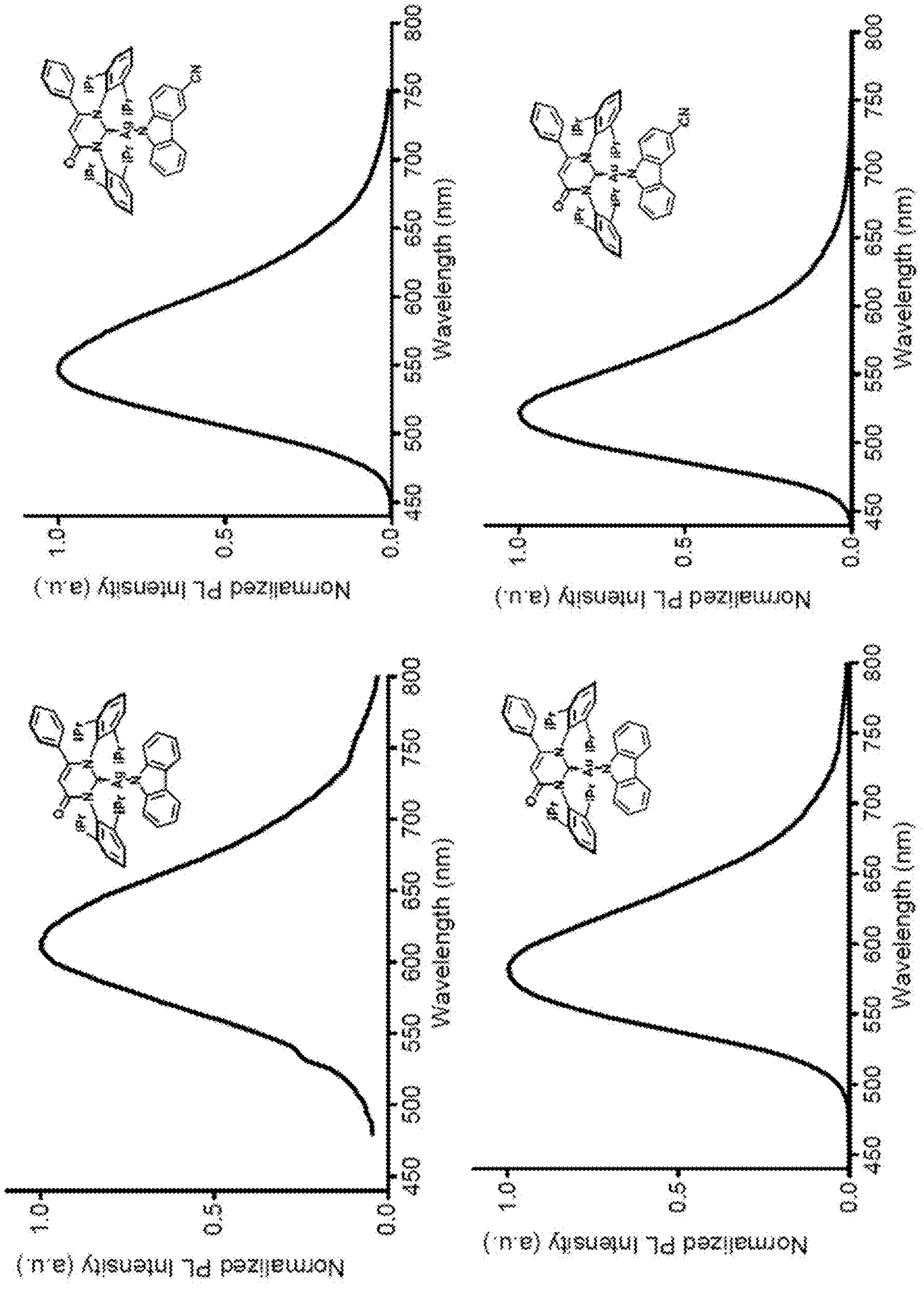
FIG. 72 depicts the emission spectra in diluted toluene solution for $^{Ph}$Ag, $^{Ph}$Ag*, $^{Ph}$Au, and $^{Ph}$Au* complexes.
Figure 73:
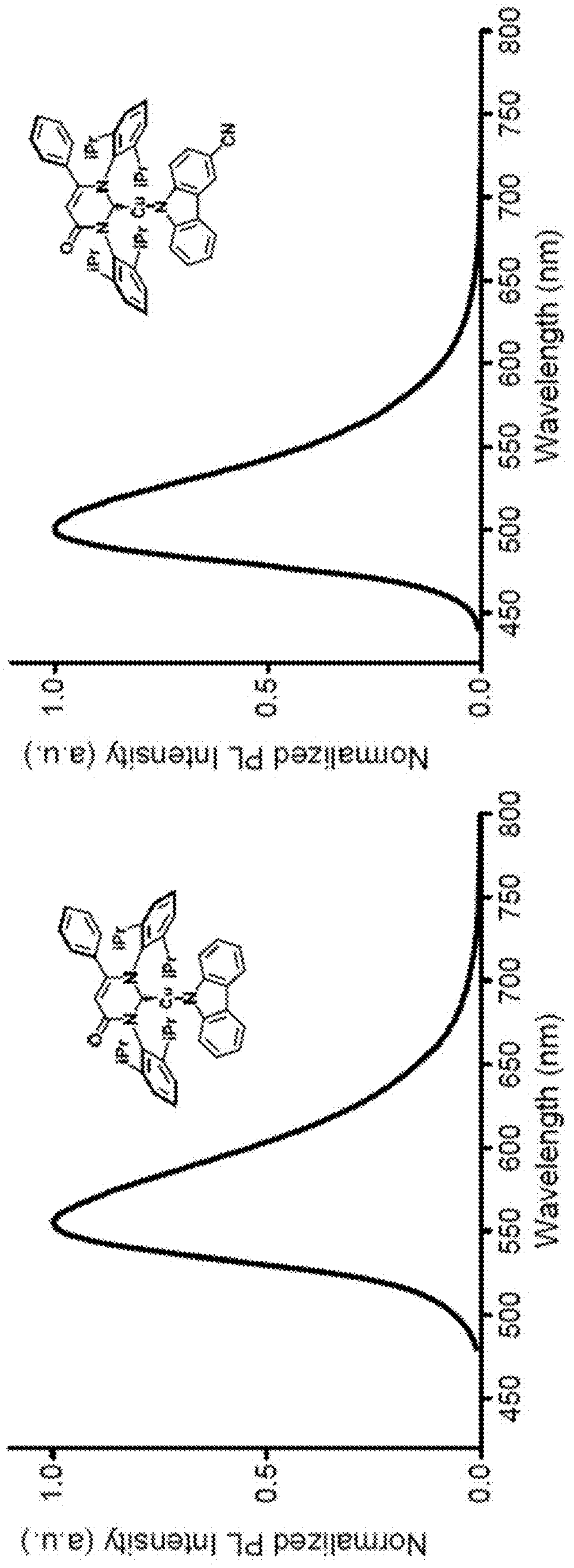
FIG. 73 depicts the emission spectra in 1 wt % doped PS film for $^{Ph}$Cu and $^{Ph}$Cu* complexes.
Figure 74:
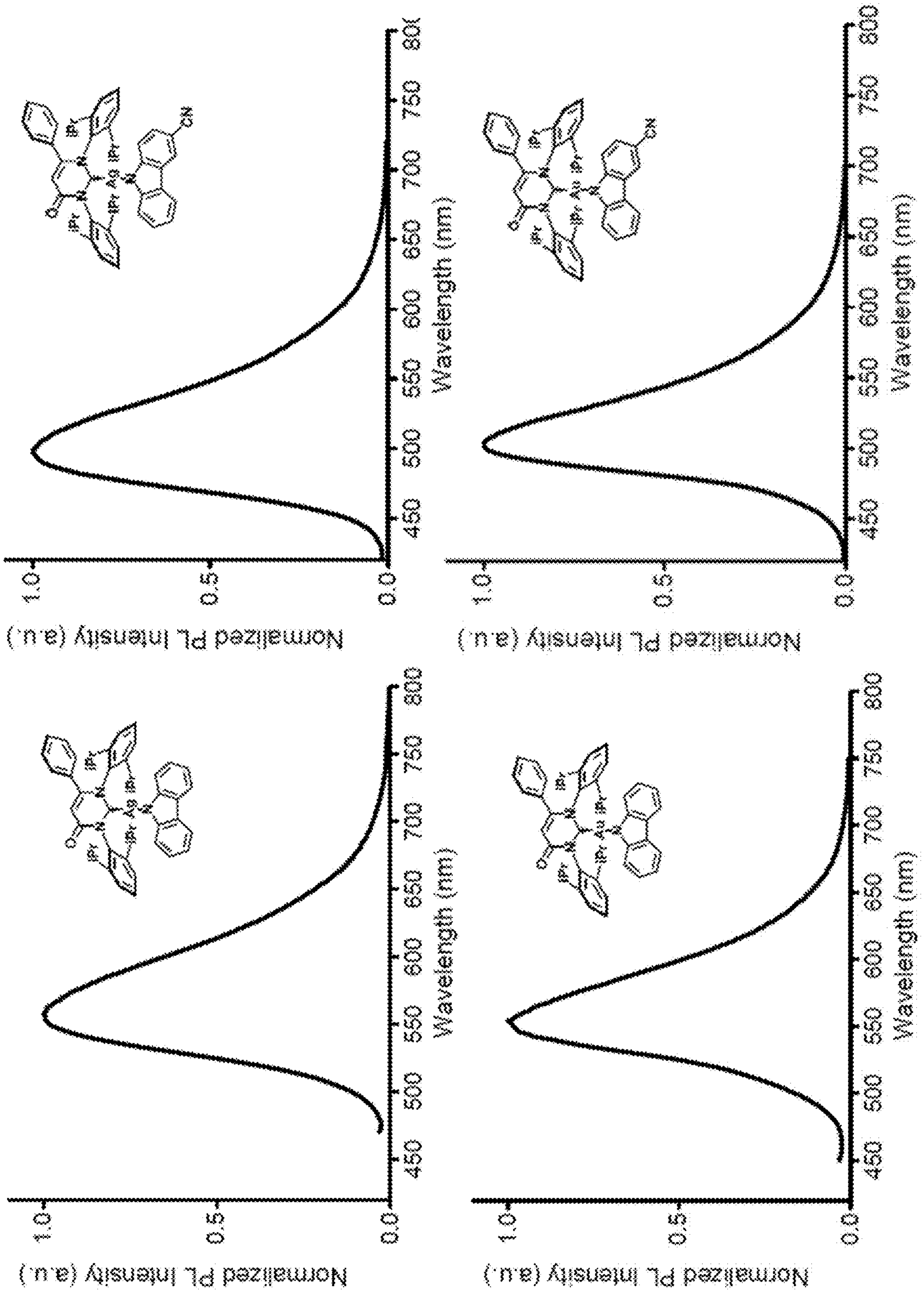
FIG. 74 depicts the emission spectra in 1 wt % doped PS film for $^{Ph}$Ag, $^{Ph}$Ag*, $^{Ph}$Au, and $^{Ph}$Au* complexes.

The molecular structures of the two coordinate coinage metal complexes with extended phenyl substitutes in carbene ligands are shown below. The absorption spectra in toluene are presented in FIG. 69 and FIG. 70. The emission spectra in diluted toluene solution are presented in FIG. 71 and FIG. 72. The emission spectra in 1 wt % doped PS film are presented in FIG. 73 and FIG. 74. Emission characteristics are presented in Table 13.

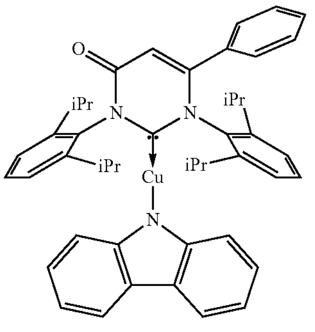

$^{Ph}$Cu

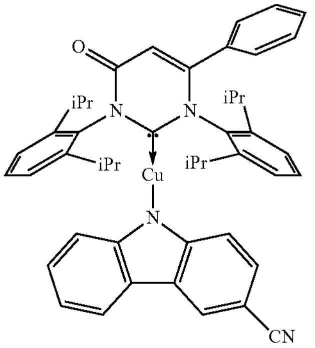

$^{Ph}$Cu*

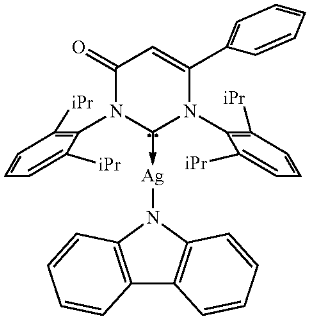

$^{Ph}$Ag

-continued

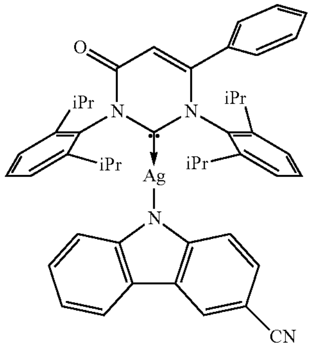

$^{Ph}$Ag*

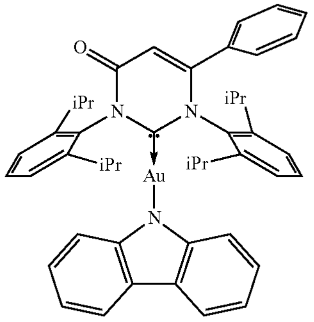

$^{Ph}$Au

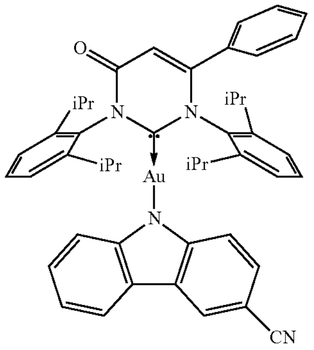

$^{Ph}$Au*

TABLE 13

Photophysical characteristics of coinage metal complexes.

| | $\lambda_{max}$ (nm) | $\tau$(μs) | Φ | $k_r$ ($10^5s^{-1}$) | $k_{nr}$ ($10^5s^{-1}$) |
|---|---|---|---|---|---|
| Toluene | | | | | |
| PhCu | 590 | 0.34 | 0.10 | 2.9 | 26 |
| PhCu* | 525 | 1.7 | 0.66 | 3.9 | 2.0 |
| PhAg | 612 | 0.076 | 0.02 | 2.6 | 129 |
| PhAg* | 546 | 0.80 | 0.38 | 4.8 | 7.8 |
| PhAu | 582 | 0.37 | 0.15 | 4.1 | 23 |
| PhAu* | 522 | 1.3 | 0.74 | 5.7 | 2.0 |
| 1 wt % doped PS film | | | | | |
| PhCu | 556 | 1.9 | 0.70 | 3.7 | 1.6 |
| PhCu* | 500 | 2.3 | 0.83 | 3.6 | 0.74 |
| PhAg | 557 | 1.1 | 0.56 | 5.1 | 4.0 |
| PhAg* | 498 | 1.2 | 0.88 | 7.3 | 1.0 |
| PhAu | 554 | 1.6 | 0.77 | 4.8 | 1.4 |
| PhAu* | 503 | 1.6 | 1.0 | 6.3 | <0.063 |

It is understood that the various embodiments described herein are by way of example only, and are not intended to limit the scope of the invention. For example, many of the materials and structures described herein may be substituted with other materials and structures without deviating from the spirit of the invention. The present invention as claimed may therefore include variations from the particular examples and preferred embodiments described herein, as will be apparent to one of skill in the art. It is understood that various theories as to why the invention works are not intended to be limiting.

We claim:

1. A compound represented by the following Formula I:

Formula I

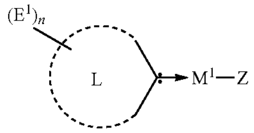

wherein $M^1$ is selected from the group consisting of Au(I), Ag(I), and Cu(I);

L is a carbene coordinated to the metal $M^1$;

Z is a monoanionic ligand;

$E^1$ is an electron accepting group;

n is an integer from 1 to the maximum allowable substitution on L, wherein when n is greater than 1, each $E^1$ may be the same or different;

$E^1$, L, and Z may each be substituted with one or more substituents independently selected from the group consisting of hydrogen, deuterium, halogen, pseudohalogen, alkyl, cycloalkyl, heteroalkyl, heterocycloalkyl, arylalkyl, alkoxy, aryloxy, amino, amide, hydroxyl, silyl, alkenyl, cycloalkenyl, heteroalkenyl, alkynyl, heteroalkynyl, aryl, heteroaryl, nitro, nitrile, isonitrile, sulfanyl, boryl, acyl, carboxylic acid, benzoyl, ether, ester, vinyl, ketone, sulfinyl, sulfonyl, cyano, phosphino, and combinations thereof; wherein any two adjacent substituents may together join to form a ring.

2. The compound of claim 1, wherein $E^1$ is selected from the group consisting of a nitrogen-containing heterocyclic ring and a carbocyclic aromatic ring optionally having at least one electron-withdrawing substituent.

3. The compound of claim 1, wherein $E^1$ is a nitrogen-containing heterocyclic ring selected from the group consisting of aza-dibenzothiophene, aza-dibenzofuran, aza-dibenzoselenophene, aza-benzofuran, aza-benzothiophene, aza-benzoselenophene, aza-carbazole, aza-indolocarbazole, pyridylindole, pyrrolodipyridine, pyrazole, imidazole, triazole, oxazole, thiazole, oxadiazole, oxatriazole, dioxazole, thiadiazole, pyridine, pyridazine, pyrimidine, pyrazine, triazine, oxazine, oxathiazine, oxadiazine, indole, benzimidazole, indazole, indoxazine, benzoxazole, benzisoxazole, benzothiazole, quinoline, isoquinoline, cinnoline, quinazoline, quinoxaline, naphthyridine, phthalazine, pteridine, azaxanthene, acridine, phenazine, phenothiazine, phenoxazine, benzofuropyridine, furodipyridine, benzothienopyridine, thienodipyridine, benzoselenophenopyridine, selenophenodipyridine, 1,2-azaborine, 1,3-azaborine, 1,4-azaborine, borazine, and aza-analogs thereof; wherein $E^1$ is optionally further substituted.

4. The compound of claim 1, wherein $E^1$ is a nitrogen-containing heterocyclic ring fused to the carbene L.

5. The compound of claim 1, wherein $E^1$ is an aromatic ring having at least one electron-withdrawing substituent selected from the group consisting of halogen, pseudohalogen, haloalkyl, halocycloalkyl, heteroalkyl, amide, alkenyl, cycloalkenyl, heteroalkenyl, alkynyl, heteroalkynyl, aryl, heteroaryl, nitro, nitrile, isonitrile, sulfanyl, boryl, acyl, carboxylic acid, benzoyl, ester, vinyl, ketone, sulfinyl, sulfonyl, cyano, phosphino, and combinations thereof; wherein $E^1$ is optionally further substituted.

6. The compound of claim 1, wherein L is selected from the group consisting of Formula A, Formula B, Formula C, Formula D, Formula E, and Formula F;

Formula A

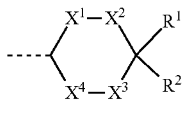

wherein each $X^1$ to $X^4$ independently represents $NR^1$, $CR^1R^2$, C=O, C=S, O, or S; and each occurrence of $R^1$ and $R^2$ is independently selected from the group consisting of hydrogen, deuterium, halogen, alkyl, cycloalkyl, heteroalkyl, heterocycloalkyl, arylalkyl, alkoxy, aryloxy, amino, silyl, alkenyl, cycloalkenyl, heteroalkenyl, alkynyl, aryl, heteroaryl, nitrile, isonitrile, sulfanyl, boryl, acyl, carboxylic acid, ether, ester, sulfinyl, sulfonyl, cyano, phosphino, and combinations thereof;

wherein at least one substituent $R^1$ and $R^2$ comprises an electron accepting group;

wherein any two adjacent $R^1$ and $R^2$ are optionally joined or fused together to form a ring which is optionally substituted, Formula B

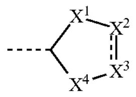

wherein each $X^1$ and $X^4$ independently represents N, $CR^1R^2$, $SiR^1$, $SiR^1R^2$, B, $BR^1$, $BR^1R^2$, O, or S; and each $X^2$ and $X^3$ independently represents $CR^1$, $CR^1R^2$, $SiR^1$, N, P, B, O, or S;

each occurrence of $R^1$ and $R^2$ is independently hydrogen or a substituent selected from the group consisting of deuterium, halogen, alkyl, cycloalkyl, heteroalkyl, heterocycloalkyl, arylalkyl, alkoxy, aryloxy, amino, silyl, alkenyl, cycloalkenyl, heteroalkenyl, alkynyl, aryl, heteroaryl, nitrile, isonitrile, sulfanyl, boryl, acyl, carboxylic acid, ether, ester, sulfinyl, sulfonyl, cyano, phosphino, and combinations thereof;

wherein at least one substituent $R^1$ and $R^2$ comprises an electron accepting group;

wherein any two adjacent $R^1$ and $R^2$ are optionally joined or fused together to form a ring which is optionally substituted; and the dashed line inside the five-member ring represents zero or one double-bond, Formula C

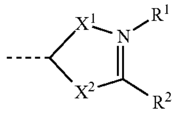

wherein each $X^1$ and $X^2$ independently represents $NR^1$, $CR^1R^2$, O, or S;

each occurrence of $R^1$ and $R^2$ is independently hydrogen or a substituent selected from the group consisting of deuterium, halogen, alkyl, cycloalkyl, heteroalkyl, heterocycloalkyl, arylalkyl, alkoxy, aryloxy, amino, silyl, alkenyl, cycloalkenyl, heteroalkenyl, alkynyl, aryl, heteroaryl, nitrile, isonitrile, sulfanyl, boryl, acyl, carboxylic acid, ether, ester, sulfinyl, sulfonyl, cyano, phosphino, and combinations thereof; and wherein at least one substituent $R^1$ and $R^2$ comprises an electron accepting group;

wherein any two adjacent $R^1$ and $R^2$ are optionally joined or fused together to form a ring which is optionally substituted, Formula D

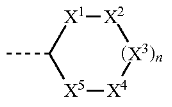

wherein each $X^1$ to $X^5$ independently represents N, P, $NR^1$, $PR^1$, B, $BR^1$, $CR^1$, $SiR^1$, $CR^1R^2$, $SiR^1R^2$, C=O, C=S, O, or S;

n is 0 or 1;

each occurrence of $R^1$ and $R^2$ is independently hydrogen or a substituent selected from the group consisting of deuterium, halogen, alkyl, cycloalkyl, heteroalkyl, heterocycloalkyl, arylalkyl, alkoxy, aryloxy, amino, silyl, alkenyl, cycloalkenyl, heteroalkenyl, alkynyl, aryl, heteroaryl, nitrile, isonitrile, sulfanyl, boryl, acyl, carboxylic acid, ether, ester, sulfinyl, sulfonyl, cyano, phosphino, and combinations thereof;

wherein at least one substituent $R^1$ and $R^2$ comprises an electron accepting group; and wherein any two adjacent $R^1$ and $R^2$ are optionally joined or fused together to form a ring which is optionally substituted;

Formula E

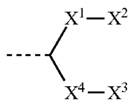

wherein each $X^1$ and $X^4$ independently represents $NR^1$, $CR^1$, $SiR^1$, $CR^1R^2$, $SiR^1R^2$, $PR^1$, $BR^1$, C=O, C=S, O, or S;

each $X^2$ and $X^3$ is independently present or absent, and if present, independently represents H, $NR^1R^2$, $CR^1R^2$, C=O, C=S, O, or S;

each occurrence of $R^1$ and $R^2$ is independently hydrogen or a substituent selected from the group consisting of deuterium, halogen, alkyl, cycloalkyl, heteroalkyl, heterocycloalkyl, arylalkyl, alkoxy, aryloxy, amino, silyl, alkenyl, cycloalkenyl, heteroalkenyl, alkynyl, aryl, heteroaryl, nitrile, isonitrile, sulfanyl, boryl, acyl, carboxylic acid, ether, ester, sulfinyl, sulfonyl, cyano, phosphino, and combinations thereof;

wherein at least one substituent $R^1$ and $R^2$ comprises an electron accepting group; and wherein any two adjacent $R^1$ and $R^2$ are optionally joined or fused together to form a ring which is optionally substituted Formula F

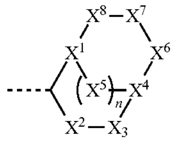

wherein each occurrence of $X^1$ to $X^8$ independently represents N, P, $NR^1$, $PR^1$, B, $BR^1$, $CR^1$, $SiR^1$, $CR^1R^2$, $SiR^1R^2$, C═O, C═S, O, or S;

n is 1 or 2;

each occurrence of $R^1$ and $R^2$ is independently hydrogen or a substituent selected from the group consisting of deuterium, halogen, alkyl, cycloalkyl, heteroalkyl, heterocycloalkyl, arylalkyl, alkoxy, aryloxy, amino, silyl, alkenyl, cycloalkenyl, heteroalkenyl, alkynyl, aryl, heteroaryl, nitrile, isonitrile, sulfanyl, boryl, acyl, carboxylic acid, ether, ester, sulfinyl, sulfonyl, cyano, phosphino, and combinations thereof;

wherein at least one substituent $R^1$ and $R^2$ comprises an electron accepting group; and wherein any two adjacent $R^1$ and $R^2$ are optionally joined or fused together to form a ring which is optionally substituted.

7. The compound of claim 1, wherein L is represented by one of the following structures:

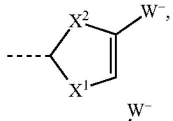,

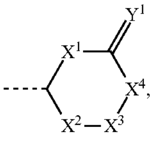,

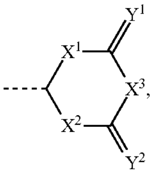, and

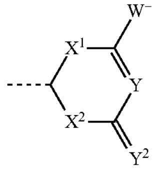

wherein each $X^1$ and $X^2$ independently represents $NR^1$, $CR^1$, $SiR^1$, $CR^1R^2$, $SiR^1R^2$, C═O, C═S, O, or S;

each $X^3$ and $X^4$ independently represents N, P, $NR^1$, $PR^1$, B, $BR^1$, $CR^1$, $SiR^1$, $CR^1R^2$, $SiR^1R^2$, C═O, C═S, O, or S;

Y represents N, P, $CR^1$, or $SiR^1$;

each $Y^1$ and $Y^2$ independently represents O, S, $NR^1$, or $CR^1R^2$

W represents O, $NR^1$, or S;

each occurrence of $R^1$ and $R^2$ is independently hydrogen or a substituent selected from the group consisting of deuterium, halogen, alkyl, cycloalkyl, heteroalkyl, heterocycloalkyl, arylalkyl, alkoxy, aryloxy, amino, silyl, alkenyl, cycloalkenyl, heteroalkenyl, alkynyl, aryl, heteroaryl, nitrile, isonitrile, sulfanyl, boryl, acyl, carboxylic acid, ether, ester, sulfinyl, sulfonyl, cyano, phosphino, and combinations thereof;

wherein at least one substituent $R^1$ and $R^2$ comprises an electron accepting group; and wherein any two adjacent $R^1$ and $R^2$ are optionally joined or fused together to form a ring which is optionally substituted.

8. The compound of claim 1, wherein L is represented by one of the following structures:

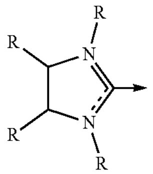
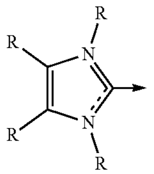
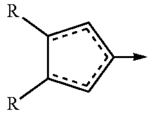
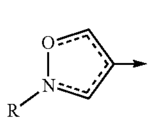
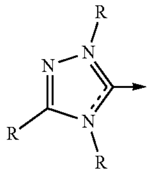
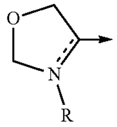
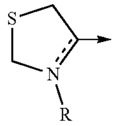
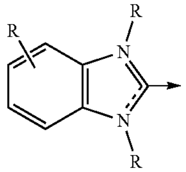
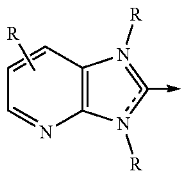
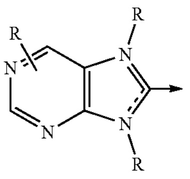
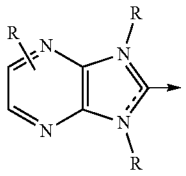
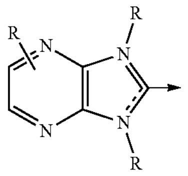
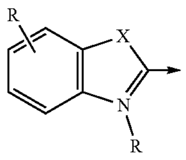
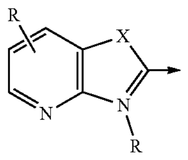
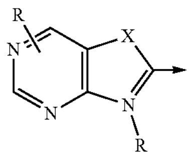
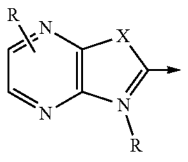
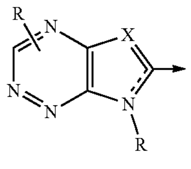
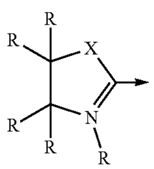
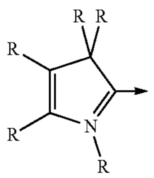

-continued
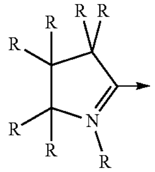
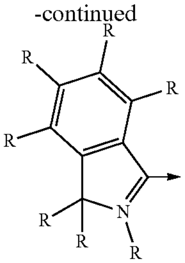
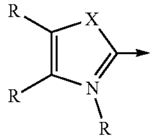
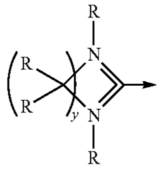
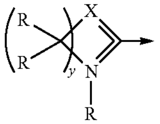
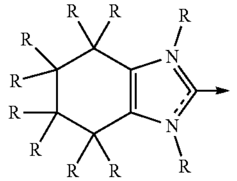
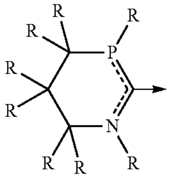
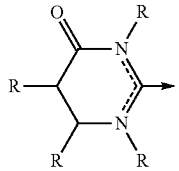
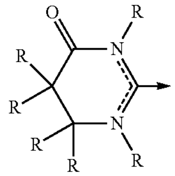
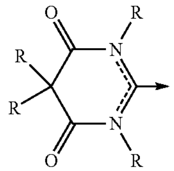
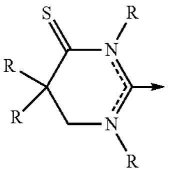
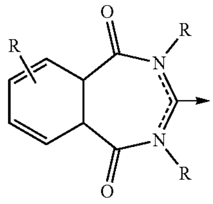
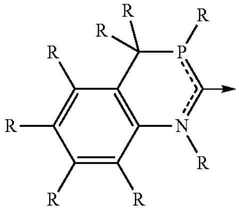
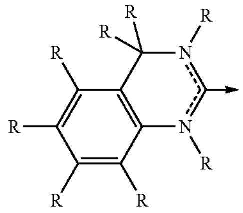
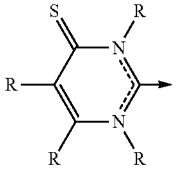
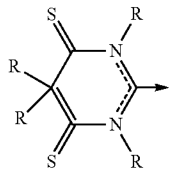
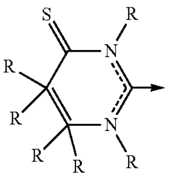
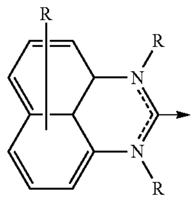
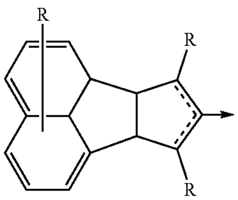
-continued
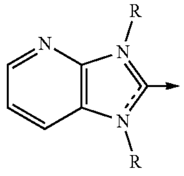
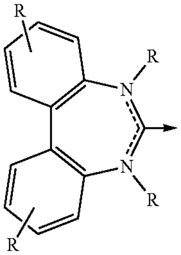
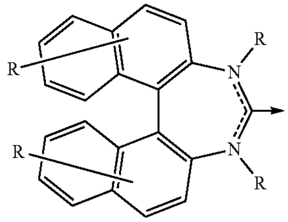
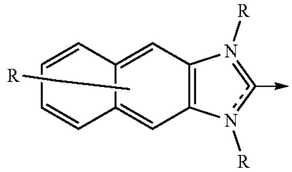
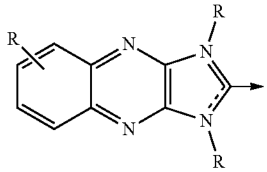
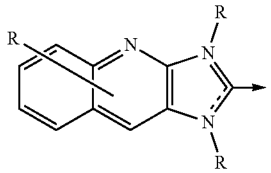
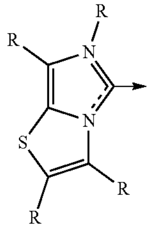
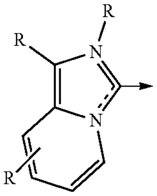
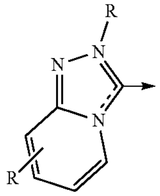
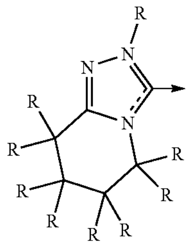
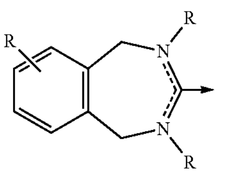
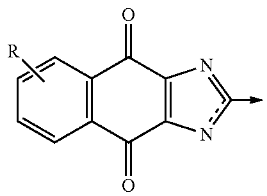
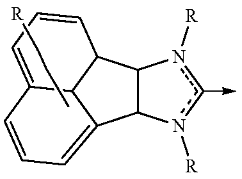

-continued

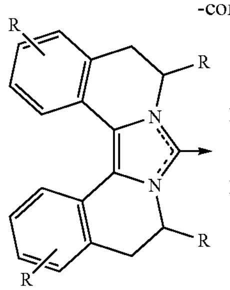

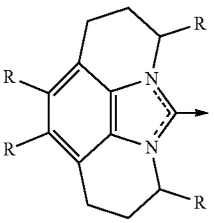

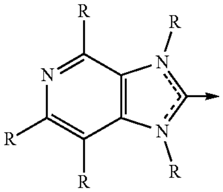

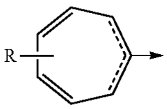

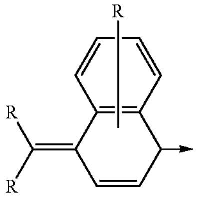

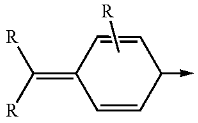

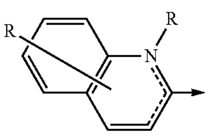

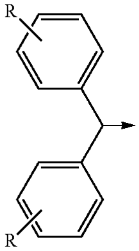

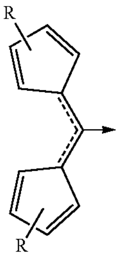

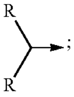;

wherein each R is independently selected from the group consisting of hydrogen, deuterium, halogen, pseudohalogen, alkyl, cycloalkyl, heteroalkyl, heterocycloalkyl, arylalkyl, alkoxy, aryloxy, amino, amide, hydroxyl, silyl, alkenyl, cycloalkenyl, heteroalkenyl, alkynyl, heteroalkynyl, aryl, heteroaryl, nitro, nitrile, isonitrile, sulfanyl, boryl, acyl, carboxylic acid, benzoyl, ether, ester, vinyl, ketone, sulfinyl, sulfonyl, cyano, phosphino, and combinations thereof; wherein any two adjacent substituents may together join to form a ring.

9. The compound of claim 1, wherein L is represented by one of the following structures:

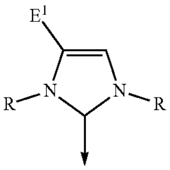

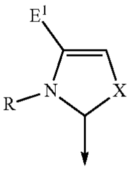

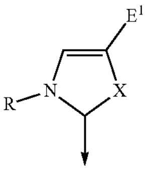

-continued

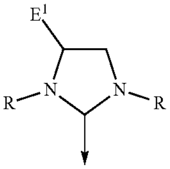

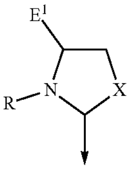

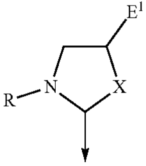

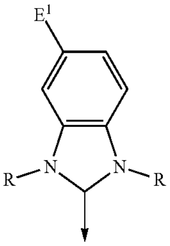

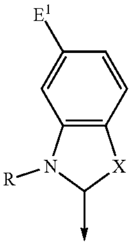

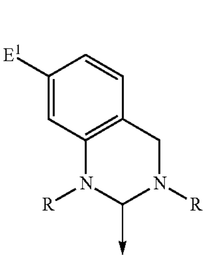

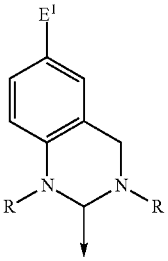

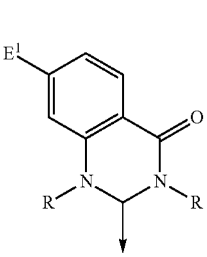

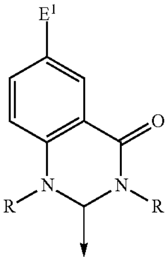

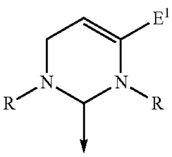

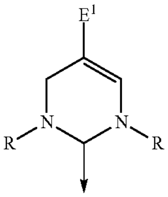

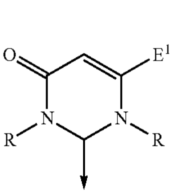

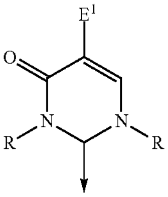

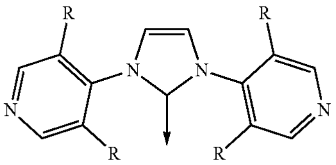

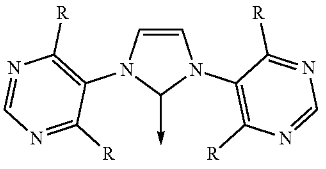

-continued

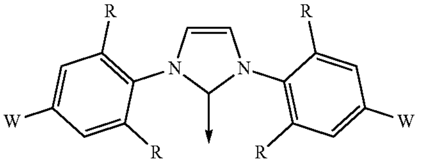

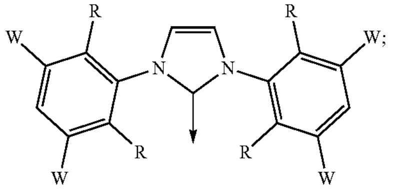

wherein each X represents S, O, $C(R)_2$, NR, or PR;

wherein each W represents an electron withdrawing group selected from the group consisting of halogen, $CF_3$, CN, C(O)R, $CO_2R$, $NO_2$, and $SO_2R$; and wherein each R is independently selected from the group consisting of hydrogen, deuterium, halogen, pseudohalogen, alkyl, cycloalkyl, heteroalkyl, heterocycloalkyl, arylalkyl, alkoxy, aryloxy, amino, amide, hydroxyl, silyl, alkenyl, cycloalkenyl, heteroalkenyl, alkynyl, heteroalkynyl, aryl, heteroaryl, nitro, nitrile, isonitrile, sulfanyl, boryl, acyl, carboxylic acid, benzoyl, ether, ester, vinyl, ketone, sulfinyl, sulfonyl, cyano, phosphino, and combinations thereof; wherein any two adjacent substituents may together join to form a ring.

10. The compound of claim 1, wherein L is represented by one of the following structures:

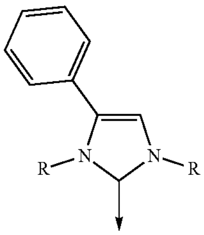

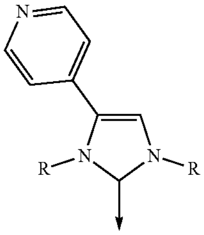

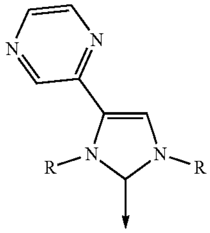

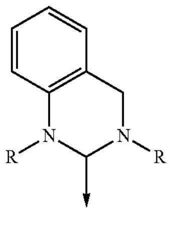

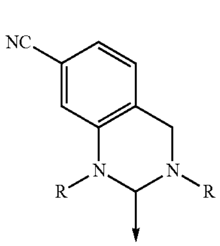

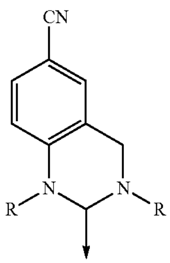

-continued

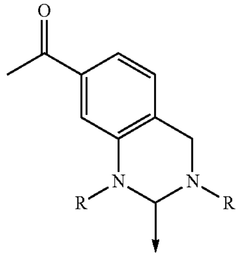

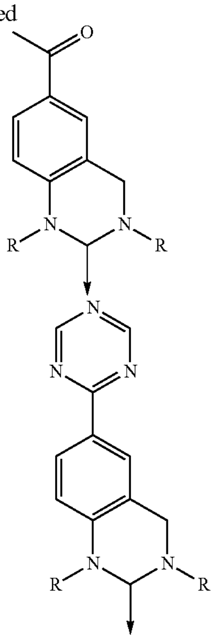

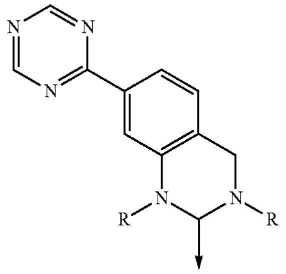

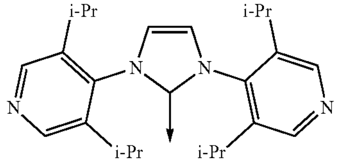

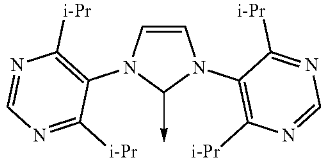

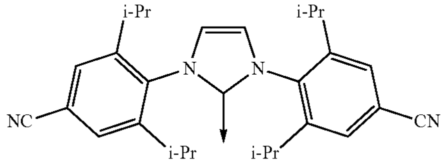

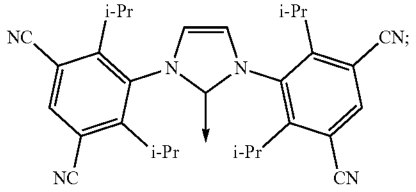

wherein each R is independently selected from the group consisting of hydrogen, deuterium, halogen, pseudohalogen, alkyl, cycloalkyl, heteroalkyl, heterocycloalkyl, arylalkyl, alkoxy, aryloxy, amino, amide, hydroxyl, silyl, alkenyl, cycloalkenyl, heteroalkenyl, alkynyl, heteroalkynyl, aryl, heteroaryl, nitro, nitrile, isonitrile, sulfanyl, boryl, acyl, carboxylic acid, benzoyl, ether, ester, vinyl, ketone, sulfinyl, sulfonyl, cyano, phosphino, and combinations thereof; wherein any two adjacent substituents may together join to form a ring.

11. The compound of claim 1, wherein Z is selected from the group consisting of an alkyl anion, aryl anion, heteroaryl anion, halide, trifluoromethylsulfonate, amide, alkoxide, sulfide, and phosphide, wherein Z may be further substituted.

12. The compound of claim 1, wherein Z is represented by one of the following structures:
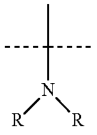
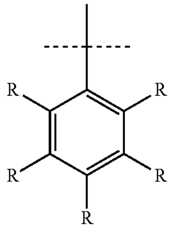
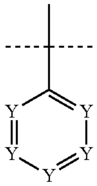
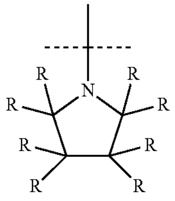
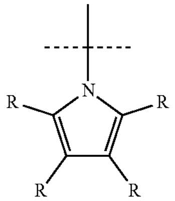
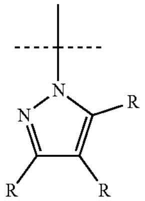
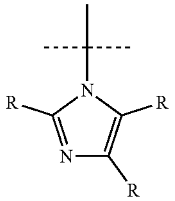
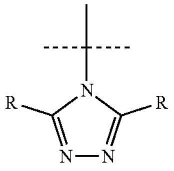
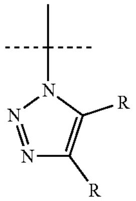
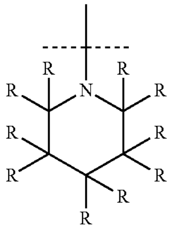
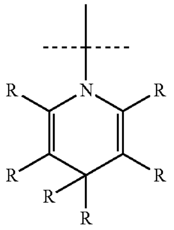
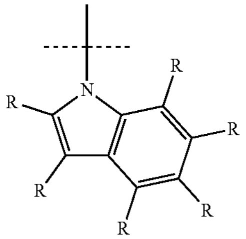
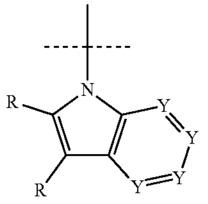
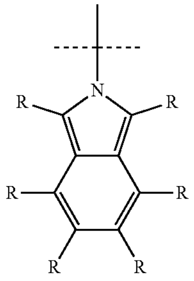
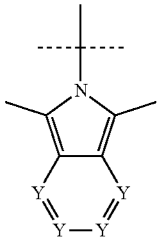
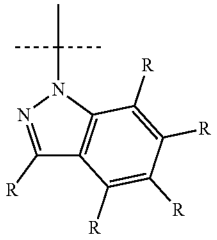
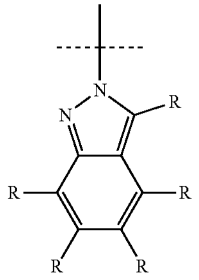
-continued
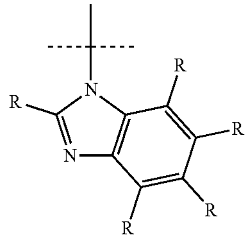
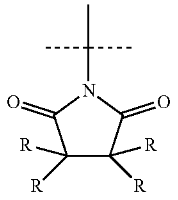
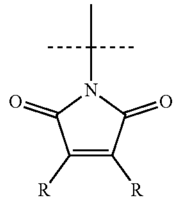
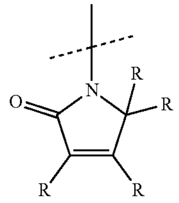
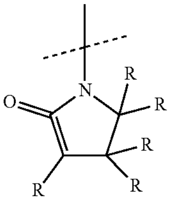
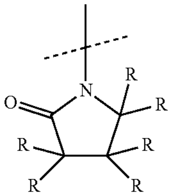
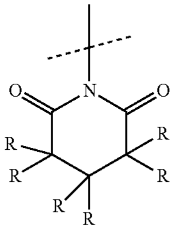
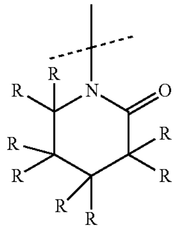
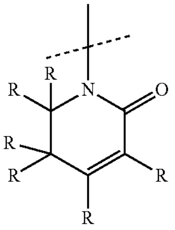
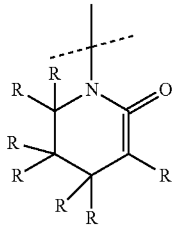
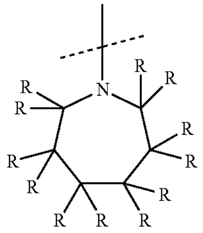
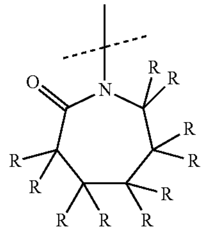
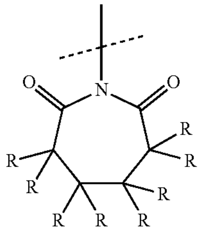
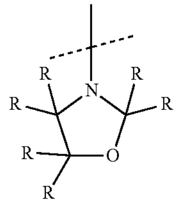
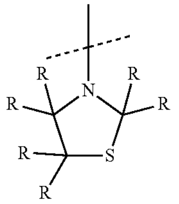
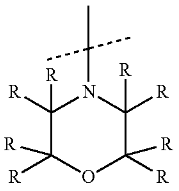
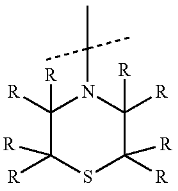

-continued

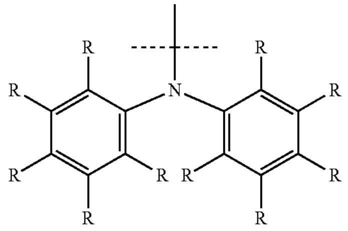

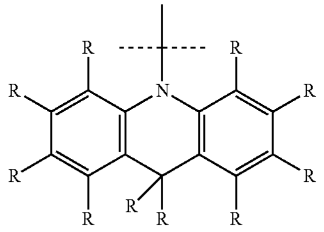

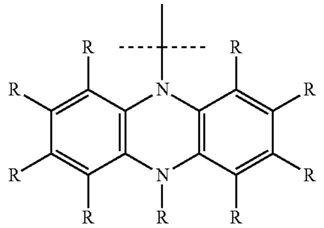

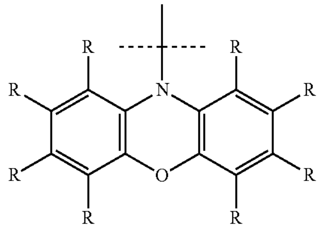

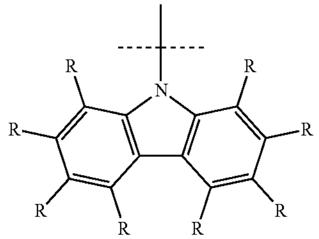

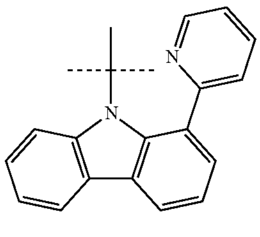

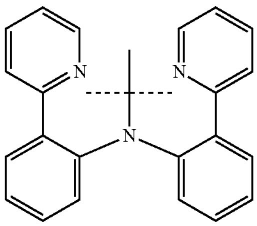

-continued

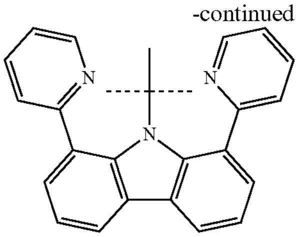

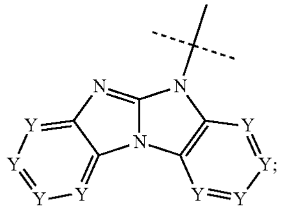

wherein the dashed line indicates the bond to $M^1$; and each occurrence Y is selected from the group consisting of N and CR; and each R independently represents a substituent selected from the group consisting of hydrogen, deuterium, halogen, pseudohalogen, alkyl, cycloalkyl, heteroalkyl, heterocycloalkyl, arylalkyl, alkoxy, aryloxy, amino, amide, hydroxyl, silyl, alkenyl, cycloalkenyl, heteroalkenyl, alkynyl, heteroalkynyl, aryl, heteroaryl, nitro, nitrile, isonitrile, sulfanyl, boryl, acyl, carboxylic acid, benzoyl, ether, ester, vinyl, ketone, sulfinyl, sulfonyl, cyano, phosphino, and combinations thereof; wherein any two adjacent substituents may together join to form a ring.

13. The compound of claim 1, wherein Z is represented by one of the following structures:

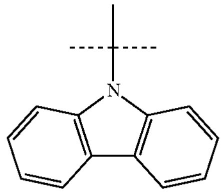

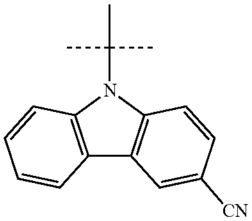

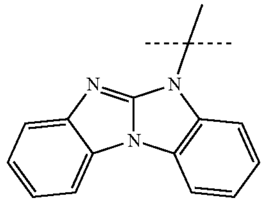

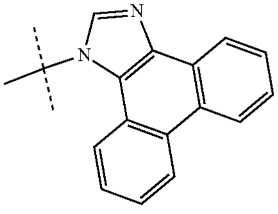

wherein the dashed line indicates the bond to $M^1$.

14. The compound of claim 1, wherein the compound is represented by one of the following structures
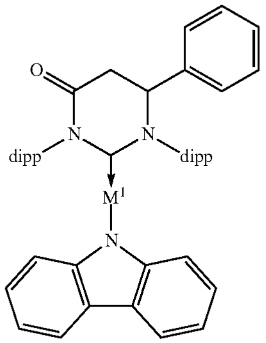
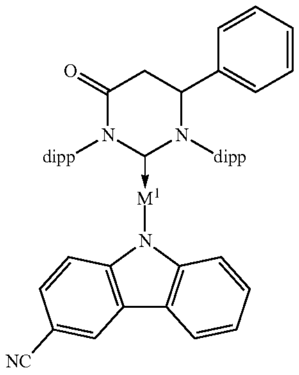
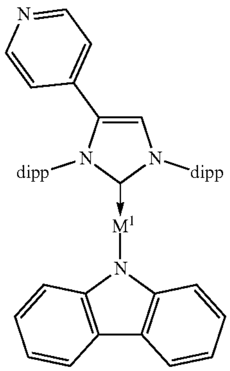
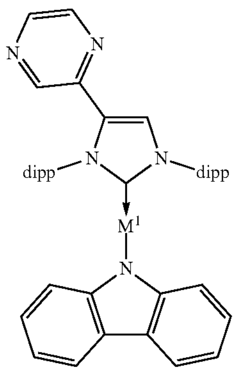
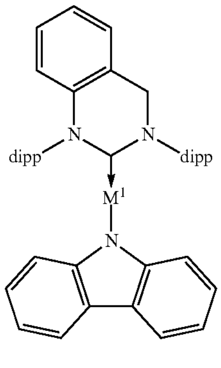
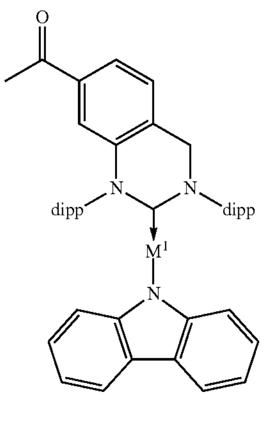
-continued
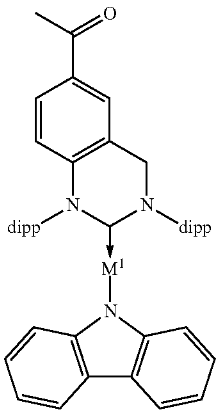
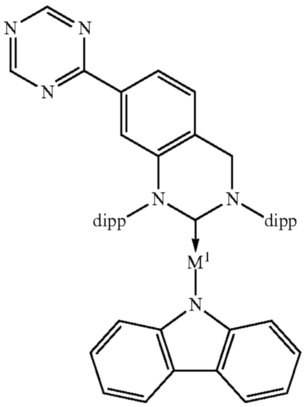
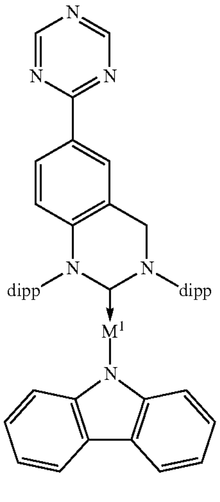
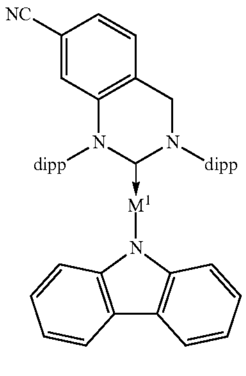

-continued

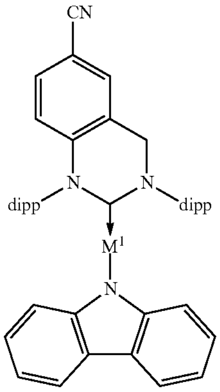

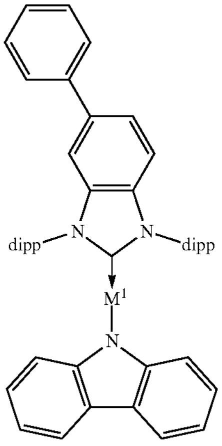

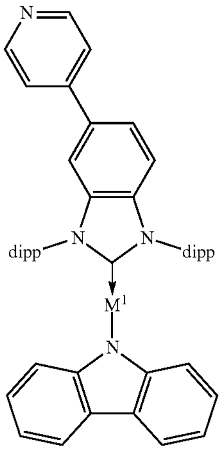

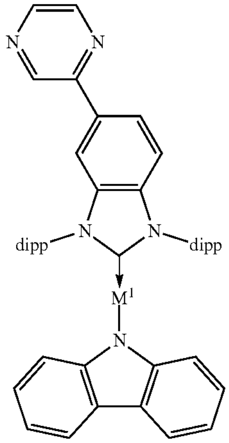

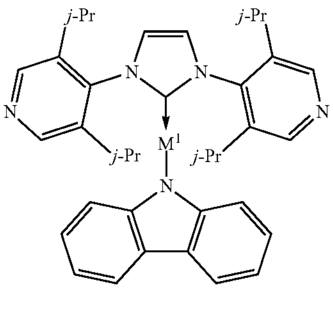

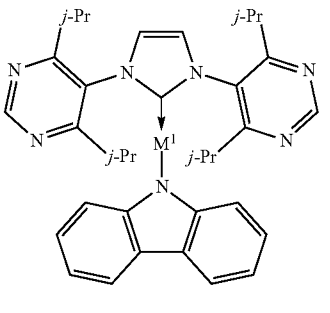

-continued

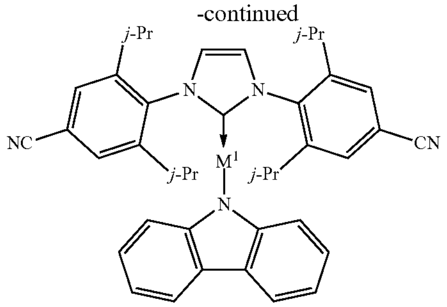

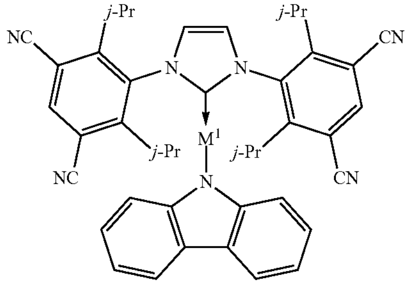

wherein dipp represents 2,6-diisopropylphenyl.

15. An organic electroluminescent device comprising:

an anode;

a cathode; and an organic layer, disposed between the anode and the cathode, comprising a compound represented by the following Formula I:

Formula I

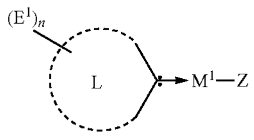

wherein is selected from the group consisting of Au(I), Ag(I), and Cu(I);

L is a carbene coordinated to the metal $M^1$;

Z is a monoanionic ligand;

$E^1$ is an electron accepting group;

n is an integer from 1 to the maximum allowable substitution on L, wherein when n is greater than 1, each $E^1$ may be the same or different;

$E^1$, L, and Z may each be substituted with one or more substituents independently selected from the group consisting of hydrogen, deuterium, halogen, pseudohalogen, alkyl, cycloalkyl, heteroalkyl, heterocycloalkyl, arylalkyl, alkoxy, aryloxy, amino, amide, hydroxyl, silyl, alkenyl, cycloalkenyl, heteroalkenyl, alkynyl, heteroalkynyl, aryl, heteroaryl, nitro, nitrile, isonitrile, sulfanyl, boryl, acyl, carboxylic acid, benzoyl, ether, ester, vinyl, ketone, sulfinyl, sulfonyl, cyano, phosphino, and combinations thereof; wherein any two adjacent substituents may together join to form a ring.

16. The organic electroluminescent device of claim 15, wherein the organic layer is an emissive layer and the compound is an emissive dopant or a non-emissive dopant.

17. The organic electroluminescent device of claim 15, wherein the organic layer further comprises a host, wherein the host comprises at least one chemical group selected from the group consisting of triphenylene, carbazole, dibenzothiphene, dibenzofuran, dibenzoselenophene, azatriphenylene, azacarbazole, aza-dibenzothiophene, aza-dibenzofuran, and aza-dibenzoselenophene.

18. A consumer product comprising an organic light-emitting device (OLED) comprising:

an anode;

a cathode; and an organic layer, disposed between the anode and the cathode, comprising a compound represented by the following Formula I:

Formula I

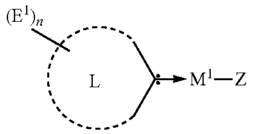

wherein is selected from the group consisting of Au(I), Ag(I), and Cu(I);

L is a carbene coordinated to the metal $M^1$;

Z is a monoanionic ligand;

$E^1$ is an electron accepting group;

n is an integer from 1 to the maximum allowable substitution on L, wherein when n is greater than 1, each $E^1$ may be the same or different;

$E^1$, L, and Z may each be substituted with one or more substituents independently selected from the group consisting of hydrogen, deuterium, halogen, pseudohalogen, alkyl, cycloalkyl, heteroalkyl, heterocycloalkyl, arylalkyl, alkoxy, aryloxy, amino, amide, hydroxyl, silyl, alkenyl, cycloalkenyl, heteroalkenyl, alkynyl, heteroalkynyl, aryl, heteroaryl, nitro, nitrile, isonitrile, sulfanyl, boryl, acyl, carboxylic acid, benzoyl, ether, ester, vinyl, ketone, sulfinyl, sulfonyl, cyano, phosphino, and combinations thereof; wherein any two adjacent substituents may together join to form a ring.

19. The consumer product of claim 18, wherein the consumer product is selected from the group consisting of a flat panel display, a computer monitor, a medical monitors television, a billboard, a light for interior or exterior illumination and/or signaling, a heads-up display, a fully or partially transparent display, a flexible display, a laser printer, a telephone, a cell phone, tablet, a phablet, a personal digital assistant (PDA), a wearable device, a laptop computer, a digital camera, a camcorder, a viewfinder, a micro-display, a 3-D display, a virtual reality or augmented reality display, a vehicle, a large area wall, a theater or stadium screen, and a sign.

20. A formulation comprising the compound of claim 1.

* * * * *